United States Patent [19]
Balmer

[11] Patent Number: 6,067,613
[45] Date of Patent: May 23, 2000

[54] ROTATION REGISTER FOR ORTHOGONAL DATA TRANSFORMATION

[75] Inventor: Keith Balmer, Bedford, United Kingdom

[73] Assignee: Texas Instruments Incorporated, Dallas, Tex.

[21] Appl. No.: 08/159,346

[22] Filed: Nov. 30, 1993

[51] Int. Cl.[7] .................................................. G06F 15/00
[52] U.S. Cl. .......................................... 712/32; 708/500
[58] Field of Search .................................. 395/800, 400, 395/425

[56] References Cited

U.S. PATENT DOCUMENTS

| | | | |
|---|---|---|---|
| 4,020,472 | 4/1977 | Bennett et al. | 395/375 |
| 4,368,513 | 1/1983 | Meltzer | 395/425 |
| 4,502,111 | 2/1985 | Riffe et al. | 395/775 |
| 4,569,016 | 2/1986 | Han et al. | 395/375 |
| 4,744,043 | 5/1988 | Kloker | 364/736 |
| 4,920,483 | 4/1990 | Pogue et al. | 395/425 |
| 4,930,065 | 5/1990 | McLagan et al. | 395/275 |
| 4,961,169 | 10/1990 | Matsumura et al. | 365/189.12 |
| 5,077,678 | 12/1991 | Guttag et al. | 395/157 |
| 5,129,088 | 7/1992 | Auslander et al. | 395/700 |
| 5,197,140 | 3/1993 | Balmer | 395/400 |
| 5,212,777 | 5/1993 | Gove et al. | 395/375 |
| 5,226,125 | 7/1993 | Balmer et al. | 395/325 |
| 5,239,654 | 8/1993 | Ing-Simmens et al. | 395/800 |
| 5,276,840 | 1/1994 | Yu | 395/425 |
| 5,283,863 | 2/1994 | Guttag et al. | 395/157 |
| 5,410,722 | 4/1995 | Cornaby | 395/800 |

OTHER PUBLICATIONS

Microprocessor Report, Slater, Michael, "IIT Ships Programmable Video Processor," vol. 5, No. 20, Oct. 30, 1991, pp. 1,6–7,13.

*Primary Examiner*—Meng-Ai T. An
*Assistant Examiner*—Walter D. Davis, Jr.
*Attorney, Agent, or Firm*—Robert D. Marshall, Jr.; Gerald E. Laws; Richard L. Donaldson

[57] ABSTRACT

A data processing apparatus (71) includes a data processor bus (103), the rotation register (208) and a register selection circuit. The rotation register (208) is embodied by a plurality of data registers (200) each having a plurality of equal bit groups. The number of bits within each bit group of each data register preferably equals the number N of data registers. The register selection circuit permits normal register reads and writes via the data processor bus. The register selection circuit permits special rotational data accesses. In a rotation read mode the register selection circuit selects noncontiguous bits from a predetermined position within each sections for each of the data registers for read access. In a rotation write mode the register selection circuit selects noncontiguous bits from a predetermined position within each sections for each of the data registers for write access. The data registers (200) are connected together in a loop (208). The most significant bit of each data register connected to the least significant bit of a sequential data register, with the last data register is connected to the first data register. In a register rotation mode the register selection circuit rotates bits in each data register in around the loop. This rotation is preferably by one bit upon each execution of a register rotation instruction.

107 Claims, 37 Drawing Sheets

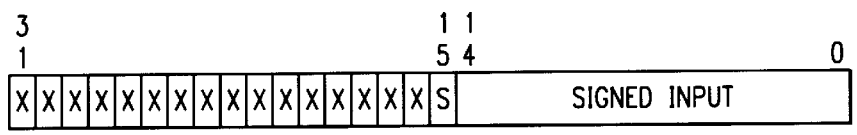
FIG. 10a
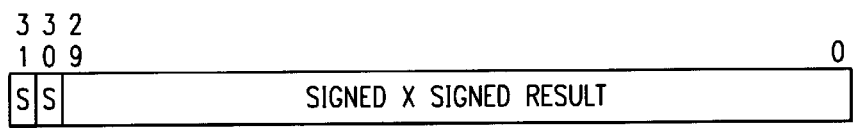
FIG. 10b ("01" IF HEX "8000" X HEX "8000")
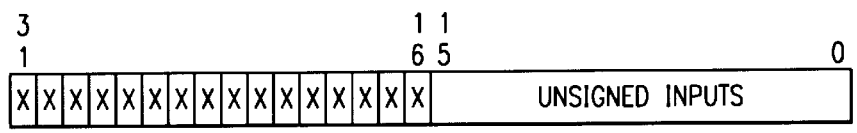
FIG. 10c
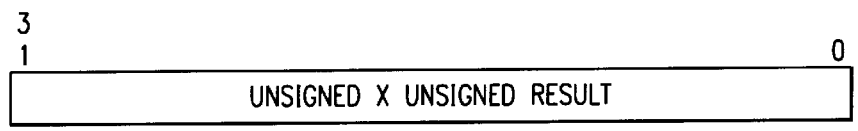
FIG. 10d
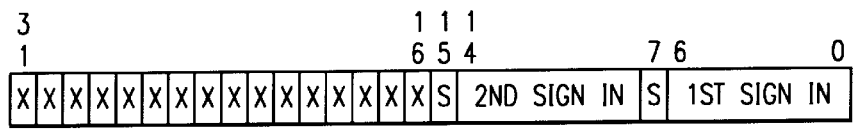
FIG. 11a
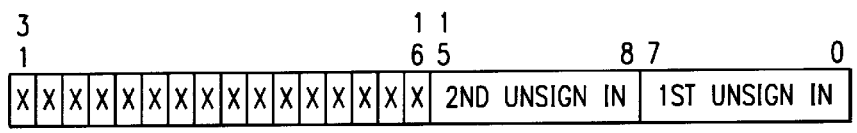
FIG. 11b
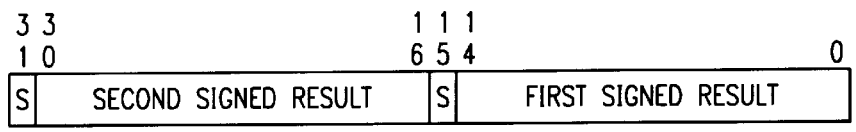
FIG. 11c
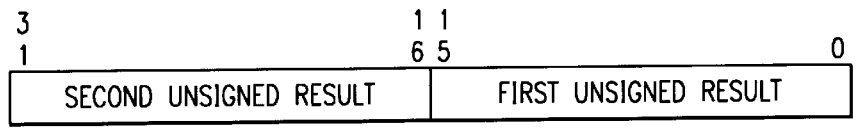
FIG. 11d

FIG. 15a

| 17 | 16 | 15 | 14 | 13 | 12 | 11 | 10 | 9 | 8 | 7 | 6 | 5 | 4 | 3 | 2 | 1 | 0 |
|----|----|----|----|----|----|----|----|---|---|---|---|---|---|---|---|---|---|
| 0 | 0 | 16 BIT UNSIGNED OPERAND | | | | | | | | | | | | | | | |

FIG. 15b

| 17 | 16 | 15 | 14 | 13 | 12 | 11 | 10 | 9 | 8 | 7 | 6 | 5 | 4 | 3 | 2 | 1 | 0 |
|----|----|----|----|----|----|----|----|---|---|---|---|---|---|---|---|---|---|
| S | S | S | 15 BIT SIGNED OPERAND | | | | | | | | | | | | | | |

FIG. 16a — bits 17..8 = 0, bits 7..0 = 8 BIT UNSIGN OP

FIG. 16b — bits 17..7 = S, bits 6..0 = 7 BIT SIGN OP

FIG. 16c — bits 17..16 = 0, bits 15..8 = 8 BIT UNSIGN OP, bits 7..0 = 0

FIG. 16d — bits 17..15 = S, bits 14..8 = 7 BIT SIGN OP, bits 7..0 = 0

FIG. 17a

Bits (31..0): E22 E21 E20 E19 E18 E17 E16 E15 E14 E13 E12 E11 E10 E9 E8 E7 E6 E5 E4 E3 E2 E1 E0 C2 C1 C0 A2 A1 A0 P2 P1 P0

FIG. 17b

Bits (31..0): D15 D14 D13 D12 D11 D10 D9 D8 D7 D6 D5 D4 D3 D2 D1 D0 C9 C8 C7 C6 C5 C4 C3 C2 C1 C0 A2 A1 A0 P2 P1 P0

```
3 3 2 2 2 2 2 2 2 2 2 2 1 1 1 1 1 1 1 1 1 1
1 0 9 8 7 6 5 4 3 2 1 0 9 8 7 6 5 4 3 2 1 0 9 8 7 6 5 4 3 2 1 0
```
| r | r | r | r | E | E | E | E | - | - | - | E | E | E | E | - | - | E | - | - | E | r | r | r | r | r | r | r | r | - | - | W |

706         707

| r | r | r | r | I | I | I | I | - | - | - | I | I | I | - | - | I | - | - | r | r | r | r | r | r | r | r | - | - | r |

```
                  781
31    28       /                         15              8         2 1 0
```
| F | S | Q | P | - | - | - | - | - | - | - | - | - | - | - | SYNC BITS | - | - | - | - | - | r | DIGP# |

```
    |       PACKET REQUEST        r r r r D D D D       DIGP
    |       PR QUEUED             e e e e I I I I      NUMBER
    |       SUSPEND               s s s s G G G G
    |       FOREGROUND                    P P P P
                                          3 2 1 0
```
                                    FIG. 42

FIG. 43

ROTATION REGISTER FOR ORTHOGONAL DATA TRANSFORMATION

CROSS REFERENCE TO RELATED APPLICATIONS

This application relates to improvements in the inventions disclosed in the following U.S. patent applications, all of which are assigned to Texas Instruments:

U.S. patent application Ser. No. 08/263,501 filed Jun. 21, 1994, now abandoned, entitled "MULTI-PROCESSOR WITH CROSSBAR LINK OF PROCESSORS AND MEMORIES AND METHOD OF OPERATION", a continuation of U.S. patent application Ser. No. 08/135,754 filed Oct. 12, 1993 and now abandoned, a continuation of U.S. patent application Ser. No. 07/933,865 filed Aug. 21, 1993 and now abandoned, a continuation of U.S. patent application Ser. No. 435,591 filed Nov. 17, 1989 and now abandoned;

U.S. Pat. No. 5,212,777, issued May 18, 1993, filed Nov. 17, 1989 and entitled "SIMD/MIMD RECONFIGURABLE MULTI-PROCESSOR AND METHOD OF OPERATION";

U.S. patent application Ser. No. 08/264,111 filed Jun. 22, 1994, now U.S. Pat. No. 5,522,083, entitled "RECONFIGURABLE COMMUNICATIONS FOR MULTI-PROCESSOR AND METHOD OF OPERATION," a continuation of U.S. patent application Ser. No. 07/895,565 filed Jun. 5, 1992 and now abandoned, a continuation of U.S. patent application Ser. No. 07/437,856 filed Nov. 17, 1989 and now abandoned;

U.S. patent application Ser. No. 08/264,582 filed Jun. 22, 1994 entitled "REDUCED AREA OF CROSSBAR AND METHOD OF OPERATION", a continuation of U.S. patent application Ser. No. 07/137,852 filed Nov. 17, 1989 and now abandoned;

U.S. patent application Ser. No. 08/032,530 filed Mar. 15, 1993 entitled "SYNCHRONIZED MIMD MULTI-PROCESSING SYSTEM AND METHOD OF OPERATION," a continuation of U.S. patent application Ser. No. 07/437,853 filed Nov. 17, 1989 and now abandoned;

U.S. Pat. No. 5,197,140 issued Mar. 23, 1993 filed Nov. 17, 1989 and entitled "SLICED ADDRESSING MULTI-PROCESSOR AND METHOD OF OPERATION";

U.S. Pat. No. 5,339,447 issued Aug. 16, 1994 filed Nov. 17, 1989 entitled "ONES COUNTING CIRCUIT, UTILIZING A MATRIX OF INTERCONNECTED HALF-ADDERS, FOR COUNTING THE NUMBER OF ONES IN A BINARY STRING OF IMAGE DATA";

U.S. Pat. No. 5,239,654 issued Aug. 24, 1993 filed Nov. 17, 1989 and entitled "DUAL MODE SIMD/MIMD PROCESSOR PROVIDING REUSE OF MIMD INSTRUCTION MEMORIES AS DATA MEMORIES WHEN OPERATING IN SIMD MODE";

U.S. patent application Ser. No. 07/911,562 filed Jun. 29, 1992, now U.S. Pat. No. 5,410,649, entitled "IMAGING COMPUTER AND METHOD OF OPERATION", a continuation of U.S. patent application Ser. No. 07/437,854 filed Nov. 17, 1989 and now abandoned; and U.S. Pat. No. 5,226,125 issued Jul. 6, 1993 filed Nov. 17, 1989 and entitled "SWITCH MATRIX HAVING INTEGRATED CROSSPOINT LOGIC AND METHOD OF OPERATION".

This application is also related to the following concurrently filed U.S. patent applications, which include the same disclosure:

U.S. patent application Ser. No. 08/160,229, now U.S. Pat. No. 5,490,828, "THREE INPUT ARITHMETIC LOGIC UNIT WITH BARREL ROTATOR";

U.S. patent application Ser. No. 08/158,742, now U.S. Pat. No. 5,640,578, "ARITHMETIC LOGIC UNIT HAVING PLURAL INDEPENDENT SECTIONS AND REGISTER STORING RESULTANT INDICATOR BIT FROM EVERY SECTION";

U.S. patent application Ser. No. 08/160,118 "MEMORY STORE FROM A REGISTER PAIR CONDITIONAL";

U.S. patent application Ser. No. 08/324,323, now U.S. Pat. No. 5,442,581, "ITERATIVE DIVISION APPARATUS, SYSTEM AND METHOD FORMING PLURAL QUOTIENT BITS PER ITERATION" a continuation of U.S. patent application Ser. No. 08/160,115 concurrently filed with this application and now abandoned;

U.S. patent application Ser. No. 08/158,285, now abandoned, "THREE INPUT ARITHMETIC LOGIC UNIT FORMING MIXED ARITHMETIC AND BOOLEAN COMBINATIONS";

U.S. patent application Ser. No. 08/160,119 "METHOD, APPARATUS AND SYSTEM FORMING THE SUM OF DATA IN PLURAL EQUAL SECTIONS OF A SINGLE DATA WORD";

U.S. patent application Ser. No. 08/159,359, now U.S. Pat. No. 5,512,896, "HUFFMAN ENCODING METHOD, CIRCUITS AND SYSTEM EMPLOYING MOST SIGNIFICANT BIT CHANGE FOR SIZE DETECTION";

U.S. patent application Ser. No. 08/160,296, now U.S. Pat. No. 5,479,166 "HUFFMAN DECODING METHOD, CIRCUIT AND SYSTEM EMPLOYING CONDITIONAL SUBTRACTION FOR CONVERSION OF NEGATIVE NUMBERS";

U.S. patent application Ser. No. 08/160,112 "METHOD, APPARATUS AND SYSTEM FOR SUM OF PLURAL ABSOLUTE DIFFERENCES";

U.S. patent application Ser. No. 08/160,120, now U.S. Pat. No. 5,644,524, "ITERATIVE DIVISION APPARATUS, SYSTEM AND METHOD EMPLOYING LEFT MOST ONE'S DETECTION AND LEFT MOST ONE'S DETECTION WITH EXCLUSIVE OR";

U.S. patent application Ser. No. 08/160,114, now U.S. Pat. No. 5,712,999, "ADDRESS GENERATOR EMPLOYING SELECTIVE MERGE OF TWO INDEPENDENT ADDRESSES";

U.S. patent application Ser. No. 08/160,114, now U.S. Pat. No. 5,420,809 "METHOD, APPARATUS AND SYSTEM METHOD FOR CORRELATION";

U.S. patent application Ser. No. 08/160,297, now U.S. Pat. No. 5,909,129 "LONG INSTRUCTION WORD CONTROLLING PLURAL INDEPENDENT PROCESSOR OPERATIONS";

U.S. patent application Ser. No. 08/159,652, "MEDIAN FILTER METHOD, CIRCUIT AND SYSTEM";

U.S. patent application Ser. No. 08/159,344, now U.S. Pat. No. 5,805,913 "ARITHMETIC LOGIC UNIT WITH CONDITIONAL REGISTER SOURCE SELECTION";

U.S. patent application Ser. No. 08/160,301 "APPARATUS, SYSTEM AND METHOD FOR DIVISION BY ITERATION"

U.S. patent application Ser. No. 08/159,650, now U.S. Pat. No. 5,644,522 "MULTIPLY ROUNDING USING REDUNDANT CODED MULTIPLY RESULT";

U.S. patent application Ser. No. 08/159,349, now U.S. Pat. No. 5,446,651 "SPLIT MULTIPLY OPERATION";

U.S. patent application Ser. No. 08/158,741, now abandoned, "MIXED CONDITION TEST CONDITIONAL AND BRANCH OPERATIONS INCLUDING CONDITIONAL TEST FOR ZERO";

U.S. patent application Ser. No. 08/160,302, now abandoned, "PACKED WORD PAIR MULTIPLY OPERATION";

U.S. patent application Ser. No. 08/160,573 "THREE INPUT ARITHMETIC LOGIC UNIT WITH SHIFTER U.S. patent application Ser. No. 08/159,282, now U.S. Pat. No. 5,590,350, "THREE INPUT ARITHMETIC LOGIC UNIT WITH MASK GENERATOR";

U.S. patent application Ser. No. 08/160,111 "THREE INPUT ARITHMETIC LOGIC UNIT WITH BARREL ROTATOR AND MASK GENERATOR";

U.S. patent application Ser. No. 08/160,298 "THREE INPUT ARITHMETIC LOGIC UNIT WITH SHIFTER AND MASK GENERATOR";

U.S. patent application Ser. No. 08/159,345, now U.S. Pat. No. 5,485,411 "THREE INPUT ARITHMETIC LOGIC UNIT FORMING THE SUM OF A FIRST INPUT ADDED WITH A FIRST BOOLEAN COMBINATION OF A SECOND INPUT AND THIRD INPUT PLUS A SECOND BOOLEAN COMBINATION OF THE SECOND AND THIRD INPUTS";

U.S. patent application Ser. No. 08/160,113, now U.S. Pat. No. 5,465,224 "THREE INPUT ARITHMETIC LOGIC UNIT FORMING THE SUM OF FIRST BOOLEAN COMBINATION OF FIRST, SECOND AND THIRD INPUTS PLUS A SECOND BOOLEAN COMBINATION OF FIRST, SECOND AND THIRD INPUTS";

U.S. patent application Ser. No. 08/159,640, now abandoned, "THREE INPUT ARITHMETIC LOGIC UNIT EMPLOYING CARRY PROPAGATE LOGIC"; and U.S. patent application Ser. No. 08/160,300 "DATA PROCESSING APPARATUS, SYSTEM AND METHOD FOR IF, THEN, ELSE OPERATION USING WRITE PRIORITY."

TECHNICAL FIELD OF THE INVENTION

The technical field of this invention is the field of digital data processing and more particularly microprocessor circuits, architectures and methods for digital data processing especially digital image/graphics processing.

BACKGROUND OF THE INVENTION

This invention relates to the field of computer graphics and in particular to bit mapped graphics. In bit mapped graphics computer memory stores data for each individual picture element or pixel of an image at memory locations that correspond to the location of that pixel within the image. This image may be an image to be displayed or a captured image to be manipulated, stored, displayed or retransmitted. The field of bit mapped computer graphics has benefited greatly from the lowered cost and increased capacity of dynamic random access memory (DRAM) and the lowered cost and increased processing power of microprocessors. These advantageous changes in the cost and performance of component parts enable larger and more complex computer image systems to be economically feasible.

The field of bit mapped graphics has undergone several stages in evolution of the types of processing used for image data manipulation. Initially a computer system supporting bit mapped graphics employed the system processor for all bit mapped operations. This type of system suffered several drawbacks. First, the computer system processor was not particularly designed for handling bit mapped graphics. Design choices that are very reasonable for general purpose computing are unsuitable for bit mapped graphics systems. Consequently some routine graphics tasks operated slowly. In addition, it was quickly discovered that the processing needed for image manipulation of bit mapped graphics was so loading the computational capacity of the system processor that other operations were also slowed.

The next step in the evolution of bit mapped graphics processing was dedicated hardware graphics controllers. These devices can draw simple figures, such as lines, ellipses and circles, under the control of the system processor. Many of these devices can also do pixel block transfers (PixBlt). A pixel block transfer is a memory move operation of image data from one portion of memory to another. A pixel block transfer is useful for rendering standard image elements, such as alphanumeric characters in a particular type font, within a display by transfer from nondisplayed memory to bit mapped display memory. This function can also be used for tiling by transferring the same small image to the whole of bit mapped display memory. The built-in algorithms for performing some of the most frequently used graphics functions provide a way of improving system performance. However, a useful graphics computer system often requires many functions besides those few that are implemented in such a hardware graphics controller. These additional functions must be implemented in software by the system processor. Typically these hardware graphics controllers allow the system processor only limited access to the bit map memory, thereby limiting the degree to which system software can augment the fixed set of functions of the hardware graphics controller.

The graphics system processor represents yet a further step in the evolution of bit mapped graphics processing. A graphics system processor is a programmable device that has all the attributes of a microprocessor and also includes special functions for bit mapped graphics. The TMS34010 and TMS34020 graphics system processors manufactured by Texas Instruments Incorporated represent this class of devices. These graphics system processors respond to a stored program in the same manner as a microprocessor and include the capability of data manipulation via an arithmetic logic unit, data storage in register files and control of both program flow and external data memory. In addition, these devices include special purpose graphics manipulation hardware that operate under program control. Additional instructions within the instruction set of these graphics system processors controls the special purpose graphics hardware. These instructions and the hardware that supports them are selected to perform base level graphics functions that are useful in many contexts. Thus a graphics system processor can be programmed for many differing graphics applications using algorithms selected for the particular problem. This provides an increase in usefulness similar to that provided by changing from hardware controllers to programmed microprocessors. Because such graphics system processors are programmable devices in the same manner as microprocessors, they can operate as stand alone graphics processors, graphics co-processors slaved to a system processor or tightly coupled graphics controllers.

New applications are driving the desire to provide more powerful graphics functions. Several fields require more cost effective graphics operations to be economically feasible. These include video conferencing, multi-media computing with full motion video, high definition television, color facsimile and digital photography. Each of these fields presents unique problems, but image data compression and decompression are common themes. The amount of transmission bandwidth and the amount of storage capacity required for images and particular full motion video is enormous. Without efficient video compression and decompression that result in acceptable final image quality, these applications will be limited by the costs associated with transmission bandwidth and storage capacity. There is also a need in the art for a single system that can support both image processing functions such as image recognition and graphics functions such as display control.

SUMMARY OF THE INVENTION

This invention is a rotation register in a data processing apparatus. The data processing apparatus includes a data processor bus, the rotation register and a register selection circuit. The rotation register is embodied by a plurality of data registers each having a plurality of equal bit groups. The number of bits within each bit group of each data register preferably equals the number N of data registers. The register selection circuit permits normal register reads and writes via the data processor bus. In the preferred embodiment the set of registers is dual ported and can be read from or written to via two data processor buses. The register selection circuit also permits special rotational data accesses. In a rotation read mode the register selection circuit selects noncontiguous bits from a predetermined position within each sections for each of the data registers for read access. In a rotation write mode the register selection circuit selects noncontiguous bits from a predetermined position within each sections for each of the data registers for write access.

The data registers are connected together in a loop. The most significant bit of each data register connected to the least significant bit of a sequential data register. The most significant bit of the last data register is connected to the least significant bit of the first data register. In a register rotation mode the register selection circuit rotates bits in each data register in around the loop. In the preferred embodiment this rotation is by one bit upon each execution of a register rotation instruction.

The data processing apparatus operates from a source of instructions. An instruction decode logic connected to the source of instructions controls the register selection circuit. This control includes: entering the normal register read mode and selecting an instruction specified data register in response to a normal register read mode instruction; entering the normal register write mode and selecting an instruction specified data register in response to a normal register write mode instruction; entering the rotation register read mode and selecting the noncontiguous bits in response to a rotation register read mode instruction; entering the rotation register write mode and selecting the noncontiguous bits in response to a rotation register write mode instruction; and entering the register rotation mode and rotating the bits in each data register in the loop in response to a register rotation instruction. In the preferred embodiment the plural data registers include 32 bit registers having 4 sections of 8 bits each.

In the preferred embodiment of this invention, the rotation register is embodied in at least one digital image/graphics processor as a part of a multiprocessor formed in a single integrated circuit used in image processing.

BRIEF DESCRIPTION OF THE FIGURES

These and other aspects of the present invention are described below together with the Figures, in which:

FIG. 10a illustrates in schematic form the data input format for 16 bit by 16 bit signed multiplication operands;

FIG. 10b illustrates in schematic form the data output format for 16 bit by 16 bit signed multiplication results;

FIG. 10c illustrates in schematic form the data input format for 16 bit by 16 bit unsigned multiplication operands;

FIG. 10d illustrates in schematic form the data output format for 16 bit by 16 bit unsigned multiplication results;

FIG. 11a illustrates in schematic form the data input format for dual 8 bit by 8 bit signed multiplication operands;

FIG. 11b illustrates in schematic form the data input format for dual 8 bit by 8 bit unsigned multiplication operands;

FIG. 11c illustrates in schematic form the data output format for dual 8 bit by 8 bit signed multiplication results;

FIG. 11d illustrates in schematic form the data output format for dual 8 bit by 8 bit unsigned multiplication results;

FIG. 15a illustrates in schematic form the second operand supplied to the partial product generators illustrated in FIG. 12 in 16 bit by 16 bit unsigned multiplication;

FIG. 15b illustrates in schematic form the second operand supplied to the partial product generators illustrated in FIG. 12 in 16 bit by 16 bit signed multiplication;

FIG. 16a illustrates in schematic form the second operand supplied to the first three partial product generators illustrated in FIG. 12 in dual 8 bit by 8 bit unsigned multiplication;

FIG. 16b illustrates in schematic form the second operand supplied to the first three partial product generators illustrated in FIG. 12 in dual 8 bit by 8 bit signed multiplication;

FIG. 16c illustrates in schematic form the second operand supplied to the second three partial product generators illustrated in FIG. 12 in dual 8 bit by 8 bit unsigned multiplication;

FIG. 16d illustrates in schematic form the second operand supplied to the second three partial product generators illustrated in FIG. 12 in dual 8 bit by 8 bit signed multiplication;

FIG. 17a illustrates in schematic form the output mapping for 16 bit by 16 bit multiplication;

FIG. 17b illustrates in schematic form the output mapping for dual 8 bit by 8 bit multiplication;

FIG. 40 illustrates in schematic form the field definitions of the interrupt enable register and the interrupt flag register of the program flow control unit illustrated in FIG. 31;

FIG. 41 illustrates in schematic form the field definitions of a command word transmitted between processors of the single integrated circuit multiprocessor illustrated in FIG. 2;

FIG. 42 illustrates in schematic form the field definitions of the communications register of the program flow control unit illustrated in FIG. 31;

FIG. 43 illustrates in schematic form the instruction word controlling the operation of the digital image/graphics processor illustrated in FIG. 3;

DETAILED DESCRIPTION OF PREFERRED EMBODIMENTS

Figure 1:
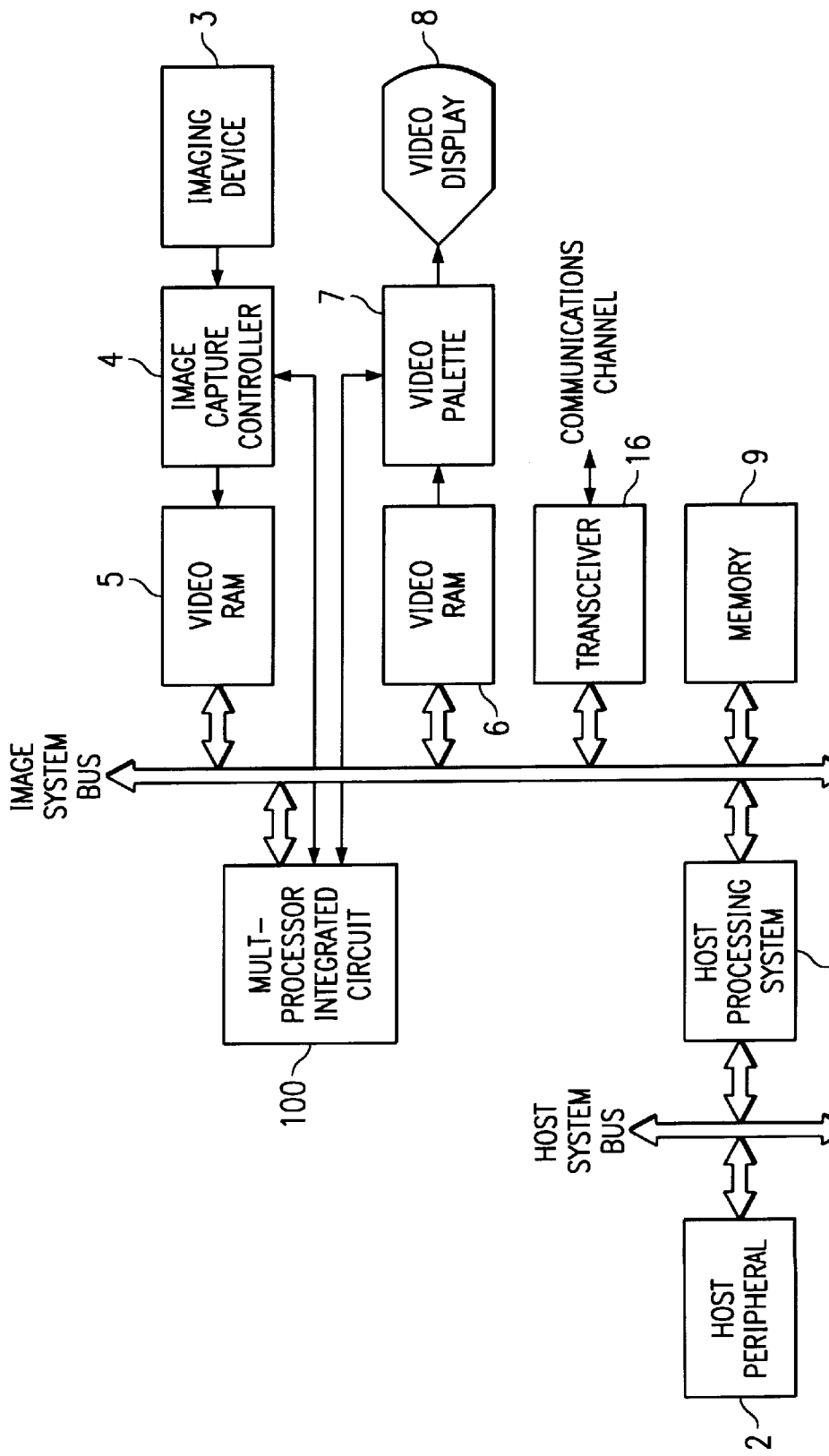
FIG. 1 illustrates the system architecture of an image processing system such as would employ this invention.

FIG. 1 is a block diagram of an image data processing system including a multiprocessor integrated circuit constructed for image and graphics processing according to this invention. This data processing system includes a host processing system 1. Host processing system 1 provides the data processing for the host system of data processing system of FIG. 1. Included in the host processing system 1 are a processor, at least one input device, a long term storage device, a read only memory, a random access memory and at least one host peripheral 2 coupled to a host system bus. Arrangement and operation of the host processing system are considered conventional. Because of its processing functions, the host processing system 1 controls the function of the image data processing system.

Multiprocessor integrated circuit 100 provides most of the data processing including data manipulation and computation for image operations of the image data processing system of FIG. 1. Multiprocessor integrated circuit 100 is bi-directionally coupled to an image system bus and communicates with host processing system 1 by way of this image system bus. In the arrangement of FIG. 1, multiprocessor integrated circuit 100 operates independently from the host processing system 1. The multiprocessor integrated circuit 100, however, is responsive to host processing system 1.

FIG. 1 illustrates two image systems. Imaging device 3 represents a document scanner, charge coupled device scanner or video camera that serves as an image input device. Imagine device 3 supplies this image to image capture controller 4, which serves to digitize the image and form it into raster scan frames. This frame capture process is controlled by signals from multiprocessor integrated circuit 100. The thus formed image frames are stored in video random access memory 5. Video random access memory 5 may be accessed via the image system bus permitting data transfer for image processing by multiprocessor integrated circuit 100.

The second image system drives a video display. Multiprocessor integrated circuit 100 communicates with video random access memory 6 for specification of a displayed image via a pixel map. Multiprocessor integrated circuit 100 controls the image data stored in video random access memory 6 via the image system bus. Data corresponding to this image is recalled from video random access memory 6 and supplied to video palette 7. Video palette 7 may transform this recalled data into another color space, expand the number of bits per pixel and the like. This conversion may be accomplished through a look-up table. Video palette 7 also generates the proper video signals to drive video display 8. If these video signals are analog signals, then video palette 7 includes suitable digital to analog conversion. The video level signal output from the video palette 7 may include color, saturation, and brightness information. Multiprocessor integrated circuit 100 controls data stored within the video palette 7, thus controlling the data transformation process and the timing of image frames. Multiprocessor integrated circuit 100 can control the line length and the number of lines per frame of the video display image, the synchronization, retrace, and blanking signals through control of video palette 7. Significantly, multiprocessor integrated circuit 100 determines and controls where graphic display information is stored in the video random access memory 6. Subsequently, during readout from the video random access memory 6, multiprocessor integrated circuit 100 determines the readout sequence from the video random access memory 6, the addresses to be accessed, and control information needed to produce the desired graphic image on video display 8.

Video display 8 produces the specified video display for viewing by the user. There are two widely used techniques. The first technique specifies video data in terms of color, hue, brightness, and saturation for each pixel. For the second technique, color levels of red, blue and green are specified for each pixel. Video palette 7 the video display 8 is designed and fabricated to be compatible with the selected technique.

FIG. 1 illustrates an addition memory 9 coupled to the image system bus. This additional memory may include additional video random access memory, dynamic random access memory, static random access memory or read only memory. Multiprocessor integrated circuit 100 may be controlled either in wholly or partially by a program stored in the memory 9. This memory 9 may also store various types of graphic image data. In addition, multiprocessor integrated circuit 100 preferably includes memory interface circuits for video random access memory, dynamic random access memory and static random access memory. Thus a system could be constructed using multiprocessor integrated circuit 100 without any video random access memory 5 or 6.

FIG. 1 illustrates transceiver 16. Transceiver 16 provides translation and bidirectional communication between the image system bus and a communications channel. One example of a system employing transceiver 16 is video conferencing. The image data processing system illustrated in FIG. 1 employs imaging device 3 and image capture controller 4 to form a video image of persons at a first location. Multiprocessor integrated circuit 100 provides video compression and transmits the compressed video signal to a similar image data processing system at another location via transceiver 16 and the communications channel. Transceiver 16 receives a similarly compressed video signal from the remote image data processing system via the communications channel. Multiprocessor integrated circuit 100 decompresses this received signal and controls video random access memory 6 and video palette 7 to display the corresponding decompressed video signal on video display 8. Note this is not the only example where the image data processing system employs transceiver 16. Also note that the bidirectional communications need not be the same type signals. For example, in an interactive cable television signal the cable system head in would transmit compressed video signals to the image data processing system via the communications channel. The image data processing system could transmit control and data signals back to the cable system head in via transceiver 16 and the communications channel.

FIG. 1 illustrates multiprocessor integrated circuit 100 embodied in a system including host processing system 1. Those skilled in the art would realize from the following disclosure of the invention that multiprocessor integrated circuit 100 may be employed as the only processor of a useful system. In such a system multiprocessor integrated circuit 100 is programmed to perform all the functions of the system.

This invention is particularly useful in a processor used for image processing. According to the preferred embodiment, this invention is embodied in multiprocessor integrated circuit 100. This preferred embodiment includes plural identical processors that embody this invention. Each of these processors will be called a digital image/graphics processor. This description is a matter of convenience only. The processor embodying this invention can be a processor separately fabricated on a single integrated circuit or a plurality of integrated circuits. If embodied on a single integrated circuit, this single integrated circuit may optionally also include read only memory and random access memory used by the digital image/graphics processor.

Figure 2:
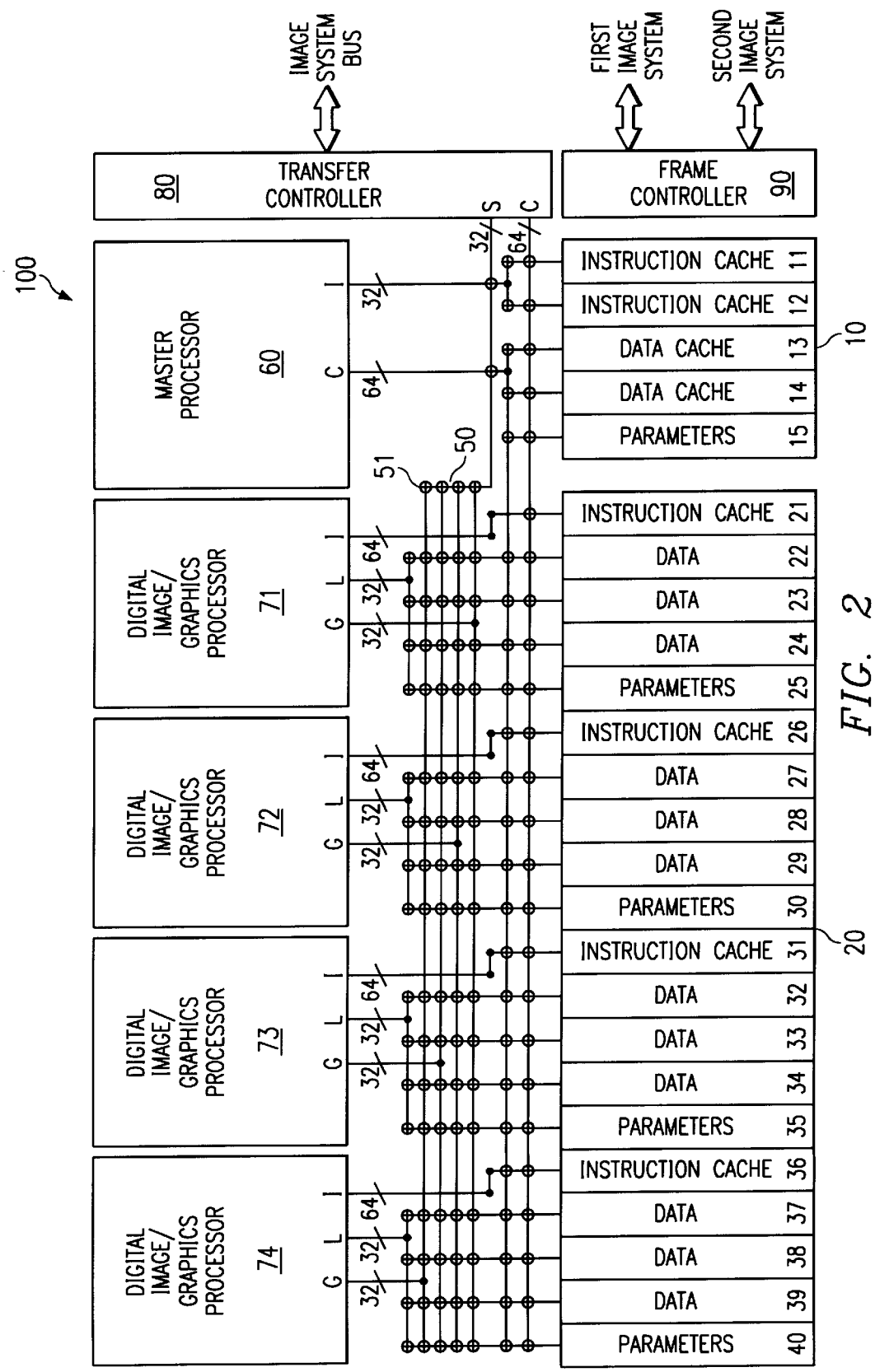
FIG. 2 illustrates the architecture of a single integrated circuit multiprocessor that forms the preferred embodiment of this invention.

FIG. 2 illustrates the architecture of the multiprocessor integrated circuit 100 of the preferred embodiment of this invention. Multiprocessor integrated circuit 100 includes: two random access memories 10 and 20, each of which is divided into plural sections; crossbar 50; master processor 60; digital image/graphics processors 71, 72, 73 and 74; transfer controller 80, which mediates access to system memory; and frame controller 90, which can control access to independent first and second image memories. Multiprocessor integrated circuit 100 provides a high degree of operation parallelism, which will be useful in image processing and graphics operations, such as in the multi-media computing.

Multiprocessor integrated circuit 100 includes two random access memories. Random access memory 10 is primarily devoted to master processor 60. It includes two instruction cache memories 11 and 12, two data cache memories 13 and 14 and a parameter memory 15. These memory sections can be physically identical, but connected and used differently. Random access memory 20 may be accessed by master processor 60 and each of the digital image/graphics processors 71, 72, 73 and 74. Each digital image/graphics processor 71, 72, 73 and 74 has five corresponding memory sections. These include an instruction cache memory, three data memories and one parameter memory. Thus digital image/graphics processor 71 has Corresponding instruction cache memory 21, data memories 22, 23, 24 and parameter memory 25; digital image/graphics processor 72 has corresponding instruction cache memory 26, data memories 27, 28, 29 and parameter memory 30; digital image/graphics processor 73 has corresponding instruction cache memory 31, data memories 32, 33, 34 and parameter memory 35; and digital image/graphics processor 74 has corresponding instruction cache memory 36, data memories 37, 38, 39 and parameter memory 40. Like the sections of random access memory 10, these memory sections can be physically identical but connected and used differently. Each of these memory sections of memories 10 and 20 preferably includes 2 K bytes, with a total memory within multiprocessor integrated circuit 100 of 50 K bytes.

Multiprocessor integrated circuit 100 is constructed to provide a high rate of data transfer between processors and memory using plural independent parallel data transfers. Crossbar 50 enables these data transfers. Each digital image/graphics processor 71, 72, 73 and 74 has three memory ports that may operate simultaneously each cycle. An instruction port (I) may fetch 64 bit data words from the corresponding instruction cache. A local data port (L) may read a 32 bit data word from or write a 32 bit data word into the data memories or the parameter memory corresponding to that digital image/graphics processor. A global data port (G) may read a 32 bit data word from or write a 32 bit data word into any of the data memories or the parameter memories or random access memory 20. Master Processor 60 includes two memory ports. An instruction port (I) may fetch a 32 bit instruction word from either of the instruction caches 11 and 12. A data port (C) may read a 32 bit data word from or write a 32 bit data word into data caches 13 or 14, parameter memory 15 of random access memory 10 or any of the data memories, the parameter memories of random access memory 20. Transfer controller 80 can access any of the sections of random access memory 10 or 20 via data port (C). Thus fifteen parallel memory accesses may be requested at any single memory cycle. Random access memories 10 and 20 are divided into 25 memories in order to support so many parallel accesses.

Crossbar 50 controls the connections of master processor 60, digital image/graphics processors 71, 72, 73 and 74, and transfer controller 80 with memories 10 and 20. Crossbar 50 includes a plurality of crosspoints 51 disposed in rows and columns. Each column of crosspoints 51 corresponds to a single memory section and a corresponding range of addresses. A processor requests access to one of the memory sections through the most significant bits of an address output by that processor. This address output by the processor travels along a row. The crosspoint 51 corresponding to the memory section having that address responds either by granting or denying access to the memory section. If no other processor has requested access to that memory section during the current memory cycle, then the crosspoint 51 grants access by coupling the row and column. This supplies the address to the memory section. The memory section responds by permitting data access at that address. This data access may be either a data read operation or a data write operation.

If more than one processor requests access to the same memory section simultaneously, then crossbar 50 grants access to only one of the requesting processors. The crosspoints 51 in each column of crossbar 50 communicate and grant access based upon a priority hierarchy. If two requests for access having the same rank occur simultaneously, then crossbar 50 grants access on a round robin basis, with the processor last granted access having the lowest priority. Each granted access lasts as long as needed to service the request. The processors may change their addresses every memory cycle, so crossbar 50 can change the interconnection between the processors and the memory sections on a cycle by cycle basis.

Master processor 60 preferably performs the major control functions for multiprocessor integrated circuit 100. Master processor 60 is preferably a 32 bit reduced instruction set computer (RISC) processor including a hardware floating point calculation unit. According to the RISC architecture, all accesses to memory are performed with load and store instructions and most integer and logical operations are performed on registers in a single cycle. The floating point calculation unit, however, will generally take several cycles to perform operations when employing the same register file as used by the integer and logical unit. A register score board ensures that correct register access sequences are maintained. The RISC architecture is suitable for control functions in image processing. The floating point calculation unit permits rapid computation of image rotation functions, which may be important to image processing.

Master processor 60 fetches instruction words from instruction cache memory 11 or instruction cache memory 12. Likewise, master processor 60 fetches data from either data cache 13 or data cache 14. Since each memory section includes 2 K bytes of memory, there is 4 K bytes of instruction cache and 4 K bytes of data cache. Cache control is an integral function of master processor 60. As previously mentioned, master processor 60 may also access other memory sections via crossbar 50.

Figure 3:
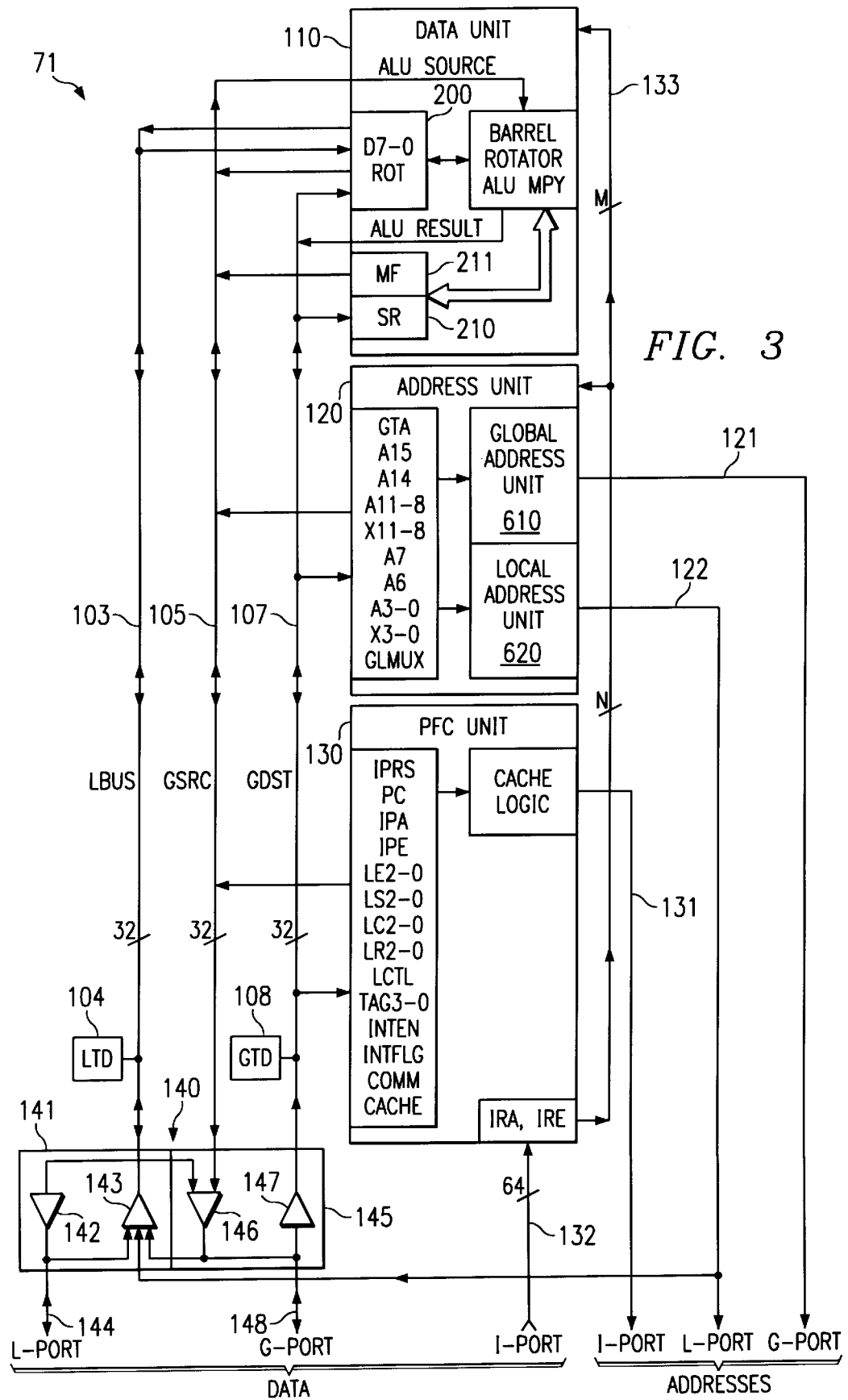
FIG. 3 illustrates in block diagram form one of the digital image/graphics processors illustrated in FIG. 2.

The four digital image/graphics processors 71, 72, 73 and 74 each have a highly parallel digital signal processor (DSP) architecture. FIG. 3 illustrates an overview of exemplary digital image/graphics processor 71, which is identical to digital image/graphics processors 72, 73 and 74. Digital image/graphics processor 71 achieves a high degree of parallelism of operation employing three separate units: data unit 110; address unit 120; and program flow control unit 130. These three units operate simultaneously on different instructions in an instruction pipeline. In addition each of these units contains internal parallelism.

The digital image/graphics processors 71, 72, 73 and 74 can execute independent instruction streams in the multiple instruction multiple data mode (MIMD). In the MIMD mode, each digital image/graphics processor executes an individual program from its corresponding instruction cache, which may be independent or cooperative. In the latter case crossbar 50 enables inter-processor communication in combination with the shared memory. Digital image/graphics processors 71, 72, 73 and 74 may also operate in a synchronized MIMD mode. In the synchronized MIMD mode, the program control flow unit 130 of each digital image/graphics processor inhibits fetching the next instruction until all synchronized processors are ready to proceed. This synchronized MIMD mode allows the separate programs of the digital image/graphics processors to be executed in lock step in a closely coupled operation.

Digital image/graphics processors 71, 72, 73 and 74 can execute identical instructions on differing data in the single instruction multiple data mode (SIMD). In this mode a single instruction stream for the four digital image/graphics processors comes from instruction cache memory 21. Digital image/graphics processor 71 controls the fetching and branching operations and crossbar 50 supplies the same instruction to the other digital image/graphics processors 72, 73 and 74. Since digital image/graphics processor 71 controls instruction fetch for all the digital image/graphics processors 71, 72, 73 and 74, the digital image/graphics processors are inherently synchronized in the SIMD mode.

Transfer controller 80 is a combined direct memory access (DMA) machine and memory interface for multiprocessor integrated circuit 100. Transfer controller 80 intelligently queues, sets priorities and services the data requests and cache misses of the five programmable processors. Master processor 60 and digital image/graphics processors 71, 72, 73 and 74 all access memory and systems external to multiprocessor integrated circuit 100 via transfer controller 80. Data cache or instruction cache misses are automatically handled by transfer controller 80. The cache service (S) port transmits such cache misses to transfer controller 80. Cache service port (S) reads information from the processors and not from memory. Master processor 60 and digital image/graphics processors 71, 72, 73 and 74 may request data transfers from transfer controller 80 as linked list packet requests. These linked list packet requests allow multidimensional blocks of information to be transferred between source and destination memory addresses, which can be within multiprocessor integrated circuit 100 or external to multiprocessor integrated circuit 100. Transfer controller 80 preferably also includes a refresh controller for dynamic random access memory (DRAM) which require periodic refresh to retain their data.

Frame controller 90 is the interface between multiprocessor integrated circuit 100 and external image capture and display systems. Frame controller 90 provides control over capture and display devices, and manages the movement of data between these devices and memory automatically. To this end, frame controller 90 provides simultaneous control over two independent image systems. These would typically include a first image system for image capture and a second image system for image display, although the application of frame controller 90 is controlled by the user. These image systems would ordinarily include independent frame memories used for either frame grabber or frame buffer storage. Frame controlled 90 preferably operates to control video dynamic random access memory (VRAM) through refresh and shift register control.

Multiprocessor integrated circuit 100 is designed for large scale image processing. Master processor 60 provides embedded control, orchestrating the activities of the digital image/graphics processors 71, 72, 73 and 74, and interpreting the results that they produce. Digital image/graphics processors 71, 72, 73 and 74 are well suited to pixel analysis and manipulation. If pixels are thought of as high in data but low in information, then in a typical application digital image/graphics processors 71, 72, 73 and 74 might well examine the pixels and turn the raw data into information. This information can then be analyzed either by the digital image/graphics processors 71, 72, 73 and 74 or by master processor 60. Crossbar 50 mediates inter-processor communication. Crossbar 50 allows multiprocessor integrated circuit 100 to be implemented as a shared memory system. Message passing need not be a primary form of communication in this architecture. However, messages can be passed via the shared memories. Each digital image/graphics processor, the corresponding section of crossbar 50 and the corresponding sections of memory 20 have the same width. This permits architecture flexibility by accommodating the addition or removal of digital image/graphics processors and corresponding memory modularly while maintaining the same pin out.

In the preferred embodiment all parts of multiprocessor integrated circuit 100 are disposed on a single integrated circuit. In the preferred embodiment, multiprocessor integrated circuit 100 is formed in complementary metal oxide semiconductor (CMOS) using feature sizes of 0.6 μm. Multiprocessor integrated circuit 100 is preferably constructed in a pin grid array package having 256 pins. The inputs and outputs are preferably compatible with transistor-transistor logic (TTL) logic voltages. Multiprocessor integrated circuit 100 preferably includes about 3 million transistors and employs a clock rate of 50M Hz.

FIG. 3 illustrates an overview of exemplary digital image/graphics processor 71, which is virtually identical to digital image/graphics processors 72, 73 and 74. Digital image/graphics processor 71 includes: data unit 110; address unit 120; and program flow control unit 130. Data unit 110 performs the logical or arithmetic data operations. Data unit 110 includes eight data registers D7–D0, a status register 210 and a multiple flags register 211. Address unit 120 controls generation of load/store addresses for the local data port and the global data port. As will be further described below, address unit 120 includes two virtually identical addressing units, one for local addressing and one for global addressing. Each of these addressing units includes an all "0" read only register enabling absolute addressing in a relative address mode, a stack pointer, five address registers and three index registers. The addressing units share a global bit multiplex control register used when forming a merging address from both address units. Program flow control unit 130 controls the program flow for the digital image/graphics processor 71 including generation of addresses for instruction fetch via the instruction port. Program flow control unit 130 includes; a program counter PC 701; an instruction pointer-address stage IRA 702 that holds the address of the instruction currently in the address pipeline stage; an instruction pointer-execute stage IRE 703 that holds the address of the instruction currently in the execute pipeline stage; an instruction pointer-return from subroutine IPRS 704 holding the address for returns from subroutines; a set of registers controlling zero overhead loops; four cache tag registers TAG3–TAG0 collectively called 708 that hold the most significant bits of four blocks of instruction words in the corresponding instruction cache memory.

Figure 4:
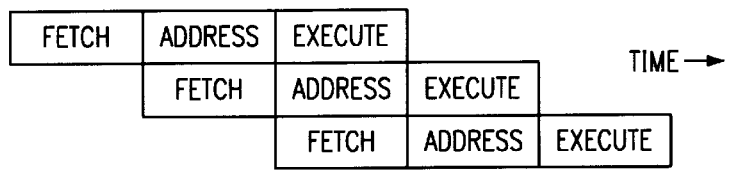
FIG. 4 illustrates in schematic form the pipeline stages of operation of the digital image/graphics processor illustrated in FIG. 2.

Digital image/graphics processor 71 operates on a three stage pipeline as illustrated in FIG. 4. Data unit 110, address unit 120 and program flow control unit 130 operate simultaneously on different instructions in an instruction pipeline. The three stages in chronological order are fetch, address and execute. Thus at any time, digital image/graphics processor 71 will be operating on differing functions of three instructions. The phrase pipeline stage is used instead of referring to clock cycles, to indicate that specific events occur when the pipeline advances, and not during stall conditions.

Program flow control unit 130 performs all the operations that occur during the fetch pipeline stage. Program flow control unit 130 includes a program counter, loop logic, interrupt logic and pipeline control logic. During the fetch pipeline stage, the next instruction word is fetched from memory. The address contained in the program counter is compared with cache tag registers to determine if the next instruction word is stored in instruction cache memory 21. Program flow control unit 130 supplies the address in the program counter to the instruction port address bus 131 to fetch this next instruction word from instruction cache memory 21 if present. Crossbar 50 transmits this address to the corresponding instruction cache, here instruction cache memory 21, which returns the instruction word on the instruction bus 132. Otherwise, a cache miss occurs and transfer controller 80 accesses external memory to obtain the next instruction word. The program counter is updated. If the following instruction word is at the next sequential address, program control flow unit 130 post increments the program counter. Otherwise, program control flow unit 130 loads the address of the next instruction word according to the loop logic or software branch. If the synchronized MIMD mode is active, then the instruction fetch waits until all the specified digital image/graphics processors are synchronized, as indicated by sync bits in a communications register.

Address unit 120 performs all the address calculations of the address pipeline stage. Address unit 120 includes two independent address units, one for the global port and one for the local port. If the instruction calls for one or two memory accesses, then address unit 120 generates the address(es) during the address pipeline stage. The address (es) are supplied to crossbar 50 via the respective global port address bus 121 and local port address bus 122 for contention detection/prioritization. If there is no contention, then the accessed memory prepares to allow the requested access, but the memory access occurs during the following execute pipeline stage.

Data unit 110 performs all of the logical and arithmetic operations during the execute pipeline stage. All logical and arithmetic operations and all data movements to or from memory occur during the execute pipeline stage. The global data port and the local data port complete any memory accesses, which are begun during the address pipeline stage, during the execute pipeline stage. The global data port and the local data port perform all data alignment needed by memory stores, and any data extraction and sign extension needed by memory loads. If the program counter is specified as a data destination during any operation of the execute pipeline stage, then a delay of two instructions is experienced before any branch takes effect. The pipelined operation requires this delay, since the next two instructions following such a branch instruction have already been fetched. According to the practice in RISC processors, other useful instructions may be placed in the two delay slot positions.

Digital image/graphics processor 71 includes three internal 32 bit data busses. These are local port data bus Lbus 103, global port source bus Gsrc 105 and global port destination data bus Gdst 107. These three buses interconnect data unit 110, address unit 120 and program flow control unit 130. These three buses are also connected to a data port unit 140 having a local port 141 and global port 145. Data port unit 140 is coupled to crossbar 50 providing memory access.

Local data port 141 has a buffer 142 for data stores to memory. A multiplexer/buffer circuit 143 loads data onto Lbus 103 from local port data bus 144 from memory via crossbar 50, from a local port address bus 122 or from global port data bus 148. Local port data bus Lbus 103 thus carries 32 bit data that is either register sourced (stores) or memory sourced (loads). Advantageously, arithmetic results in address unit 120 can be supplied via local port address bus 122, multiplexer buffer 143 to local port data bus Lbus 103 to supplement the arithmetic operations of data unit 110. This will be further described below. Buffer 142 and multiplexer buffer 143 perform alignment and extraction of data. Local port data bus Lbus 103 connects to data registers in data unit 110. A local bus temporary holding register LTD 104 is also connected to local port data Lbus 103.

Global port source data bus Gsrc 105 and global port destination data bus Gdst 107 mediate global data transfers. These global data transfers may be either memory accesses, register to register moves or command word transfers between processors. Global port source data bus Gsrc 105 carries 32 bit source information of a global port data transfer. The data source can be any of the registers of digital image/graphics processor 71 or any data or parameter memory corresponding to any of the digital image/graphics processors 71, 72, 73 or 74. The data is stored to memory via the global port 145. Multiplexer buffer 146 selects lines from local port data Lbus 103 or global port source data bus Gsrc 105, and performs data alignment. Multiplexer buffer 146 writes this data onto global port data bus 148 for application to memory via crossbar 50. Global port source data bus Gsrc 105 also supplies data to data unit 110, allowing the data of global port source data bus Gsrc 105 to be used as one of the arithmetic logic unit sources. This latter connection allows any register of digital image/graphics processor 71 to be a source for an arithmetic logic unit operation.

Global port destination data bus Gdst 107 carries 32 bit destination data of a global bus data transfer. The destination is any register of digital image/graphics processor 71. Buffer 147 in global port 145 sources the data of global port destination data bus Gdst 107. Buffer 147 performs any needed data extraction and sign extension operations. This buffer 147 operates if the data source is memory, and a load is thus being performed. The arithmetic logic unit result serves as an alternative data source for global port destination data bus Gdst 107. This allows any register of digital image/graphics processor 71 to be the destination of an arithmetic logic unit operation. A global bus temporary holding register GTD 108 is also connected to global port destination data bus Gdst 107.

Circuitry including multiplexer buffers 143 and 146 connect between global port source data bus Gsrc 105 and global port destination data bus Gdst 107 to provide register to register moves. This allows a read from any register of digital image/graphics processor 71 onto global port source data bus Gsrc 105 to be written to any register of digital image/graphics processor 71 via global port destination data bus Gdst 107.

Note that it is advantageously possible to perform a load of any register of digital image/graphics processor 71 from memory via global port destination data bus Gdst 107, while simultaneously sourcing the arithmetic logic unit in data unit 110 from any register via global port source data bus Gsrc 105. Similarly, it is advantageously possible to store the data in any register of digital image/graphics processor 71 to memory via global port source data bus Gsrc 105, while saving the result of an arithmetic logic unit operation to any register of digital image/graphics processor 71 via global port destination data bus Gdst 107. The usefulness of these data transfers will be further detailed below.

Program flow control unit 130 receives the instruction words fetched from instruction cache memory 21 via instruction bus 132. This fetched instruction word is advantageously stored in two 64 bit instruction registers designated instruction register-address stage IRA 751 and instruction register-execute stage IRE 752. Each of the instruction registers IRA and IRE have their contents decoded and distributed. Digital image/graphics processor 71 includes opcode bus 133 that carries decoded or partially decoded instruction contents to data unit 110 and address unit 120. As will be later described, an instruction word may include a 32 bit, a 15 bit or a 3 bit immediate field. Program flow control unit 130 routes such an immediate field to global port source data bus Gsrc 105 for supply to its destination.

Digital image/graphics processor 71 includes three address buses 121, 122 and 131. Address unit 120 generates addresses on global port address bus 121 and local port address bus 122. As will be further detailed below, address unit 120 includes separate global and local address units, which provide the addresses on global port address bus 121 and local port address bus 122, respectively. Notes that local address unit 620 may access memory other than the data memory corresponding to that digital image/graphics processor. In that event the local address unit access is via global port address bus 121. Program flow control unit 130 sources the instruction address on instruction port address bus 131 from a combination of address bits from a program counter and cache control logic. These address buses 121, 122 and 131 each carry address, byte strobe and read/write information.

Figure 5:
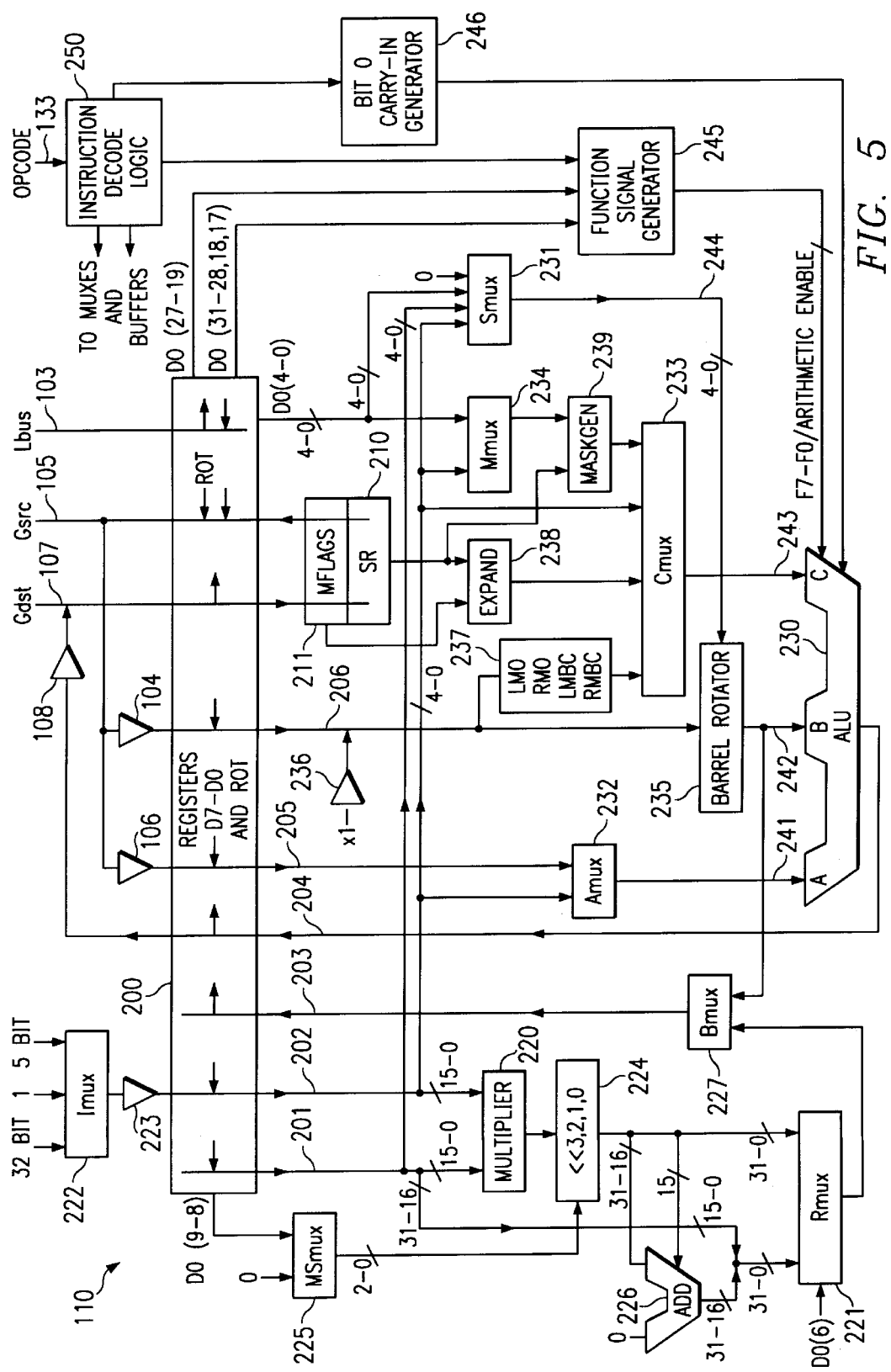
FIG. 5 illustrates in block diagram form the data unit of the digital image/graphics processors illustrated in FIG. 3.

FIG. 5 illustrates details of data unit 110. It should be understood that FIG. 5 does not illustrate all of the connections of data unit 110. In particular various control lines and the like have been omitted for the sake of clarity. Therefore FIG. 5 should be read with the following description for a complete understanding of the operation of data unit 110. Data unit 110 includes a number of parts advantageously operating in parallel. Data unit 110 includes eight 32 bit data registers 200 designated D7–D0. Data register D0 may be used as a general purpose register but in addition has special functions when used with certain instructions. Data registers 200 include multiple read and write ports connected to data unit buses 201 to 206 and to local port data bus Lbus 103, global port source data bus Gsrc 105 and global port destination data bus Gdst 107. Data registers 200 may also be read "sideways" in a manner described as a rotation register that will be further described below. Data unit 110 further includes a status register 210 and a multiple flags register 211, which stores arithmetic logic unit resultant status for use in certain instructions. Data unit 110 includes as its major computational components a hardware multiplier 220 and a three input arithmetic logic unit 230. Lastly, data unit 110 includes: multiplier first input bus 201, multiplier second input bus 202, multiplier destination bus 203, arithmetic logic unit destination bus 204, arithmetic logic unit first input bus 205, arithmetic logic unit second input bus 206; buffers 104, 106, 108 and 236; multiplexers Rmux 221, Imux 222, MSmux 225, Bmux 227, Amux 232, Smux 231, Cmux 233 and Mmux 234; and product left shifter 224, adder 226, barrel rotator 235, LMO/RMO/LMBC/RMBC circuit 237, expand circuit 238, mask generator 239, input A bus 241, input B bus 242, input C bus 243, rotate bus 244, function signal generator 245, bit 0 carry-in generator 246, and instruction decode logic 250, all of which will be further described below.

The following description of data unit 110 as well as further descriptions of the use of each digital image/graphics processor 71, 72, 73 and 74 employ several symbols for ease of expression. Many of these symbols are standard mathematical operations that need no explanation. Some are logical operations that will be familiar to one skilled in the art, but whose symbols may be unfamiliar. Lastly, some symbols refer to operations unique to this invention. Table 1 lists some of these symbols and their corresponding operation.

TABLE 1

| Symbol | Operation |
| --- | --- |
| ~ | bit wise NOT |
| & | bit wise AND |
| \| | bit wise OR |
| ^ | bit wise exclusive OR |
| @ | multiple flags register expand |
| % | mask generation |
| %! | modified mask generation |
| \\ | rotate left |
| << | shift left |
| >>u | shift right zero extend |
| >>s | shift right sign extend |
| >> | shift right sign extend default case |
| \|\| | parallel operation |
| *(A±X) | memory contents at address base register A ± index register X or offset X |
| &*(A±X) | address unit arithmetic address base register A ± index register X or offset X |
| *(A±[X]) | memory contents at address base register A ± scaled index register X or offset X |

The implications of the operations listed above in Table 1 may not be immediately apparent. These will be explained in detail below.

Figure 6:
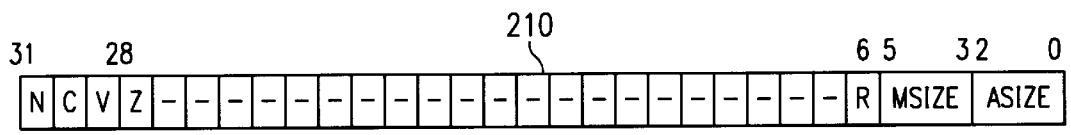
FIG. 6 illustrates in schematic form field definitions of the status register of the data unit illustrated in FIG. 5.

FIG. 6 illustrates the field definitions for status register 210. Status register 210 may be read from via global port source data bus Gsrc 105 or written into via global port destination data bus Gdst bus 107. In addition, status register 210 may write to or load from a specified one of data registers 200. Status register 210 is employed in control of operations within data unit 110.

Status register 210 stores four arithmetic logic unit result status bits "N", "C", "V" and "Z". These are individually described below, but collectively their setting behavior is as follows. Note that the instruction types listed here will be fully described below. For instruction words including a 32 bit immediate fields, if the condition code field is "unconditional" then all four status bits are set according to the result of arithmetic logic unit 230. If the condition code field specifies a condition other than "unconditional", then no status bits are set, whether or not the condition is true. For instruction words not including a 32 bit immediate field operations and not including conditional operations fields, all status bits are set according to the result of arithmetic logic unit 230. For instruction words not including a 32 bit immediate field that permit conditional operations, if the condition field is "unconditional", or not "unconditional" and the condition is true, instruction word bits 28–25 indicate which status bits should be protected. All unprotected bits are set according to the result of arithmetic logic unit 230. For instruction words not including a 32 bit immediate field, which allow conditional operations, if the condition field is not "unconditional" and the condition is false, no status bits are set. There is no difference in the status setting behavior for Boolean operations and arithmetic operations. As will be further explained below, this behavior, allows the conditional instructions and source selection to perform operations that would normally require a branch.

The arithmetic logic unit result bits of status register 210 are as follows. The "N" bit (bit 31) stores an indication of a negative result. The "N" bit is set to "1" if the result of the last operation of arithmetic logic unit 230 was negative. This bit is loaded with bit 31 of the result. In a multiple arithmetic logic unit operation, which will be explained below, the "N" bit is set to the AND of the zero compares of the plural sections of arithmetic logic unit 230. In a bit detection operation performed by LMO/RMO/LMBC/RMBC circuit 237, the "N" bit is set to the AND of the zero compares of the plural sections of arithmetic logic unit 230. Writing to this bit in software overrides the normal arithmetic logic unit result writing logic.

The "C" bit (bit 30) stores an indication of a carry result. The "C" bit is set to "1" if the result of the last operation of arithmetic logic unit 230 caused a carry-out from bit 31 of the arithmetic logic unit. During multiple arithmetic and bit detection, the "C" bit is set to the OR of the carry outs of the plural sections of arithmetic logic unit 230. Thus the "C" bit is set to "1" if at least one of the sections has a carry out. Writing to this bit in software overrides the normal arithmetic logic unit result writing logic.

The "V" bit (bit 29) stores an indication of an overflow result. The "V" bit is set to "1" if the result of the last operation of arithmetic logic unit 230 created an overflow condition. This bit is loaded with the exclusive OR of the carry-in and carry-out of bit 31 of the arithmetic logic unit 230. During multiple arithmetic logic unit operation the "V" bit is the AND of the carry outs of the plural sections of arithmetic logic unit 230. For left most one and right most one bit detection, the "V" bit is set to "1" if there were no "1's" in the input word, otherwise the "V" bit is set to "0". For left most bit change and right most bit change bit detection, the "V" bit is set to "1" is all the bits of the input are the same, or else the "V" bit is set to "0". Writing to this bit in software overrides the normal arithmetic logic unit result writing logic.

The "Z" bit (bit 28) stores and indication of a "0" result. The "Z" bit is set to "1" if the result of the last operation of arithmetic logic unit 230 produces a "0" result. This "Z" bit is controlled for both arithmetic operations and logical operations. In multiple arithmetic and bit detection operations, the "Z" bit is set to the OR of the zero compares of the plural sections of arithmetic logic unit 230. Writing to this bit in software overrides the normal arithmetic logic unit result writing logic circuitry.

The "R" bit (bit 6) controls bits used by expand circuit 238 and rotation of multiple flags register 211 during instructions that use expand circuit 238 to expand portions of multiple flags register 211. If the "R" bit is "1", then the bits used in an expansion of multiple flags register 211 via expand circuit 238 are the most significant bits. For an operation involving expansion of multiple flags register 211 where the arithmetic logic unit function modifier does not specify multiple flags register rotation, then multiple flags register 211 is "post-rotated left" according to the "Msize" field. If the arithmetic logic unit function modifier does specify multiple flags register rotation, then multiple flags register 211 is rotated according to the "Asize" field. If the "R" bit is "0", then expand circuit 238 employs the least significant bits of multiple flags register 211. No rotation takes place according to the "Msize" field. However, the arithmetic logic unit function modifier may specify rotation by the "Asize" field.

The "Msize" field (bits 5–3) indicates the data size employed in certain instruction classes that supply mask data from multiple flags register 211 to the C-port of arithmetic logic unit 230. The "Msize" field determines how many bits of multiple flags register 211 uses to create the mask information. When the instruction does not specify rotation corresponding to the "Asize" field and the "R" bit is "1", then multiple flags register 211 is automatically "post-rotated left" by an amount set by the "Msize" field. Codings for these bits are shown in Table 2.

TABLE 2

| Msize Field 5 4 3 | Data Size bits | Multiple Flags Register | | | |
|---|---|---|---|---|---|
| | | Rotate amount | No. of bits used | Bit(s) R = 1 | used R = 0 |
| 0 0 0 | 0 | 64 | 64 | — | — |
| 0 0 1 | 1 | 32 | 32 | 31–0 | 31–0 |
| 0 1 0 | 2 | 16 | 16 | 31–16 | 15–0 |
| 0 1 1 | 4 | 8 | 8 | 31–24 | 7–0 |
| 1 0 0 | 8 | 4 | 4 | 31–28 | 3–0 |
| 1 0 1 | 16 | 2 | 2 | 31–30 | –0 |
| 1 1 0 | 32 | 1 | 1 | 31 | 0 |
| 1 1 1 | 64 | 0 | 0 | — | — |

As noted above, the preferred embodiment supports "Msize" fields of "100", "101" and "110" corresponding to data sizes of 8, 16 and 32 bits, respectively. Note that rotation for an "Msize" field of "001" results in no change in data output. "Msize" fields of "001", "010" and "011", are possible useful alternatives. "Msize" fields of "000", and "111" are meaningless but may be used in an extension of multiple flags register 211 to 64 bits.

The "Asize" field (bits 2–0) indicate the data size for multiple operations performed by arithmetic logic unit 230. Arithmetic logic unit 230 preferably includes 32 parallel bits. During certain instructions arithmetic logic unit 230 splits into multiple independent sections. This is called a multiple arithmetic logic unit operation. This splitting of arithmetic logic unit 230 permits parallel operation on pixels of less than 32 bits that are packed into 32 bit data words. In the preferred embodiment arithmetic logic unit 230 supports: a single 32 bit operation; two sections of 16 bit operations; and four sections of 8 bit operations. These options are called word, half-word and byte operations.

The "Asize" field indicates: the number of multiple sections of arithmetic logic unit 230; the number of bits of multiple flags register bits 211 set during the arithmetic logic unit operation, which is equal in number to the number of sections of arithmetic logic unit 230; and the number of bits the multiple flags register should "post-rotate left" after output during multiple arithmetic logic unit operation. The rotation amount specified by the "Asize" field dominates over the rotation amount specified by the "Msize" field and the "R" bit when the arithmetic logic unit function modifier indicates multiple arithmetic with rotation. Codings for these bits are shown in Table 3. Note that while the current preferred embodiment of the invention supports multiple arithmetic of one 32 bit section, two 16 bit sections and four 8 bit sections the coding of the "Asize" field supports specification of eight sections of 4 bits each, sixteen sections of 2 bits each and thirty-two sections of 1 bit each. Each of these additional section divisions of arithmetic logic unit 230 are feasible. Note also that the coding of the "Asize" field further supports specification of a 64 bit data size for possible extension of multiple flags register 211 to 64 bits.

TABLE 3

| Asize | Data | Multiple Flags Register | | |
|---|---|---|---|---|
| Field 2 1 0 | Size bits | Rotate amount | No. of bits set | Bit(s) set |
| 0 0 0 | 0 | 64 | 64 | — |
| 0 0 1 | 1 | 32 | 32 | 31–0 |
| 0 1 0 | 2 | 16 | 16 | 15–0 |
| 0 1 1 | 4 | 8 | 8 | 7–0 |
| 1 0 0 | 8 | 4 | 4 | 3–0 |
| 1 0 1 | 16 | 2 | 2 | 1–0 |
| 1 1 0 | 32 | 1 | 1 | 0 |
| 1 1 1 | 64 | 0 | 0 | — |

The "Msize" and "Asize" fields of status register 210 control different operations. When using the multiple flags register 211 as a source for producing a mask applied to the C-port of arithmetic logic unit 230, the "Msize" field controls the number of bits used and the rotate amount. In such a case the "R" bit determines whether the most significant bits or least significant bits are employed. When using the multiple flags register 211 as a destination for the status bits corresponding to sections of arithmetic logic unit 230, then the "Asize" field controls the number and identity of the bits loaded and the optional rotate amount. If a multiple arithmetic logic unit operation with "Asize" field specified rotation is specified with an instruction that supplies mask data to the C-port derived from multiple flags register 211, then the rotate amount of the "Asize" field dominates over the rotate amount of the combination of the "R" bit and the "Msize" field.

The multiple flags register 211 is a 32 bit register that provides mask information to the C-port of arithmetic logic unit 230 for certain instructions. Global port destination data bus Gdst bus 107 may write to multiple flags register 211. Global port source bus Gsrc may read data from multiple flags register 211. In addition multiple arithmetic logic unit operations may write to multiple flags register 211. In this case multiple flags register 211 records either the carry or zero status information of the independent sections of arithmetic logic unit 230. The instruction executed controls whether the carry or zero is stored.

The "Msize" field of status register 210 controls the number of least significant bits used from multiple flags register 211. This number is given in Table 2 above. The "R" bit of status register 210 controls whether multiple flags register 211 is pre-rotated left prior to supply of these bits. The value of the "Msize" field determines the amount of rotation if the "R" bit is "1". The selected data supplies expand circuit 238, which generates a 32 bit mask as detailed below.

The "Asize" field of status register 210 controls the data stored in multiple flags register 211 during multiple arithmetic logic unit operations. As previously described, in the preferred embodiment arithmetic logic unit 230 may be used in one, two or four separate sections employing data of 32 bits, 16 bits and 8 bits, respectively. Upon execution of a multiple arithmetic logic unit operation, the "Asize" field indicates through the defined data size the number of bits of multiple flags register 211 used to record the status information of each separate result of the arithmetic logic unit. The bit setting of multiple flags register 211 is summarized in Table 4.

TABLE 4

| Data Size | ALU carry-out bits setting MF bits | | | | ALU result bits equal to zero setting MF bits | | | |
|---|---|---|---|---|---|---|---|---|
| bits | 3 | 2 | 1 | 0 | 3 | 2 | 1 | 0 |
| 8 | 31 | 23 | 15 | 7 | 31–24 | 23–16 | 15–8 | 7–0 |
| 16 | — | — | 31 | 15 | — | — | 31–16 | 15–0 |
| 32 | — | — | — | 31 | — | — | — | 31–0 |

Note that Table 4 covers only the cases for data sizes of 8, 16 and 32 bits. Those skilled in the art would easily realize how to extend Table 4 to cover the cases of data sizes of 64 bits, 4 bits, 2 bits and 1 bit. Also note that the previous discussion referred to storing either carry or zero status in multiple flags register 211. It is also feasible to store other status bits such as negative and overflow.

Multiple flags register 211 may be rotated left a number of bit positions upon execution of each arithmetic logic unit operation. The rotate amount is given above. When performing multiple arithmetic logic unit operations, the result status bit setting dominates over the rotate for those bits that are being set. When performing multiple arithmetic logic unit operations, an alternative to rotation is to clear all the bits of multiple flags register 211 not being set by the result status. This clearing is after generation of the mask data if mask data is used in that instruction. If multiple flags register 211 is written by software at the same time as recording an arithmetic logic unit result, then the preferred operation is for the software write to load all the bits. Software writes thus dominate over rotation and clearing of multiple flags register 211.

Figure 7:
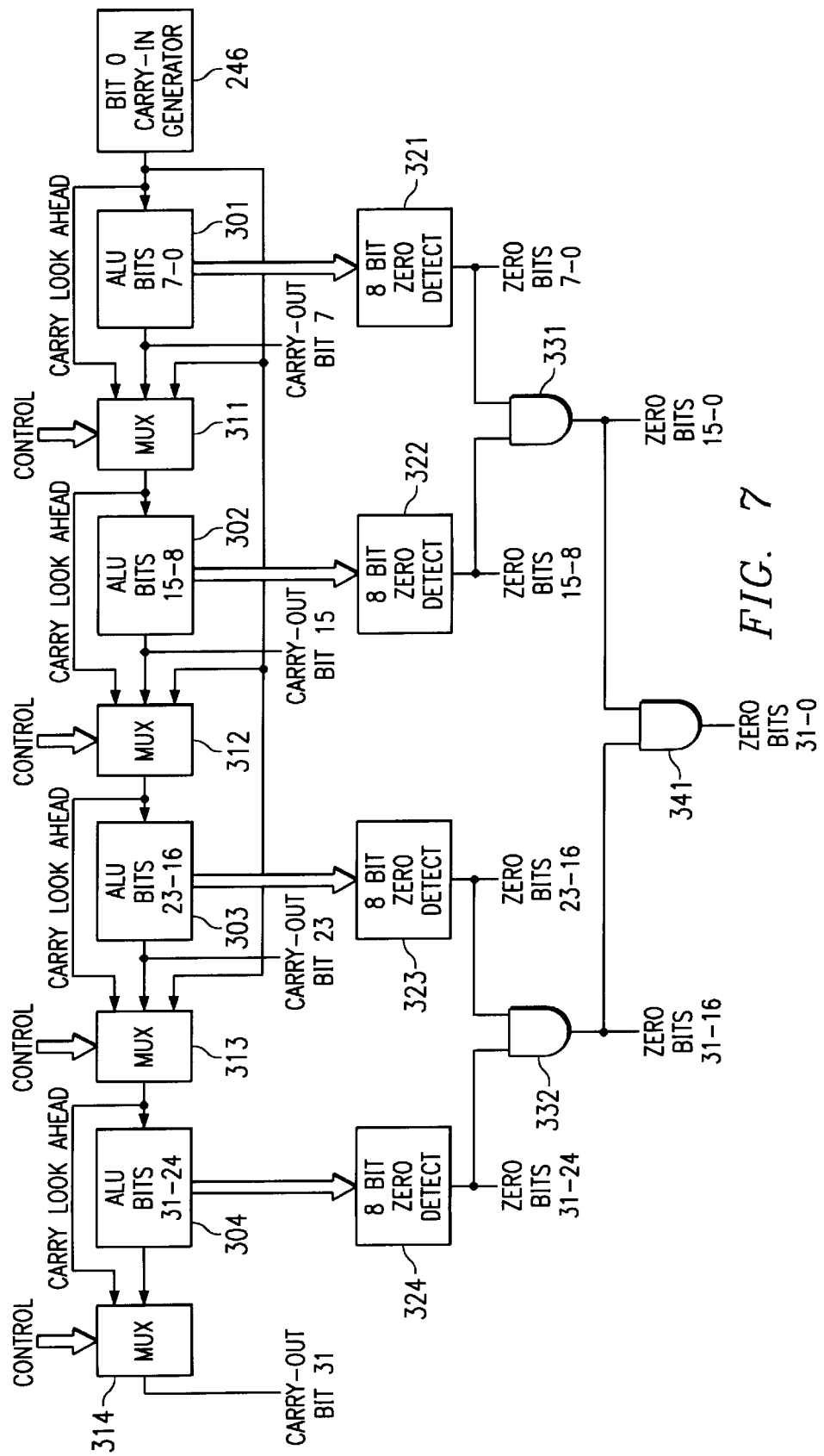
FIG. 7 illustrates in block diagram form the manner of splitting the arithmetic logic unit of the data unit illustrated in FIG. 5.

FIG. 7 illustrates the splitting of arithmetic logic unit 230 into multiple sections. As illustrated in FIG. 7, the 32 bits of arithmetic logic unit 230 are separated into four sections of eight bits each. Section 301 includes arithmetic logic unit bits 7–0, section 302 includes bits 15–8, section 303 includes bits 23–16 and section 304 includes bits 31–24. Note that FIG. 7 does not illustrate the inputs or outputs of these sections, which are conventional, for the sake of clarity. The carry paths within each of the sections 301, 302, 303 and 303 are according to the known art.

Multiplexers 311, 312 and 313 control the carry path between sections 301, 302, 303 and 304. Each of these multiplexers is controlled to select one of three inputs. The first input is a carry look ahead path from the output of the previous multiplexer, or in the case of the first, multiplexer 311 from bit 0 carry-in generator 246. Such carry look ahead paths and their use are known in the art and will not be further described here. The second selection is the carry-out from the last bit of the corresponding section of arithmetic logic unit 230. The final selection is the carry-in signal from bit 0 carry-in generator 246. Multiplexer 314 controls the output carry path for arithmetic logic unit 230. Multiplexer 314 selects either the carry look ahead path from the carry-out selected by multiplexer 313 or the carry-out signal for bit 31 from section 304.

Multiplexers 311, 312, 313 and 314 are controlled based upon the selected data size. In the normal case arithmetic logic unit 230 operates on 32 bit data words. This is indicated by an "Asize" field of status register 210 equal to "110". In this case multiplexer 311 selects the carry-out from bit 7, multiplexer 312 selects the carry-out from bit 15, multiplexer 313 selects the carry-out from bit 23 and multiplexer 314 selects the carry-out from bit 31. Thus the four sections 301, 302, 303 and 304 are connected together into a single 32 bit arithmetic logic unit. If status register 210 selected a half-word via an "Asize" field of "101", then multiplexer 311 selects the carry-out from bit 7, multiplexer 312 selects the carry-in from bit 0 carry-in generator 246, multiplexer 313 selects the carry-out from bit 23 and multiplexer 314 selects the carry-out from bit 31. Sections 301 and 302 are connected into a 16 bit unit and sections 303 and 304 are connected into a 16 bit unit. Note that multiplexer 312 selects the bit 0 carry-in signal for bit 16 just like bit 0, because bit 16 is the first bit in a 16 bit half-word. If status register 210 selected a byte via an "Asize" field of "100", then multiplexers 311, 312 and 313 select the carry-in from bit 0 carry-in generator 246. Sections 301, 302, 303 and 304 are split into four independent 8 bit units. Note that selection of the bit 0 carry-in signal at each multiplexer is proper because bits 8, 16 and 24 are each the first bit in an 8 bit byte.

FIG. 7 further illustrates zero resultant detection. Each 8 bit zero detect circuit 321, 322, 323 and 324 generates a "1" output if the resultant from the corresponding 8 bit section is all zeros "00000000". AND gate 331 is connected to 8 bit zero detect circuits 321 and 322, thus generating a "1" when all sixteen bits 15–0 are "0". AND gate 332 is similarly connected to 8 bit zero detect circuits 321 and 322 for generating a "1" when all sixteen bits 31–16 are "0". Lastly, AND gate 341 is connected to AND gates 331 and 332, and generates a "1" when all 32 bits 31–0 are "0".

During multiple arithmetic logic unit operations multiple flags register 211 may store either carry-outs or the zero comparison, depending on the instruction. These stored resultants control masks to the C-port during later operations. Table 4 shows the source for the status bits stored. In the case in which multiple flags register 211 stores the carry-out signal(s), the "Asize" field of status register 210 determines the identity and number of carry-out signals stored. If the "Asize" field specifies word operations, then multiple flags register 211 stores a single bit equal to the carry-out signal of bit 31. If the "Asize" field specifies half-word operations, then multiple flags register 211 stores two bits equal to the carry-out signals of bits 31 and 15, respectfully. If the "Asize" field specifies byte operations, then multiple flags register 211 stores four bits equal to the carry-out signals of bits 31, 23, 15 and 7, respectively. The "Asize" field similarly controls the number and identity of zero resultants stored in multiple flags register 211 when storage of zero resultants is selected. If the "Asize" field specifies word operations, then multiple flags register 211 stores a single bit equal to output of AND gate 341 indicating if bits 31–0 are "0". If the "Asize" field specifies half-word operations, then multiple flags register 211 stores two bits equal to the outputs of AND gates 331 and 332, respectfully. If the "Asize" field specifies byte operations, then multiple flags register 211 stores four bits equal to the outputs of 8 bit zero detect circuits 321, 322, 323 and 324, respectively.

It is technically feasible and within the scope of this invention to allow further multiple operations of arithmetic logic unit 230 such as: eight sections of 4 bit operations; sixteen sections 2 bit operations; and thirty-two sections single bit operations. Note that both the "Msize" and the "Asize" fields of status register 210 include coding to support such additional multiple operation types. Those skilled in the art can easily modify and extend the circuits illustrated in FIG. 7 using additional multiplexers and AND gates. These latter feasible options are not supported in the preferred embodiment due to the added complexity in construction of arithmetic logic unit 230. Note also that this technique can be extended to a data processing apparatus employing 64 bit data and that the same teachings enable such an extension.

Data registers 200, designated data registers D7–D0 are connected to local port data bus Lbus 103, global port source data bus Gsrc 105 and global port destination data bus Gdst 107. Arrows within the rectangle representing data registers 200 indicate the directions of data access. A left pointing arrow indicates data recalled from data registers 200. A right pointing arrow indicates data written into data registers 200. Local port data bus Lbus 103 is bidirectionally coupled to data registers 200 as a data source or data destination. Global port destination data bus Gdst 107 is connected to data registers 200 as a data source for data written into data registers 200. Global port source data bus Gsrc 107 is connected to data registers 200 as a data destination for data recalled from data registers 200 in both a normal data register mode and in a rotation register feature described below. Status register 210 and multiple flags register 211 may be read from via global port source data bus Gsrc 106 and written into via global port destination data bus Gdst 107. Data registers 200 supply data to multiplier first input bus 201, multiplier second input bus 202, arithmetic logic unit first input bus 205 and arithmetic logic unit second input bus 206. Data registers 200 are connected to receive input data from multiplier destination bus 203 and arithmetic logic unit destination bus 204.

Figure 8:
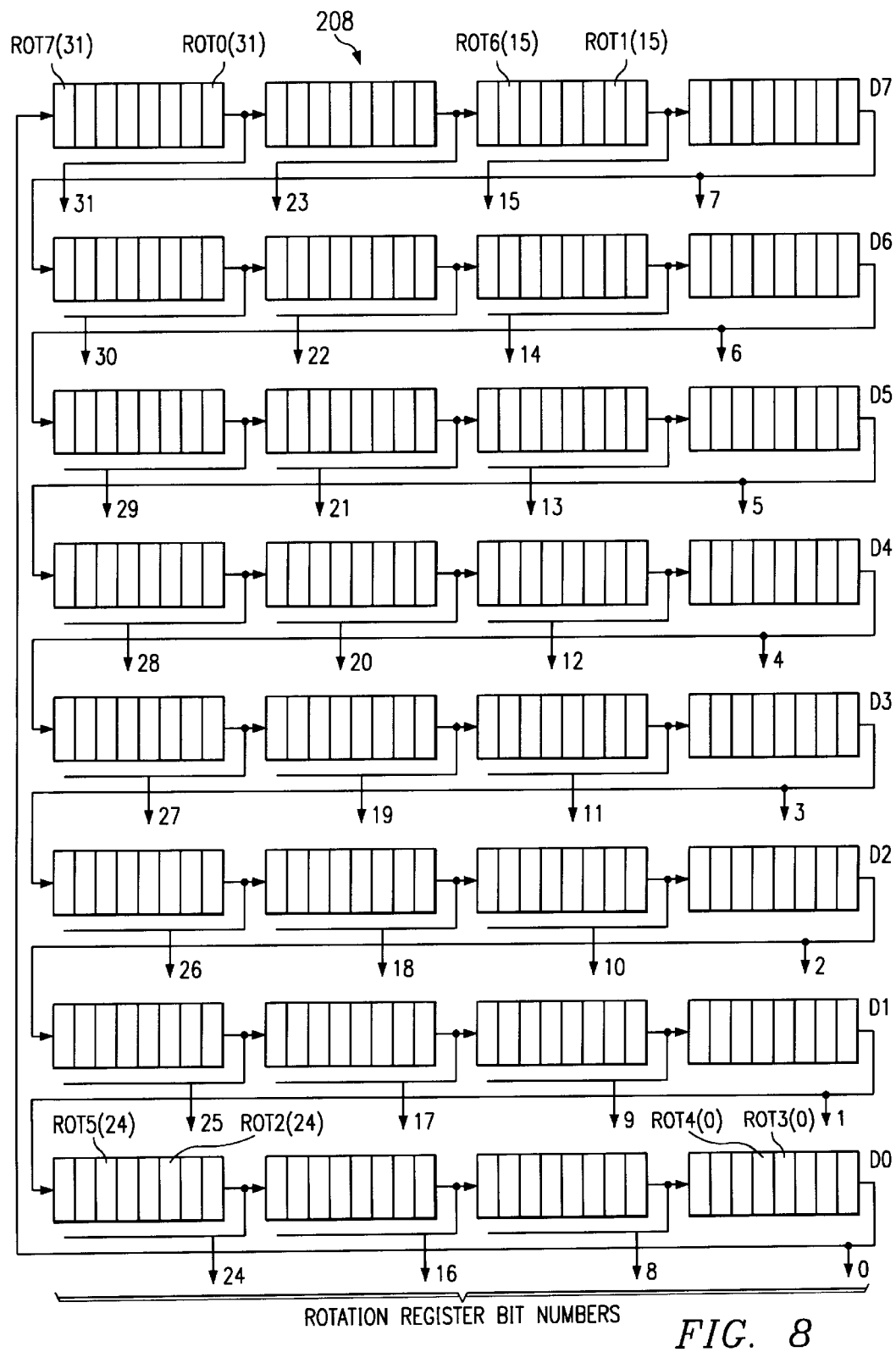
FIG. 8 illustrates in block diagram form the manner of addressing the data register of the data unit illustrated in FIG. 5 as a rotation register.

Data registers 200, designated registers D7–D0, are connected to form a 256 bit rotate register as illustrated in FIG. 8. This rotate register is collectively designated rotation (ROT) register ROT 208. This forms a 256 bit register comprising eight 32 bit rotation registers ROT0, ROT1, . . . ROT7. FIG. 8 illustrates in part the definitions of the rotation registers ROT0, ROT1, . . . ROT7. These rotation registers are defined sideways with respect to data registers D7–D0. The rotation register 208 may be rotated by a non-arithmetic logic unit instruction DROT, as described below. During this rotation the least significant bit of data register D7 rotates into the most significant bit of data register D6, etc. The least significant bit of data register D0 is connected back to the most significant bit of data register D7. ROT register 208 may be read in four 8 bit bytes at a time. The four 8 bit bytes are respective octets of bits having the same bit number in each of data registers 200 as shown below in Table 5 and illustrated in FIG. 8.

TABLE 5

| Rotation Register bits | Octet of bits from each D7–D0 Bit |
| --- | --- |
| 31–24 | 24 |
| 23–16 | 16 |
| 15–8 | 8 |
| 7–0 | 0 |

When a DROT instruction is executed the 256 bit rotation register 208 is rotated right one bit place. The least significant bit 0 of each byte A, B, C, D of each register such as D7 is mapped as shown to a particular bit number of the ROT register output onto the global port source data bus Gsrc 105. ROT register 208 is read only in the preferred embodiment, but can be writable in other embodiments.

ROT register 208 is useful in image rotations, orthogonal transforms and mirror transforms. Performing 32 bit stores to memory from the rotation register 208 in parallel with eight DROT instructions rotates four 8 by 8 bit patches of data clockwise ninety degrees. The rotated data is stored in the target memory locations. Various combinations of register loading, memory address storing, and data size alteration, can enable a variety of clockwise and counter-clockwise rotations of 8 by 8 bit patches to be performed. Rotation of larger areas can then be performed by moving whole bytes. This remarkable orthogonal structure that provides register file access to registers D7–D0 in one mode, and rotation register access in the DROT operation, is only slightly more complex than a register file alone.

Figure 9:
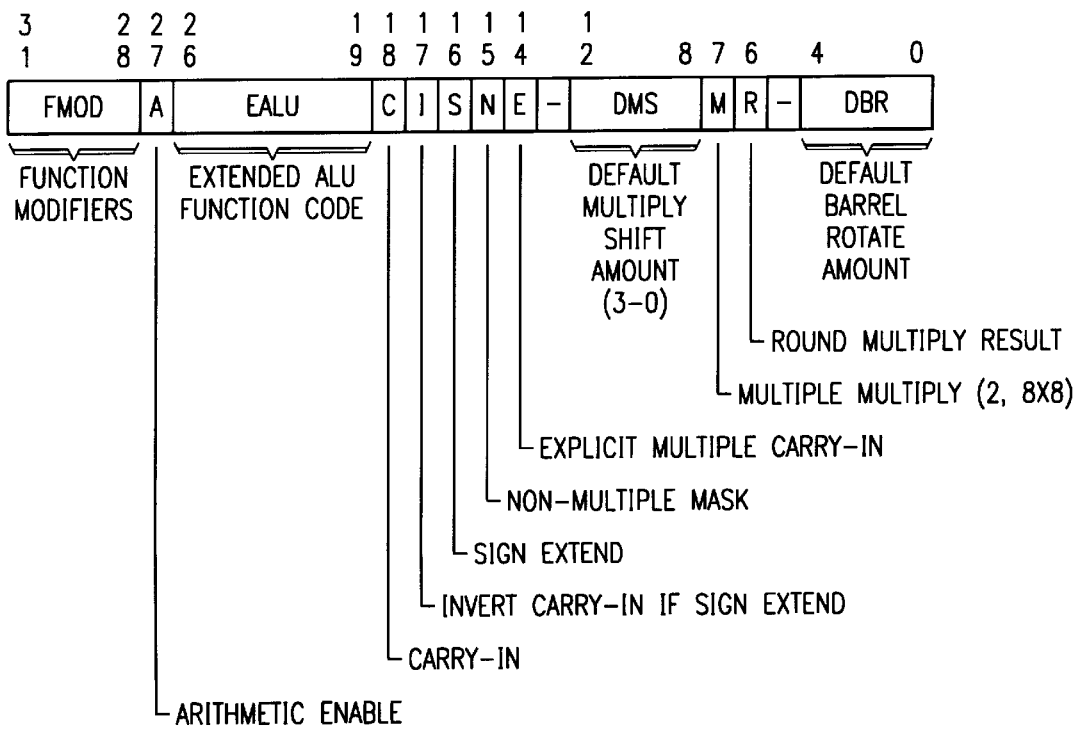
FIG. 9 illustrates in schematic form the field definitions of the first data register of the data unit illustrated in FIG. 5.

The data register D0 has a dual function. It may be used as a normal data register in the same manner as the other data registers D7–D1. Data register D0 may also define certain special functions when executing some instructions. Some of the bits of the most significant half-word of data register D0 specifies the operation of all types of extended arithmetic logic unit operations. Some of the bits of the least significant half-word of data register D0 specifies multiplier i options during a multiple multiply operation. The 5 least significant bits of data register D0 specify a default barrel rotate amount used by certain instruction classes. FIG. 9 illustrates the contents of data register D0 when specifying data unit 110 operation.

The "FMOD" field (bits 31–28) of data register D0 allow modification of the basic operation of arithmetic logic unit 230 when executing an instruction calling for an extended arithmetic logic unit (EALU) operation. Table 6 illustrates these modifier options. Note, as indicated in Table 6, certain instruction word bits in some instruction formats are decoded as function modifiers in the same fashion. These will be further discussed below.

TABLE 6

| Function Modifier Code | Modification Performed |
| --- | --- |
| 0 0 0 0 | normal operation |
| 0 0 0 1 | cin |
| 0 0 1 0 | %! if mask generation instruction<br>LMO if not mask generation instruction |
| 0 0 1 1 | (%! and cin) if mask generation instruction<br>RMO if not mask generation instruction |
| 0 1 0 0 | A-port = 0 |
| 0 1 0 1 | A-port = 0 and cin |
| 0 1 1 0 | (A-port = 0 and %!) if mask generation instruction<br>LMBC if not mask generation instruction |
| 0 1 1 1 | (A-port = 0 and %! and cin) if mask generation instruction<br>RMBC if not mask generation instruction |
| 1 0 0 0 | Multiple arithmetic logic unit operations,<br>carry-out(s) --▸ multiple flags register |
| 1 0 0 1 | Multiple arithmetic logic unit operations,<br>zero result(s) --▸ multiple flags register |
| 1 0 1 0 | Multiple arithmetic logic unit operations,<br>carry-out(s) --▸ multiple flags register,<br>rotate by "Asize" field of status register |

TABLE 6-continued

| Function Modifier Code | Modification Performed |
| --- | --- |
| 1 0 1 1 | Multiple arithmetic logic unit operations,<br>zero result(s) --▸ multiple flags register,<br>rotate by "Asize" field of status register |
| 1 1 0 0 | Multiple arithmetic logic unit operations,<br>carry-out(s) --▸ multiple flags register,<br>clear multiple flags register |
| 1 1 0 1 | Multiple arithmetic logic unit operations,<br>zero result(s) --▸ multiple flags register,<br>clear multiple flags register |
| 1 1 1 0 | Reserved |
| 1 1 1 1 | Reserved |

```
            Instruction word bit     Data Register D0 bit
                   52                        28
                   54                        29
                   56                        30
                   58                        31
```

The modified operations listed in Table 6 are explained below. If the "FMOD" field is "0000", the normal, unmodified operation results. The modification "cin" causes the carry-in to bit 0 of arithmetic logic unit 230 to be the "C" bit of status register 210. This allows add with carry, subtract with borrow and negate with borrow operations. The modification "%!" works with mask generation ashen the "%!" modification is active mask generator 239 effectively generates all "1's" for a zero rotate amount rather than all "0's". This function can be implemented by changing the mask generated by mask generator 239 or by modifying the function of arithmetic logic unit 230 so that mask of all "0's" supplied to the C-port operates as if all "1's" were supplied. This modification is useful in some rotate operations. The modifications "LMO", "RMO", "LMBC" and "RMBC" designate controls of the LMO/RMO/LMBC/RMBC circuit 237. The modification "LMO" finds the left most "1" of the second arithmetic input. The modification "RMO" finds the right most "1". The modification "LMBC" finds the left most bit that differs from the sign bit (bit 31). The "RMBC" modification finds the right most bit that differs from the first bit (bit 0). Note that these modifications are only relevant if the C-port of arithmetic logic unit 230 does not receive a mask from mask generator 239. The modification "A-port= 0" indicates that the input to the A-port of arithmetic logic unit 230 is effectively zeroed. This may take place via multiplexer Amux 232 providing a zero output, or the operation of arithmetic logic unit 230 may be altered in a manner having the same effect. An "A-port=0" modification is used in certain negation, absolute value and shift right operations. A "multiple arithmetic logic unit operation" modification indicates that one or more of the carry paths of arithmetic logic unit 230 are severed, forming in effect two or more independent arithmetic logic units operating in parallel. The "Asize" field of status register 210 controls the number of such multiple arithmetic logic unit sections. The multiple flags register 211 stores a number of status bits equal to the number of sections of the multiple arithmetic logic unit operations. In the "carry-out(s)→multiple flags" modification, the carry-out bit or bits are stored in multiple flags register 211. In the "zero result(s)→multiple flags" modification, an indication of the zero resultant for the corresponding arithmetic logic unit section is stored in multiple flags register 211. This process is described above together with the description of multiple flags register 211. During this storing operation, bits within multiple flags register 211 may be rotated in response to the "rotate" modification or cleared in response to the "clear" modification. These options are discussed above together with the description of multiple flags register 211.

The "A" bit (bit 27) of data register D0 controls whether arithmetic logic unit 230 performs an arithmetic or Boolean logic operation during an extended arithmetic logic unit operation. This bit is called the arithmetic enable bit. If the "A" bit is "1", then an arithmetic operation is performed. If the "A" bit is "0", then a logic operation is performed. If the "A" bit is "0", then the carry-in from bit 0 carry-in generator 246 into bit 0 of the arithmetic logic unit 230 is generally "0". As will be further explained below certain extended arithmetic logic unit operations may have a carry-in bit of "1" even when the "A" bit is "0" indicating a logic operation.

The "EALU" field (bits 19–26) of data register D0 defines an extended arithmetic logic unit operation. The eight bits of the "EALU" field specify the arithmetic logic unit function control bits used in all types of extended arithmetic logic unit operations. These bits become the control signals to arithmetic logic unit 230. They may be passed to arithmetic logic unit 230 directly, or modified according to the "FMOD" field. In some instructions the bits of the "EALU" field are inverted, leading to an "EALUF" or extended arithmetic logic unit false operation. In this case the eight control bits supplied to arithmetic logic unit 230 are inverted.

The "C" bit (bit 18) of data register D0 designates the carry-in to bit 0 of arithmetic logic unit 230 during extended arithmetic logic unit operations. The carry-in value into bit 0 of the arithmetic logic unit during extended arithmetic logic unit operations is given by this "C" bit. This allows the carry-in value to be specified directly, rather than by a formula as for non-EALU operations.

The "I" bit (bit 17) of data register D0 is designated the invert carry-in bit. The "I" bit, together with the "C" bit and the "S" bit (defined below), determines whether or not to invert the carry-in into bit 0 of arithmetic logic unit 230 when the function code of an arithmetic logic unit operation are inverted. This will be further detailed below.

The "S" bit (bit 16) of data register D0 indicates selection of sign extend. The "S" bit is used when executing extended arithmetic logic unit operations ("A" bit=1). If the "S" bit is "1", then arithmetic logic unit control signals F3–F0 (produced from bits 22–19) should be inverted if the sign bit (bit 31) of the data first arithmetic logic unit input bus 206 is "0", and not inverted if this sign bit is "1". The effect of conditionally inverting arithmetic logic unit control signals F3–F0 will be explained below. Such an inversion is useful to sign extend a rotated input in certain arithmetic operations. If the extended arithmetic logic unit operation is Boolean ("A" bit=0), then the "S" bit is ignored and the arithmetic logic unit control signals F3–F0 are unchanged.

Table 7 illustrates the interaction of the "C", "I" and "S" bits of data register D0. Note that an "X" entry for either the "I" bit or the first input sign indicates that bit does not control the outcome, i.e. a "don't care" condition.

TABLE 7

| S | I | First Input Sign | Invert C? | Invert F3–F0 |
|---|---|---|---|---|
| 0 | X | X | no | no |
| 1 | 0 | 0 | no | no |
| 1 | 0 | 1 | no | yes |
| 1 | 1 | 0 | no | no |
| 1 | 1 | 1 | yes | yes |

If the "S" bit equals "1" and the sign bit of the first input destined for the B-port of arithmetic logic unit 230 equals "0", then the value of the carry-in to bit 0 of arithmetic logic unit 230 set by the "C" bit value can optionally be inverted according to the value of the "I" bit. This allows the carry-in to be optionally inverted or not, based on the sign of the input. Note also that arithmetic logic unit control signals F3–F0 are optionally inverted based on the sign of the input, if the "S" bit is "1". This selection of inversion of arithmetic logic unit control signals F3–F0 may be overridden by the "FMOD" field. If the "FMOD" field specifies "Carry-in= Status Register's Carry bit", then the carry-in equals the "C" bit of status register 210 whatever the value of the "S" and "I" bits. Note also that the carry-in for bit 0 of arithmetic logic unit 230 may be set to "1" via the "C" bit for extended arithmetic logic unit operations even if the "A" bit is "0" indicating a Boolean operation.

The "N" bit (bit 15) of data register D0 is used when executing a split or multiple section arithmetic logic unit operation. This "N" bit is called the non-multiple mask bit. For some extended arithmetic logic unit operations that specify multiple operation via the "FMOD" field, the instruction specifies a mask to be passed to the C-port of arithmetic logic unit 230 via mask generator 239. This "N" bit determines whether or not the mask is split into the same number of sections as arithmetic logic unit 230. Recall that the number of such multiple sections is set by the "Asize" field of status register 210. If the "N" bit is "0", then the mask is split into multiple masks. If the "N" bit is "1", then mask generator 239 produces a single 32 bit mask.

The "E" bit (bit 14) designates an explicit multiple carry-in. This bit permits the carry-in to be specified at run time by the input to the C-port of arithmetic logic unit 230. If both the "A" bit and the "E" bit are "1" and the "FMOD" field does not designate the cin function, then the effects of the "S", "I" and "C" bits are annulled. The carry input to each section during multiple arithmetic is taken as the exclusive OR of the least significant bit of the corresponding section input to the C-port and the function signal F0. If multiple arithmetic is not selected the single carry-in to bit 0 of arithmetic logic unit 230 is the exclusive OR of the least significant bit (bit 0) the input to the C-port and the function signal F0. This is particularly useful for performing multiple arithmetic in which differing functions are performed in different sections. One extended arithmetic logic unit operation corresponds to (A^B)&C|(A^~B)&C. Using a mask for the C-port input, a section with all "0's" produces addition with the proper carry-in of "0" and a section of all "1's" produces subtraction with the proper carry-in of "1".

The "DMS" field (bits 12–8) of data register D0 defines the shift following the multiplier. This shift takes place in product left shifter 224 prior to saving the result or passing the result to rounding logic. During this left shift the most significant bits shifted out are discarded and zeroes are shifted into the least significant bits. The "DMS" field is effective during any multiply/extended arithmetic logic unit operation. In the preferred embodiment data register D0 bits 9–8 select 0, 1, 2 or 3 place left shifting. Table 8 illustrates the decoding.

TABLE 8

| DMS field | | Left shift amount |
|---|---|---|
| 9 | 8 | |
| 0 | 0 | 0 |
| 0 | 1 | 1 |
| 1 | 0 | 2 |
| 1 | 1 | 3 |

The "DMS" field includes 5 bits that can designate left shift amounts from 0 to 31 places. In the preferred embodiment product left shifter 224 is limited to shifts from 0 to 3 places for reasons of size and complexity. Thus bits 12–10 of data register D0 are ignored in setting the left shift amount. However, it is feasible to provide a left shift amount within the full range from 0 to 31 places from the "DMS" field if desired.

The "M" bit (bit 7) of data register D0 indicates a multiple multiply operation. Multiplier 220 can multiply two 16 bit numbers to generate a 32 bit result or of simultaneously multiplying two pair of 8 bit numbers to generate a pair of 16 bit resultants. This "M" bit selects either a single 16 by 16 multiply if "M"="0", or two 8 by 8 multiplies if "M"="1". This operation is similar to multiple arithmetic logic unit operations and will be further described below.

The "R" bit (bit 6) of data register D0 specifies whether a rounding operation takes place on the resultant from multiplier 220. If the "R" bit is "1", the a rounding operation, explained below together with the operation of multiplier 220, takes place. If the "R" bit is "0", then no rounding takes place and the 32 bit resultant form multiplier 220 is written into the destination register. Note that use of a predetermined bit in data register D0 is merely a preferred embodiment for triggering this mode. It is equally feasible to enable the rounding mode via a predetermined instruction word bit.

The "DBR" field (bits 4–0) of data register D0 specifies a default barrel rotate amount used barrel rotator 235 during certain instructions. The "DBR" field specifies the number of bit positions that barrel rotator 235 rotates left. These 5 bits can specify a left rotate of 0 to 31 places. The value of the "DBR" field may also be supplied to mask generator 239 via multiplexer Mmux 234. Mask generator 239 forms a mask supplied to the C-port of arithmetic logic unit 230. The operation of mask generator 239 will be discussed below.

Multiplier 220 is a hardware single cycle multiplier. As described above, multiplier 220 operates to multiply a pair of 16 bit numbers to obtain a 32 bit resultant or to multiply two pairs of 8 bit numbers to obtain two 16 bit resultants in the same 32 bit data word.

FIGS. 10a, 10b, 10c and 10d illustrate the input and output data formats for multiplying a pair of 16 bit numbers. FIG. 10a shows the format of a signed input. Bit 15 indicates the sign of this input, a "0" for positive and a "1" for negative. Bits 0 to 14 are the magnitude of the input. Bits 16 to 31 of the input are ignored by the multiply operation and are shown as a don't care "X". FIG. 10b illustrates the format of the resultant of a signed by signed multiply. Bits 31 and 30 are usually the same and indicate the sign of the resultant. If the multiplication was of Hex "8000" by Hex "8000", then bits 31 and 30 become "01". FIG. 10c illustrates the format of an unsigned input. The magnitude is represented by bits 0 to 15, and bits 16 to 31 are don't care "X". FIG. 10d shows the format of the resultant of an unsigned by unsigned multiply. All 32 bits represent the resultant.

FIG. 11 illustrates the input and output data formats for multiplying two pair of 8 bit numbers. In each of the two 8 bit by 8 bit multiplies the two first inputs on multiplier first input bus 201 are always unsigned. The second inputs on multiplier second input bus 202 may be both signed, resulting in two signed products, or both unsigned, resulting in two unsigned products. FIG. 11a illustrates the format of a pair of signed inputs. The first signed input occupies bits 0 to 7. Bit 7 is the sign bit. The second signed input occupies bits 8 to 15, bit 15 being the sign bit. FIG. 11b illustrates the format of a pair of unsigned inputs. Bits 0 to 7 form the first unsigned input and bits 8 to 16 form the second unsigned input. FIG. 11c illustrates the format of a pair of signed resultants. As noted above, a dual unsigned by signed multiply operation produces such a pair of signed resultants. The first signed resultant occupies bits 0 to 15 with bit 15 being the sign bit. The second signed resultant occupies bits 16 to 31 with bit 31 being the sign bit. FIG. 11d illustrates the format of a pair of unsigned resultants. The first unsigned resultant occupies bits 1 to 15 and the second unsigned resultant occupies bits 16 to 31.

Multiplier first input bus 201 is a 32 bit bus sourced from a data register within data registers 200 selected by the instruction word. The 16 least significant bits of multiplier first input bus 201 supplies a first 16 bit input to multiplier 220. The 16 most significant bits of multiplier first input bus 201 supplies the 16 least significant bits of a first input to a 32 bit multiplexer Rmux 221. This data routing is the same for both the 16 bit by 16 bit multiply and the dual 8 bit by 8 bit multiply. The 5 least significant bits multiplier first input bus 201 supply a first input to a multiplexer Smux 231.

Multiplier second input bus 202 is a 32 bit bus sourced from one of the data registers 200 as selected by the instruction word or from a 32 bit, 5 bit or 1 bit immediate value imbedded in the instruction word. A multiplexer Imux 222 supplies such an immediate multiplier second input bus 202 via a buffer 223. The instruction word controls, multiplexer Imux 222 to supply either 32 bits, 5 bits or 1 bit from an immediate field of the instruction word to multiplier second input bus 202 when executing an immediate instruction. The short immediate fields are zero extended in multiplexer Imux 222 upon supply to multiplier second input bus 202. The 16 least significant bits of multiplier second input bus 202 supplies a second 16 bit input to multiplier 220. This data routing is the same for both the 16 bit by 16 bit multiply and the dual 8 bit by 8 bit multiply. Multiplier second input bus 202 further supplies one input to multiplexer Amux 232 and one input to multiplexer Cmux 233. The 5 least significant bits of multiplier second input bus 202 supply one input to multiplexer Mmux 234 and a second input to multiplexer Smux 231.

The output of multiplier 220 supplies the input of product left shifter 224. Product left shifter 224 can provide a controllable left shift of 3, 2, 1 or 0 bits. The output of multiply shift multiplexer MSmux 225 controls the amount of left shift of product left shifter 224. Multiply shift multiplexer MSmux 225 selects either bits 9–8 from the "DMS" field of data register D0 or all zeroes depending on the instruction word. In the preferred embodiment, multiply shift multiplexer MSmux 225 selects the "0" input for the instructions MPYx∥ADD and MPYx∥SUB. These instructions combine signed or unsigned multiplication with addition or subtractions using arithmetic logical unit 230. In the preferred embodiment, multiply shift multiplexer MSmux 225 selects bits 9–8 of data register D0 for the instructions MPYx∥EALUx. These instructions combine signed or unsigned multiplication with one of two types of extended arithmetic logic unit instructions using arithmetic logic unit 230. The operation of data unit 110 when executing these instructions will be further described below. Product left shifter 224 discards the most significant bits shifted out and fills the least significant bits shifted in with zeros. Product left shifter 224 supplies a 32 bit output connected to a second input of multiplexer Rmux 221.

Figure 12:
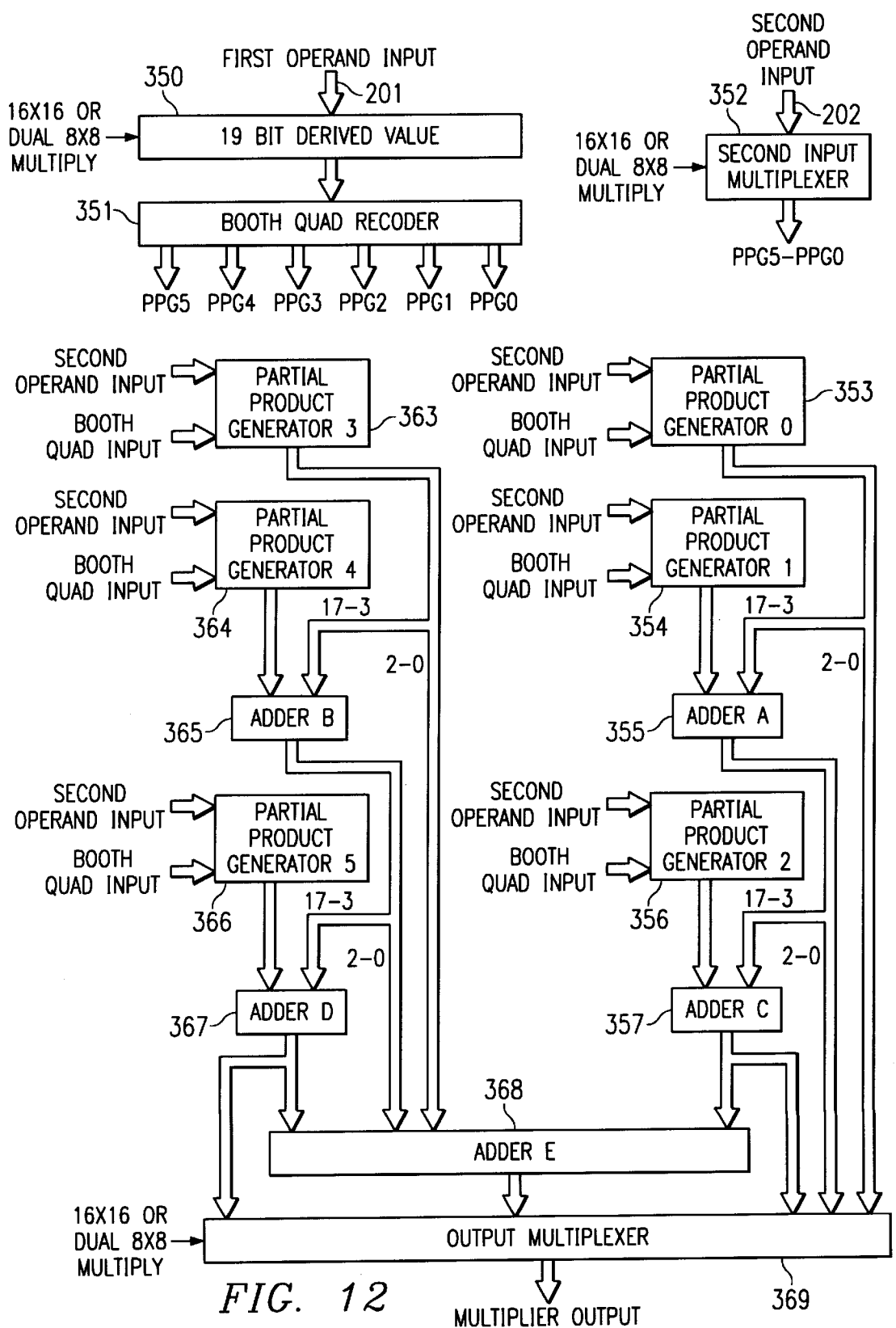
FIG. 12 illustrates in block diagram form the multiplier illustrated in FIG. 5.

FIG. 12 illustrates internal circuits of multiplier 220 in block diagram form. The following description of multiplier 220 points out the differences in organization during 16 bit by 16 bit multiplies from that during dual 8 bit by 8 bit multiplies. Multiplier first input bus 201 supplies a first data input to multiplier 220 and multiplier second input bus 202 supplies a second data input. Multiplier first input bus 201 supplies 19 bit derived value circuit 350. Nineteen bit derived value circuit 350 forms a 19 bit quantity from the 16 bit input. Nineteen bit derived value circuit 350 includes a control input indicating whether multiplier 220 executes a single 16 bit by 16 bit multiplication or dual 8 bit by 8 bit multiplication. Booth quad re-coder 351 receives the 19 bit value from 19 bit derived value circuit 350 and forms control signals for six partial product generators 353, 354, 356, 363, 364 and 366 (PPG5–PPG0). Booth quad re-coder 351 thus controls the core of multiplier 220 according to the first input or inputs on multiplier first input bus 201 for generating the desired product or products.

Figure 13:
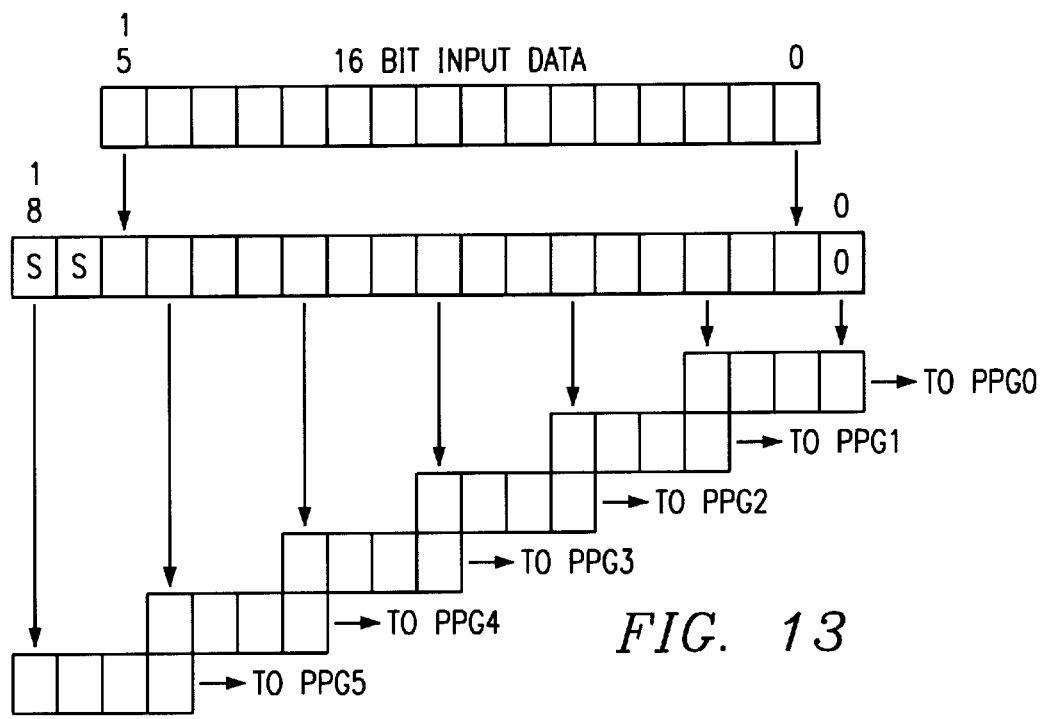
FIG. 13 illustrates in schematic form generation of Booth quads for the first operand in 16 bit by 16 bit multiplication.
Figure 14:
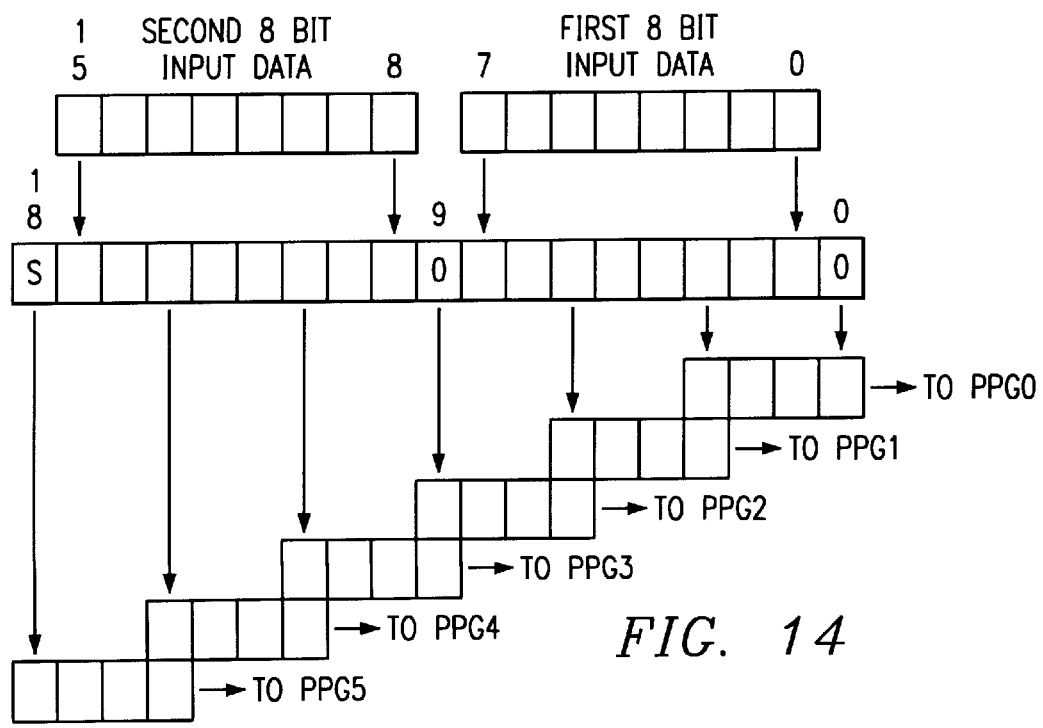
FIG. 14 illustrates in schematic form generation of Booth quads for dual first operands in 8 bit by 8 bit multiplication.

FIGS. 13 and 14 schematically illustrate the operation of 19 bit derived value circuit 350 and Booth quad re-coder 351. For all modes of operation, the 16 most significant bits of multiplier first input bus 201 are ignored by multiplier 220. FIG. 13 illustrates the 19 bit derived value for 16 bit by 16 bit multiplications. The 16 bits of the first input are left shifted by one place and sign extended by two places. In the unsigned mode, the sign is "0". Thus bits 18–17 of the 19 bit derived value are the sign, bits 16–1 correspond to the 16 bit input, and bit 0 is always "0". The resulting 19 bits are grouped into six overlapping four-bit units to form the Booth quads. Bits 3–0 form the first Booth quad controlling partial product generator PPG0 353, bits 6–3 control partial product generator PPG1 354, bits 9–6 control partial product generator PPG2 356, bits 12–9 control partial product generator PPG3 363, bits 15–12 control partial product generator PPG4 364, and bits 18–15 control partial product generator PPG5 366. FIG. 14 illustrates the 19 bit derived value for dual 8 bit by 8 bit multiplications. The two inputs are pulled apart. The first input is left shifted by one place, the second input is left shifted by two places. Bits 0 and 9 of the 19 bit derived value are set to "0", bit 18 to the sign. The Booth quads are generated in the same manner as in 16 bit by 16 bit multiplication. Note that placing a "0" in bit 9 of the derived value makes the first three Booth quads independent of the second 8 bit input and the last three Booth quads independent of the first 8 bit input. This enables separation of the two products at the multiplier output.

The core of multiplier 220 includes: six partial product generators 353, 354, 356, 363, 364 and 366, which are designated PPG0 to PPG5, respectively; five adders 355, 365, 357, 267 and 368, designated adders A, B, C, D and E; and an output multiplexer 369. Partial product generators 353, 354, 356, 363, 364 and 366 are identical. Each partial product generator 353, 354, 356, 363, 364 and 366 forms a partial product based upon a corresponding Booth quad. These partial products are added to form the final product by adders 355, 365, 357, 367 and 368.

The operation of partial product generator 353, 354, 356, 363, 364 and 366 is detailed in Tables 9 and 10. Partial product generators 353, 354, 356, 363, 364 and 366 multiply the input data derived from multiplier second input bus 202 by integer amounts ranging from −4 to +4. The multiply amounts for the partial product generators are based upon the value of the corresponding Booth quad. This relationship is shown in Table 9 below.

TABLE 9

| Quad | Multiply Amount |
| --- | --- |
| 0000 | 0 |
| 0001 | 1 |
| 0010 | 1 |
| 0011 | 2 |
| 0100 | 2 |
| 0101 | 3 |
| 0110 | 3 |
| 0111 | 4 |
| 1000 | −4 |
| 1001 | −3 |
| 1010 | −3 |
| 1011 | −2 |
| 1100 | −2 |
| 1101 | −1 |
| 1110 | −1 |
| 1111 | −0 |

Table 10 lists the action taken by the partial product generator based upon the desired multiply amount.

TABLE 10

| Multiply Amount | Partial Product Generator Action |
| --- | --- |
| ±0 | select all zeros |
| ±1 | pass input straight through |
| ±2 | shift left one place |
| ±3 | select output of 3x generator |
| ±4 | shift left two places |

In most cases, the partial product is easily derived. An all "0" output is selected for a multiply amount of 0. A multiply amount of 1 results in passing the input unchanged. Multiply amounts of 2 and 4 are done simply by shifting. A dedicated piece of hardware generates the multiple of 3. This hardware essentially forms the addition of the input value and the input left shifted one place.

Each partial product generator 353, 354, 356, 363, 364 and 366 receives an input value based upon the data received on multiply second input bus 202. The data on multiply second input bus 202 is 16 bits wide. Each partial product generator 353, 354, 356, 363, 364 and 366 needs to be 18 bits to hold the 16 bit number shifted two places left, as in the multiply by 4 case. The output of each partial product generator 353, 354, 356, 363, 364 and 366 is shifted three places left from that of the preceding partial product generator 353, 354, 356, 363, 364 and 366. Thus each partial product generator output is weighted by 8 from its predecessor. This is shown in FIG. 12, where bits 2–0 of each partial product generator 353, 354, 356, 363, 364 and 366 is handled separately. Note that adders A, B, C, D and E are always one bit wider than their input data to hold any overflow.

The adders 355, 357, 365, 367 and 368 used in the preferred embodiment employ redundant-sign-digit notation. In the redundant-sign-digit notation, a magnitude bit and a sign bit represents each bit of the number. This known format is useful in the speeding the addition operation in a manner not important to this invention. However this invention is independent of the adder type used, so for simplicity this will not be further discussed. During multiply operations data from the 16 least significant bits on multiply second input bus 202 is fed into each of the six partial product generator 353, 354, 356, 363, 364 and 366, and multiplied by the amount determined by the corresponding Booth quad.

Second input multiplexer 352 determines the data supplied to the six partial produce generators 353, 354, 356, 363, 364 and 366. This data comes from the 16 least significant bits on multiply second input bus 202. The data supplied to partial products generators 353, 354, 356, 363, 364 and 366 differ depending upon whether multiplier 220 executes a single 16 bit by 16 bit multiplication or dual 8 bit by 8 bit multiplication. FIG. 15 illustrates the second input data supplied to the six partial produce generators 353, 354, 356, 363, 364 and 366 during a 16 bit by 16 bit multiply. FIG. 15a illustrates the case of unsigned multiplication. The 16 bit input is zero extended to 18 bits. FIG. 15b illustrates the case of signed multiplication. The data is sign extended to 18 bits by duplicating the sign bit (bit 15). During 16 bit by 16 bit multiplication and of the six partial produce generators 353, 354, 356, 363, 364 and 366 receives the same second input.

The six partial produce generators 353, 354, 356, 363, 364 and 366 do not receive the same second input during dual 8 bit by 8 bit multiplication. Partial product generators 353, 345 and 356 receive one input and partial product generators 363, 364 and 366 receive another. This enables separation of the two inputs when operating in multiple multiply mode. Note that in the multiple multiply mode there is no overlap of second input data supplied to the first three partial product generators 353, 345 and 356 and the second three partial product generators 363, 364 and 366. FIG. 16 illustrates the second input data supplied to the six partial produce generators 353, 354, 356, 363, 364 and 366 during a dual 8 bit by 8 bit multiply. FIG. 16a illustrates the second input data supplied to partial product generators 353, 354 and 356 for an unsigned input. FIG. 16a illustrates the input zero extended to 18 bits. FIG. 16b illustrates the second input data supplied to partial product generators 353, 354 and 356 for a signed input, which is sign extended to 18 bits. FIG. 16c illustrates the second input data supplied to partial product generators 363, 364 and 366 for an unsigned input. FIG. 16c illustrates the input at bits 15–8 with the other places of the 18 bits set to "0". FIG. 16d illustrates the second input data supplied to partial product generators 363, 364 and 366 for a signed input. The 7 bit magnitude is at bits 14–8, bits 17–15 hold the sign and bits 7–0 are set to "0".

Note that it would be possible to have added the partial products of partial product generators 353, 354, 356, 363, 364 and 366 in series. The present embodiment illustrated in FIG. 12 has two advantages over such a series of additions. This embodiment offers significant speed advantages by performing additions in parallel. This embodiment also lends itself well to performing dual 8 bit by 8 bit multiplies. These can be very useful in speeding data manipulation and data transfers where an 8 bit by 8 bit product provides the data resolution needed.

A further multiplexer switches between the results of a 16 bit by 16 bit multiply and dual 8 bit by 8 bit multiplies. Output multiplexer 369 is controlled by a signal indicating whether multiplier 220 executes a single 16 bit by 16 bit multiplication or dual 8 bit by 8 bit multiplication. FIG. 17 shows the derivation of each bit of the resultant. FIG. 17a illustrates the derivation of each bit for a 16 bit by 16 bit multiply. Bits 31–9 of the resultant come from bits 22–0 of adder E 368, respectively. Bits 8–6 come from bits 2–0 of adder C 357, respectively. Bits 5–3 come from bits 2–0 of adder A 355, respectively. Bits 2–0 come from bits 2–0 of partial product generator 353. FIG. 17b illustrates the derivation of each bit for the case of dual 8 bit by 8 bit multiplication. Bits 31–16 of the resultant in this case come from bits 15–0 of adder D 367, respectively. Bits 15–6 of the resultant come from bits 9–0 of adder C 357 respectively. As in the case illustrated in FIG. 17a, bits 5–3 come from bits 2–0 of adder A 355 and bits 2–0 come from bits 2–0 of partial product generator 353.

It should be noted that in the actual implementation of output multiplexer 369 requires duplicated data paths to handle both the magnitude and sign required by the redundant-sign-digit notation. This duplication has not been shown or described in detail. The redundant-sign-digit notation is not required to practice this invention, and those skilled in the art would easily realize how to construct output multiplexer 369 to achieve the desired result in redundant-sign-digit notation. Note also when using the redundant-sign-digit notation, the resultant generally needs to be converted into standard binary notation before use by other parts of data unit 110. This conversion is known in the art and will not be further described.

It can be seen from the above description that with the addition of a small amount of logic the same basic hardware can perform 16 bit by 16 multiplication and dual 8 bit by 8 bit multiplications. The additional hardware consists of multiplexers at the two inputs to the multiplier core, a modification to the Booth re-coder logic and a multiplexer at the output of the multiplier. This additional hardware permits much greater data through put when using dual 8 bit by 8 bit multiplication.

Adder 226 has three inputs. A first input is set to all zeros. A second input receives the 16 most significant bits (bits 31–16) of the left shifted resultant of multiplier 220. A carry-in input receives the output of bit 15 of this left shifter resultant of multiplier 220. Multiplexer Rmux 221 selects either the entire 32 bit resultant of multiplier 220 as shifted by product left shifter 224 to supply to multiply destination bus 203 via multiplexer Bmux 227 or the sum from adder 226 forms the 16 most significant bits and the 16 most significant bits of multiplier first input bus 201 forms the 16 least significant bits. As noted above, in the preferred embodiment the state of the "R" bit (bit 6) of data register D0 controls this selection at multiplexer Rmux 221. If this "R" bit is "0", then multiplexer Rmux 221 selects the shifted 32 bit resultant. If this "R" bit is "1", there multiplexer Rmux 221 selects the 16 rounded bits and The 16 most significant bits of multiplier first input bus 201. Note that it is equally feasible to control multiplexer Rmux 221 via an instruction word bit.

Adder 226 enables a multiply and round function on a 32 bit data word including a pair of packed 16 bit half words. Suppose that a first of the data registers 200 stores a pair of packed half words (a::b), a second data register stores a first half word coefficient (X::c1) and a third data register stores a second half word coefficient (X::c2), where X may be any data. The desired resultant is a pair of packed half words (a*c2::b*c1) with a*c2 and b*c1 each being the rounded most significant bits of the product. The desired resultant may be formed in two instructions using adder 226 to perform the rounding. The first instruction is:

$$mdst = msrc1 * msrc2$$
$$(b*c1::a) = (a::b) * (X::c1)$$

As previously described multiplier first input bus 201 supplies its 16 least significant bits, corresponding to b, to the first input of multiplier 220. At the same time multiply second input bus 202 supplies its 16 least significant bits, corresponding to c1, to the second input of multiplier 220. This 16 by 16 bit multiply produces a 32 bit product. The 16 most significant bits of the 32 bit resultant form one input to adder 226 with "0" supplied to the other input of adder 226. If bit 15 of the 32 bit resultant is "1", then the 16 most significant bits of the resultant is incremented, otherwise these 16 most significant bits are unchanged. Thus the 16 most significant bits of the multiply operation are rounded in adder 226. Note that one input to multiplexer Rmux 221 includes the 16 bit resultant from adder 226 as the 16 most significant bits and the 16 most significant bits from multiplier first input bus 201, which is the value a, as the least significant bits. Also note that the 16 most significant bits on multiplier second input bus 202 are discarded, therefore their initial state is unimportant. Multiplexer Rmux selects the combined output from adder 226 and multiplier first input bus 201 for storage in a destination register in data registers 200.

The packed word multiply/round operation continues with another multiply instruction. The resultant (b*c1::a) of the first multiply instruction is recalled via multiply first input bus 201. This is shown below:

$$mdst = msrc1 * msrc2$$
$$(a*c2::b*c1) = (b*c1::a) * (X::c2)$$

The multiply occurs between the 16 least significant bits on the multiplier first input bus 201, the value a, and the 16 least significant bits on the multiplier second input bus 202, the value c2. The 16 most significant bits of the resultant are rounded using adder 226. These bits become the 16 most significant bits of one input to multiplexer Rmux 221. The 16 most significant bits on multiplier first input bus 201, the value b*c1, becomes the 16 least significant bits of the input to multiplexer Rmux 221. The 16 most significant bits on the multiplier second input bus 202 are discarded. Multiplexer Rmux 221 then selects the desired resultant (a*c2::b*c1) for storage in data registers 200 via multiplexer Bmux 227 and multiplier destination bus 203. Note that this process could also be performed on data scaled via product left shifter 224, with adder 226 always rounding the least significant bit retained. Also note that the factors c1 and c2 may be the same or different.

This packed word multiply/round operation is advantageous because the packed 16 bit numbers can reside in a single register. In addition fewer memory loads and stores are needed to transfer such packed data than if this operation was not supported. Also note that no additional processor cycles are required in handling this packed word multiply/rounding operation. The previous description of the packed word multiply/round operation partitioned multiplier first input bus 201 into two equal halves. This is not necessary to employ the advantages of this invention. As a further example, it is feasible to partition multiplier first input bus 201 into four 8 bit sections. In this further example multiplier 220 forms the product of the 8 least significant bits of multiplier first input bus 201 and the 8 least significant bits of multiplier second input bus 202. After optional scaling in product left shifter 224 and rounding via adder 226, the 8 most significant bits of the product form the most significant bits of one input to multiplexer Mmux 221. In this further example, the least significant 24 bits of this second input to multiplexer Mmux 221 come from the most significant 24 bits on multiplier first input bus 201. This further example permits four 8 bit multiplies on such a packed word in 4 passes through multiplier 220, with all the intermediate results and the final result packed into one 32 bit data word. To further generalize, this invention partitions the original N bit data word into a first set of M bits and a second set of L bits. Following multiplication and rounding, a new data word is formed including the L most significant bits of the product and the first set of M bits from the first input. The data order in the resultant is preferably shifted or rotated in some way to permit repeated multiplications using the same technique. As in the further example described above, the number of bits M need not equal the number of bits L. In addition, the sum of M and L need not equal the original number of bits N.

In the preferred embodiment the round function selected by the "R" (bit 6) of data register D0 is implemented in a manner to increase its speed. Multiplier 220 employs a common hardware multiplier implementation that employs internally a redundant-sign-digit notation. In the redundant-sign-digit notation each bit of the number is represented by a magnitude bit and a sign bit. This known format is useful in the internal operation of multiplier 220 in a manner not important to this invention. Multiplier 220 converts the resultant from this redundant-sign-digit notation to standard binary notation before using the resultant. Conventional conversion operates by subtracting the negative signed magnitude bits from the positive signed magnitude bits. Such a subtraction ordinarily involves a delay due to borrow ripple from the least significant bit to the most significant bit. In the packed multiply/round operation the desired result is the 16 most significant bits and the rounding depends upon bit 15, the next most significant bit. Though the results are the most significant bits, the borrow ripple from the least significant bit may affect the result. Conventionally the borrow ripple must propagate from the least significant bit to bit 15 before being available to make the rounding decision.

Figure 18:
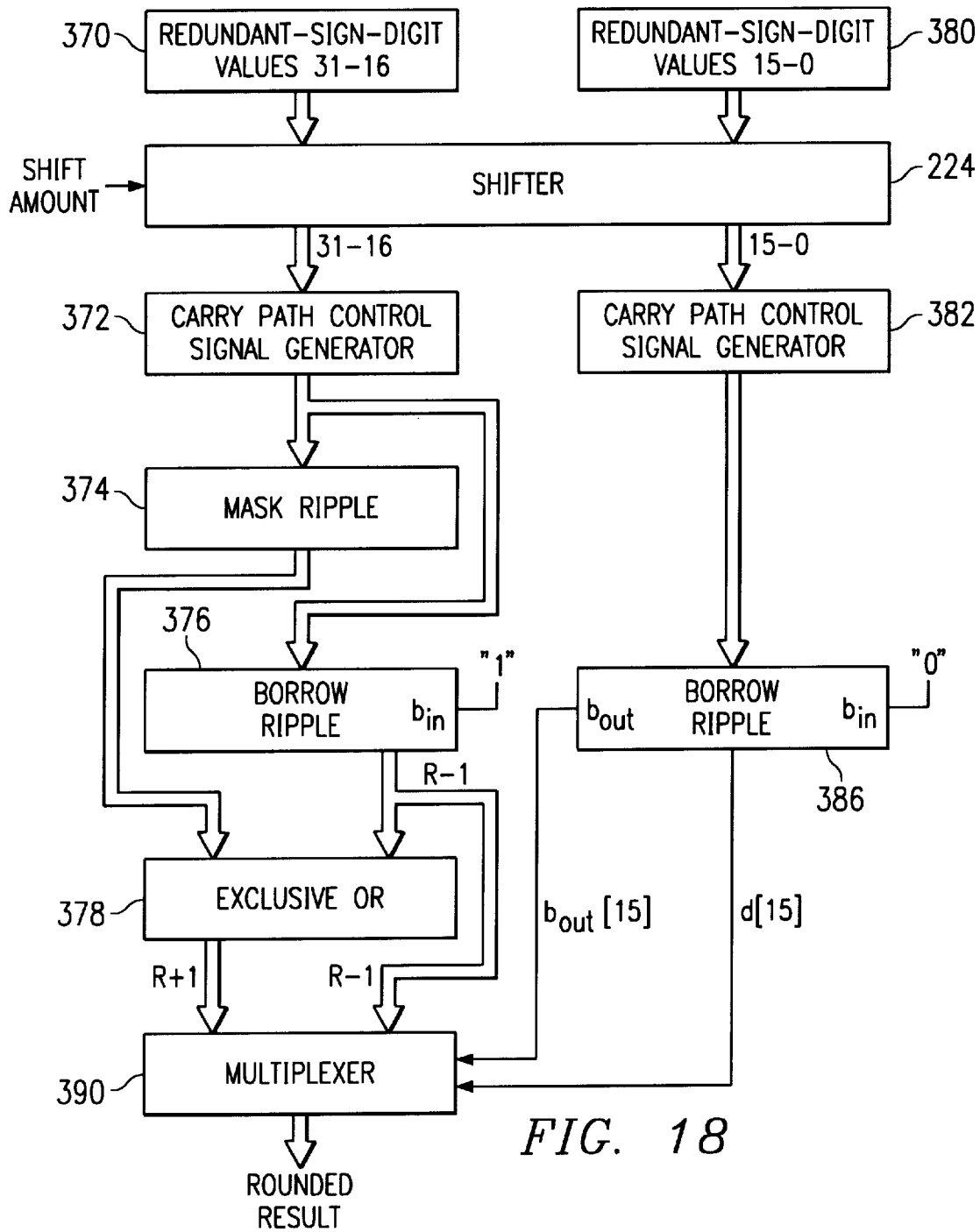
FIG. 18 illustrates in block diagram form the details of the construction of the rounding adder 226 illustrated in FIG. 5.

FIG. 18 illustrates in block diagram form hardware for speeding this rounding determination. In FIG. 18 the 32 bit multiply resultant from multiplier 220 is separated into a most significant 16 bits (bits 31–16) coded in redundant-sign-digit form stored in register 370 and a least significant 16 bits (bits 15–0) coded in redundant-sign-digit form stored in register 380. In FIG. 18 product left shifter 224 is used for scaling as previously described. Product left shifter 224 left shifts both the magnitude bit and the sign bit for each bit of the of redundant-sign-digit form stored in registers 370 and 380 of multiplier 220 prior to forming the resultant. The shift amount comes from multiply shift multiplexer MSmux 225 as previously described above.

Conventionally such redundant-sign-digit notation is converted to standard binary notation by generating carry/borrow control signals. Carry path control signal generator 382 forms three carry path control signals, propagate, kill and generate, from the magnitude and sign bits of the corresponding desired resultant bit. These signals are easily derived according to Table 11.

TABLE 11

| Magnitude | Sign | Indicates | Carry Path Control Signal |
|---|---|---|---|
| 0 | X | Zero (0) | Propagate (P) |
| 1 | 0 | Plus One (1) | Kill (K) |
| 1 | 1 | Minus One (T) | Generate (G) |

Carry path control signal generator 382 supplies these carry path control signals to borrow ripple unit 386. Borrow ripple unit 386 uses the bit wise carry path control signals to control borrow ripple during the subtraction of the negatively signed bits from the positively signed bits. Note from Table 11 that the three signals propagate, kill and generate are mutually exclusive. One and only one of these signals is active at any particular time. A propagate signal causes any borrow signal from the previous less significant bit to propagate unchanged to the next more significant bit. A kill signal absorbs any borrow signal from the prior bit and prevents propagation to the next bit. A generate signal produces a borrow signal to propagate to the next bit whatever the received borrow signal. Borrow ripple unit 386 propagates the borrow signal from the least significant bit to the most significant bit. As illustrated in FIG. 18, bits 15–0 are converted in this manner. The only part of the result used is the data of bit 15 d[15] and the borrow output signal of bit 15 $b_{out}$[15].

The circuit illustrated in FIG. 18 employs a different technique to derive the 16 most significant bits. Note that except for the rounding operation that depends upon bit 15, only the 16 most significant bits are needed in the packed multiply/round operation. There are two possible resultants for bits 31–16 depending upon the rounding determination. The circuit of FIG. 18 computes both these possible resultants in parallel and the selects the appropriate resultant depending upon the data of bit 15 d[15] and the borrow output signal of bit 15 $b_{out}$[15]. This substantially reduces the delay forming the rounded value. Note that using adder 226 to form the rounded value as illustrated in FIG. 5 introduces an additional carry ripple delay within adder 226 when forming the sum.

The circuit illustrated in FIG. 18 forms the minimum and maximum possible rounded results simultaneously. If R is the simple conversion of the 16 most significant bits, then the rounded final result may be R−1, R or R+1. These are selected based upon the data of bit 15 d[15] and the borrow output signal of bit 15 $b_{out}$[15] according to Table 12.

TABLE 12

| d [15] | $b_{out}$ [15] | | Final Result |
|---|---|---|---|
| 0 | 0 | R | Neither increment nor decrement |
| 0 | 1 | R − 1 | Decrement only |
| 1 | 0 | R + 1 | Increment only |
| 1 | 1 | R | Both increment and decrement |

The circuit of FIG. 18 computes the value R−1 for the 16 most significant bits employing carry path control signal generator 372 and borrow ripple unit 376. Carry path control signal generator 372 is the same as carry path control signal generator 382 and operates according to Table 11. Borrow ripple unit 376 is the same as borrow ripple unit 386. Borrow ripple unit 376 computes the value R−1 because the borrow-in input is always supplied with a borrow value of "1", thus always performing a decrement of the simple conversion value R.

The circuit of FIG. 18 forms the value R+1 by adding 2 to the value of R−1. Note that a binary number may be incremented by 1 by toggling all the bits up to and including the right most "0" bit in the original binary number. The circuit of FIG. 18 employs this technique to determine bits 31–17. This addition takes place in two stages in a manner not requiring a carry borrow for the entire 16 bits. In the first stage, mask ripple unit 374 generates a mask from the carry path control signals. An intermediate mask is formed with a "1" in any bit position in which the converted result is known to be "0" or known to differ from the result of the prior bit. Mask ripple unit 374 sets other bit positions to "0". The manner of forming this intermediate mask is shown in Table 13.

TABLE 13

| Bit [n] | Bit [n − 1] | Final Result of Bit [n] | Intermediate Mask Value |
|---|---|---|---|
| T (G) | T (G) | 0 | 1 |
| 0 (P) | T (G) | 1 | 0 |
| 1 (K) | T (G) | 0 | 1 |
| T (G) | 0 (P) | Different from Bit [n − 1] | 1 |
| 0 (P) | 0 (P) | Same as Bit [n − 1] | 0 |
| 1 (K) | 0 (P) | Different from Bit [n − 1] | 1 |
| T (G) | 1 (K) | 1 | 0 |
| 0 (P) | 1 (K) | 0 | 1 |
| 1 (K) | 1 (K) | 1 | 0 |

Review of the results of Table 13 reveal that this operation can be performed by the function P[n] XNOR K[n−1]. Thus a simple circuit generates the intermediate mask for each bit. Mask ripple unit 374 ripples through the intermediate mask until reaching the right most "0". Those bits including the right most "0" bit are set to "1", and all more significant bits are set to "0". This toggle mask and the R−1 result from borrow ripple unit 376 are supplied to exclusive OR unit 378. Exclusive OR unit 378 toggles those bits from borrow ripple unit 376 corresponding to the mask generated by mask ripple unit 374.

Multiplexer 390 assembles the rounded resultant. This operation takes place as shown in Tables 14 and 15. Table 14 shows the derivation of bit 16, the least significant rounded bit of the desired resultant, depending upon the data of bit 15 d[15] and the borrow output signal of bit 15 $b_{out}$[15]. These results from the 16 least significant bits of the output of multiplier 220 are available from borrow ripple unit 386.

TABLE 14

| d [15] | $b_{out}$ [15] | Final Result for Bit [16] |
|---|---|---|
| 0 | 0 | ~R − 1 [16] |
| 0 | 1 | R − 1 [16] |
| 1 | 0 | R + 1 [16] |
| 1 | 1 | ~R − 1 [16] |

The data of bit 15 d[15], the borrow output signal of bit 15 $b_{out}$[15] and the final result of bit 16 determine bits 31–17 according to Table 15.

TABLE 15

| d [15] | $b_{out}$ [15] | Final Result of Bit [16] | Final Result Bits 31 − 17 |
|---|---|---|---|
| 0 | 0 | 0 | R + 1 [31 − 17] |
| 0 | 0 | 1 | R − 1 [31 − 17] |
| 0 | 1 | X | R − 1 [31 − 17] |
| 1 | 0 | X | R + 1 [31 − 17] |
| 1 | 1 | 0 | R + 1 [31 − 17] |
| 1 | 1 | 1 | R − 1 [31 − 17] |

Thus multiplexer 390 forms the desired rounded resultant, which is the same as formed by adder 226. The manner of generation of the rounded resultant substantially eliminates the carry ripple delay associated with adder 226. Note that FIG. 5 contemplates circuits similar to carry path control signal generators 372 and 382 and borrow ripple units 376 and 386 to generate the output of multiplier 220 in normal coded form. Thus the circuit illustrated in FIG. 18 substitutes the delay of exclusive OR unit 378 and multiplexer 390 for the carry ripple delay of adder 226. The delay of exclusive OR unit 378 and multiplexer 390 is expected to be considerably less than the delay of adder 226. This is in a critical path, because the rounding performed by adder 226 follows the operation of multiplier 220. Thus this reduction in delay enables speeding up of the entire execute pipeline stage. This in turn enhances the rate of operation of multiprocessor integrated circuit 100.

Note that the circuit illustrated in FIG. 18 is employed as described above only if the "R" bit of data register 200 D0 selects the packed word multiply/rounding operation. In the event that the "R" bit of data register 200 D0 is "0", the packed word multiply/round operation is not enabled. In this event borrow ripple units 376 and 386 may be connected conventionally, with the signal $b_{out}[15]$ from borrow ripple unit 386 coupled to the borrow input $b_{in}$ of borrow ripple unit 376. Borrow ripple units 376 and 386 thus produce the shifted 32 bit resultant of multiplier 220 for selection by multiplexer Rmux 221.

Arithmetic logic unit 230 performs arithmetic and logic operations within data unit 110. Arithmetic logic unit 230 advantageously includes three input ports for performing three input arithmetic and logic operations. Numerous buses and auxiliary hardware supply the three inputs.

Input A bus 241 supplies data to an A-port of arithmetic logic unit 230. Multiplexer Amux 232 supplies data to input A bus 241 from either multiplier second input bus 202 or arithmetic logic unit first input bus 205 depending on the instruction. Data on multiplier second input bus 202 may be from a specified one of data registers 200 or from an immediate field of the instruction via multiplexer Imux 222 and buffer 223. Data on arithmetic logic unit first input bus 205 may be from a specified one of data registers 200 or from global port source data bus Gsrc bus 105 via buffer 106. Thus the data supplied to the A-port of arithmetic logic unit 230 may be from one of the data registers 200, from an immediate field of the instruction word or a long distance source from another register of digital image/graphics processor 71 via global source data bus Gsrc 105 and buffer 106.

Input B bus 242 supplies data to the B-port of arithmetic logic unit 230. Barrel rotator 235 supplies data to input B bus 242. Thus barrel rotator 235 controls the input to the B-port of arithmetic logic unit 230. Barrel rotator 235 receives data from arithmetic logic unit second input bus 206. Arithmetic logic unit second input bus 206 supplies data from a specified one of data registers 200, data from global port source data bus Gsrc bus 105 via buffer 104 or a special data word from buffer 236. Buffer 236 supplies a 32 bit data constant of "00000000000000000000000000000001" (also called Hex "1") to arithmetic logic unit second input bus 206 if enabled. Note hereinafter data or addresses preceded by "Hex" are expressed in hexadecimal. Data from global port source data bus Gsrc 105 may be supplied to barrel rotator 235 as a long distance source as previously described. When buffer 236 is enabled, barrel rotator 235 enables generation on input B bus 242 of any constant of the form $2^N$, where N is the barrel rotate amount. Constants of this form are useful in operations to control only a single bit of a 32 bit data word. The data supplied to arithmetic logic unit second input bus 206 and barrel rotator 235 depends upon the instruction.

Barrel rotator 235 is a 32 bit rotator that may rotate its received data from 0 to 31 positions. It is a left rotator, however, a right rotate of n bits may be obtained by left rotating 32-n bits. A five bit input from rotate bus 244 controls the amount of rotation provided by barrel rotator 235. Note that the rotation is circular and no bits are lost. Bits rotated out the left of barrel rotator 235 wrap back into the right. Multiplexer Smux 231 supplies rotate bus 244. Multiplexer Smux 231 has several inputs. These inputs include: the five least significant bits of multiplier first input bus 201; the five least significant bits of multiplier second input bus 202; five bits from the "DBR" field of data register D0; and a five bit zero constant "00000". Note that because multiplier second input bus 202 may receive immediate data via multiplexer Imux 222 and buffer 223, the instruction word can supply an immediate rotate amount to barrel rotator 235. Multiplexer Smux 231 selects one of these inputs to determine the amount of rotation in barrel rotator 235 depending on the instruction. Each of these rotate quantities is five bits and thus can set a left rotate in the range from 0 to 31 bits.

Barrel rotator 235 also supplies data to multiplexer Bmux 227. This permits the rotated data from barrel rotator 235 to be stored in one of the data registers 200 via multiplier destination bus 203 in parallel with an operation of arithmetic logic unit 230. Barrel rotator 235 shares multiplier destination bus 203 with multiplexer Rmux 221 via multiplexer Bmux 227. Thus the rotated data cannot be saved if a multiply operation takes place. In the preferred embodiment this write back method is particularly supported by extended arithmetic logic unit operations, and can be disabled by specifying the same register destination for barrel rotator 235 result as for arithmetic logic unit 230 result. In this case only the result of arithmetic logic unit 233 appearing on arithmetic logic unit destination bus 204 is saved.

Although the above description refers to barrel rotator 235, those skilled in the art would realize that substantial utility can be achieved using a shifter which does not wrap around data. Particularly for shift and mask operations where not all of the bits to the B-port of arithmetic logic unit 230 are used, a shifter controlled by rotate bus 244 provides the needed functionality. In this event an additional bit, such as the most significant bit on the rotate bus 244, preferably indicates whether to form a right shift or a left shift. Five bits on rotate bus 244 are still required to designate the magnitude of the shift. Therefore it should be understood in the description below that a shifter may be substituted for barrel rotator 235 in many instances.

Input C bus 243 supplies data to the C-port of arithmetic logic unit 230. Multiplexer Cmux 233 supplies data to input C bus 243. Multiplexer Cmux 233 receives data from four sources. These are LMO/RMO/LMBC/RMBC circuit 237, expand circuit 238, multiplier second input bus 202 and mask generator 239.

LMO/RMO/LMBC/RMBC circuit 237 is a dedicated hardware circuit that determines either the left most "1", the right most "1", the left most bit change or the right most bit change of the data on arithmetic logic unit second input bus 206 depending on the instruction or the "FMOD" field of data register D0. LMO/RMO/LMBC/RMBC circuit 237 supplies to multiplexer Cmux 233 a 32 bit number having a value corresponding to the detected quantity. The left most bit change is defined as the position of the left most bit that is different from the sign bit 32. The right most bit change is defined as the position of the right most bit that is different from bit 0. The resultant is a binary number corresponding to the detected bit position as listed below in Table 16. The values are effectively the big endian bit number of the detected bit position, where the result is 31-(bit position).

TABLE 16

| bit position | result |
| --- | --- |
| 0 | 31 |
| 1 | 30 |
| 2 | 29 |
| 3 | 28 |
| 4 | 27 |
| 5 | 26 |
| 6 | 25 |
| 7 | 24 |
| 8 | 23 |
| 9 | 22 |
| 10 | 21 |
| 11 | 20 |
| 12 | 19 |
| 13 | 18 |
| 14 | 17 |
| 15 | 16 |
| 16 | 15 |
| 17 | 14 |
| 18 | 13 |
| 19 | 12 |
| 20 | 11 |
| 21 | 10 |
| 22 | 9 |
| 23 | 8 |
| 24 | 7 |
| 25 | 6 |
| 26 | 5 |
| 27 | 4 |
| 28 | 3 |
| 29 | 2 |
| 30 | 1 |
| 31 | 0 |

This determination is useful for normalization and for image compression to find a left most or right most "1" or changed bit as an edge of an image. The LMO/RMO/LMBC/RMBC circuit 237 is a potential speed path, therefore the source coupled to arithmetic logic unit second input bus 206 is preferably limited to one of the data registers 200. For the left most "1" and the right most "1" operations, the "V" bit indicating overflow of status register 210 is set to "1" if there were no "1's" in the source, and "0" if there were. For the left most bit change and the right most bit change operations, the "V" bit is set to "1" if all bits in the source were equal, and "0" if a change was detected. If the "V" bit is set to "1" by any of these operations, the LMO/RMO/LMBC/RMBC result is effectively 32. Further details regarding the operation of status register 210 appear above.

Expand circuit 238 receives inputs from multiple flags register 211 and status register 210. Based upon the "Msize" field of status register 210 described above, expand circuit 238 duplicates some of the least significant bits stored in multiple flags register 211 to fill 32 bits. Expand circuit 238 may expand the least significant bit 32 times, expand the two least significant bits 16 times or expand the four least significant bits 8 times. The "Asize" field of status register 210 controls processes in which the 32 bit arithmetic logic unit 230 is split into independent sections for independent data operations. This is useful for operation on pixels sizes less than the 32 bit width of arithmetic logic unit 230. This process, as well as examples of its use, will be further described below.

Mask generator 239 generates 32 bit masks that may be supplied to the input C bus 243 via multiplexer Cmux 233. The mask generated depends on a 5 bit input from multiplexer Mmux 234. Multiplexer Mmux 234 selects either the 5 least significant bits of multiplier second input bus 202, or the "DBR" field from data register D0. In the preferred embodiment, an input of value N causes mask generator 239 to generate a mask generated that has N "1's" in the least significant bits, and 32–N "0's" in the most significant bits. This forms an output having N right justified "1's". This is only one of four possible methods of operation of mask generator 239. In a second embodiment, mask generator 239 generates the mask having N right justified "0's", that is N "0's" in the least significant bits and N–32 "1's" in the most significant bits. It is equally feasible for mask generator 239 to generate the mask having N left justified "1's" or N left justified "0's". Table 17 illustrates the operation of mask generator 239 in accordance with the preferred embodiment when multiple arithmetic is not selected.

TABLE 17

| Mask Generator Input | Mask - Nonmultiple Operation | | | | | | | |
| --- | --- | --- | --- | --- | --- | --- | --- | --- |
| 0 0 0 0 0 | 0000 | 0000 | 0000 | 0000 | 0000 | 0000 | 0000 | 0000 |
| 0 0 0 0 1 | 0000 | 0000 | 0000 | 0000 | 0000 | 0000 | 0000 | 0001 |
| 0 0 0 1 0 | 0000 | 0000 | 0000 | 0000 | 0000 | 0000 | 0000 | 0011 |
| 0 0 0 1 1 | 0000 | 0000 | 0000 | 0000 | 0000 | 0000 | 0000 | 0111 |
| 0 0 1 0 0 | 0000 | 0000 | 0000 | 0000 | 0000 | 0000 | 0000 | 1111 |
| 0 0 1 0 1 | 0000 | 0000 | 0000 | 0000 | 0000 | 0000 | 0001 | 1111 |
| 0 0 1 1 0 | 0000 | 0000 | 0000 | 0000 | 0000 | 0000 | 0011 | 1111 |
| 0 0 1 1 1 | 0000 | 0000 | 0000 | 0000 | 0000 | 0000 | 0111 | 1111 |
| 0 1 0 0 0 | 0000 | 0000 | 0000 | 0000 | 0000 | 0000 | 1111 | 1111 |
| 0 1 0 0 1 | 0000 | 0000 | 0000 | 0000 | 0000 | 0001 | 1111 | 1111 |
| 0 1 0 1 0 | 0000 | 0000 | 0000 | 0000 | 0000 | 0011 | 1111 | 1111 |
| 0 1 0 1 1 | 0000 | 0000 | 0000 | 0000 | 0000 | 0111 | 1111 | 1111 |
| 0 1 1 0 0 | 0000 | 0000 | 0000 | 0000 | 0000 | 1111 | 1111 | 1111 |
| 0 1 1 0 1 | 0000 | 0000 | 0000 | 0000 | 0001 | 1111 | 1111 | 1111 |
| 0 1 1 1 0 | 0000 | 0000 | 0000 | 0000 | 0011 | 1111 | 1111 | 1111 |
| 0 1 1 1 1 | 0000 | 0000 | 0000 | 0000 | 0111 | 1111 | 1111 | 1111 |
| 1 0 0 0 0 | 0000 | 0000 | 0000 | 0000 | 1111 | 1111 | 1111 | 1111 |
| 1 0 0 0 1 | 0000 | 0000 | 0000 | 0001 | 1111 | 1111 | 1111 | 1111 |
| 1 0 0 1 0 | 0000 | 0000 | 0000 | 0011 | 1111 | 1111 | 1111 | 1111 |
| 1 0 0 1 1 | 0000 | 0000 | 0000 | 0411 | 1111 | 1111 | 1111 | 1111 |
| 1 0 1 0 0 | 0000 | 0000 | 0000 | 1111 | 1111 | 1111 | 1111 | 1111 |
| 1 0 1 0 1 | 0000 | 0000 | 0001 | 1111 | 1111 | 1111 | 1111 | 1111 |
| 1 0 1 1 0 | 0000 | 0000 | 0011 | 1111 | 1111 | 1111 | 1111 | 1111 |
| 1 0 1 1 1 | 0000 | 0000 | 0111 | 1111 | 1111 | 1111 | 1111 | 1111 |
| 1 1 0 0 0 | 0000 | 0000 | 1111 | 1111 | 1111 | 1111 | 1111 | 1111 |
| 1 1 0 0 1 | 0000 | 0001 | 1111 | 1111 | 1111 | 1111 | 1111 | 1111 |
| 1 1 0 1 0 | 0000 | 0011 | 1111 | 1111 | 1111 | 1111 | 1111 | 1111 |
| 1 1 0 1 1 | 0000 | 0111 | 1111 | 1111 | 1111 | 1111 | 1111 | 1111 |
| 1 1 1 0 0 | 0000 | 1111 | 1111 | 1111 | 1111 | 1111 | 1111 | 1111 |
| 1 1 1 0 1 | 0001 | 1111 | 1111 | 1111 | 1111 | 1111 | 1111 | 1111 |
| 1 1 1 1 0 | 0011 | 1111 | 1111 | 1111 | 1111 | 1111 | 1111 | 1111 |
| 1 1 1 1 1 | 0111 | 1111 | 1111 | 1111 | 1111 | 1111 | 1111 | 1111 |

A value N of "0" thus generates 32 "0's". In some situations however it is preferable that a value of "0" generates 32 "1's". This function is selected by the "%!" modification specified in the "FMOD" field of status register 210 or in bits 52, 54, 56 and 58 of the instruction when executing an extended arithmetic logic unit operation. This function can be implemented by changing the mask generated by mask generator 239 or by modifying the function of arithmetic logic unit 230 so that mask of all "0's" supplied to the C-port operates as if all "1's" were supplied. Note that similar modifications of the other feasible mask functions are possible. Thus the "%!" modification can change a mask generator 239 which generates a mask having N right justified "0's" to all "0's" for N=0. Similarly, the "%!" modification can change a mask generator 239 which generates N left justified "1's" to all "1's" for N=0, or change a mask generator 239 which generates N left justified "0's" to all "0's" for N=0.

Selection of multiple arithmetic modifies the operation of mask generator 239. When the "Asize" field of status register is "110", this selects a data size of 32 bits and the operation of mask generator 239 is unchanged from that shown in Table 17. When the "Asize" field of status register is "101", this selects a data size of 16 bits and mask generator 239 forms two independent 16 bit masks. This is shown in Table 18. Note that in this case the most significant bit of the input to mask generator 239 is ignored. Table 18 shows this bit as a don't care "X".

TABLE 18

| Mask Generator Input | Mask - Half Word Operation | | | | | | | |
|---|---|---|---|---|---|---|---|---|
| X 0 0 0 0 | 0000 | 0000 | 0000 | 0000 | 0000 | 0000 | 0000 | 0000 |
| X 0 0 0 1 | 0000 | 0000 | 0000 | 0001 | 0000 | 0000 | 0000 | 0001 |
| X 0 0 1 0 | 0000 | 0000 | 0000 | 0011 | 0000 | 0000 | 0000 | 0011 |
| X 0 0 1 1 | 0000 | 0000 | 0000 | 0111 | 0000 | 0000 | 0000 | 0111 |
| X 0 1 0 0 | 0000 | 0000 | 0000 | 1111 | 0000 | 0000 | 0000 | 1111 |
| X 0 1 0 1 | 0000 | 0000 | 0001 | 1111 | 0000 | 0000 | 0001 | 1111 |
| X 0 1 1 0 | 0000 | 0000 | 0011 | 1111 | 0000 | 0000 | 0011 | 1111 |
| X 0 1 1 1 | 0000 | 0000 | 0111 | 1111 | 0000 | 0000 | 0111 | 1111 |
| X 1 0 0 0 | 0000 | 0000 | 1111 | 1111 | 0000 | 0000 | 1111 | 1111 |
| X 1 0 0 1 | 0000 | 0001 | 1111 | 1111 | 0000 | 0001 | 1111 | 1111 |
| X 1 0 1 0 | 0000 | 0011 | 1111 | 1111 | 0000 | 0011 | 1111 | 1111 |
| X 1 0 1 1 | 0000 | 0111 | 1111 | 1111 | 0000 | 0111 | 1111 | 1111 |
| X 1 1 0 0 | 0000 | 1111 | 1111 | 1111 | 0000 | 1111 | 1111 | 1111 |
| X 1 1 0 1 | 0001 | 1111 | 1111 | 1111 | 0001 | 1111 | 1111 | 1111 |
| X 1 1 1 0 | 0011 | 1111 | 1111 | 1111 | 0011 | 1111 | 1111 | 1111 |
| X 1 1 1 1 | 0111 | 1111 | 1111 | 1111 | 0111 | 1111 | 1111 | 1111 |

The function of mask generator 239 is similarly modified for a selection of byte data via an "Asize" field of "100". Mask generator 239 forms four independent masks using only the three least significant bits of its input. This is shown in Table 19.

TABLE 19

| Mask Generator Input | Mask - Byte Operation | | | | | | | |
|---|---|---|---|---|---|---|---|---|
| X X 0 0 0 | 0000 | 0000 | 0000 | 0000 | 0000 | 0000 | 0000 | 0000 |
| X X 0 0 1 | 0000 | 0001 | 0000 | 0001 | 0000 | 0001 | 0000 | 0001 |
| X X 0 1 0 | 0000 | 0011 | 0000 | 0011 | 0000 | 0011 | 0000 | 0011 |
| X X 0 1 1 | 0000 | 0111 | 0000 | 0111 | 0000 | 0111 | 0000 | 0111 |
| X X 1 0 0 | 0000 | 1111 | 0000 | 1111 | 0000 | 1111 | 0000 | 1111 |
| X X 1 0 1 | 0001 | 1111 | 0001 | 1111 | 0001 | 1111 | 0001 | 1111 |
| X X 1 1 0 | 0011 | 1111 | 0011 | 1111 | 0011 | 1111 | 0011 | 1111 |
| X X 1 1 1 | 0111 | 1111 | 0111 | 1111 | 0111 | 1111 | 0111 | 1111 |

As noted above, it is feasible to support multiple operations of 8 sections of 4 bits each, 16 sections of 2 bits each and 32 single bit sections. Those skilled in the art would realize that these other data sizes require similar modification to the operation of mask generator 239 as shown above in Tables 17, 18, and 19.

Data unit 110 includes a three input arithmetic logic unit 230. Arithmetic logic unit 230 includes three input busses: input A bus 241 supplies an input to an A-port; input B bus 242 supplies an input to a B-port; and input C bus 243 supplies an input to a C-port. Arithmetic logic unit 230 supplies a resultant to arithmetic logic unit destination bus 204. This resultant may be stored in one of the data registers of data registers 200. Alternatively the resultant may be stored in another register within digital image/graphics processor 71 via buffer 108 and global port destination data bus Gdst 107. This function is called a long distance operation. The instruction specifies the destination of the resultant. Function signals supplied to arithmetic logic unit 230 from function signal generator 245 determine the particular three input function executed by arithmetic logic unit 230 for a particular cycle. Bit 0 carry-in generator 246 forms a carry-in signal supplied to bit 0, the first bit of arithmetic logic unit 230. As previously described, during multiple arithmetic operations bit 0 carry-in generator 246 supplies the carry-in signal to the least significant bit of each of the multiple sections.

Figure 19:
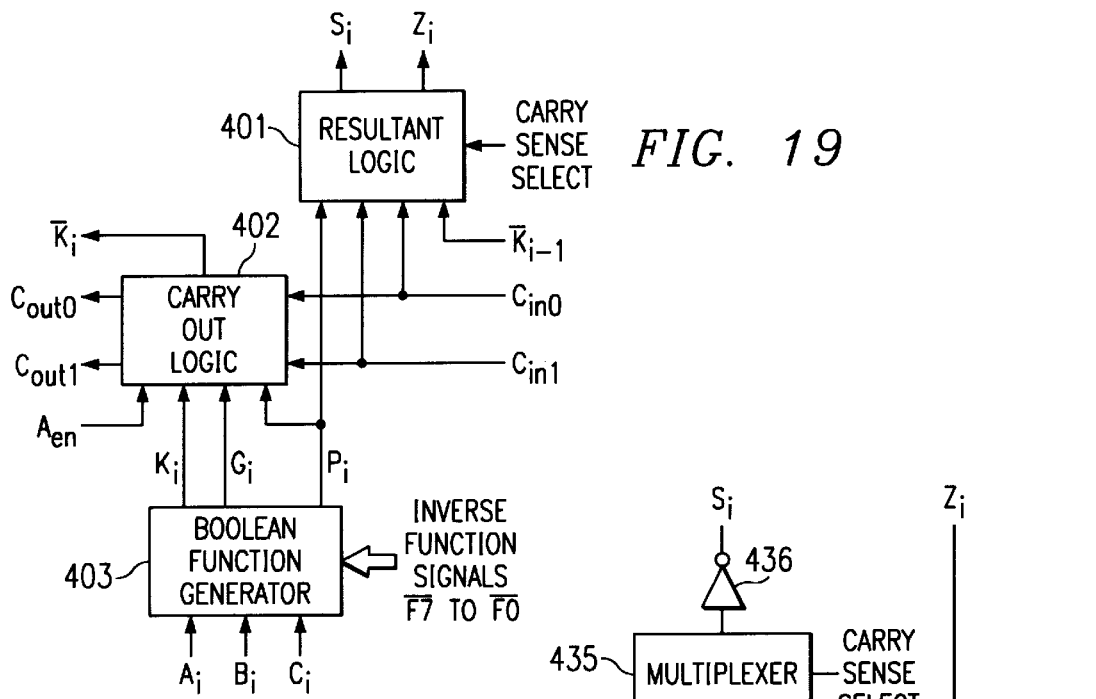
FIG. 19 illustrates in block diagram form the construction of one bit circuit of the arithmetic logic unit of the data unit illustrated in FIG. 5.

FIG. 19 illustrates in block diagram form the construction of an exemplary bit circuit 400 of arithmetic logic unit 230. Arithmetic logic unit 230 preferably operates on data words of 32 bits and thus consists of 32 bit circuits 400 in parallel. Each bit circuit 400 of arithmetic logic unit 230 receives: the corresponding bits of the three inputs $A_i$, $B_i$ and $C_i$; a zero carry-in signal designated $c_{in0}$ from the previous bit circuit 400; a one carry-in signal designated $c_{in1}$ from the previous bit circuit 400; an arithmetic enable signal $A_{en}$; an inverse kill signal $\overline{K}_{i-1}$ from the previous bit circuit; a carry sense select signal for selection of carry-in signal $c_{in0}$ or $c_{in1}$; and eight inverse function signals $\overline{F7}$–$\overline{F0}$. The carry-in signals $c_{in0}$ and $c_{in1}$ for the first bit (bit 0) are identical and are generated by a special circuit that will be described below. Note that the input signals $A_i$, $B_i$ and $C_i$ are formed for each bit of arithmetic logic unit 230 and may differ. The arithmetic enable signal $A_{en}$ and the inverted function signals $\overline{F7}$–$\overline{F0}$ are the same for all of the 32 bit circuits 400. Each bit circuit 400 of arithmetic logic unit 230 generates: a corresponding one bit resultant $S_i$; an early zero signal $Z_i$; a zero carry-out signal designated $c_{out0}$ that forms the zero carry-in signal $c_{in0}$ for the next bit circuit; a one carry-out signal designated $c_{out1}$ that forms the one carry-in signal $c_{in1}$ for the next bit circuit; and an inverse kill signal $\overline{K}_i$ that forms the inverse kill signal $\overline{K}_{i-1}$ for the next bit circuit. A selected one of the zero cariy-out signal $c_{out0}$ or the one carry-out signal $c_{out1}$ of the last bit in the 32 bit arithmetic logic unit 230 is stored in status register 210, unless the "C" bit is protected from change for that instruction. In addition during multiple arithmetic the instruction may specify that carry-out signals from separate arithmetic logic unit sections be stored in multiple flags register 211. In this event the selected zero carry-out signal $c_{out0}$ or the one carry-out signal $c_{out1}$ will be stored in multiple flags register 211.

Bit circuit 400 includes resultant generator 401, carry out logic 402 and Boolean function generator 403. Boolean function generator 403 forms a Boolean combination of the respective bits inputs $A_i$, $B_i$ and $C_i$ according to the inverse function signals $\overline{F7}$–$\overline{F0}$. Boolean function generator produces a corresponding propagate signal $P_i$, a generate signal $G_i$ and a kill signal $K_i$. Resultant logic 401 combines the propagate signal $P_i$ with one of the carry-in signal $c_{in0}$ or carry-in signal $c_{in1}$ from a prior bit circuit 400 as selected by the carry sense select signal and forms the bit resultant $S_i$ and an early zero signal $Z_i$. Carry out logic 402 receives the propagate signal $P_i$, the generate signal $G_i$, the kill signal $K_i$, the two carry-in signals $c_{in0}$ and $c_{in1}$ and an arithmetic enable signal $A_{en}$. Carry out logic 402 produces two carry-out signals $c_{out0}$ and $c_{in1}$ that are supplied to the next bit circuit 400.

Figure 20:
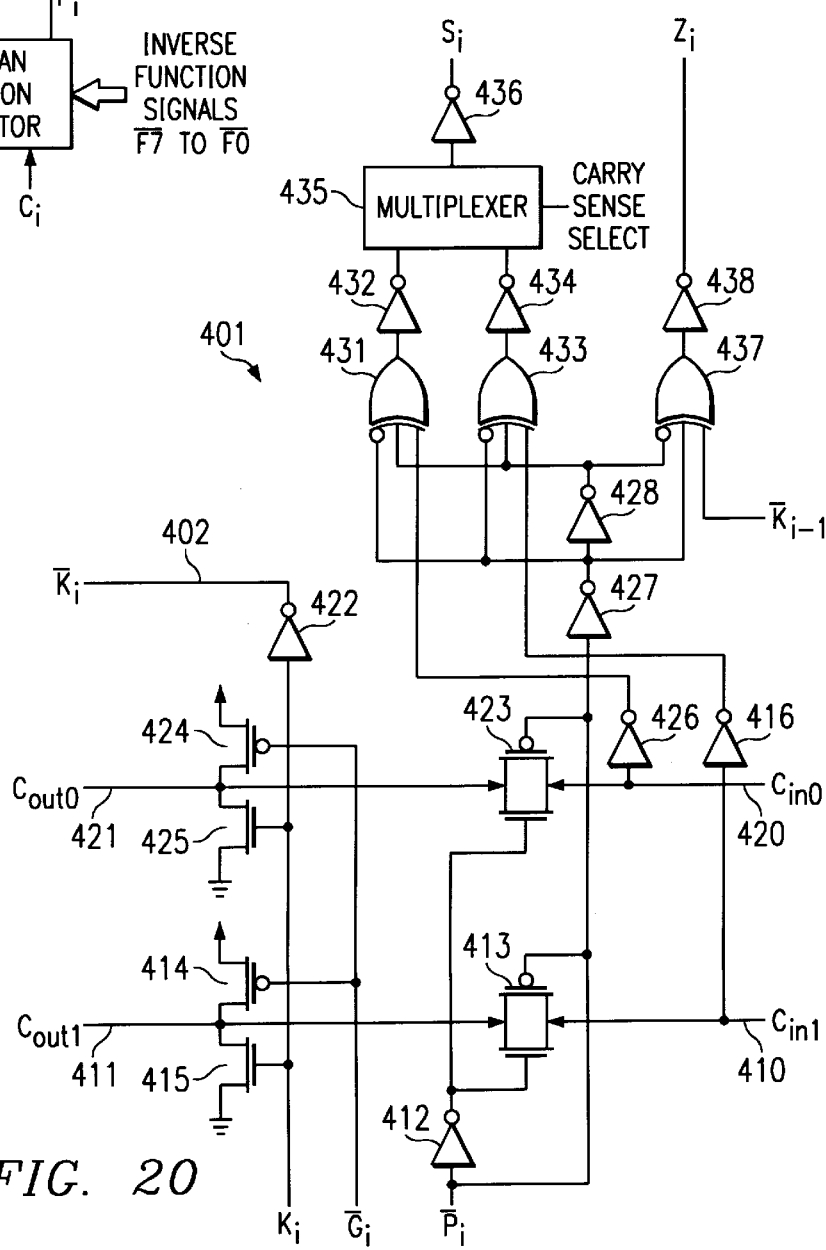
FIG. 20 illustrates in schematic form the construction of the resultant logic and carry out logic of the bit circuit illustrated in FIG. 19.
Figure 21:
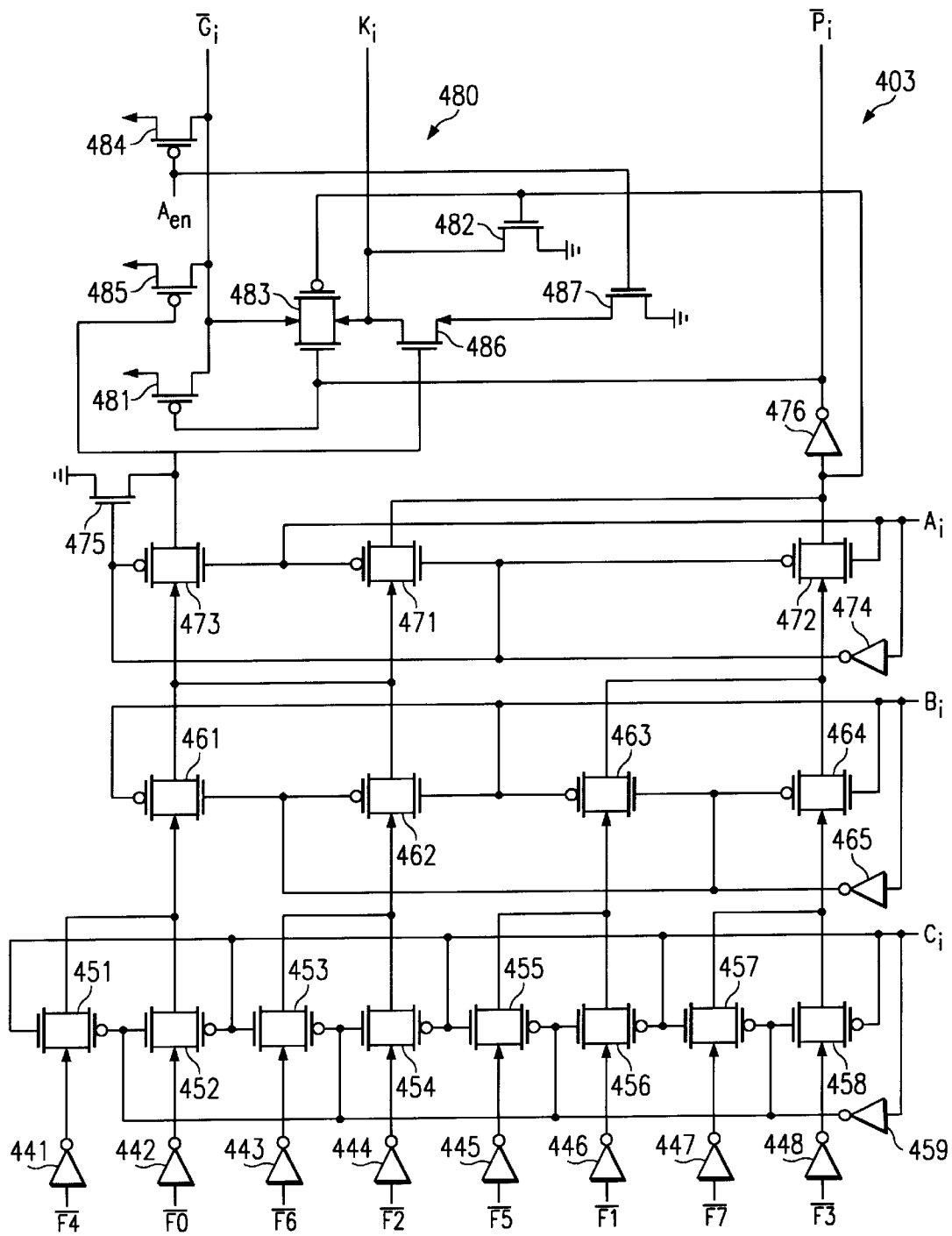
FIG. 21 illustrates in schematic form the construction of the Boolean function generator of the bit circuit illustrated in FIG. 19.

FIGS. 20 and 21 together illustrate an exemplary bit circuit 400 of arithmetic logic unit 230. FIG. 20 illustrates the details of a resultant logic 401 and carry out logic 402 of each bit circuit 400 of arithmetic logic unit 230. FIG. 21 illustrates the details of the corresponding Boolean function generator 403 of each bit circuit 400 of arithmetic logic unit 230.

Each resultant logic 401 generates a corresponding resultant signal $S_i$ and an early zero signal $Z_i$. Resultant logic 420 forms these signals from the two carry-in signals, an inverse propagate signal $\overline{P}_i$, an inverse kill signal $\overline{K}_{i-1}$ from the previous bit circuit and a carry sense select signal. The carry out logic 402 forms two carry-out signals and an inverse kill signal $\overline{K}_i$. These signals are formed from the two carry-in signals, an inverse propagate signal $\overline{P}_i$, an inverse generate signal $\overline{G}_i$ and a kill signal $K_i$ for that bit circuit 400. Each propagate signal indicates whether a "1" carry-in signal propagates through the bit circuit 400 to the next bit circuit 400 or is absorbed. The generate signal indicates whether the inputs to the bit circuit 400 generate a "1" carry-out signal to the next bit circuit 400. The kill signal indicates whether the input to the bit circuit 400 generate a "0" carry-out signal to the next bit circuit. Note that the propagate signal $P_i$, the generate signal $G_i$ and the kill signal $K_i$ are mutually exclusive. Only one of these signals is generated for each combination of inputs.

Each bit circuit 400 of arithmetic logic unit 230 employs a technique to reduce the carry ripple time through the 32 bits. Arithmetic logic unit 230 is divided into carry sections, preferably 4 sections of 8 bits each. The least significant bit circuit 400 of each such section has its zero carry-in signal $c_{in0}$ hardwired to "0" and its one carry-in signal $c_{in1}$ hardwired to "1". Each bit circuit 400 forms two resultants and two carry-out signals to the next bit circuit. Once the carry ripple through each section is complete, the actual carry output from the most significant bit of the previous carry section forms the carry sense select signal. This carry select signal permits selection of the actual resultant generated by the bits of a section via a multiplexer. The first carry section receives its carry select signal from bit 0 carry-in generator 246 described in detail below. This technique permits the carry ripple through the carry sections to take place simultaneously. This reduces the length of time required to generate the resultant at the cost of some additional hardware for the redundant carry lines and the carry sense selection.

Carry out logic 402 controls transformation of the carry-in signals into the carry-out signals. Carry out logic 402 includes identical circuit operating on the two carry-in signals $c_{in0}$ and $c_{in1}$. The inverse propagate signal $\overline{P}_i$ and its inverse, the propagate signal $P_i$ formed by invertor 412, control pass gates 413 and 423. If the propagate signal $P_i$ is "1", then one carry-in line 410 is connected to one carry-out line 411 via pass gate 413 and zero carry-in line 420 is connected to zero carry-out line 421 via pass gate 423. Thus the carry-in signal is propagated to the carry-out. If the propagate signal $P_i$ is "0", then one carry-in line 410 is isolated from one carry-out line 411 and zero carry-in line 420 is isolated from carry-out line 421. If the generate signal $G_i$ is "1", that is if the inverse generate signal $\overline{G}_i$ is "0", then P-channel MOSFET (metal oxide semiconductor field effect transistor) 414 is turned on to couple the supply voltage to carry-out line 411 and P-channel MDSFET 424 is turned on to couple the supply voltage to carry-out line 421. If the generate signal $G_i$ is "0", that is if the inverse generate signal $\overline{G}_i$ is "1", then the P-channel MOSFETs 414 and 424 are cut off and do not affect the carry-out lines 411 and 421. If the kill signal $K_i$ is "1", then N-channel MOSFET 415 couples ground to carry-out line 411 and N-channel MOSFET 425 couples ground to carry-out line 421. If the kill signal $K_i$ is "0", then the N-channel MOSFETs 415 and 425 are cut off and do not affect the carry-out lines 411 and 421. Invertor 422 generates the inverse kill signal $\overline{K}_i$ supplied to the next bit circuit.

Exclusive OR circuits 431 and 433 form the two resultants of resultant logic 401. Exclusive OR circuits 431 and 433 each receive the propagate signal $P_i$ from invertor 427 on an inverting input and the inverse propagate signal $\overline{P}_i$ from invertor 428 on a noninverting input. Exclusive OR circuit 431 receives the inverse zero carry-in signal $\overline{c}_{in0}$ from invertor 426 on a noninverting input and forms the resultant for the case of a "0" carry-in to the least significant bit of the current carry section. Likewise, exclusive OR circuit 433 receives the inverse one carry-in signal $\overline{c}_{in1}$ from invertor 416 on a noninverting input and forms the resultant for the case of a "1" carry-in to the least significant bit of the current carry section. Invertors 432 and 434 supply inputs to multiplexer 435. Multiplexer 435 selects one of these signals based upon the carry sense select signal. This carry sense select signal corresponds to the actual carry-out signal from the most significant bit of the previous carry section. The inverted output of multiplexer 435 from invertor 436 is the desired bit resultant $S_i$.

Resultant logic 401 also forms an early zero signal $Z_i$ for that bit circuit. This early zero signal $Z_i$ gives an early indication that the resultant $S_i$ of that bit circuit 400 is going to be "0". Exclusive OR circuit 437 receives the propagate signal $P_i$ from invertor 427 on an inverting input and the inverse propagate signal $\overline{P}_i$ from invertor 428 on a noninverting input. Exclusive OR circuit 437 also receives the inverse kill signal $\overline{K}_{i-1}$ from the previous bit circuit 400 on a noninverting input. Exclusive OR circuit 437 forms early zero signal $Z_i$ for the case in which the previous bit kill signal $K_{i-1}$ generates a "0" carry-out signal and the propagate signal $P_i$ is also "0". Note that if $K_{i-1}$ is "0", then both the zero carry-out signal $c_{out0}$ and the one carry-out signal $c_{out1}$ are "0" whatever the state of the carry-in signals $C_{in0}$ and $c_{in1}$. Note that this early zero signal $Z_i$ is available before the carry can ripple through the carry section. This early zero signal $Z_i$ may thus speed the determination of a zero output from arithmetic logic unit 230.

Boolean function generator 403 of each bit circuit 400 of arithmetic logic unit 230 illustrated in FIG. 21 generates the propagate signal $P_i$, the generate signal $G_i$ and the kill signal $K_i$ for bit circuit 400. Boolean function generator 403 consists of four levels. The first level includes pass gates 451, 452, 453, 454, 455, 456, 457 and 458. Pass gates 451, 453, 455 and 457 are controlled in a first sense by input $C_i$ and inverse input $\overline{C}_i$ from invertor 459. Pass gates 452, 454, 456 and 458 are controlled in an opposite sense by input $C_i$ and inverse input $\overline{C}_i$. Depending on the state of input $C_i$, either pass gates 451, 453, 455 and 457 are conductive or pass gates 452, 454, 456 and 458 are conductive. The second level includes pass gates 461, 462, 463 and 464. Pass gates 461 and 463 are controlled in a first sense by input $B_i$ and inverse input $\overline{B}_i$ from invertor 465. Pass gates 462 and 464 are controlled in the opposite sense. Depending on the state of input $B_i$, either pass gates 461 and 463 are conductive or pass gates 462 and 464 are conductive. The third level includes pass gates 471, 472 and 473. Pass gates 471 is controlled in a first sense by input $A_i$ and inverse input $\overline{A}_i$ from invertor 473. Pass gates 472 and 473 are controlled in the opposite sense. Depending on the state of input $A_i$, either pass gates 471 is conductive or pass gates 472 and 473 are conductive. The first level includes invertors 441, 442, 443, 444, 445, 446, 447 and 448 that are coupled to corresponding inverted function signals $\overline{F7}$–$\overline{F0}$. Invertors 441, 442, 443, 444, 445, 446, 447 and 448 provide input drive to Boolean function generator 403 and determine the logic function performed by arithmetic logic unit 230.

Boolean function generator 403 forms the propagate signal $P_i$ based upon the corresponding input signals $A_i$, $B_i$ and $C_i$ and the function selected by the state of the inverted function signals $\overline{F7}$–$\overline{F0}$. The propagate signal $P_i$ at the input to invertor 476 is "1" if any path through pass gates 451, 452, 453, 454, 455, 456, 457, 458, 461, 462, 463, 461, 471 or 472 couples a "1" from one of the invertors 441, 4412, 443, 444, 445, 446, 447 or 448. In all other cases this propagate signal $P_i$ is "0". Invertor 476 forms the inverse propagate signal $\overline{P}_i$, which is connected to resultant logic 401 illustrated in FIG. 20.

Each pass gate 451, 452, 453, 454, 455, 456, 457, 458, 461, 462, 463, 464, 471, 472 and 473 consists of an N-channel MOSFET and a P-channel MOSFET disposed in parallel. The gate of the N-channel MOSFET receives a control signal. This field effect transistor is conductive if its gate input is above the switching threshold voltage. The gate of the P-channel MOSFET is driven by the inverse of the control signal via one of the invertors 459, 465 or 474. This field effect transistor is conductive if its gate input is below a switching threshold. Because the P-channel MOSFET operates in inverse to the operation of N-channel MOSFET, the corresponding invertor 459, 467 or 474 assures that these two field effect transistors are either both conducting or both non-conducting. The parallel N-channel and P-channel field effect transistors insure conduction when desired whatever the polarity of the controlled input.

Tri-state AND circuit 480 forms the generate signal $G_i$ and the kill signal $K_i$. The generate signal $G_i$, the kill signal $K_1$ and the propagate signal $P_i$ are mutually exclusive in the preferred embodiment. Therefore the propagate signal $P_i$ controls the output of tri-state AND circuit 480. If the propagate signal $P_i$ is "1", then tri-state AND circuit 480 is disabled and both the generate signal $G_i$ and the kill signal $K_i$ are "0". Thus neither the generate signal $G_i$ nor the kill signal $K_i$ change the carry signal. Pass gate 473 couples the output from part of Boolean function generator 403 to one input of tri-state AND circuit 480. The gate inputs of pass gate 473 are coupled to the first input bit $A_i$ in the first sense. An N-channel MOSFET 475 conditionally couples this input of tri-state AND circuit 480 to ground. The inverse of the first input bit $\overline{A}_i$ supplies the gate input to N-channel MOSFET 475. Pass gate 473 and N-channel MOSFET 475 are coupled in a wired OR relationship, however no OR operation takes place because their gate inputs cause them to be conductive alternately. N-channel MOSFET 475 serves to force a "0" input into tri-state AND circuit 480 when $A_i$="0". An arithmetic enable signal supplies the second input to tri-state AND circuit 480.

The tri-state AND gate 480 operates as follows. If the propagate signal $P_i$ is "1", then both P-channel MOSFET 481 and N-channel MOSFET 482 are conductive and pass gate 483 is non-conductive. This cuts off P-channel MOSFETs 414 and 424 and N-channel MOSFETs 415 and 425 so that none of these field effect transistor conducts. The output of tri-state AND circuit 480 thus is a high impedance state that does not change the signal on the carry-out lines 411 and 421. If the propagate signal $P_i$ is "0", then both P-channel MDSFET 481 and N-channel MOSFET 482 are non-conductive and pass gate 483 is conductive. The circuit then forms a logical AND of the two inputs. If either arithmetic enable or the signal at the junction of N-channel MOSFET 475 and pass gate 473 is "0" or both are "0", then at least one of P-channel MOSFET 484 or P-channel MOSFET 485 connects the supply voltage V+ (a logic "1") as the inverse generate signal $\overline{G}_i$ to the gates of P-channel MOSFETs 414 and 424 of carry out logic 402. Thus P-channel MOSFETs 414 and 424 are non-conductive. At the same time pass gate 483 is conductive and supplies this "1" signal as kill signal $K_i$ to the gates of N-channel MOSFETs 415 and 425 of carry out logic 402. This actively pulls down the signal on zero carry-out line 421 forcing the zero carry-out signal $c_{out0}$ to "0" and one carry-out line 411 forcing the one carry-out signal $c_{out1}$ to "0". If both the inputs are "1", then the series combination of N-channel MOS3FET 486 and N-channel MOSFET 487 supplies ground (a logic "0") to the gates of N-channel MOSFETs 415 and 425. N-channel MOSFETs 415 and 425 of carry out logic 402 are cut off and non-conductive. At the same time pass gate 483 couples this "0" to the gates of P-channel MOSFETs 414 and 424. Thus P-channel MOSFETs 414 and 424 of carry out logic 402 are conductive. This actively pulls up the signal on zero carry-out line 421 forcing the zero carry-out signal $c_{out0}$ to "1" and one carry-out line 411 forcing the one carry-out signal $c_{out1}$ to "1".

The bit circuit construction illustrated in FIGS. 20 and 21 forms a propagate term, a generate term, a resultant term and two carry-out terms. Bit circuit 400 forms the propagate term $P_i$ as follows:

$$P_i = F0 \&(\sim A_i \& \sim B_i \& \sim C_i) \mid F1 \&( A_i \& \sim B_i \& \sim C_i) \mid F2 \&(\sim A_i \& B_i \& \sim C_i)$$
$$\mid F3 \&( A_i \& B_i \& \sim C_i) \mid F4 \&(\sim A_i \& \sim B_i \& C_i) \mid F5 \&( A_i \& \sim B_i \& C_i)$$
$$\mid F6 \&(\sim A_i \& B_i \& C_i) \mid F7 \&( A_i \& B_i \& C_i)$$

Bit circuit 400 forms the generate term $G_i$ as follows:

$$G_i = A_i \& [ (F0 \& \sim F1 \& \sim B_i \& \sim C_i) \mid (F2 \& \sim F3 \& B_i \& \sim C_i)$$
$$\mid (F4 \& \sim F5 \& \sim B_i \& C_i) \mid (F6 \& \sim F7 \& B_i \& C_i) ]$$

Bit circuit 400 forms the kill terms $K_i$ as follows:

$$K_i = \sim G_i \& \sim P_i$$

Bit circuit 400 forms the resultant term $S_i$ as follows:

$$S_i = P_i (c_{in0} \& CSS \mid c_{in1} \& \sim CSS)$$

where: CSS is the carry sense select signal. Bit circuit 400 forms the two carry-out signals $c_{out0}$ and $c_{out1}$ as follows:

$$c_{out0} = (P_i \& c_{in0}) \mid (G_i \& A_{en}) \mid \sim (K_i \& A_{en})$$

$$c_{out1} = (P_i \& c_{in1}) \mid (G_i \& A_{en}) \mid \sim (K_i \& A_{en})$$

Note that for any particular bit i the propagate signal $P_i$, the generate signal $G_i$ and the kill signal $K_i$ are mutually exclusive. No two of these signals occurs simultaneously.

The construction of each bit circuit 400 enables arithmetic logic unit 230 to perform any one of 256 possible 3 input Boolean functions or any one of 256 possible 3 input mixed Boolean and arithmetic functions depending upon the inverted function signals $\overline{F7}$–$\overline{F0}$. The nine inputs including the arithmetic enable signal and the inverted function signals $\overline{F7}$–$\overline{F0}$ permit the selection of 512 functions. As will be further described below the data paths of data unit 110 enable advantageous use of three input arithmetic logic unit 230 to speed operations in many ways.

Table 20 lists the simple Boolean logic functions of bit circuit 400 in response to single function signals $\overline{F7}$–$\overline{F0}$. Since these are Boolean logic functions and the arithmetic enable signal is "0", both the generate and kill functions are disabled. Note that for Boolean extended arithmetic logic unit operations it is possible to specify the carry-in signals $c_{in0}$ and $c_{in1}$ from bit 0 carry-in generator 246 as previously described, thus permitting a carry ripple.

TABLE 20

| 8-bit ALU code field | Function Signal | Logical Operation |
|---|---|---|
| 58 | F7 | A & B & C |
| 57 | F6 | ~A & B & C |
| 56 | F5 | A & ~B & C |
| 55 | F4 | ~A & ~B & C |
| 54 | F3 | A & B & ~C |
| 53 | F2 | ~A & B & ~C |
| 52 | F1 | A & ~B & ~C |
| 51 | F0 | ~A & ~B & ~C |

These functions can be confirmed by inspecting FIGS. 20 and 21. For the example of F7="1" and F6–F0 all equal to "0", invertors 441, 442, 443, 444, 446, 447 and 448 each output a "0". Only invertor 445 produces a "1" output. The propagate signal is "1" only if $C_i$="1" turning on pass gate 455, $B_i$="1" turning on pass gate 463 and $A_i$="1" turning on pass gate 472. All other combinations result in a propagate signal of "0". Since this is a logical operation, both the zero carry-in signal $c_{in0}$ and the one carry-in signal $c_{in1}$ are "0". Thus $S_i$="1" because both exclusive OR circuits 431 and 433 return the propagate signal. The other entries on Table 20 may be similarly confirmed.

A total of 256 Boolean logic functions of the three inputs A, B and C are enabled by proper selection of function signals F7–F0. Note that the state table of three inputs includes 8 places, thus there are $2^8$=256 possible Boolean logic functions of three inputs. Two input functions are subset functions achieved by selection of function signals F7–F0 in pairs. Suppose that a Boolean function of B and C, without relation to input A, is desired selection of F7=F6, F5=F4, F3=F2 and F1=F0 assures independence from input A. Note that the branches of Boolean function generator 403 connected to pass gates 471 and 472 are identically driven. This ensures that the result is the same whether $A_1$="1" or $A_1$="0". Such a selection still provides 4 controllable function pairs permitting specification of all 16 Boolean logic functions of inputs B and C. Note that the state table of two inputs includes four places, thus there are $2^4$=16 possible Boolean logic functions of three inputs. Similarly, selection of F7=F5, F6=F4, F3=F1 and F2=F0 ensures independence from input B and provides 4 controllable function pairs for specification of 16 Boolean logic functions of inputs A and C. Selection of F7=F3, F6=F2, F5=F1 and F4=F0 permits selection via 4 controllable function pairs of 16 Boolean logic functions of inputs A and B independent of input C.

The instruction word determines the function performed by arithmetic logic unit 230 and whether this operation is arithmetic or Boolean logic. As noted in Table 20, the instruction word includes a field coded with the function signals for Boolean logic operations. This field, the "8 bit arithmetic logic unit" field (bits 58–51) of the instruction word, is directly coded with the function signals when the instruction specifies a Boolean logic operation for arithmetic logic unit 230.

The "8 bit arithmetic logic unit" field is differently coded when the instruction specifies arithmetic operations. Study of the feasible arithmetic functions indicates that a subset of these arithmetic functions specify the most often used operations. If the set of function signals F7–F0 is expressed as a two place hexadecimal number, then these most often used functions are usually formed with only the digits a, 9, 6 and 5. In these sets of function signals F7=~F6, F5=~F4, F3=~F2 and F1=~F0. Bits 57, 55, 53 and 51 specify fifteen operations, with an "8 bit arithmetic logic unit" field of all zeros reserved for the special case of non-arithmetic logic unit operations. Non-arithmetic logic unit operations will be described below. When executing an arithmetic operation function signal F6=bit 57, function signal F4=bit 55, function signal F4=bit 53 and function signal F2=bit 51. The other function signals are set by F7=~F6, F5=~F4, F3=~F2 and F1=~F0. These operations and their corresponding function signals are shown in Table 21. Table 21 also shows the modifications to the default coding.

TABLE 21

| 8-bit ALU code field | | | | Derived Function Signal | | |
|---|---|---|---|---|---|---|
| 5 7 | 5 5 | 5 3 | 5 1 | FFFFFFFF 76543210 | Hex | Description of operation |
| 0 | 0 | 0 | 0 | 10101010 | AA | reserved for non-arithmetic logic unit operations |
| 0 | 0 | 0 | 1 | 10101001 | A9 | A–B shift left "1" extend |
| 0 | 0 | 1 | 0 | 10100110 | A6 | A+B shift left "0" extend |
| 0 | 0 | 1 | 1 | 10100101 | A5 | A–C |
| 0 | 1 | 0 | 0 | 10011010 | 9A | A–B shift right "1" extend if sign=0 flips to 95 A–B shift right sign extend |
| 0 | 1 | 0 | 1 | 10011001 | 99 | A–B |
| 0 | 1 | 1 | 0 | 10010110 | 96 | A+B/A–B depending on C if ~@MF flips to 99 A–B if sign=1 A+\|B\| |
| 0 | 1 | 1 | 1 | 10010101 | 95 | A–B shift right "0" extend |
| 1 | 0 | 0 | 0 | 01101010 | 6A | A+B shift right "0" extend |
| 1 | 0 | 0 | 1 | 01101001 | 69 | A–B/A+B if ~@MF flips to 66 A+B if sign=1 A–\|B\| |
| 1 | 0 | 1 | 0 | 01100110 | 66 | A+B |
| 1 | 0 | 1 | 1 | 01100101 | 65 | A+B shift right "1" extend if sign=0 flips to 6A A+B shift right sign extend |
| 1 | 1 | 0 | 0 | 01011010 | 5A | A+C |
| 1 | 1 | 0 | 1 | 01011001 | 59 | A–B shift left "0" extend |
| 1 | 1 | 1 | 0 | 01010110 | 56 | A+B shift left "1" extend |
| 1 | 1 | 1 | 1 | 01100000 | 60 | (A&C) + (B&C), field A+B |

Several codings of instruction word bits 57, 55, 53 and 51 are executed in modified form as shown in Table 21. Note that the functions that list left or right shifts are employed in conjunction with barrel rotator 235 and mask generator 238. These operations will be explained in detail below. The "sign" referred to in this description is bit 31 of arithmetic logic unit second input bus 206, the bus driving barrel rotator 235. This is the sign bit of a signed number. A "0" in this sign bit indicates a positive number and a "1" in this sign bit indicates a negative (two's complement) number. A bit 57, 55, 53 and 51 state of "0100" results in a normal function of A–B with shift right "1" extend. If bit 31 of arithmetic logic unit second input bus 206 is "0", then the operation changes to A–B with shift right sign extend. A bit 57, 55, 53 and 51 state of "0110" results in a normal function of A–B or A+B depending on the bit wise state of C. If the instruction does not specify a multiple flags register mask operation (@MF) then the operation changes to A–B. If bit 31 of arithmetic logic unit second input bus 206 is "1", then the operation changes to A+\|B\| (A plus the absolute value of B). A bit 57, 55, 53 and 51 state of "1011" results in a normal function of A+B or A−B depending on the bit wise state of C. If the instruction does not specify a multiple flags register mask operation (~@MF) then the operation changes to A+B. If bit 31 of arithmetic logic unit second input bus 206 is "1", then the operation changes to A−|B| (A minus the absolute value of B) . A bit 57, 55, 53 and 51 state of "1001" results in a normal function of A+B with shift right "1" extend. If bit 31 of arithmetic logic unit second input bus 206 is "0", then the operation changes to A+B with shift right sign extend.

Two codes are modified to provide more useful functions. A bit 57, 55, 53 and 51 state of "0000" results in a normal function of ~A (not A), which is reserved to support non-arithmetic logic unit operations as described below. A bit 57, 55, 53 and 51 state of "1111" results in a normal function of A. This is modified to (A&C)+(B&C) or a field add of A and B controlled by the state of C.

The base set of operations listed in Table 21 may be specified in arithmetic instructions. Note that instruction word bits 58, 56, 54 and 52 control modifications of these basic operations as set forth in Table 6. These modifications were explained above in conjunction with Table 6 and the description of status register 210. As further described below certain instructions specify extended arithmetic logic unit operations. It is still possible to specify each of the 256 arithmetic operations via an extended arithmetic logic unit (EALU) operation. For these instructions the "A" (bit 27) of data register D0 specifies either an arithmetic or Boolean logic operation, the "EALU" field (bits 26–19) specifies the function signals F7–F0 and the "FMOD" field (bits 31–28) specifies modifications of the basic function. Also note that the "C", "I", "S", "N" and "E" fields of data register D0 permit control of the carry-in to bit 0 of arithmetic logic unit 230 and to the least significant bit of each section if multiple arithmetic is enabled. There are four forms of extended arithmetic logic unit operations. Two of these specify parallel multiply operations using multiplier 220. In an extended arithmetic logic unit true (EALUT) operation, the function signals F7–F0 equal the corresponding bits of the "EALU" field of data register D0. In an extended arithmetic logic unit false (EALUF) operation, the individual bits of the "EALU" field of data register D0 are inverted to form the function signals F7–F0. The extended arithmetic logic unit false operation is useful because during some algorithms the inverted functions signals perform a useful related operation. Inverting all the function signals typically specifies an inverse function. Thus this related operation may be accessed via another instruction without reloading data register 208. In the other extended arithmetic logic unit operations the function signals F7–F0 equal the corresponding bits of the "EALU" field of data register D0, but differing data paths to arithmetic logic unit 230 are enabled. These options will be explained below.

Data unit 110 operation is responsive to instruction words fetched by program flow control unit 130. Instruction decode logic 250 receives data corresponding to the instruction in the execute pipeline stage via opcode bus 133. Instruction decode logic 250 generates control signals for operation of multiplexers Fmux 221, Imux 222, MSmux 225, Bmux 227, Amux 232, Cmux 233, Mmux 234 and Smux 231 according to the received instruction word. Instruction decode logic 250 also controls operation of buffers 104, 106, 108, 223 and 236 according to the received instruction word. Control lines for these functions are omitted for the sake of clarity. The particular controlled functions of the multiplexers and buffers will be described below on description of the instruction word formats in conjunction with FIG. 43. Instruction decode logic 250 also supplies partially decoded signals to function signal generator 245 and bit 0 carry-in generator 246 for control of arithmetic logic unit 230. Particular hardware for this partial decoding is not shown, however, one skilled in the art would be able to provide these functions from the description of the instruction word formats in conjunction with FIG. 43. Instruction decode logic 250 further controls the optional multiple section operation of arithmetic logic unit 230 by control of multiplexers 311, 312, 313 and 314, previously described in conjunction with FIG. 7.

Figure 22:
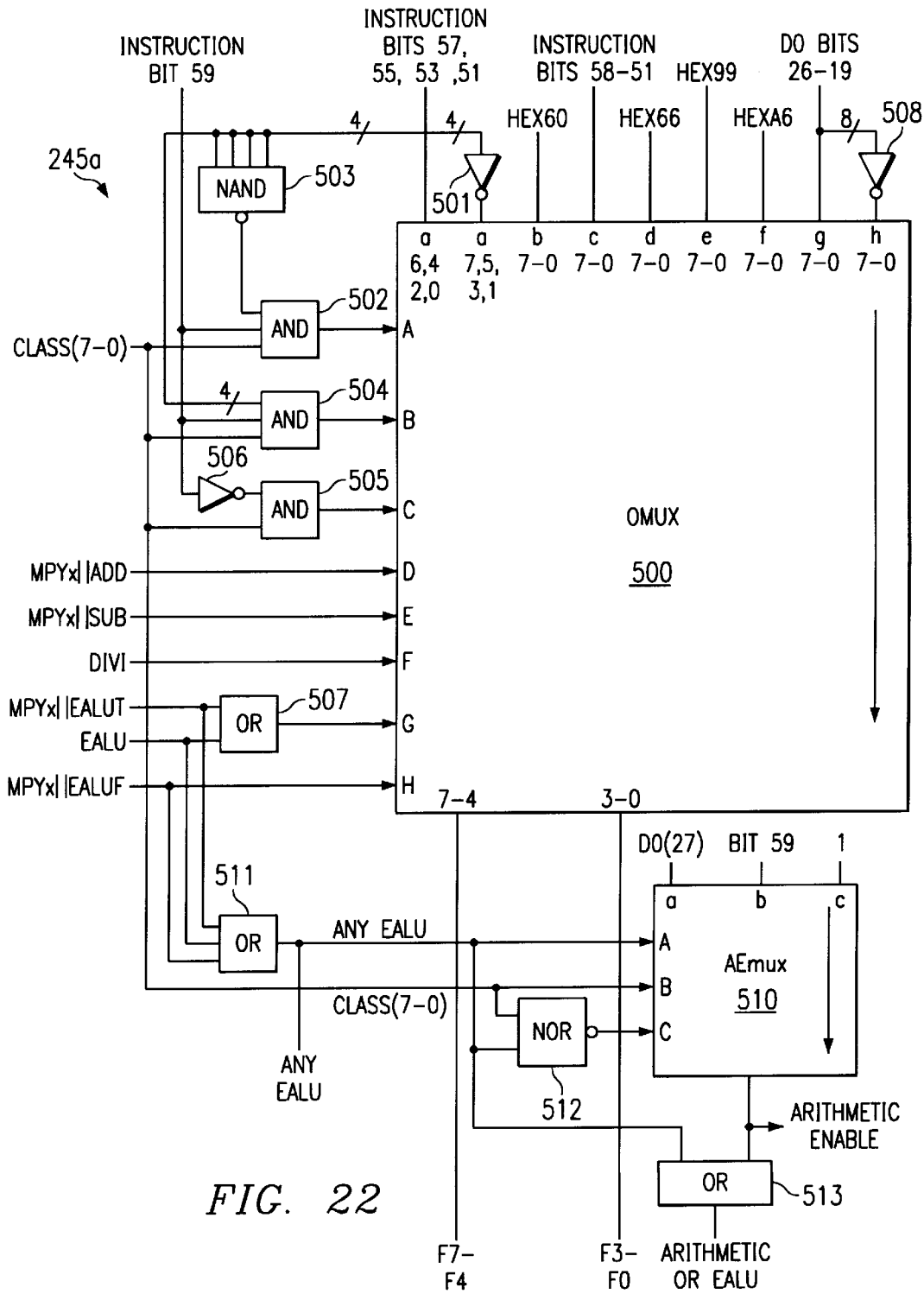
FIG. 22 illustrates in block diagram form the function signal selector of the function signal generator of the data unit illustrated in FIG. 5.

FIG. 22 illustrates details of the function signal selector 245a. Function signal selector 245a forms a part of function signal generator 245 illustrated in FIG. 5. For a full picture of function signal generation, FIG. 22 should be considered with the function signal modifier 245b illustrated in FIG. 23. Multiplexers are shown by rectangles having an arrow representing the flow of bits from inputs to outputs. Inputs are designated with lower case letters. Control lines are labeled with corresponding upper * case letters drawn entering the multiplexer rectangle perpendicular to the arrow. When a control lines designated with a particular upper case letter is active, then the input having the corresponding lower case letter is selected and connected to the output of the multiplexer.

Input "a" of multiplexer Omux 500 receives an input in two parts. Bits 57, 55, 53 and 51 of the instruction word are connected to bit lines 6, 4, 2 and 0 of input "a", respectively. Invertor 501 inverts the respective instruction word bits and supplies them to bit lines 7, 5, 3 and 1 of input "a". Input "a" is selected if control line "A" goes active, and when selected the eight input bit lines are connected to their eight corresponding numbered output bit lines 7–4 and 3–0. Control line "A" is fed by AND gate 502. AND gate 503 receives a first input indicating execution of an instruction in any of the instruction classes 7–0. Instruction word bit 63 indicates this. These instruction classes will be further described below. AND gate 502 has a second input fed by bit 59 of the instruction word. As will be explained below, a bit 59 equal to "1" indicates an arithmetic operation. NAND gate 503 supplies a third input to AND gate 502. NAND gate 503 senses when any of the four instruction word bits 57, 55, 53 or 51 is low. Control input "A" is thus active when any of the instruction classes 7–0 is selected, and arithmetic bit 59 of the instruction word is "1" and instruction word bits 57, 55, 53 and 51 are not all "1'". Recall from Table 21 that a bit 57, 55, 53 and 51 state of "1111" results in the modified function signals Hex "60" rather than the natural function signals.

Input "b" to multiplexer Omux 500 is a constant Hex "60". Multiplexer Omux 500 selects this input if AND gate 504 makes the control "B" active. AND gate 504 makes control "B" active if the instruction is within classes 7–0 as indicate by instruction word bit 63, the instruction word bit 59 is "1" indicating an arithmetic operation, and a bit 57, 55, 53 and 51 state of "1111". As previously described in conjunction with Table 21, under these conditions the function Hex "60" is substituted for the function signals indicated by the instruction.

Input "c" to multiplexer Omux 500 receives all eight instruction word bits 58–51. Multiplexer Omux 500 selects this input if AND gate 505 makes control "C" active. AND gate 505 receives instruction word bit 59 inverted via invertor 506 and an indication of any of the instruction classes 7–0. Thus instruction word bits 58–51 are selected to perform any of the 256 Boolean operations in instruction classes 7–0.

Instruction words for the operations relevant to control inputs "D", "E", "F", "G" and "H" have bits 63–61 equal to "011". If this condition is met, then bits 60–57 define the type of operation. These operations are further described below in conjunction with Table 35.

Input "d" to multiplexer Omux 500 is a constant Hex "66". This input is selected for instructions that execute a parallel signed multiply and add (MPYS∥ADD) or a parallel unsigned multiply and add (MPYU∥ADD). These instructions are collectively referred to by the mnemonic MPYx∥ADD.

Input "e" to multiplexer Omux 500 is a constant Hex "99". This input is selected for instructions that execute a parallel signed multiply and subtract (MPYS∥SUB) or a parallel unsigned multiply and subtract (MPYU∥SUB). These instructions are collectively referred to by the mnemonic MPYx∥SUB.

Input "f" to multiplexer Omux 500 is a constant Hex "A6". This input is selected for the DIVI operation. The operation of this DIVI operation, which is employed in division, will be further described below.

Input "g" to multiplexer Omux 500 is supplied from the "EALU" field (bits 26–19) of data register D0 according to an extended arithmetic logic unit function code from bits 26–19 therein. Control input "G" goes active to select: this "EALU" field from data register D0 if OR gate 507 detects either a MPYx∥EALUT operation or and an EALU operation. As previously described, the T suffix in EALUT signifies EALU code true in contrast to the inverse (false) in EALUF. The EALU input is active to control input "G" when the "EALU" field of data register D0 indicates either EALU or EALU%.

Invertor 508 inverts the individual bits of the "EALU" field of data register D0 for supply to input "h" of multiplexer Omux 500. Input "h" of multiplexer Omux 500 is selected in response to detection of a MPYx∥EALUF operation at control input "H". As previously described, the F suffix of EALUF indicates that the individual bits of the "EALU" field of register D0 are inverted for specification of function signals F7–F0.

Multiplexer AEmux 510, which is also illustrated in FIG. 22, generates the arithmetic enable signal. This arithmetic enable signal is supplied to tri-state AND gate 480 of every bit circuit 400. The "a" input to multiplexer AEmux 510 is the "A" bit (bit 27) of data register D0. OR gate 511 receives three inputs: MPYx∥EALUT, EALU, and MIPYx∥EALUF. If the instruction selects any of these three operations, then control input "A" to multiplexer AEmux selects the "A" bit (bit 27) of data register D0. The "b" input to multiplexer AEmux 510 is the "ari" bit (bit 59) of the instruction word. As will be described below, this "ari" bit selects arithmetic operations for certain types of instructions. This input is selected if the instruction is any of the instruction classes 7–0. In this case the "ari" bit signifying an arithmetic operation ("ari"="1") or a Boolean operation ("ari"="0") is passed directly to the arithmetic logic unit 230. The "c" input of multiplexer AEmux 510 is a constant "1". The gate 512 selects this input if the instruction is neither an extended arithmetic logic unit instruction nor within instruction classes 7–0. Such instructions include the DIVI operation and the MPYx∥ADD and MPYx∥SUB operations. OR gate 513 provides an arithmetic or EALU signal when the instruction is either an arithmetic operation as indicated by the output of multiplexer AEmux 510 or an "any EALU" operation as indicated by OR gate 511.

Figure 23:
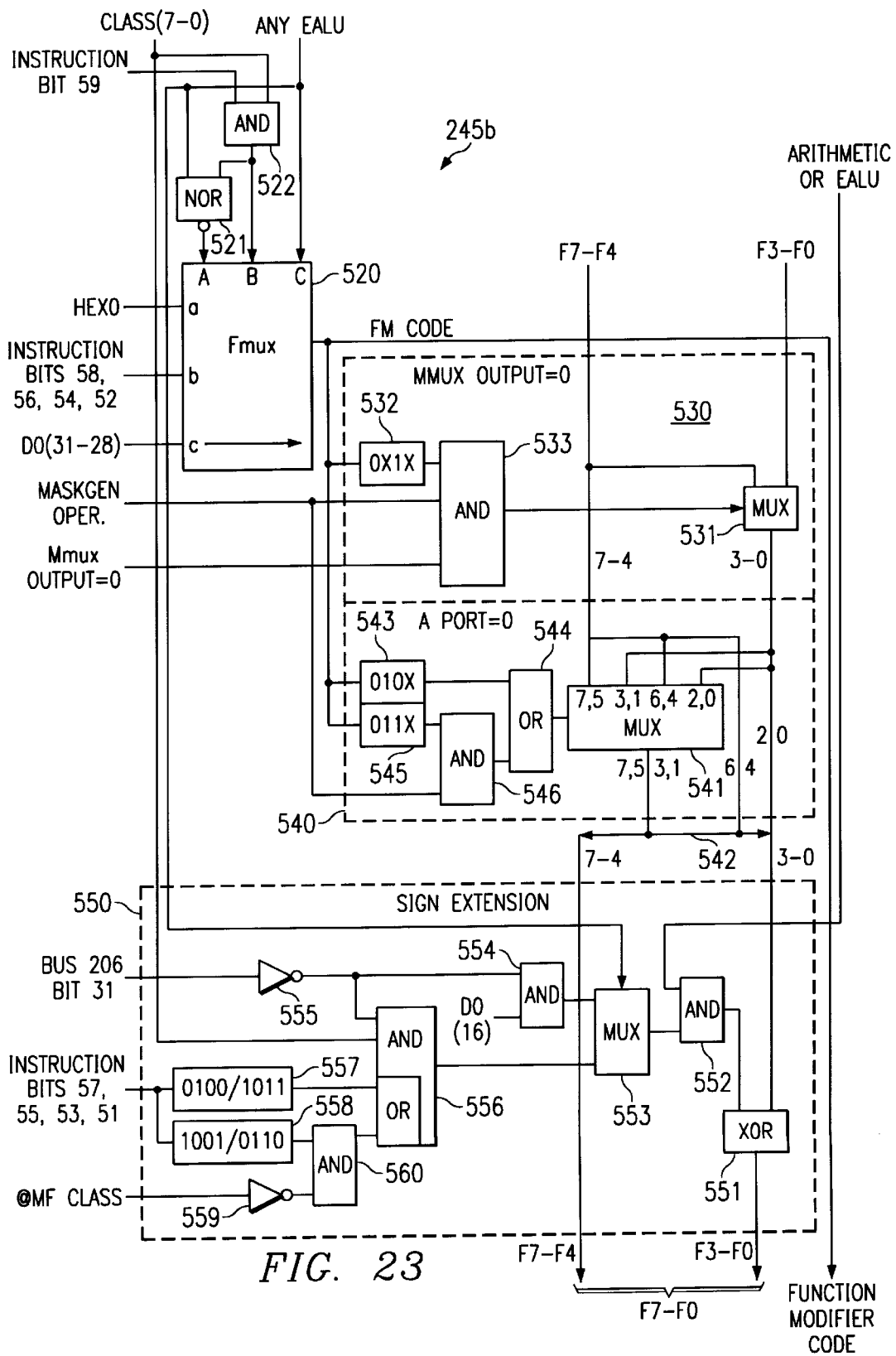
FIG. 23 illustrates in block diagram form the function signal modifier portion of the function signal generator of the data unit illustrated in FIG. 5.

FIG. 23 illustrates function signal modifier 245b. Function signal modifier 245b modifies the function signal set from function signal generator 245a according to the "FMOD" field of data register D0 or the instruction bits 58, 56, 54 and 52 depending on the instruction. Multiplexer Fmux 520 selects the function modifier code.

The "a" input to multiplexer Fmux 520 is all "0's" (Hex "0"). NOR gate 521 supplies control line "A" of multiplexer Fmux 520. NOR gate 521 has a first input receiving the "any EALU" signal from OR gate 511 illustrated in FIG. 22 and a second input connected to the output of AND gate 522. AND gate 522 receives a first input from the "ari" bit (bit 59) of the instruction word and a second input indicating the instruction is in instruction classes 7–0. Thus NOR gate 521 generates an active output that selects the Hex "0" input to Fmux 520 if the instruction is not any extended arithmetic logic unit operation and either the "ari" bit of the instruction word is "0" or the instruction is not within instruction classes class 7–0.

The "b" input to multiplexer Fmux 520 receives bits 58, 56, 54 and 52 of the instruction word. The control input "B" receives the output of AND gate 522. Thus multiplexer Fmux 520 selects bits 58, 56, 54 and 52 of the instruction word when the instruction is in any instruction class 7–0 and the "ari" bit of the instruction is set.

The "c" input of multiplexer Fmux 520 receives bits of the "FMOD" field (bits 31–28) of data register D0. The control input "C" receives the "any EALU" signal from OR gate 511. Multiplexer Fmux 520 selected the "FMOD" field of data register D0 if the instruction calls for any extended arithmetic logic unit operation.

Multiplexer Fmux 520 selects the active function modification code. The active function modification code modifies the function signals supplied to arithmetic logic unit 230 as described below. The function modification code is decoded to control the operations specified in Table 6. As explained above, these modified operations include controlled splitting of arithmetic logic unit 230, setting one or more bits of multiple flags register 211 by zero(es) or carry-out(s) from arithmetic logic unit 230, rotating or clearing multiple flags register 211, operating LMO/RMO/LMBC/RMBC circuit 237 in one of its four modes, operating mask generation 239 and operating bit 0 carry-in generator 246. The operations performed in relation to a particular state of the function modification code are set forth in Table 6.

Three circuit blocks within function modifier 245b may modify the function signals F7–F0 from multiplexer Omux 500 illustrated in FIG. 22. Mmux block 530 may operate to effectively set the input to the C-port to all "1's". A-port block 540 may operate to effectively set the input to the A-port to all "0's". Sign extension block 550 is a sign extension unit that may flip function signals F3–F0.

Mmux block 530 includes a multiplexer 531 that normally passes function signals F3–F0 without modification. To effectively set the input to the C-port of arithmetic logic unit 230 to "1's", multiplexer 531 replicates function signals F7–F4 onto function signals F3–F0. Multiplexer 531 is controlled by AND gate 533. AND gate 533 is active to effectively set the input to the C-port to all "1's" provided all three of the following conditions are present: 1) the function modifier code multiplexer Fmux 520 is any of the four codes "0010", "0011", "0110" or "0111" as detected by "0X1X" match detector 532 (X=don't care); 2) the instruction calls for a mask generation operation; and 3) the output from multiplexer Mmux 234 is "0". As previously described above, duplication of functions signals F7–F4 onto function signals F3–F0, that is selection of F7=F3, F6=F2, F5=F1 and F4=F0, enables selection of the 16 Boolean logic functions of inputs A and B independent of input C. Note from Table 6 that the four function modifier codes "0X1X" include the "%!" modification. According to FIG. 23, the "%!" modification is achieved by changing the function signals sent to arithmetic logic unit 230 rather than by chancing the mask generated by mask generator 239.

A-port block 540 includes multiplexer 541 and connection circuit 542 that normally pass function signals F7–F0 without modification. To effectively set the input to the A-port of arithmetic logic unit 230 to all "0's", multiplexer 541 and connection circuit 541 replicates function signals F6, F4, F2 and F0 onto function signals F7, F5, F3 and F1, respectively. Multiplexer 541 and connection circuit 542 make this substitution when activated by OR gate 544. OR gate 544 has a first input connected to "010X" match detector 543, and a second input connected to AND gate 546. AND gate 546 has a first input connected to "011X" match detector 545. Both match detectors 543 and 545 determine whether the function modifier code matches their detection state. AND gate 546 has a second input that receives a signal indicating whether the instruction calls for a mask generation operation. The input to the A-port of arithmetic logic unit 230 is effectively zeroed by swapping function signals F6, F4, F2 and F0 for function signals F7, F5, F3 and F1, respectively. As previously described, this substitution makes the output of arithmetic logic unit 230 independent of the A input. This substitution takes place if: 1) the function modifier code finds a match in "010X" match detector 543; or 2) the instruction calls for a mask generation operation and the function modifier code find a match in "010X" match detector 545 and the instruction calls for a mask generation operation.

Sign extension block 550 includes exclusive OR gate 551, which normally passes function signals F3–F0 unmodified. However, these function signals F3–F0 are inverted for arithmetic logic unit sign extension and absolute value purposes under certain conditions. Note that function signals F7–F4 from A-port block 540 are always passed unmodified by sign extension block 550. AND gate 552 controls whether exclusive OR gate 551 inverts function signals F3–F0. AND gate 552 has a first input receiving the arithmetic or extended arithmetic logic unit signal from OR gate 513 illustrated in FIG. 22. The second input to AD gate 552 is from multiplexer 553.

Multiplexer 553 is controlled by the "any EALU" signal from OR gate 511 of FIG. 22. Multiplexer 553 selects a first signal from AND gate 554 when the "any EALU" signal is active and selects a second signal from compound AND/OR gate 556 when the "any EALU" signal is inactive. The output of AND gate 554 equals "1" when the data on arithmetic logic unit second input bus 206 is positive, as indicated by the sign bit (bit 31) as inverted by invertor 555, and the "S" bit (bit 16) of data register D0 is "1". The output of compound AND/OR gate 556 is active if: 1) the data on arithmetic logic unit second input bus 206 is positive, as indicated by the sign bit (bit 31) as inverted by invertor 555; 2) the instruction is within instruction classes 7–0; and 3) either a) instruction bits 57, 55, 53 and 51 find a match in "0100"/"1011" match detector 557 or b) AND gate 560 detects that instruction word bits 57, 55, 53 and 51 find a match in "1001"/"0110" match detector 558, and the instruction does not call for a multiple flags register mask operation (@MF) as indicated by invertor 559.

Sign extension block 550 implements the exceptions noted in Table 21. An inactive "any EALU" signal, which indicates that the instruction specified an arithmetic operation, selects the second input to multiplexer 553. Compound AND/OR gate 556 determines that the instruction is within instruction classes 7–0 and that the sign bit is "0". Under these conditions, if instruction word bits 57, 55, 53 and 51 equal "0100" and then the function signal flips from Hex "9a" to Hex "95" by inverting function signal bits F3–F0. Similarly, it instruction word bits 57, 55, 53 and 51 equal "1011" and then the function signal flips from Hex "65" to Hex "6a" by inverting function signal bits F3–F0. If instruction word bits 57, 55, 53 and 51 equal "1001" and the instruction does not call for a multiple flags register mask operation as indicated by invertor 599, then the function signal flips from Hex "69" to Hex "66". This set of function signals causes arithmetic logic unit 230 to implement A−|B|, A minus the absolute value of B. If instruction word bits 57, 55, 53 and 51 equal "0110" and the instruction does not call for a multiple flags register mask operation, then the function signal flips from Hex "96" to Hex "99". This executes the function A+|B|, A plus the absolute value of B. Note that these flips of the function signals are based on the sign bit (bit 31) of the data on arithmetic logic unit second input bus 206.

Figure 24:
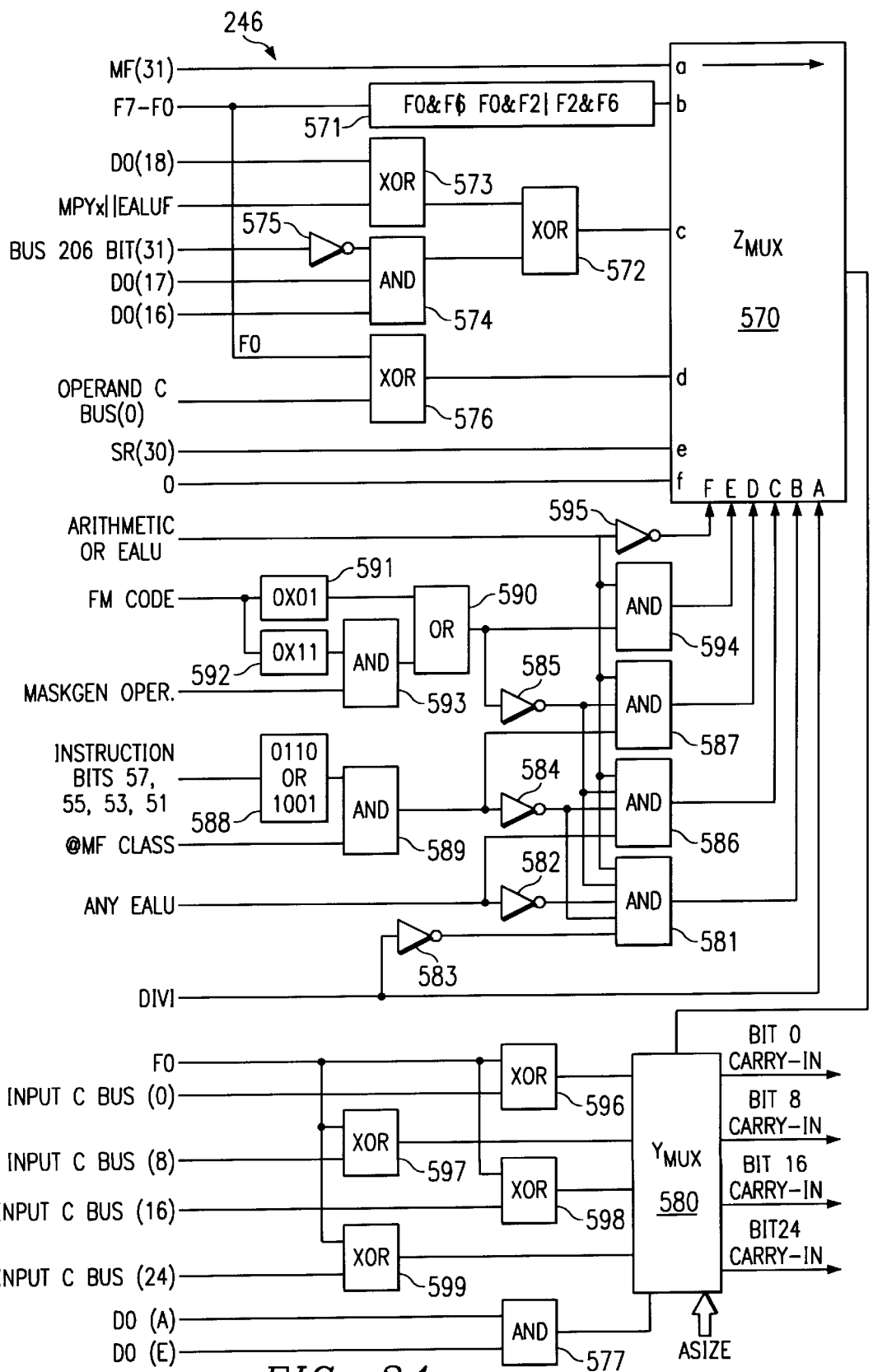
FIG. 24 illustrates in block diagram form the bit 0 carry-in generator of the data unit illustrated in FIG. 5.

FIG. 24 illustrates bit 0 carry-in generator 246. As previously described bit, 0 carry-in generator 246 produces the carry-in signal $c_{in}$ supplied to the first bit of arithmetic logic unit 230. In addition this carry-in signal $c_{in}$ from bit 0 carry-in generator 246 is generally supplied to the first bit of each of the multiple sections, if the instruction calls for a multiple arithmetic logic unit operation. Multiplexer Zmux 570 selects one of six possible sources for this bit 0 carry-in signal $c_{in}$ based upon six corresponding controls inputs from instruction decode logic 250.

Input "a" of multiplexer Zmux 570 is supplied with bit 31 of multiple flags register 211. Multiplexer Zmux 570 selects this input as the bit 0 carry-in signal $c_{in}$ if the instruction calls for a DIVI operation.

Inputs "b", "c" and "d" to multiplexer Zmux 570 are formed of compound logic functions. Input "b" of multiplexer Zmux 570 receives a signal that is a Boolean function of the function signals F6, F2 and F0. This Boolean expression, which is formed by circuit 571, is (F0 & ~F6)|(F0 & ~F2)|(~F2 & ~F6). Input "c" of multiplexer Zmux 570 is fed by exclusive OR gate 572, which has a first input supplied by exclusive OR gate 573 and a second input supplied by AND gate 574. The exclusive OR gate 573 has as a first input the "C" bit (bit 18) of data register D0, which indicates whether the prior operation of arithmetic logic unit 230 produced a carry-out signal $c_{out}$ at bit 31, the last bit. The second input of XOR gate 573 receives a signal indicating the instruction calls for a MPYx||EALUF operation. AND gate 574 has a first input from invertor 575 inverting the sign bit (bit 31) present on arithmetic logic unit second input bus 206 for detecting a positive sign. AND gate 574 has a second input from the "I" bit (bit 17) of data register D0 and a third input from the "S" bit (bit 16) of data register D. As explained above, the "I" bit causes inversion of carry-in when the "S" bit indicates sign extend is enabled. This operation complements the sign extend operation of AND gate 554 and XOR gate 551 of the function modifier 246b illustrated in FIG. 23. Input "d" of multiplexer Zmux 570 comes from XOR gate 576. XOR gate 576 has a first input supplied the function signal F0 and a second input supplied bit 0 of the data on input C bus 243.

Input "b" of multiplexer Zmux 570 is selected when AND gate 581 sets control input "B" active. This occurs when the "arithmetic or EALU" from OR gate 513 is active, the instruction does not call for an extended arithmetic logic unit operation as indicated by invertor 582 and no other multiplexer Zmux 570 input is applicable as controlled by invertors 583, 584 and 585.

Input "c" of multiplexer Zmux 570 is selected when AND gate 586 supplies an active output to control input "C". AND gate 586 is responsive to a signal indicating the instruction calls for "any EALU" operation. The rest of the inputs to AND gate 586 assure that AND gate 586 is not active if any of inputs "d", "e" or "f" are active via invertors 584, 585 and 595.

Input "d" of multiplexer Zmux 570 is selected when control line "D" is from AND gate 587. AND gate 587 is active when the instruction is an arithmetic operation or an extended arithmetic logic unit operation, AND gate 589 is active and input "e" is not selected as indicated by invertor 585. AND gate 589 is active when the instruction specifies a multiple flags register mask operation (@MF) expansion and instruction word bits 57, 55, 53 and 51 find a match in "0110"/"1001" match circuit 588. These instruction word bits correspond to function signals Hex "69" and Hex "96", which cause addition or subtraction between ports A and B depending on the input to port C. No function signal flipping is involved since the instruction class involves multiple flags register expansion. FIG. 7 illustrates providing this carry-in signal to plural sections of a split arithmetic logic unit in multiple mode.

Input "e" of multiplexer Zmux 570 comes from the "C" bit (bit 30) of status register 210. As previously described, this "C" bit of status register 210 is set to "1" if the result of the last operation of arithmetic logic unit 230 caused a carry-out from bit 31. AND gate 594 supplies control input "E". AND gate 594 goes active when the instruction specifies an arithmetic operation or an extended arithmetic logic unit operation and the following logic is true: 1) the function modifier code finds a match in "0X01" match detector 591; or (OR gate 590) 2) the instruction calls for a mask generation operation and (AND gate 593) the function modifier code finds a match in "0X11" match detector 592.

Input "f" of multiplexer Zmux 570 is supplied with a constant "0". Multiplexer Zmux 570 selects this input when the "arithmetic or EALU" signal from OR gate 513 indicates the instruction specifies a Boolean operation as inverted by invertor 595.

The output of Zmux 570 normally passes through Ymux 580 unchanged and appears at the bit 0 carry-in output. In a multiple arithmetic operation in which data register D0 "A" bit (bit 27) and "E" bit (bit 14) are not both "1", Ymux produces plural identical carry-in signals. Selection of half word operation via "Asize" field of status register 210 causes Ymux to produce the supply the output of Zmux 570 to both the bit 0 carry-in output and the bit 16 carry-in output. Likewise, upon selection of byte operation Ymux 580 supplies the output of Zmux 570 to the bit 0 carry-in output, the bit 8 carry-in output, the bit 16 carry-in output and the bit 24 carry-in output.

The operation of Ymux 580 differs when data register D0 "A" bit (bit 27) and "E" bit (bit 14) are both "1". AND gate 577 forms this condition and controls the operation of Ymux 580. This is the only case in which the carry-in signals supplied to different sections of arithmetic logic unit 230 during multiple arithmetic differ. If AND gate 577 detects this condition, then the carry-in signals are formed by the exclusive OR of function signal F0 and the least significant bit of the C input of the corresponding section of arithmetic logic unit 230. If the "Asize" field selects word operation, that is if arithmetic logic unit 230 forms a single 32 bit section, then the bit 0 carry-in output formed ba Ymux 580 is the exclusive OR of function signal F0 and input C bus bit 0 formed by XOR gate 596. No other carry-in signals are formed. If the "Asize" field selects half word operation forming two 16 bit sections, then the bit 0 carry-in output formed by Ymux 580 is the output of XOR gate 596 and the carry-in to bit 16 is the exclusive OR of function signal F0 and input C bus bit 16 formed by XOR gate 598. Lastly, for byte multiple arithmetic the bit 0 carry-in output formed by Ymux 580 is the output of XOR gate 596, the bit 8 carry-in is formed by XOR gate 597, and the bit 16 carry-in is formed by XOR gate 598 and the bit 24 carry-in is formed by XOR gate 599.

FIGS. 22, 23 and 24 not only represent specific blocks implementing the Tables but also illustrates the straightforward process by which the Tables and Figures compactly define logic circuitry to enable the skilled worker to construct the preferred embodiment even when a block diagram of particular circuitry may be absent for conciseness. Note that the circuits of FIGS. 22 and 23 do not cover control for the various multiplexers and special circuits via instruction decode logic 250 that are a part of data unit 110 illustrated in FIG. 5. However, control of these circuits is straight forward and within the capability of one of ordinary skill in this art. Therefore these will not be further disclosed for the sake of brevity.

Arithmetic logic unit 230 includes three 32 bit inputs having differing hardware functions preceding each input. This permits performance of many different functions using arithmetic logic unit 230 to combine results from the hardware feeding each input. Arithmetic logic unit 230 performs Boolean or bit by bit logical combinations, arithmetic combinations and mixed Boolean and arithmetic combinations of the 3 inputs. Mixed Boolean and arithmetic functions will hereafter be called arithmetic functions due to their similarity of execution. Arithmetic logic unit 230 has one control bit that selects either Boolean functions or arithmetic functions. Boolean functions generate no carries out of or between bit circuits 400 of arithmetic logic unit 230. Thus each bit circuit 400 of arithmetic logic unit 230 combines the 3 inputs to that bit circuit independently forming 32 individual bit wise results. During arithmetic functions, each bit circuit 400 may receive a carry-in from the adjacent lesser significant bit and may generate a carry-out to the next most significant bit location. An 8 bit control signal (function control signals F7–F0) control the function performed by arithmetic logic unit 230. This enables selection of one of 256 Boolean functions and one of 256 arithmetic functions. The function signal numbering of function signals F7–F0 is identical to that used in Microsoft® Windows. Bit 0 carry-in generator 246 supplies carry-in signals when in arithmetic mode. In arithmetic mode, arithmetic logic unit 230 may be split into either two independent 16 bit sections or four independent 8 bit sections to process in parallel multiple smaller data segments. Bit 0 carry-in generator 246 supplies either one, two or four carry-in signals when arithmetic logic unit 230 operates in one, two or four sections, respectively. In the preferred embodiment, an assemblier for data unit 110 includes an expression evaluator that selects the proper set of function signals based upon an algebraic input syntax.

The particular instruction being executed determines the function of arithmetic logic unit 230. As will be detailed below, in the preferred embodiment the instruction word includes a field that indicates either Boolean or arithmetic operations. Another instruction word field specifies the function signals supplied to arithmetic logic unit 230. Boolean instructions specify the 8 function signals F7–F0 directly. In arithmetic instructions a first subset of this instruction word field specifies a subset of the possible arithmetic logic unit operations according to Table 21. A second subset of this instruction word field specifies modifications of instruction function according to Table 6. All possible variations of the function signals and the function modifications for both Boolean and arithmetic instructions may be specified using an extended arithmetic logic unit (EALU) instruction. In this case the predefined fields within data register D0 illustrated in FIG. 9 specify arithmetic logic unit 230 operation.

Though arithmetic logic unit 230 can combine all three inputs, many useful functions don't involve some of the inputs. For example the expression A&B treats the C input as a don't care, and the expression A|C treats the B input as a don't care. Because different data path hardware precedes each input, the ability to use or ignore any the inputs supports the selection of data path hardware needed for the desired function. Table 22 shows examples of useful three input expressions where the C-input is treated as a mask or a merging control. Because data unit 110 includes expand circuit 238 and mask generator 239 in the data path of the C-input of arithmetic logic unit 230, it is natural to employ the C-input as a mask.

TABLE 22

| Logical Function | Typical use |
|---|---|
| (A&C) | (B&~C) | Bit by bit multiplexing (merge) of A and B based on C. A chosen if corresponding bit in C is 1 |
| (A&~C) | (B&C) | Bit by bit multiplexing (merge) of A and B based on C. B chosen if corresponding bit in C is 1 |
| (A|B)&~C | Logic OR of A and B and then force to 0 everywhere that C is a 1 |
| (A&B)&~C | Logic AND of A and B and then force to 0 everywhere C is a 1 |
| A| (B&C) | If C is 0 then force the B-input to 0 before logical ORing with A |
| A| (B|~C) | If C is 0 then force the B-input to 1 before logical ORing with A |

The three input arithmetic logic unit 230 can perform mixed Boolean and arithmetic functions in a single pass through arithmetic logic unit 230. The mixed. Boolean and arithmetic functions support performing Boolean functions prior to an arithmetic function. Various compound functions such as shift and add, shift and subtract or field masking prior to adding or subtracting can be performed by the appropriate arithmetic logic unit function in combination with other data path hardware. Note arithmetic logic unit 230 supports 256 different arithmetic functions, but only a subset of these will be needed for most programming. Additionally, further options such as carry-in and sign extension need to be controlled. Some examples expected to be commonly used are listed below in Table 23.

TABLE 23

| Func Code Hex | Function | Default Carry-In | Common Use |
|---|---|---|---|
| 66 | A+B | 0 | A+B ignore C |
| 99 | A−B | 1 | A−B ignore C |
| 5A | A+C | 0 | A+C ignore B |
| A5 | A−C | 1 | A−C ignore B |
| 6A | A+(B&C) | 0 | A+B shift right "0" extend C shift mask |

TABLE 23-continued

| Func Code Hex | Function | Default Carry-In | Common Use |
|---|---|---|---|
| 95 | A−(B&C) | 1 | A−B shift right "0" extend C shift mask |
| 56 | A+(B| C) | 0 | A+B shift left "0" extend C shift mask |
| A9 | A−(B| C) | 1 | A−B shift left "1" extend C shift mask |
| A6 | A+(B&~C) | 0 | A+B shift left "0" extend C shift mask |
| 59 | A−(B&~C) | 1 | A−B shift left "0" extend C shift mask |
| 65 | A+(B| ~C) | 0 | A+B shift right sign extend C shift mask |
| 9A | A−(B| ~C) | 1 | A−B shift right sign extend C shift mask |
| 60 | (A&C)+(B&C) | 0 | A+B mask by C |
| 9F | (A&C)−(B&C) | 1 | A−B mask by C |
| 06 | (A&~C)+(B&~C) | 0 | A+B mask by ~C |
| F9 | (A&~C)−(B&~C) | 1 | A−B mask by ~C |
| 96 | A+((−B&C) | (B&~C)) | LSB of C | A+B or A−B based on ~C |
| 69 | A+((B&C) | (−B&~C)) | LSB of ~C | A+B or A−B based on C |
| CC | B | 0 | B ignore A and C |
| 33 | −B | 1 | Negative B ignore A and C |
| F0 | C | 0 | C ignore A and B |
| 0F | −C | 1 | Negative C ignore A and B |
| C0 | (B&C) | 0 | B shift right "0" extend C shift mask |
| 3F | −(B&C) | 1 | Negative B shift right "0" extend C shift mask |
| FC | (B| C) | 0 | B shift left "1" extend C shift mask |
| 03 | −(B| C) | 1 | Negative B shift left "1" extend C shift mask |
| 0C | (B&~C) | 0 | B shift left "0" extend C shift mask |
| F3 | −(B&~C) | 1 | Negative B shift left "0" extend C shift mask |
| CF | (B| ~C) | 0 | B shift right sign extend C shift mask |
| 30 | −(B| ~C) | 1 | Negative B shift right sign extend C shift mask |
| 3C | (−B&C) | (B&~C) | LSB of C | −B or B based on ~C |
| C3 | (B&C) | (−B&~C) | LSB of ~C | B or −B based on C |

The most generally useful set of arithmetic functions combined with default carry-in control and sign extension options are available directly in the instruction set in a base set of operations. These are listed in Table 21. This base set include operations that modify the arithmetic logic unit's functional controls based on sign bits and that use default carry-in selection. Some examples of these are detailed below.

All 256 arithmetic functions along with more explicit carry-in and sign extension control are available via the extended arithmetic logic unit (EALU) instruction. In extended arithmetic logic unit instructions the function control signals, the function modifier and the explicit carry-in and sign extension control are specified in data register D0. The coding of data register D0 during such extended arithmetic logic unit instructions is described above in relation to FIG. 9.

Binary numbers may be designated as signed or unsigned. Unsigned binary numbers are non-negative integers within the range of bits employed. An N bit unsigned binary number may be any integer between 0 and $2^N-1$. Signed binary numbers carry an indication of sign in their most significant bit. If this most significant bit is "0" then the number is positive or zero. If the most significant bit is "1" then the number is negative or zero. An N bit signed binary number may be any integer from $-2^{N-1}-1$ to $2^{N-1}-1$. Knowing how and why numbers produce a carry out or overflow is important in understanding operation of arithmetic logic unit 230.

The sum of two unsigned numbers overflows if the sum can no longer be expressed in the number of bits used for the numbers. This state is recognized by the generation of a carry-out from the most significant bit. Note that arithmetic logic unit 230 may be configured to operation on numbers of 8 bits, 16 bits or 32 bits. Such carry-outs may be stored in Mflags register 211 and employed to maintain precision. The difference of two unsigned numbers underflows when the difference is less than zero. Note that negative numbers cannot be expressed in the unsigned number notation. The examples below show how carry-outs are generated during unsigned subtraction.

The first example shows 7 "00000111" minus 5 "00000110". Arithmetic logic unit 230 performs subtraction by two's complement addition. The two's complement of an unsigned binary number can be generated by inverting the number and adding 1, thus $-X=\sim X+1$. Arithmetic logic unit 230 negates a number by logically inverting (or one's complementing) the number and injecting a carry-in of 1 into the least significant bit. First the 5 is bit wise inverted producing the one's complement "11111001". Arithmetic logic unit 230 adds this to 7 with a "1" injected into the carry-in input of the first bit. This produces the following result.

```
    00000111    7
+   11111010   -5
+          1
  ─────────── ───
  1 00000010    2
```

Note that this produces a carry-out of "1" from the most significant bit. In two's complement subtraction, such a carry-out indicates a not-borrow. Thus there is no underflow during this subtraction. The next example shows 7–5. Note that the 8 bit one's complement of "00000111" is "11111000".

```
    00000101    5
+   11111000   -7
+          1
  ─────────── ───
  0 11111110   -2
```

In this case the carry-out of "0" indicates a borrow, thus the result is less than zero and an underflow has occurred. The last example of unsigned subtraction is 0–0. Note that the 8 bit one's complement of 0 is "11111111".

```
    00000000    0
+   11111111   -0
+          1
  ─────────── ───
  1 00000000    0
```

The production of a carry-out of "1" indicates no underflow.

The situation for signed numbers is more complex. An overflow on a signed add occurs if both operands are positive and the sign bit of the result is a 1 (i.e., negative) indicating that the result has rolled over from positive to negative. Overflow on an add also occurs if both operands are negative and the result has a 0 (i.e., positive) sign bit. Or in other words overflow on addition occurs if both of the sign bits of the operands are the same and the result has a different sign bit. Similarly a subtraction of can overflow if the operands have the same sign and the result has a different sign bit.

When setting the carry bit in status register 210 or in the Mflags register 211, the bit or bits are always the "natural" carry outs generated by arithmetic logic unit 230 Most other microprocessors set "carry status" based upon the carry-out bit during addition but set it based upon not-carry-out (or borrow) during subtraction. These other microprocessors must re-invert the not-carry when performing subtract with borrow to get the proper carry-in to the arithmetic logic unit. This difference results in a slightly different set of conditional branch equations, using this invention than other processors to get the same branch conditions. Leaving the sense of carries/not-borrows the same as those generated by arithmetic logic unit 230 simplifies many ways in which each digital image/graphics processor can utilize them.

In the base set of arithmetic instructions, the default carry-in is "0" for addition and "1" for subtraction. The instruction set and the preferred embodiment of the assembler will automatically set the carry-in correctly for addition or subtraction in 32-bit arithmetic operations. The instruction set also supports carry-in based on the status registers carry-out to support multiple precision add-with-carry or subtract-with-borrow operations.

As will be explained in more detail later, some functions arithmetic logic unit 230 support the C-port controlling whether the input to the B-port is added to or subtracted from the input to the A-port. Combining these arithmetic logic unit functions with multiple arithmetic permits the input to the C-port to control whether each section of arithmetic logic unit 230 adds or subtracts. The base set of operations controls the carry-in to each section of arithmetic logic unit 230 to supply a carry-in of "0" that section is performing addition and a carry-in of "1" if that section is performing subtraction. The hardware for supplying the carry-in to these sections is described above regarding FIG. 24.

The following details the full range of arithmetic functions possible using digital image/graphics processor 71 3-input arithmetic logic unit 230. For most algorithms, the subset of instructions listed above will be more than adequate. The more detailed description following is included for completeness.

Included in the description below is information about how to derive the function code for arithmetic logic unit 230. Some observations about function code F7–F0 will be helpful in understanding how arithmetic logic unit 230 can be used for various operations and how to best use extended arithmetic logic unit instructions. The default carry-in is equal to F0, the least significant bit of the function code, except for the cases where the input to the C-port controls selection of addition or subtraction between A and B. Inverting all the function code bits changes the sign of the operation. For example the function codes Hex "66", which specifies A+B, and Hex "99", which specifies A–B, are bit wise inverses. Similarly, function code Hex "65" (A+(B|~C)) and Hex "9A" (A–(B|~C)) are bit wise inverses. Extended arithmetic logic unit instructions come in the pairs of extended arithmetic logic unit true (EALUT) and extended arithmetic logic unit false (EALUF). The extended arithmetic logic unit false instruction inverts the arithmetic logic unit control code stored in bits 26–19 of data register D0. As noted above, this inversion generally selects between addition and subtraction. Inverting the 4 least significant bits of the function code Hex "6A" for A+(B&C) yields gives Hex "65" that is the function A+(B|~C). Similarly, inverting the 4 least significant bits of function code Hex "95" for A–(B&C) yields the function code Hex "9A" that is A–(B|~C). The B&C operation zero's bits in B where C is "0" and *he operation B|~C forces bits in B to "1" where C is "0". This achieves the opposite masking function with respect to C. As will be explained below selectively inverting the 4 least significant bits of the function code based on a sign bit performs sign extension before addition or subtraction.

All the 256 arithmetic functions available employing arithmetic logic unit 230 can be expressed as:

$$S=A\&F1(B,C)+F2(B,C)$$

where: S is the arithmetic logic unit resultant; and F1(B,C) and F2(B,C) can be any of the 16 possible Boolean functions of B and C shown below in Table 24.

TABLE 24

| F1 Code | F2 Code | Subfunction | Common Use |
|---|---|---|---|
| 00 | 00 | 0 | Zeros term |
| AA | FF | all 1's = –1 | Sets term to all 1's |
| 88 | CC | B | B |
| 22 | 33 | –B–1 | Negate B |
| A0 | F0 | C | C |
| 0A | 0F | –C–1 | Negate C |
| 80 | C0 | B&C | Force bits in B to 0 where C is 0 |
| 2A | 3F | –(B&C)–1 | Force bits in B to 0 where C is 0 and negate |
| A8 | FC | B\| C | Force bits in B to 1 where C is 1 |
| 02 | 03 | –(B\| C)–1 | Force bits in B to 1 where C is 1 and negate |
| 08 | 0C | B&~C | Force bits in B to 0 where C is 1 |
| A2 | F3 | –(B&~C)–1 | Force bits in B to 0 where C is 1 and negate |
| 8A | CF | B\| ~C | Force bits in B to 1 where C is 0 |
| 20 | 30 | –(B\| ~C)–1 | Force bits in B to 1 where C is 0 and negate |
| 28 | 3C | (B&~C) \| ((–B–1)&C) | Choose B if C=all 0's and –B if C=all 1's |
| 82 | C3 | (B&C) \| ((–B–1)&~C) | Choose B is C=all 1's and –B if C=all 0's |

Figure 25:
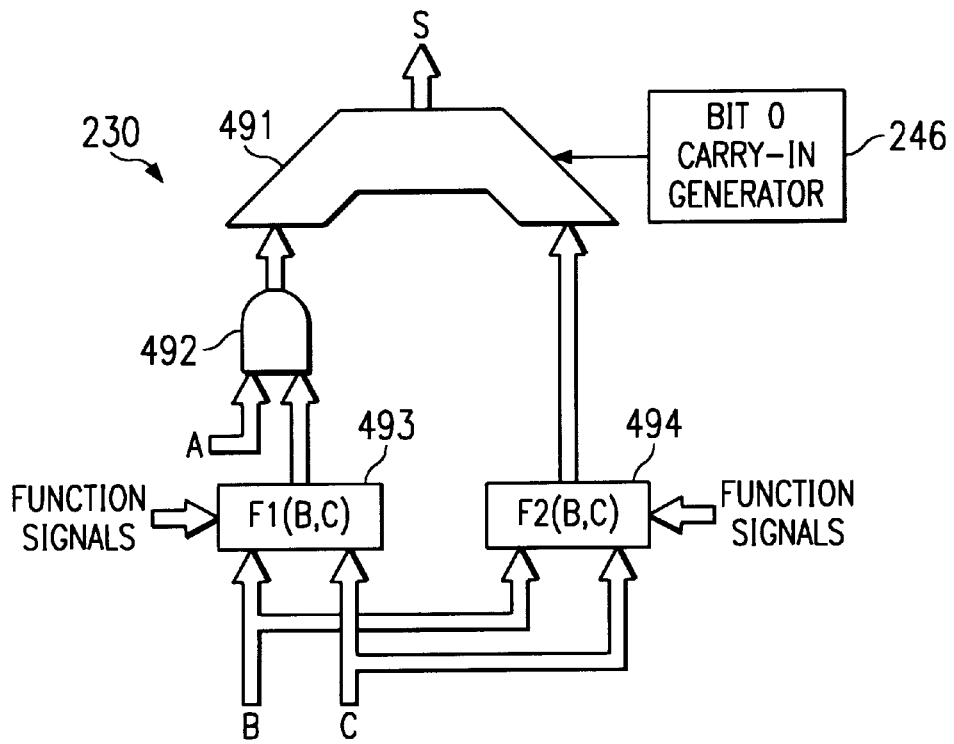
FIG. 25 illustrates in block diagram form a conceptual view of the arithmetic logic unit illustrated in FIGS. 19 and 20.

FIG. 25 illustrates this view of arithmetic logic unit 230 in block diagram form. Arithmetic unit 491 forms the addition of the equation. Arithmetic unit 491 receives a carry input for bit 0 from bit 0 carry-in generator. The AND gate 492 forms A AND F1(B,C). Logic unit 493 forms the subfunction F1(B,C) from the function signals as listed in Table 24. Logic unit 494 forms the subfunction F2(B,C) from the function signals as listed in Table 24. This illustration of arithmetic logic unit 230 shows that during mixed Boolean and arithmetic operations the Boolean functions are performed before the arithmetic functions. A set of the bit circuits 400 illustrated in FIGS. 19, 20 and 21 together with the function generator illustrated in FIG. 22, the function modifier illustrated in FIG. 23 and the bit 0 carry-in generator illustrated in FIG. 24 form the preferred embodiment of the arithmetic logic unit 230 illustrated in FIG. 25. Those skilled in the art would recognize that there are many other feasible ways to implement arithmetic logic unit 230 illustrated in FIG. 25.

As clearly illustrated in FIG. 25, the subfunctions F1(B,C) and F2(B,C) are independent and may be different subfunctions for a single operation of arithmetic logic unit 230. The subfunction F2(B,C) includes both the negative of B and the negative of C. Thus either B or C may be subtracted from A by adding its negative. The codes for the subfunctions F1(B,C) and F2(B,C) enable derivation of the function code F7–F0 for arithmetic logic unit 230 illustrated in FIGS. 20 and 21. The function code F7–F0 for arithmetic logic unit 230 is the exclusive OR of the codes for the corresponding subfunctions F1(B,C) and F2 (B,C). Note the codes for the subfunctions have been selected to provide this result, thus these subfunctions do not have identical codes for the same operation.

The subfunctions of Table 24 are listed with the most generally useful ways of expression. There are other ways to represent or factor each function. For example by applying DeMorgan's Law, the function B|~C is equivalent to ~(~B&C). Because ~X=–X–1, ~(~B&C) is equivalent –(~B&C)–1 and B|~C is equivalent to B|(–C–1). Note that the negative firms in Table 24 each have a trailing "–1" term. As explained above negative numbers are two's complements. These are equivalent to the bit wise logical inverse, which forms the 1's complement, minus 1. A carry-in of "1" may be injected into the least significant bit to cancel out the –1 and form the two's complement. In the most useful functions with a negative subfunction, only the F2(B,C) subfunction produces a negative.

Often it will be convenient to think of the Boolean subfunctions in Table 24 as performing a masking operation. As noted in Table 24, the subfunction B&C can be interpreted as forcing the B input value to "0" where the corresponding bit in C is "0. The subfunction B|~C can be interpreted as forcing the B input value to "1" for every bit where the C input is "0". Because mask generator 234 and expand circuit 238 feed the C-port of arithmetic logic unit 230 via multiplexer 233, in most cases the C-port will be used as a mask in subfunctions that involve both B and C terms. Table 24 has factored the expression of each subfunction in terms assuming that the input to the C-port is used as a mask. The equation above shows that the A-input cannot be negated in the arithmetic expression. Thus arithmetic logic unit 230 cannot subtract A from either B or C. On the other hand, either B or C can be subtracted from A because the subfunctions F1(B,C) and F2(B,C) support negation/inversion of B and C.

The subfunctions of Table 24 when substituted into the above equation produces all of the 256 possible arithmetic functions that arithmetic logic unit 230 can perform. Occasionally, some further reduction in the expression of the resultant yields an expression that is equivalent to the original and easier to understand. When reducing such expressions, several tips can be helpful. The base instruction set defaults to a carry-in of "0" for addition and a carry-in of "1" when the subfunction F2(B,C) has a negative B or C term as expressed in Table 24. This carry-in injection has the effect of turning the one's complement (logical inversion) into a two's complement by effectively canceling the −1 on the right hand side of the expression of these subfunctions. The logic AND of A all "1's" equals A. Thus subfunction F1(B,C) may be set to yield all "1's" to get A on the left side of the equation. Note also that all "1's" equals two's complement signed binary number minus 1 (−1).

The examples below show how to use the equation and the subfunctions of Table 24 to derive any of the possible arithmetic logic unit functions and their corresponding function codes. The arithmetic function A+B can be expressed as A&(all "1's")+B. This requires F1(B,C)=all "1's" and F2(B,C)=B. The F1 code for all "1's" is Hex "AA" and the F2 code for B is Hex "CC". Bit-wise XORing Hex "AA" and Hex "CC" gives Hex "66". Table 23 shows that Hex "66" is function code for A+B.

The arithmetic function A−B can be expressed as A&(all "1's")+(−B−1)+1. This implies F1(B,C)=all "1's" (F1 code Hex "AA") and F2(B,C)=−B−1 (F2 code Hex "33") with a carry-in injection of "1". Recall that a carry-in of "1" is the default for subfunctions F2 that include negation. Bit-wise XORing the F1 code of Hex "AA" and with the F2 code of Hex "33" gives Hex "99". Table 23 shows that Hex "99" is the function code for A−B assuming a carry-in of "1".

The arithmetic function A+C is derived similarly to A+B. Thus A+C=A&(all "1's")+C. This can be derived by choosing F1(B,C)=all "1's" and F2(B,C)=C. The exclusive OR of the F1 code of Hex "AA" and the F2 code of Hex "F0" produces Hex "5A" the function code for A+C. Likewise, A−C is the same as A&(all "1's")+(−C−1)+1. The exclusive OR of the F1 code of Hex "AA" and the F2 code of Hex "0F" produces Hex "A5" the function code for A−C.

Three input arithmetic logic unit 230 provides a major benefit by providing masking and/or conditional functions between two of the inputs based on the third input. The data path of data unit 110 enables the C-port to be most useful as a mask using mask generator 234 or conditional control input using expand circuit 238. Arithmetic logic unit 230 always performs Boolean functions before arithmetic functions in any mixed Boolean and arithmetic function. Thus a carry could ripple out of unmasked bits into one or more bits that were zeroed or set by a Boolean function. The following examples are useful in masking and conditional operations.

The function A+(B&C) can be expressed as A&(all "1's")+(B&C). Choosing F1(B,C)=all "1's" (F1 code of Hex "AA") and F2(B,C)=B&C (F2 code of Hex "C0") gives A+(B&C). The bit-wise exclusive OR of HEX "AA" and Hex "C0" gives the arithmetic logic unit function code of Hex "6A" listed in Table 23. This function can strip off bits from unsigned numbers. As shown below, this function can be combined with barrel rotator 235 and mask generator 234 in performing right shift and add operations. In this case C acts as a bit mask that zeros bits of B everywhere C is "0". Since mask generator 234 can generate a mask with right justified ones, selection of mask generator 234 via multiplexer Cmux 233 permits this function to zero some of the most significant bits in B before adding to A. Another use of this function is conditional addition of B to A. Selection of expand circuit 238 via multiplexer Cmux 233 enables control of whether B is added to A based upon bits in Mflags register 211. During multiple arithmetic, bits in Mflags register 211 can control corresponding sections of arithmetic logic unit 230.

The function A+(B|~C) can be expressed as A&(all '1'S")+(B|~C). Choosing F1(B,C)=all "1's" (F1 code of Hex "AA") and F2(B,C)=B|~C (F2 code of "CF") yields this expression. The bit-wise exclusive OR of Hex "AA" and Hex "C0" obtains the function code of Hex "65" as listed in Table 23.

The function A−(B&C) can be expressed as A&(all "1's")+(−(B&−C)−1)+1. Choosing F1(B,C)=all "1's" (F1 code Hex "AA") and F2(B,C)=−(B&C)−1 (F2 code Hex "3F") with a carry-in injection of "1" yields this expression. The bit-wise exclusive OR of Hex "AA" and Hex "3F" yields the function code Hex "95", as listed in Table 23. This function can strip off or mask bits in the B input by the C input before subtracting from A.

There are 16 possible functions where the subfunction F1(B,C)=0. These functions are commonly used with other hardware to perform negation, absolute value, bit masking, and/or sign extension of the B-input by the C-input. When subfunction F1(B,C)=0 then the arithmetic logic unit function is given by subfunction F2(B,C).

The function −(B&C) may be expressed as (A&"0")+(−(B&C)). This expression can be formed by choosing F1(B,C)=0 (F1 code Hex "00") and F2(B,C)=−(B&C)−1 (F2 code Hex "3F") with a carry-in injection of "1". The exclusive OR of Hex "00" and Hex "3F" yields the function code Hex "3F" as shown in Table 23. This function masks bits in B by a mask C and then negates the quantity. This function can be used as part of a shift right and negate operation.

Several functions support masking both terms of the sum in the equation above in a useful manner. The function (A&C)+(B&C) can be achieved by choosing F1(B,C)=C (F1 code Hex "A0") and F2(B,C)=B&C (F2 code Hex "C0"). The exclusive OR of Hex "A0" and Hex "F0" yields the function code Hex "60" as shown in Table 23. This function will effectively zero the corresponding bits of the A and B inputs where C is "0" before adding. It should be noted that the Boolean function is applied before the addition and that one or more carries can ripple into the bits that have been zeroed. When using multiple arithmetic such carries do not cross the boundaries between the split sections of arithmetic logic unit 230. A common use for this function is to sum multiple smaller quantities held in one register. The B-port receives a rotated version of the number going to the A-port and the C-port provides a mask for the bits that overlap. Four 8 bit numbers can be summed into two 16 bit numbers or two 16 bit numbers summed into one 32 bit number in a single instruction.

The similar function (A&C)−(B&C) is achieved by choosing F1(B,C)=C (F1 code Hex A0") and F2(B,C)=−(B&C)−1 and injecting a carry-in of "1". The exclusive OR of Hex "A0" and Hex "3F" yields the function code Hex "9F" as shown in Table 23. This function can produce negative sums with the C-port value acting as a mask of the A and B inputs.

The function (A&B)+B is achieved by choosing F1(B,C)=C (F1 code Hex "A0") and F2(B,C)=B (F2 code Hex "CC"). The exclusive OR of Hex "A0" and Hex "CC" yields the function code Hex "6C". This function can conditionally double B based on whether A is all "1's" or all "0's".

Figure 26:
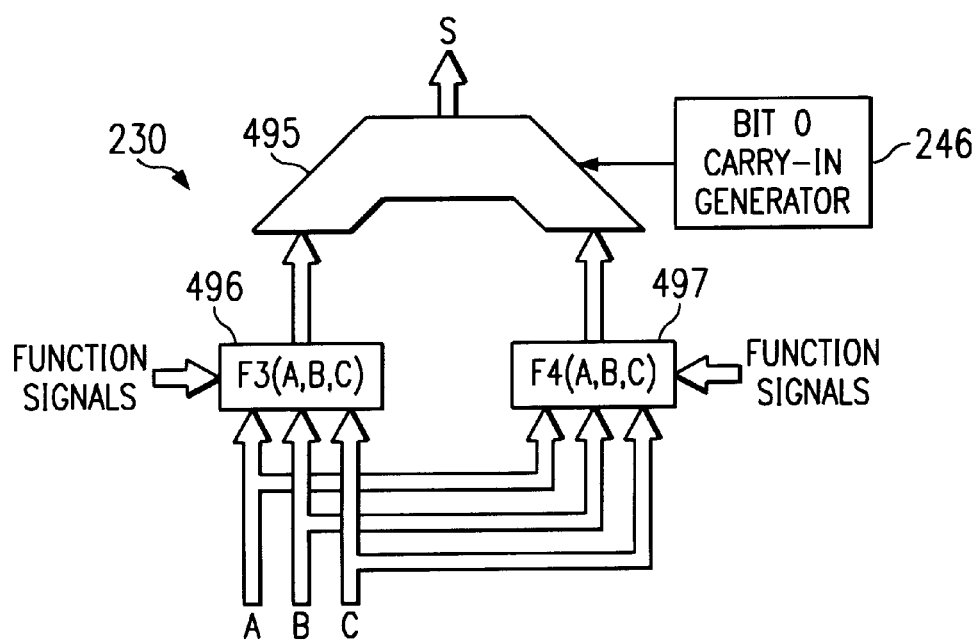
FIG. 26 illustrates in block diagram form a conceptual view of an alternative embodiment of the arithmetic logic unit.

FIG. 26 illustrates in block diagram form an alternative embodiment of arithmetic logic unit 230. The arithmetic logic unit 230 of FIG. 26 forms the equation:

$$S=F3(A,B,C)+F4(A,B,C)$$

where: S is the arithmetic logic unit resultant; and F3(A,B,C) and F4(A,B,C) can be any of the 256 possible Boolean functions of A, B and C. Adder 495 forms the addition of this equation and includes an input for a least significant bit carry input from bit 0 carry-in generator 246. Boolean function generator 496 forms the function F3(A,B,C) as controlled by input function signals. Boolean function generator 497 similarly forms the function F4(A,B,C) as controlled by input function signals. Note that Boolean function generators 496 and 497 independently form selected Boolean combinations of A, B and C from a set of the 256 possible Boolean combinations of three inputs. Note that it is clear from this construction that arithmetic logic unit 230 forms the Boolean combinations before forming the arithmetic combination. The circuit in FIG. 21 can be modified to achieve this result. The generate/kill function illustrated in FIG. 21 employs a part of the logic tree used in the propagate function. This consists of pass gates 451, 452, 453, 454, 461 and 462. Providing a separate logic tree for this function that duplicates pass gates 451, 452, 453, 454, 461 and 462 and eliminating the NOT A gate 475 results in a structure embodying FIG. 26. Note in this construction one of the generate or kill terms may occur simultaneously with the propagate term. This construction provides even greater flexibility than that illustrated in FIG. 25.

The three input arithmetic logic unit 230, the auxiliary data path hardware and knowledge of the binary number system can be used to form many useful elementary functions The instruction set of the digital image/graphics processors makes more of the hardware accessible to the programmer than typical in microprocessors. Making hardware more accessible to the programmer exposes some aspects of architecture that are hidden on most other processors. This instruction set supports forming custom operations using the elemental functions as building blocks. This makes greater functionality accessible to the programmer beyond the hardware functions commonly found within other processors, the digital image/graphics processors have hardware functions that can be very useful for image, graphics, and other processing. This combination of hardware capability and flexibility allows programmers to perform in one instruction what could require many instructions on most other architectures. The following describes some key elemental functions and how two or more of them can be combined to produce a more complex operation.

The previous sections described the individual workings of each functional block of data unit 110. This section will discuss how these functions can be used in combination to perform more complex operations. Barrel rotator 235, mask generator 239 and 3-input arithmetic logic unit 230 can work together to perform shift left, unsigned shift right, and signed shift right either alone or combination with addition or subtraction in a single arithmetic logic unit instruction cycle. An assembler produces program code for digital image/graphics processors 71, 72, 73 and 74. This assemblier preferably supports the symbols ">>u" for unsigned (logical) right shift, ">>" or ">>s" for arithmetic (signed) right shift, and "<<" for a left shift. These shift notations are in effect macro functions that select the appropriate explicit functions in terms of rotates, mask generation, and arithmetic logic unit function. The assemblier also preferably supports explicitly specifying barrel rotation ("\\"), mask generation ("%" and "%!"), and the arithmetic logic unit function. The explicit notation will generally be used only when specifying a custom function not expressible by the shift notation.

Data unit 110 performs left shift operations in a single arithmetic logic unit cycle. Such a left shift operation includes barrel rotator via barrel rotator 235 by the number of bits of the left shift. As noted above during such rotation, bits that rotate out the left wrap around into the right and thus need to be stripped off to perform a left shift. The rotated output is sent to the B-port of arithmetic logic unit 230. Mask generator 239 receives the shift amount and forms a mask with a number of right justified ones equal to the shift amount. Note that the same shift amount supplies the rotate control input of barrel rotator 235 from second input bus 202 via multiplexer Smux 231 and mask generator 239 from second input bus 202 via multiplexer Mmux 234. Mask generator 239 supplies the C-port of arithmetic logic unit 230. Arithmetic logic unit 230 combines the rotated output with the mask with the Boolean function B&~C. Left shifts are expressed in the assemblier below:

Left_Shift=Input<<Shift_Amount

This operation is equivalent to the explicit notation:

Left_Shift=(Input\\Shift_Amount)&~%Shift_Amount

The following example shows of a left shift of Hex "53FFFFA7" by 4 bits. While shown in several steps, data unit 110 performs this in a single pass arithmetic logic unit cycle The original number in binary notation is:

0101 0011 1111 1111 1111 1111 1010 0111

Rotation by 4 places in barrel rotator 235 yields:

0011 1111 1111 1111 1111 1010 0111 0101

Mask generator 239 forms the following mask:

0000 0000 0000 0000 0000 0000 0000 1111

Arithmetic logic unit 230 forms the logical combination B&~C. This masks bits in the rotated amount causing them to be "0" and retains the other bits. This yields the left shift result:

0011 1111 1111 1111 1111 1010 0111 0000

The left shift of the above example results in an arithmetic overflow, because some bits have "overflowed". During a shift left, arithmetic overflow occurs for unsigned numbers if any bits are shifted out. Arithmetic overflow may also occur for signed numbers if the resulting sign bit differs from the original sign bit. Arithmetic logic unit 230 of this invention does not automatically detect arithmetic overflow on left shifts. Left shift overflow can be detected by subtracting the left-most-bit-change amount of the original number generated by LMO/RMO/LMBC/RMBC circuit 237 from the left shift amount. If the difference is less than or equal to zero, then no bits will overflow during the shift. If the difference is greater than zero, this difference is the number of bits that overflow.

The assemblier further controls data unit 110 to perform left shift and add operations and left shift and subtract operations. The assemblier translates the A+(B<<n) function into control of barrel rotator 235, mask generator 239, and arithmetic logic unit 230 to performed the desired operation. A shift left and add operation works identically to the above example of a simple shift except for the operation of arithmetic logic unit 230. Instead of performing the logical function B&~C as in a simple shift, the arithmetic logic unit performs the mixed arithmetic and logical function A+(B&~C). A left shift and add operation is expressed in the assemblier notation as:

LShift_Add=Input1+Input2<<Shift_Amount

This operation is equivalent to:

LShift_Add=Input1+[(Input2\\Shift_Amount) &~%Shift_Amount]

The following example shows a left shift of Hex "53FFFFA7" by 4 bits followed by addition of Hex "000000AA". Note that all these steps require only a single arithmetic logic unit cycle. The original Input2 in binary notation is:

0101 0011 1111 1111 1111 1111 1010 0111

Rotation by 4 places in barrel rotator 235 yields:

0011 1111 1111 1111 1111 1010 0111 0101

Mask generator 239 forms the mask:

0000 0000 0000 0000 0000 0000 0000 1111

Arithmetic logic unit 230 forms the logical combination B&~C producing a left shift result:

0011 1111 1111 1111 1111 1010 0111 0010

The other operand Input1 in binary notation is:

0000 0000 0000 0000 0000 0000 1010 1010

Finally the sum is:

0011 1111 1111 1111 1111 1011 0001 1010

Note that arithmetic logic unit 230 forms the logical combination and the arithmetic combination in a single cycle and that the left shift result shown above is not available as an intermediate result. Note also that the sum may overflow even if the left shift does not produce an overflow. Overflow of the sum is detected by generation of a carry-out from the most significant bit of arithmetic logic unit 230. This condition is detected and stored in the "V" bit of status register 210.

The shift left and subtract operation also breaks down into a set of functions performed by barrel rotator 235, mask generator 237, and arithmetic logic unit 239 in a single arithmetic logic unit cycle. The left shift and subtract operation differs from the previously described left shift operation and left shift and add operation only in the function of arithmetic logic unit 230. During left shift and subtract arithmetic logic unit 230 performs the mixed arithmetic and logical function A+(B|~C)+1. Arithmetic logic unit 230 performs the "+1" operation by injection of a "1" into the carry input of the least significant bit. This injection of a carry-in takes place at bit 0 carry-in generator 246. Most subtraction operations with this invention take place using such a carry-in of "1" to the least significant bit. The assemblier notation expresses left shift and subtract operations as follows:

LShift_Sub=Input1-Input2<<Shift_Amount

This operation is equivalent to:

LShift_Sub=Input1-[(Input2\\Shift_Amount) &~%Shift_Amount]+1

The following example shows a left shift of Hex "53FFFFA7" by 4 bits followed by subtraction of Hex "000000AA". Note that all these steps require only a single arithmetic logic unit cycle. The original Input2 in binary notation is:

0101 0011 1111 1111 1111 1111 1010 0111

Rotation by 4 places in barrel rotator 235 yields:

0011 1111 1111 1111 1111 1010 0111 0101

Mask generator 239 forms the mask:

0000 0000 0000 0000 0000 0000 0000 1111

The result of the logical combination ~B|C is as follows:

1100 0000 0000 0000 0000 0101 1000 1111

The other operand Input1 in binary notation is:

0000 0000 0000 0000 0000 0000 1010 1010

The sum A+(~B|C) is:

1100 0000 0000 0000 0000 0110 0011 1001

Finally the addition of the "1" injected into the least significant bit carry-in yields:

1100 0000 0000 0000 0000 0110 0011 1010

Note that arithmetic logic unit 230 forms the logical combination and the arithmetic combination in a single cycle and that neither the left shift result nor the partial sum shown above are available as intermediate results.

The assemblier of the preferred embodiment can control data unit 110 to perform an unsigned right shift with zeros shifted in from the left in a single arithmetic logic unit cycle. Since barrel rotator 235 performs a left rotate, at net right rotate may be formed with a rotate amount of 32-n, where n is the number of bits to rotate right. Note, only the 5 least significant bits of the data on second input bus 202 are used by barrel rotator 235 and mask generator 239. Therefore the amounts 32 and 0 are equivalent in terms of controlling the shift operation. The assembler will automatically make the 32-n computation for shifts with an immediate right shift amount. The assemblier of the preferred embodiment requires the programmer form the quantity 32-n on register based shifts.

Once the accommodation for right rotation is made, the unsigned shift right works the same as the shift left except that arithmetic logic unit 230 performs a different function. This operation includes rotation by the quantity 32-n via barrel rotator 235. The result of this net rotate right will to have bits wrapped around from the least significant to the most significant part of the word. The same quantity (32-n) controls mask generator 239, which will generate 32-n right justified ones. Mask generator 239 is controlled with the "!" option so that a shift amount of zero produces a mask of all "1's". In this case no bits are to be stripped off. Arithmetic logic unit 230 then forms a Boolean combination of the outputs of barrel rotator 235 and mask generator 239.

An example of an unsigned right shift operation is shown below. The assemblier notation for an unsigned right shift is:

Unsigned_Right_Shift=Input>>u(32-Shift_Amount)

The equivalent operation explicitly showing the functions performed is:

Unsigned_Right_Shift=(Input\\(32-Shift_Amount)) &%!(32-Shift_Amount)

Note in the equation above the mask operator "%!" specifies that if the shift amount is zero, an all "1" mask will be generated. The example below shows the unsigned shifting the number Hex "53FFFFA7" right by 4 bit positions. The original number in binary form is:

0101 0011 1111 1111 1111 1111 1010 0111

This number when left rotated by 32-4=28 places becomes:

0111 0101 0011 1111 1111 1111 1111 1010

Mask generator 239 forms a mask from the input 32-4=28, which is:

0000 1111 1111 1111 1111 1111 1111 1111

Lastly arithmetic logic unit 230 forms the Boolean combination B&C yielding the result:

0000 0101 0011 1111 1111 1111 1111 1010

Data unit 110 may perform either unsigned right shift and add or unsigned right shift and subtract operations. In the preferred embodiment the assemblier translates the notation A+B>>u(n) into an instruction that controls barrel rotator 235, mask generator 239 and arithmetic logic unit 230 to performed an unsigned right shift and add operation. The unsigned shift right and add works identically to the previous example of a simple unsigned shift right except that arithmetic logic unit 230 performs the function A+(B&C). In the preferred embodiment the assemblier translates the notation A-B>>u(n) into an instruction that controls barrel rotator 235, mask generator 239 and arithmetic logic unit 230 to performed an unsigned right shift and subtract operation. The unsigned shift right and subtract works similarly to the previous example of a simple unsigned shift right except that arithmetic logic unit 230 performs the function A-(~B|c)+1. As with left shift and subtract the "+1" operation involves injection of a "1" carry-in into the least significant bit via bit 0 carry-in generator 246.

The assemblier of the preferred embodiment can control data unit 110 to perform a signed right shift with sign bits shifted in from the left in a single arithmetic logic unit cycle. The assembler will automatically make the 32−n computation for such shifts with an immediate right shift amount. Data unit 110 includes hardware that detects that state of the most significant bit, called the sign bit, of the input into barrel rotator 235. This sign bit may control the 4 least significant bits of the function code. When using this hardware, the 4 least significant bits of the function code are inverted if the sign bit is "0". Signed right shift operations use this sign detection hardware to control the function arithmetic logic unit 230 performs based on the sign of the input to barrel rotator 235. This operation can be explained using the following elemental functions. Barrel rotator 235 performs a net rotate right by rotating left by 32 minus the number of bits of the desired signed right shift (32−n). This shift amount (32−n) is supplied to mask generator 237, which will thus generate 32−n right justified "1's". The "1's" of this mask will select the desired bits of the number that is right shifted. The "0's" of this mask will generate sign bits equal to the of the most significant bit input to barrel rotator 235. Arithmetic logic unit 230 then combines the rotated number from barrel rotator 235 and the mask from mask generator 237. The Boolean function performed by arithmetic logic unit 230 depends upon the sign bit at the input to barrel rotator 235. If this sign bit is "0", then arithmetic logic unit 230 receives function signals to perform B&C. While selecting the rotated number unchanged, this forces "0" any bits that are "0" in the mask. Thus the most significant bits of the result are "0" indicating the same sign as the input to barrel rotator 235. If the sign bit is "1", then arithmetic logic unit 230 received function signal to perform B|~C. This function selects the rotated amount unchanged while forcing to "1" any bits that are "0" in the mask. The change in function code involves inverting the 4 least significant bits if the detected sign bit is "0". Thus the most significant bits of the result are "1", the same sign indication as the input to barrel rotator 235.

Two examples of the unsigned right shift operation are shown below. Signed right shift is the default assemblier notation for right shifts. The two permitted assembler notations for a signed right shift are:

Signed_Right_Shift=Input>>s(32−Shift_Amount)

Signed_Right_Shift=Input>>(32−Shift_Amount)

Because this operation uses the sign detection hardware, there is no explicit way in the notation of the preferred embodiment of the assemblier to specify this operation in terms of rotation and masking. In the preferred embodiment the sign of the input to barrel rotator 235 controls inversion of the function signals F3–F0. The first example shows a 4 place signed right shift of the negative number Hex "ECFFFFA7". The original number in binary notation is:

1110 1100 1111 1111 1111 1111 1010 0111

Left rotation by 28 (32−4) places yields:

0111 1110 1100 1111 1111 1111 1111 1010

Mask generator 237 forms this mask:

0000 1111 1111 1111 1111 1111 1111 1111

Because the most significant bit of the input to barrel rotator 235 is "1", arithmetic logic unit 230 forms the Boolean combination of B|~C. This yields the result:

1111 1110 1100 1111 1111 1111 1111 1010

In this example "1's" are shifted into the most significant bits of the shifted result, matching the sign bit of the original number. The second example shows a 4 place signed right shift of the positive number Hex "5CFFFFA7". The original number in binary notation is:

0101 1100 1111 1111 1111 1111 1010 0111

Left rotation by 28 (32−4) places yields:

0111 0101 1100 1111 1111 1111 1111 1010

Mask generator 237 forms this mask:

0000 1111 1111 1111 1111 1111 1111 1111

Because the most significant bit of the input to barrel rotator 235 is "0", arithmetic logic unit 230 forms the Boolean combination of B&C by inversion of the four least significant bits of the function code. This yields the result:

0000 0101 1100 1111 1111 1111 1111 1010

Note that upon this right shift "0's" are shifted in the most significant bits, matching the sign bit of the original number.

Data unit 110 may perform either signed right shift and add or signed right shift and subtract operations. In the preferred embodiment the assemblier translates the notations A+B>>(n) or A+B>>s(n) into an instruction that controls barrel rotator 235, mask generator 239 and arithmetic logic unit 230 to perform a signed right shift and add operation. The signed shift right and add works identically to the previous example of the signed shift right except for the function performed by arithmetic logic unit 230. In the signed right shift and add operation arithmetic logic unit 230 performs the function A+(B&C) if the sign bit of the input to barrel rotator 235 is "0". If this sign bit is "1", then arithmetic logic unit 230 performs the function A+(B|~C). In the preferred embodiment the assemblier translates the notations A−B>>s(n) or A−B>>(n) into an instruction that controls barrel rotator 235, mask generator 239 and arithmetic logic unit 230 to perform a signed right shift and subtract operation. The signed shift right and subtract operation works similarly to the previous example of a simple signed shift right except for the function of arithmetic logic unit 230. When the sign bit is "1", arithmetic logic unit 230 performs the function A−(B&C)+1. When the sign bit is "0", arithmetic logic unit 230 performs the alternate function A−(B|~C)+1. As in the ease of left shift and subtract the "+1" operation involves injection of a "1" carry-in into the least significant bit via bit 0 carry-in generator 246.

Barrel rotator 235, mask generator 237 and arithmetic logic unit 230 can perform field extraction in a single cycle. A field extraction takes a field of bits in a word starting at any arbitrary bit position, strips off the bits outside the field and right justifies the field. Such a field extraction is performed by rotating the word left the number of bits necessary to right justify the field and masking the result of the rotation by the number of bits in the size of the field. Unlike the cases for shifting, the rotation amount, which is based on the bit position, and the mask input, which is based on the field size, are not necessarily the same amount. The assemblier of the preferred embodiment employs the following notation for field extraction:

Field_Extract=(Value\\(32−starting_bit))&%!Eield size

The "%!" operator causes mask generator 237 to form a mask having a number of right justified "1's" equal to the field size, except for an input of zero. In that case all bits of the generated mask are "1". so that no bits are masked by the logical AND operation. This rotation and masking may produce wrapped around bits if the field size is greater than the starting bit position. These parameters specify an anomalous case in which the specified field extends beyond the end of the original word. Data unit 110 provides no hardware check to for this case. It is the responsibility of the programmer to prevent this result. The example below demonstrates field extraction of a 4-bit field starting at bit 24, which is the eight bit from the left, of the number Hex "5CFFFFA7". The number in binary form is:

0101 1100 1111 1111 1111 1111 1010 0111

The number must be rotated left by 32−24 or 8 bits to right justify the field. The output from barrel rotator 235 is:

1111 1111 1111 1111 1010 0111 0101 1100

Mask generator 237 forms the following mask from the field size of 4 bits:

0000 0000 0000 0000 0000 0000 0000 1111

Lastly, arithmetic logic unit 230 forms the Boolean combination B&C. This produces the extracted field as follows:

0000 0000 0000 0000 0000 0000 0000 1100

Mflags register 211 is useful in a variety of image and graphics processing operations. These operations fall into two classes. The first class of Mflags operations require a single pass through arithmetic logic unit 230. A number is loaded into Mflags register 211 and controls the operation of arithmetic logic unit 230 via expand circuit 238, multiplexer Cmux 233 and the C-port of arithmetic logic unit 230. Color expansion is an example of these single pass operations. The second class of Mflags operations require two passes through arithmetic logic unit 230. During a first pass certain bits are set within Mflags register 211 based upon the carry of zero results of arithmetic logic unit 230. During a second pass the contents of Mflags register 211 control the operation of arithmetic logic unit 230 via expand circuit 238, multiplexer Cmux 233 and the C-port of arithmetic logic unit 230. Such two pass Mflags operations are especially useful when using multiple arithmetic. Numerous match and compare, transparency, minimum, maximum and saturation operations fall into this second class.

A basic graphics operation is the conversion of one bit per pixel shape descriptors into pixel size quantities. This is often called color expansion. In order to conserve memory space the shape of bit mapped text fonts are often stored as shapes of one bit per pixel. These shapes are then "expanded" into the desired color(s) when drawn into the display memory. Generally "1's" in the shape descriptor select a "one color" and "0's" in the shape descriptor select a "zero color". A commonly used alternative has "0's" in the shape descriptor serving as a place saver or transparent pixel.

The following example converts 4 bits of such shape descriptor data into 8 bit pixels. In this example the data size of the multiple arithmetic operation is 8 bits. Thus arithmetic logic unit 230 operates in 4 independent 8 bit sections. The four bits of descriptor data "0110", are loaded into Mflags register 211:

XXXXXXXX XXXXXXXX XXXXXXXX XXXX0110

The bits listed as "X" are don't care bits that are not involved in the color expansion operation. Expand circuit 238 expands these four bits in Mflags register 211 into blocks of 8 bit "1's" and "0's" as follows:

00000000 11111111 11111111 00000000

The one color is supplied to the A-port of arithmetic logic unit 230 repeated for each of the 4 pixels within the 32 bit data word:

11110000 11110000 11110000 11110000

The zero color is supplied to the B-port of arithmetic logic unit 230, also repeated for each of the 4 pixels:

10101010 10101010 10101010 10101010

Arithmetic logic unit 230 forms the Boolean combination (A&C)|(B&~C) which yields:

10101010 11110000 11110000 10101010

Color expansion is commonly used with a PixBlt algorithm. To perform a complete PixBlt, the data will have to be rotated and merged with prior data to align the bits in the data to be expanded with the pixel alignment of the destination words. Barrel rotator 235 and arithmetic logic unit 230 can align words into Mflags register 211. This example assumed that the shape descriptor data was properly aligned to keep the example simple. Note also that Mflags register 211 has its own rotation capability upon setting bits and using bits. Thus a 32 bit word can be loaded into Mflags register 211 and the above instruction repeated 8 times to generate 32 expanded pixels.

Simple color expansion as in the above example forces the result to be one of two solid colors. Often, particularly with kerned text letters whose rectangular boxes can overlap, it is desirable to expand "1's" in the shape descriptor to the one color but have "0's" serve as place saver or transparent pixels. The destination pixel value is unchanged when moving such a transparent color. Data unit 110 can perform a transparent color expand by simply using a register containing the original contents of the destination as the zero value input. An example of this appears below. Arithmetic logic unit 230 performs the same function as the previous color expansion example. The only difference is the original destination becomes one of the inputs to arithmetic logic unit 230. The four bits of descriptor data "0110" are loaded into Mflags register 211:

XXXXXXXX XXXXXXXX XXXXXXXX XXXX0110

Expand circuit 238 expands these four bits in Mflags register 211 into blocks of 8 bit "1's" and "0's" as follows:

00000000 11111111 11111111 00000000

The one color is supplied to the A-port of arithmetic logic unit 230 repeated for each of the 4 pixels within the 32 bit data word:

11110000 11110000 11110000 11110000

The original destination data is supplied to the B-port of arithmetic logic unit 230, original destination data including 4 pixels:

11001100 10101010 11101110 11111111

Arithmetic logic unit 230 again forms the Boolean combination (A&C)|(B&~C) which yields:

11001100 11110000 11110000 11111111

Note that the result includes the one color for pixels corresponding to a "1" in Mflags register 211 and the original pixel value for pixels corresponding to a "0" in Mflags register 211.

Data unit 110 can generate a 1 bit per pixel mask based on an exact match of a series of 8 bit quantities to a fixed compare value. This is shown in the example below. The compare value is repeated four times within the 32 bit word. Arithmetic logic unit 230 subtracts the repeated compare value from a data word having four of the 8 bit quantities. During this subtraction, arithmetic logic unit 230 is split into 4 sections of 8 bits each. The zero detectors 321, 322, 323 and 324 illustrated in FIG. 7 supply are data to be stored in Mflags register 211. This example includes two instructions in a row to demonstrate accumulating by rotating Mflags register 211. Initially Mflags register 211 stores don't care data:

XXXXXXXX XXXXXXXX XXXXXXXX XXXXXXXX

The first quantity for comparison is:

00000011 00001111 00000001 00000011

The compare value is "00000011". This is repeated four times in the 32 bit word as:

00000011 00000011 00000011 00000011

Arithmetic logic unit 230 subtracts the compare value from the first quantity. The resulting difference is:

00000000 00001100 11111110 00000000

This forms the following zero compares "1001" that are stored in Mflags register 211. In this example Mflags register 211 is pre-cleared before storing the zero results. Thus Mflags register 211 is:

00000000 00000000 00000000 00001001

The second quantity for comparison is:

00000111 11111100 00000011 00000000

The result of a second subtraction of the same compare value is:

00000100 11111001 00000000 11111101

This forms the new zero compares "0010" that are stored in Mflags register 211 following rotation of four places:

00000000 00000000 00000000 10010010

Additional compares may be made in the same fashion until Mflags register 211 stores 32 bits. Then the contents of Mflags register 211 may be moved to another register or written to memory.

Threshold detection involves comparing pixel values to a fixed threshold. Threshold detection sets a 1 bit value for each pixel which signifies the pixel value was greater than or less than the fixed threshold. Depending on the particular application, the equal to case is grouped with either the greater than case or the less than case. Data unit 110 may be programmed to from the comparison result in a single arithmetic logic unit cycle. Arithmetic logic unit 230 forms the difference between the quantity to be tested and the fixed threshold. The carry-outs from each section of arithmetic logic unit 230 are saved in Mflags register 211. If the quantity to be tested I has the fixed threshold T subtracted from it, a carry out will occur only if I is greater than or equal to T. As stated above, arithmetic logic unit 230 performs subtraction by two's complement addition and under these circumstances a carry-out indicates a not-borrow. Below is an example of this process for four 8 bit quantities in which the threshold value is "00000111". Let four 8 bit quantities I to be tested be:

00001100 00000001 00000110 00000111

The threshold value T repeated four times within the 32 bit word is:

00000111 00000111 00000111 00000111

The difference is:

00000101 11111010 11111111 00000000 which produces the following carry-outs "1001". This results in a Mflags register 211 of:

XXXXXXXX XXXXXXXX XXXXXXXX XXXX1001

As in the case of match detection, this single instruction can be repeated for new data with Mflags resister rotation until 32 bits are formed.

When adding two unsigned numbers, a carry-out indicates that the result is greater than can be expressed in the number of bits of the result. This carry-out represents the most significant bit of precision of the result. Thus saving the carry-outs in Mflags register 211 can be used to maintain precision. These carry-out bits may be saved for later addition to maintain precision. Particularly when used with multiple arithmetic, limiting the precision to fewer bits often enables the same process to be performed in fewer arithmetic logic unit cycles.

Mflags operations of the second type employ both setting bits within Mflags register 211 and employing bits stored in Mflags register 211 to control the operation of arithmetic logic unit 230. Multiple arithmetic can be used it in combination with expands of Mflags register 211 to perform multiple parallel byte or half-word operations. Additionally, the setting of bits in Mflags register 211 and expanding Mflags register 211 to arithmetic logic unit 230 are inverse space conversions that can be used in a multitude of different ways.

The example below shows a combination of an 8 bit multiple arithmetic instruction followed by an instruction using expansion to perform a transparency function. Transparency is commonly used when performing rectangular PixBlts of shapes that are not rectangular. The transparent pixels are used as place saver pixels that will not affect the destination and thus are transparent so the original destination shows through. With transparency, only the pixels in the source that are not equal to the transparent code are replaced in the destination. In a first instruction the transparent color code is subtracted from the source and Mflags register 211 is set based on equal zero. If a given 8 bit quantity matches the transparent code, a corresponding "1" will be set in Mflags register 211. The second instruction uses expansion circuit 238 to expand Mflags register 211 to control selection on a pixel by pixel basis of the source or destination. Arithmetic logic unit 230 performs the function (A&C)|(B&~C) to make this selection. While this Boolean function is performed bit by bit, Mflags register 211 has been expanded to the pixel size of 8 and thus it selects between pixels. The pixel source is:

00000011 01110011 00000011 00000001

The transparent code TC is "00000011". Repeated 4 times to fill the 32 bit word this becomes:

00000011 00000011 00000011 00000011

The difference SRC–TC is:

00000000 01110000 00000000 11111110 which produces the zero detection bits "1010". Thus Mflags register 211 stores:

XXXXXXXX XXXXXXXX XXXXXXXX XXXX1010

In the second instruction, expand circuit 238 expands Mflags register 211 to:

11111111 00000000 11111111 00000000

The original destination DEST is:

11110001 00110011 01110111 11111111

The original source SRC forms a third input to arithmetic logic unit 230. Arithmetic logic unit 230 then forms the Boolean combination (DEST&@MF)|(SRC&~@MF) which is:

11110001 00010011 01110111 00000001

Note that the resultant has the state of the source where the source was not transparent, otherwise it has the state of the destination. This is the transparency function.

Data unit 110 can perform maximum and minimum functions using Mflags register 211 and two arithmetic logic unit cycles. The maximum function takes the greater of two unsigned pixel values as the result. The minimum function takes the lesser of two unsigned pixel values as the result. In these operations the first instruction performs multiple subtractions, setting Mflags register 211 based on carry-outs. Thus for status setting arithmetic logic unit 230 forms OP1–OP2. This first instruction only sets Mflags register 211 and the resulting difference is discarded. When performing the maximum function the second instruction, arithmetic logic unit 230 performs the operation (OP1&@MF)|(OP2&~@MF). This forms the maximum of the individual pixels. Let the first operand OP1 be:

00000001 11111110 00000011 00000100 and the second operand OP2 be:

00000011 00000111 00000111 00000011

The difference OP1–OP2 is:

11111110 11110111 11111100 00000000

This produces carry-outs (not-borrows) "0101" setting Mflags register 211 as:

XXXXXXXX XXXXXXXX XXXXXXXX XXXX0101

In the second instruction the four least significant bits in Mflags register 211 are expanded via expand circuit 238 producing:

00000000 11111111 00000000 11111111

Arithmetic logic unit 230 performs the Boolean function (OP1&@MF)|(OP2&~@MF). This produces the result:

00000011 11111110 00000111 00000100

Note that each 8 bit section of the result has the state of the greater of the corresponding sections of OP1 and OP2. This is the maximum function. The minimum function operates similarly to the maximum function above except that in the second instruction arithmetic logic unit 230 performs the Boolean function (OP1&~@MF)|(OP2&@MF). This Boolean function selects the lesser quantity rather than greater quantity for each 8 bit section.

Data unit 110 may also perform an add-with-saturate function. The add-with-saturate function operates like a normal add unless an overflow occurs. In that event the add-with-saturate function clamps the result to all "1's". The add-with-saturate function is commonly used in graphics and image processing to keep small integer results from overflowing the highest number back to a low number. The example below shows forming the add-with-saturate function using multiple arithmetic on four 4 bit pixels in two instructions. First the addition takes place with the carry-outs stored in Mflags register 211. A carry-out of "1" indicates an overflow, thus that sum should be set to all "1's", which is the saturated value. Then expand circuit 238 expands Mflags register 211 to control selection of the sum or the saturated value. The first operand OP1 is:

00000001 11111001 00000011 00111111

The second operand OP2 is:

11111111 00001011 00000111 01111111

Arithmetic logic unit 230 forms the sum OP1+OP2= RESULT resulting in:

00000000 00000100 00001010 10111110 with corresponding carry-outs of "1100". These are stored in Mflags register 211 as:

XXXXXXXX XXXXXXXX XXXXXXXX XXXX1100

In the second instruction expand circuit 238 expands the four least significant bits of Mflags register 211 to:

11111111 11111111 00000000 00000000

Arithmetic logic unit 230 performs the Boolean function RESULT|@MF forming:

11111111 11111111 00001010 10111110

Note the result of the second instruction equals the sum when the sum did not overflow and equals "11111111" when the sum overflowed.

Data unit 110 can similarly perform a subtract-with-saturate function. The subtract-with-saturate function operates like a normal subtract unless an underflow occurs. In that event the subtract-with-saturate function clamps the result to all "0's". The subtract-with-saturate function may also be commonly used in graphics and image processing. The data unit 110 performs the subtract-with-saturate function similarly to the add-with-saturate function shown above. First the subtraction takes place with the carry-outs stored in Mflags register 211. A carry-out of "0" indicates a borrow and thus an underflow. In that event the difference should be set to all "0's", which is the saturated value. Then expand circuit 238 expands Mflags register 211 to control selection of the difference or the saturated value. During this second instruction arithmetic logic unit 230 performs the Boolean function RESULT&@MF. This forces the combination to "0" if the corresponding carry-out was "0", thereby saturating the difference at all "0's". On the other hand if the corresponding carry-out was "1", then the Boolean combination is the same as RESULT.

Figure 27:
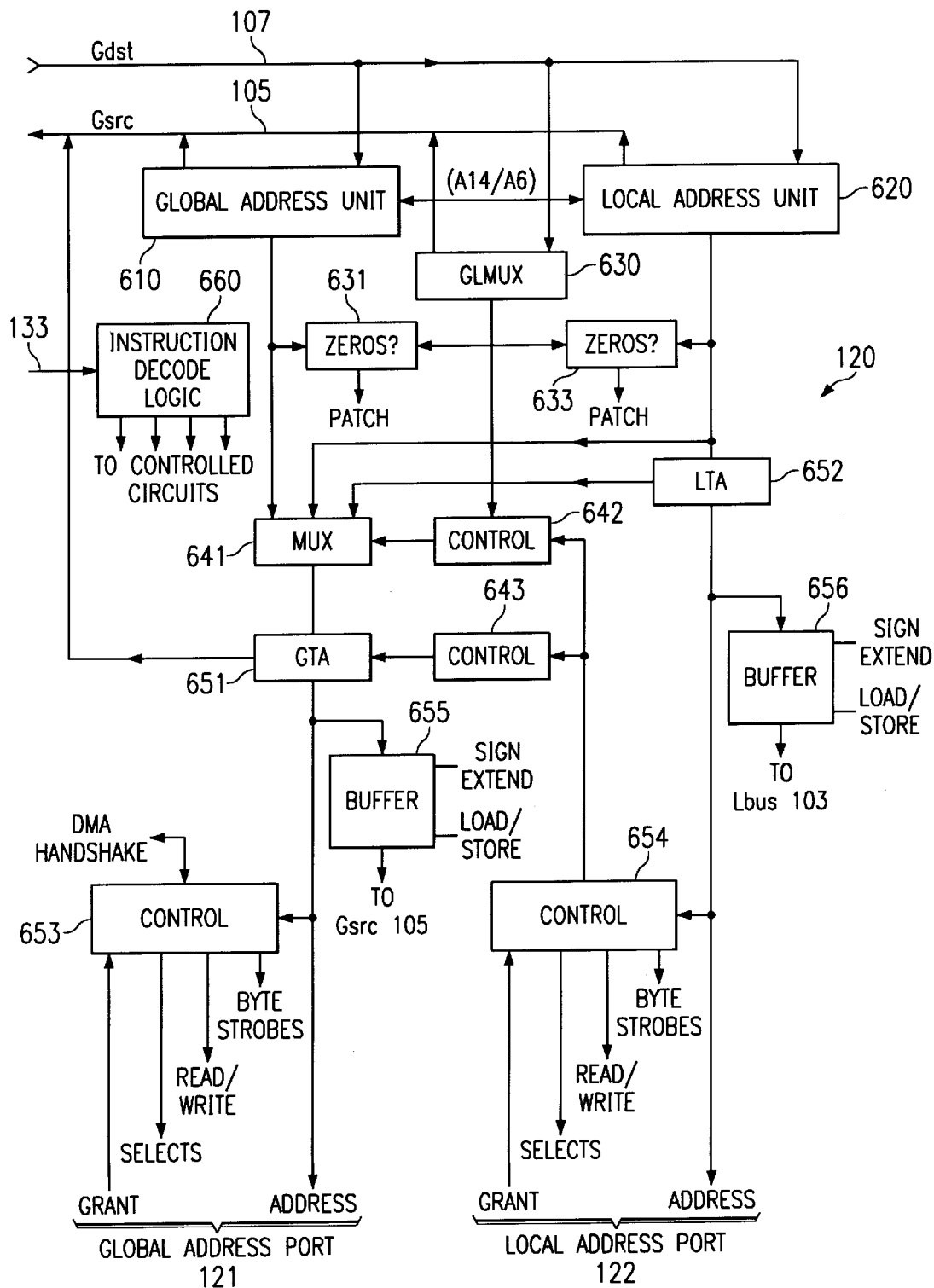
FIG. 27 illustrates in block diagram form the address unit of the digital image/graphics processor illustrated in FIG. 3.

FIG. 27 illustrates in block diagram form the construction of address unit 120 of digital image/graphics processor 71 according to the preferred embodiment of this invention. The address unit 120 includes: a global address unit 610; a local address unit 620; a global/local multiplexer control register GLMUX 631; a pair of zero detectors 631 and 632; a multiplexer 641; four control circuits 612, 643, 653, 654; a global temporary address register GTA 651; a local temporary address register LTA 652; a pair of address unit arithmetic buffers 655 and 656; an instruction decode logic 660; a global address port 121; and a local address port 122. As illustrated in FIG. 27, global/local address multiplexer register GLMUX 630 is coupled to global port source data bus Gsrc 105 and to global port destination data bus Gdst 107. Global/local address multiplexer register GLMUX 630 is in the register space of digital image/graphics processor 71 and may be written to or read from as any other register. Global temporary address register GTA 651 is connected to global port source data bus Gsrc 105 only. Though global temporary address register GTA is within the register space of digital image/graphics processor 71, the preferred embodiment allows reads from but not writes to this register. An attempted write to global temporary address register GTA 651 is ignored. Note that local temporary address register LTA 652 is coupled to neither global port source data bus Gsrc 105 nor global port destination data bus Gdst 107. This register is not within the register space of digital image/graphics processor 71 and cannot be accessed. As previously described each digital image/graphics processor 71, 72, 73 and 74 includes both a global data port and a local data port, which may operate simultaneously. Separate global and local address units allow generation of independent addresses for these independent data transfers. In addition, some combined addresses are permitted as will be further described below. Note that all the functions of address unit 120 are controlled by instruction decode logic 660, which is responsive to the instruction currently in the address pipeline stage via opcode bus 133. The details of these control lines are omitted from FIG. 27 for the sake of clarity. However, these control functions are within the capability of one skilled in the art from this description and the description of the instruction word formats in conjunction with FIG. 43.

Tables 25 and 26 detail the permitted addresses generated by the respective global and local data ports, of digital image/graphics processors 71, 72, 73 and 74. Table 25 indicates the permitted data space addresses in hexadecimal according to the form Hex "0000????", where the range of the final four digits "????" is shown in Table 25.

TABLE 25

| Global Ports | Local Ports | | | |
|---|---|---|---|---|
| | DIGP 71 | DIGP 72 | DIGP 73 | DIGP 74 |
| 0000–3FFF | 0000–0FFF | 1000–1FFF | 2000–2FFF | 3000–3FFF |
| 8000–8FFF | 8000–87FF | 9000–97FF | A000–A7FF | B000–B7FF |
| 9000–97FF | | | | |
| A000–A7FF | | | | |
| B000–B7FF | | | | |

In a similar fashion, Table 26 indicates the permitted parameter space addresses in hexadecimal according to the form Hex "0100????", where the range of the final four digits "????" is shown in Table 26.

TABLE 26

| Global Ports | Local Ports | | | |
|---|---|---|---|---|
| | DIGP 71 | DIGP 72 | DIGP 73 | DIGP 74 |
| 0000–07FF<br>1000–17FF<br>2000–27FF<br>3000–37FF | 0000–07FF | 1000–17FF | 2000–27FF | 3000–37FF |

Tables 25 and 26 show the limitations on addressing of the local data ports. As previously described, the global data ports (G) of the four digital image/graphics processors 71, 72, 73 and 74 may address any location within a data memory or a parameter memory. At the same time the local data ports (L) of each digital image/graphics processor 71, 72, 73 and 74 may only address the data and parameter memories corresponding to that digital image/graphics processor.

Figure 28:
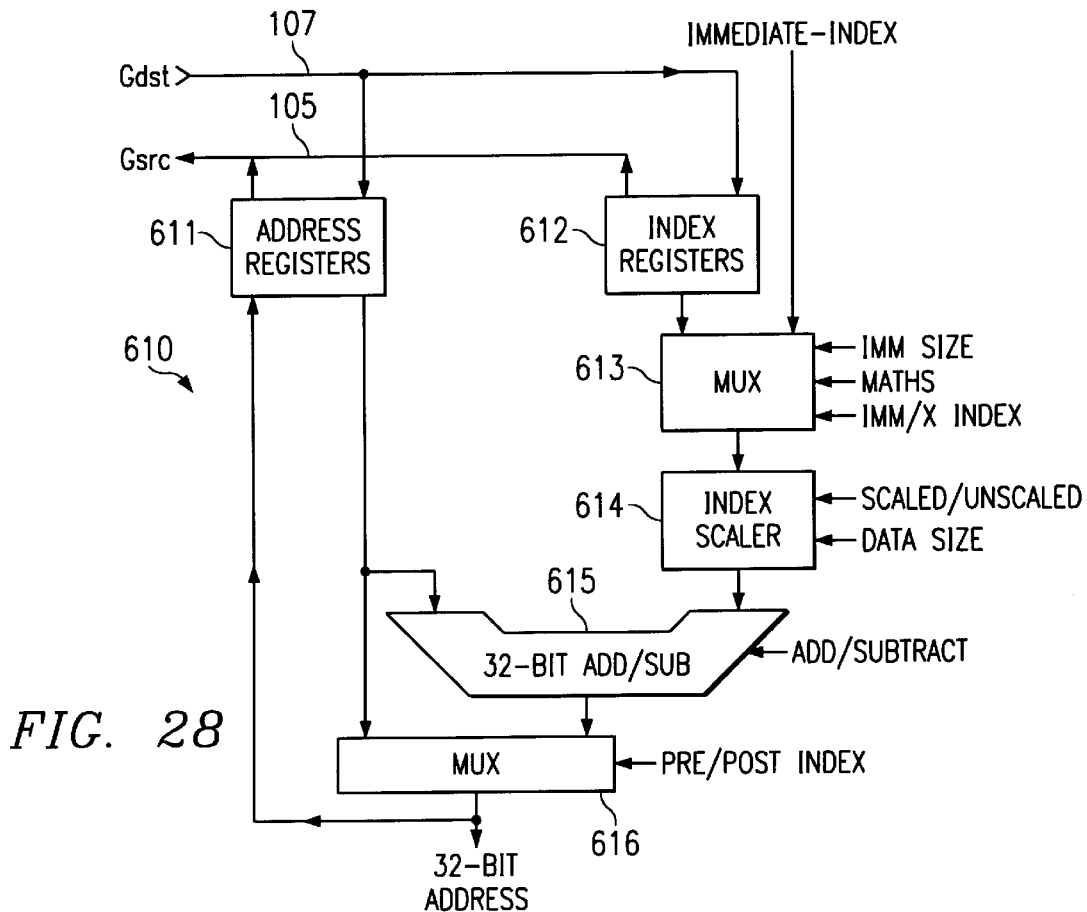
FIG. 28 illustrates in block diagram form an example of a global or a local address unit of the address unit illustrated in FIG. 27.

FIG. 28 illustrates in block diagram form the construction of global address unit 610. In accordance with the preferred embodiment, local address unit 620 is constructed identically. Global address unit 610 includes: a set of address registers 611; a set of index registers 612; multiplexers 613 and 616; an index scaler circuit; 614; and an addition/subtraction unit 615. According to the preferred embodiment the addresses include 32 bits, therefore address registers 611 and index registers 612 store data words of 32 bits and addition/subtraction unit 615 operates on data words of 32 bits.

Table 27 lists the address register assignments. Note that address registers 611 are coupled to both global port source data bus Gsrc 105 and global port destination data bus Gdst 107. These connections allow register loads from memory, register stores to memory, and register to register data transfer with other registers within that digital image/graphics processor, such as data registers 200 within data unit 110. Various uses of these connections will be described below.

TABLE 27

| Address Register | Register Assignment |
|---|---|
| A0 | Local address unit |
| A1 | Local address unit |
| A2 | Local address unit |
| A3 | Local address unit |
| A4 | Local address unit |
| A5 | reserved |
| A6 | Global/Local address units shared stack pointer |
| A7 | Local address unit read only, all zeros |
| A8 | Global address unit |
| A9 | Global address unit |
| A10 | Global address unit |
| A11 | Global address unit |
| A12 | Global address unit |
| A13 | reserved |
| A14 | Global/Local address units shared stack pointer |
| A15 | Global address unit read only, all zeros |

Address registers A0, A1, A2, A3 and A4 are within local address unit 620 and are available for general use. Address register A5 is not supported in the current embodiment, but its address is reserved for future expansion of the local address unit 620. Address registers A8, A9, A10, A11 and A12 are within global address unit 620 and are available for general use. Address register A13 is not supported in the current embodiment, but its address is reserved for future expansion of the global address unit 610. Address registers A6 and A14 are embodied by a single register accessible by local address unit 620 at address A6 and by address unit 610 at address A14. This combined register A14/A6 will generally be used as a stack pointer. Note that stack operations are only allowed on aligned 32 bit word boundaries. Consequently the two least significant bits of combined register A14/A6 are hardwired to "00". Writing to these two bits has no effect and they are always read as "00". Registers A7 and A15 are also embodied by the same hardware and both global address sun-unit 610 and local address unit 620 may use this combined register in the same instruction. Register A7 is accessible to local address unit 620 and register A15 is accessible to global address unit 610. Combined register A15/A7 is hardwired to all "0's". Writing to either of these two registers has no effect and they are always read as all "0's". In the preferred embodiment these two registers are embodied by the same hardware accessible at differing addresses.

Table 28 lists the index register assignments. Index registers 612 are coupled to both global port source data bus Gsrc 105 and global port destination data bus Gdst 107. These connections permits register loads from memory, register stores to memory, and register to register data transfer with other registers within that digital image/graphics processor, such as data registers 200 within data unit 110. Various uses of these connections will be described below.

TABLE 28

| Index Register | Register Assignment |
|---|---|
| X0 | Local address unit |
| X1 | Local address unit |
| X2 | Local address unit |
| X3 | reserved |
| X4 | reserved |
| X5 | reserved |
| X6 | reserved |
| X7 | reserved |
| X8 | Global address unit |
| X9 | Global address unit |
| X10 | Global address unit |
| X11 | reserved |
| X12 | reserved |
| X13 | reserved |
| X14 | reserved |
| X15 | reserved |

Index registers X0, X1 and X2 are within local address unit 620 and are available for general use. Index registers X3, X4, X5, X6 and X7 are not supported in the current embodiment, but their addresses are reserved for future expansion of the local address unit 620. Index registers X8, X9 and X10 are within global address unit 620 and are available for general use. Index registers X11, X12, X13, X14 and X15 are not supported in the current embodiment, but their addresses are reserved for future expansion of the global address unit 610.

Global address unit 610 generates a 32 bit address. Either an index stored in a specified index register within index registers 612 or an offset field from the instruction word is selected at multiplexer 613. This selection is controlled by the instruction via instruction decode logic 660 (FIG. 27). Multiplexer 613 also selects the size of the offset field again based on the instruction. As will be further discussed below, global address unit 610 may receive a 15 bit offset field or a 3 bit offset field. Whether the offset field is 15 bits or 3 bits, this value is zero extended to 32 bits before use.

Index scaler 614 optionally left shifts the data selected by multiplexer 613. This optional left shift is selected by a scaled/unscaled input that corresponds to the function of the instruction. This left shift is 0, 1 or 2 bits depending on the indicated data size. As previously described the pixel data may be specified as 8 bits (byte), 16 bits (half word) or 32 bits (word). If scaling is selected, then the data is left shifted with zero filling 0 bit places for byte data, 1 bit place for half word data and 2 bit places for word data. Since no scaling ever occurs for byte data transfers, the instruction word bit specifying scaling is available for other purposes. In the preferred embodiment this instruction word bit is used as an additional offset bit. Thus if the data size is 8 bits, the instruction can supply a 16 bit offset index rather than a 15 bit offset index or a 4 bit offset index rather than a 3 bit offset index. This address index scaling feature permits addressing that is independent from the data size. This feature is useful in certain applications such as look up table operations.

Addition/subtraction unit 615 receives a base address from an address register selected by the instruction and the index. The instruction selects either addition of the index to the base address or subtraction of the index from the base address. The resultant forms one input to multiplexer 616. The base address from the selected address register forms the other input to multiplexer 616. Multiplexer 610 selects one of these addresses depending on whether the instruction specifies pre-indexing or post-indexing. If the instruction specifies pre-indexing, then the resultant of addition/subtraction unit 615 is selected by multiplexer 616 as the output address. If the instruction specified post-indexing, then the base address from address registers 611 is selected by multiplexer 616 as the output address.

The modified address may be written into the selected address register. In pre-indexing, then instruction selects whether to write the modified address into the source address register within address registers 611. In post-indexing, then the modified address is always written into the source address register within address registers 611. In the preferred embodiment, the instruction word specifies one of 12 modes for each of the global address unit 610 and the local address unit 620. These twelve modes include: pre-addition of an offset index without base address modification; pre-addition of an offset index with base address modification; post-addition of an offset index with base address modification; pre-subtraction of an offset index without base address modification; pre-subtraction of an offset index with base address modification; post-subtraction of an offset index with base address modification; pre-addition from an index register without base address modification; pre-addition from an index register with base address modification; post-addition from an index register with base address modification; pre-subtraction from an index register without base address modification; pre-subtraction from an index register with base address modification; and post-subtraction from an index register with base address modification.

Special read only zero value address registers A15/A7 permit special functions. Specification of the corresponding one of these registers as the source of the base address converts the index address into an absolute address. Specification of one of these zero value address registers may also load an offset index.

Hardware associated with each address unit permits specification of the base address of the data memories and the parameter memory corresponding to each digital image/graphics processor. This specification occurs employing two pseudo address registers. Specification of "PBA" as the address register produces the address of the parameter memory corresponding to that digital image/graphics processor. The parameter memory base address register of each digital image/graphics processor permanently stores the base address of the corresponding parameter memory. The parameter memory 25 corresponds to digital image/graphics processor 71, parameter memory 30 corresponds to digital image/graphics processor 72, parameter memory 35 corresponds to digital image/graphics processor 73, and parameter memory 40 corresponds to digital image/graphics processor 74. Specification of "DBA" as the address register produces the address of the base data memory corresponding to that digital image/graphics processor. The data memory 22 includes the lowest address corresponding to digital image/graphics processor 71, data memory 27 includes the lowest address corresponding to digital image/graphics processor 72, data memory 32 includes the lowest address corresponding to digital image/graphics processor 73 and data memory 37 includes the lowest address corresponding to digital image/graphics processor 74.

These pseudo address registers may be used in global address unit 610 and local address unit 620 and with indices in any of the 12 permitted combinations of pre- and post-addition or subtraction, except that these may not be address destinations. There are restrictions on the permitted data transfers when using these pseudo address registers. These are called pseudo address registers because no actual address register corresponds to these designations. Instead each address unit employs hardware in conjunction with an identifier in a command register (to be later described) to produce the required address.

The particular addresses for the preferred embodiment of this invention are listed below in Table 29. The pseudo address register PBA produces an address of the form Hex "0100#000" and the pseudo address register DBA produces an address of the form Hex "0000#000", where # is the digital image/graphics processor number.

TABLE 29

| Digital Image/ Graphics Processor Number | Parameter Memory Base Address | Data Memory Base Address |
| --- | --- | --- |
| 0 | 01000000 | 00000000 |
| 1 | 01001000 | 00001000 |
| 2 | 01002000 | 00002000 |
| 3 | 01003000 | 00003000 |

These pseudo address registers are advantageously used in programs written independent of the particular digital image/graphics processor. These pseudo address registers allow program specification of addresses that correspond to the particular digital image/graphics processor. Thus programs may be written which are independent of the particular digital image/graphics processor executing the programs.

Referring back to FIG. 27, address unit 120 forms respective addresses on global address port 121 and local address port 122. In the least complex case, the global address generated by global address unit 610 passes through multiplexer 641 and is stored in global temporary address register GTA 651. Global address port 121 passes this address together with byte strobe, read/write and select signals to crossbar 50. Similarly the local address generated by local address unit 620 is stored in local temporary address register LTA 652 for supply to crossbar 50 via local address port 122 together with accompanying byte strobe, read/write and select signals. Global temporary address register 651 and local temporary address register 652 hold the generated addresses for reuse in case of crossbar contention. This is more convenient than recomputing the address for reuse because the possibility of address register modification would require conditional recomputation.

Sometimes an address generated by local address unit 620 passes to crossbar 50 via global address port 121 rather than by local address port 122. Control circuit 654 determines if the address generated by local address unit 620 is a legal local address. Note that the local ports may only address the corresponding data or parameter memory. If local address unit 620 generates an address outside its permitted range, and no global port access is specified, then control circuit 654 signals control circuit 642 to cause multiplexer 641 to select the local address generated by local address unit 620. This address is then stored in global temporary address register GTA 651. If a global port access is specified, this is serviced first and then control circuit 654 signals control circuit 642 to cause multiplexer 641 to select the address stored in local temporary address register LTA 652. In either case global temporary address register GTA 653 supplies the address to the global address port 121.

Global/local address multiplexer register GLMUX 630 permits a single address to be formed from parts of the addresses generated by global address unit 610 and local address unit 620. This is known as XY patching that forms a patched address. Global/local address multiplexer register GLMUX 630 is coupled to both global port source data bus Gsrc 105 and global port destination data bus Gdst 107 and can be accessed within the register space of digital image/graphics processor 71. Global/local address multiplexer register GLMUX 630 includes 30 bits. For each bit position of global/local address multiplexer register GLMUX 630 a "1" selects the corresponding bit from global address unit 610 and a "0" selects the corresponding bit from local address unit 620. Global/local address multiplexer register GLMUX 630 signals control circuit 642 to make the corresponding bit selections within multiplexer 641. The patched address from multiplexer 641 is stored in global temporary address register GTA 651 for application to global address port 121 in the manner previously described.

In the preferred embodiment XY patched addressing only supports post-indexing due to speed considerations. Note that XY patch address selection must occur following address generation by both global address unit 610 and local address unit 620. Thus XY patch address selection takes more time than normal addressing. Limiting XY patch addressing to post-indexing insures that this address is available not later than other addresses. Note that if the timing of this address generation is not an problem, then XY patch addressing may support all the address modes listed in Tables 45 and 47.

When executing an instruction calling for global/local address multiplexing, the instruction can specify XY patch detection. XY patch detection determines when the address specified by the global or local address unit is outside a defined boundary or patch. A one bit patch option field in the instruction word (bit 34) enables XY patch detection. If this patch option field is "1", then specified operations are performed when the generated address is outside the XY patch. If this patch option field is "0", then these specified operations are performed if the generated address is inside the XY patch. Zero detectors 631 and 632 perform the patch detection. Zero detector 631 masks the global port address generated by global address unit 610 with the contents of global/local address multiplexer register 630. If this masked address is non-zero, then the global address from global address unit 610 includes a "1" in a data position assigned to local address unit 620. This indicates the global address is outside the patch. Similarly zero detector 633 masks the local port address generated by local address unit 620 with the inverse of the contents of global/local address multiplexer register GLMUX 630. If this masked address is non-zero, then the local address is outside the patch. The logical OR of these two outputs indicates whether the patched address is inside or outside the patch.

The instruction word specifies alternative actions to be taken based upon whether the patched address is inside or outside the patch. A conditional access one bit field specifies conditional memory access. If this conditional access field is "1", then memory access is unconditional and is performed whether the address is inside or outside the XY patch. If the conditional access field is "0", then the memory access, either a load or a store, is conditional based upon the state of the patch option field. An interrupt one bit field indicates whether to issue an interrupt upon patch detection. When the interrupt field is "1", address unit 120 issues an interrupt upon patch detection in the sense specified by the patch option field. When the interrupt field is "0", no interrupt issues regardless of patch detection.

These XY patched address modes have several uses. A display screen can be addressed in rows and columns by segregating the address between global address unit 610 and local address unit 620. Thus the name XY patch addressing. The conditional memory accessing or interrupt generation can then signal branch operations for window clipping. It is also feasible to use this addressing mode in software "pseudo" data caching to detect cache hit or cache miss.

Control circuits 653 and 654 control interface between data unit 120 and crossbar 50. Each unit generates byte strobe signals, a read/write signal and select signals. These signals control the data transfer operation. In addition each control circuit 653 and 654 receives from crossbar 50 a grant signal. Receipt of this grant signal indicates that the contention circuits of crossbar 50 have granted access to the corresponding port. This could be either because there is no contention for memory access or any memory access contention has been resolved by granting access to the corresponding port. Upon retry after an access failure due to memory contention, these signals are reconstituted from the instruction word stored in the instruction register-address stage IRA 751 and the generated address stored in either global temporary address register GTA 651 or local temporary address register LTA 652.

The byte strobe signals handle the cases for writing data less than 32 bits wide. The data size for data transfers of byte (8 bits), half-word (16 bits) or word (32 bits) is set by the instruction. If the data size is 8 bits, then the data is replicated 4 times to fill a 32 bit word. Similarly if the data size is 16 bits, this data is duplicated to fill 32 bits. There are four byte strobe signals corresponding to the four bytes in the 32 bit data word. Each of these four byte strobes may be active ("1") indicating write hat byte or inactive ("0") indicating do not write that byte. The byte strobes are set according to the 2 least significant bits (bits 1–0) of the generated address and the current endian mode.

Figure 29A:
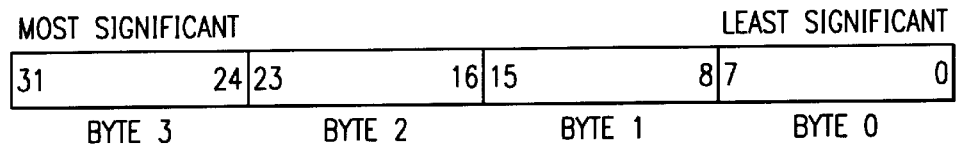
FIG. 29a illustrates the order of data bytes according to the little endian mode.
Figure 29B:
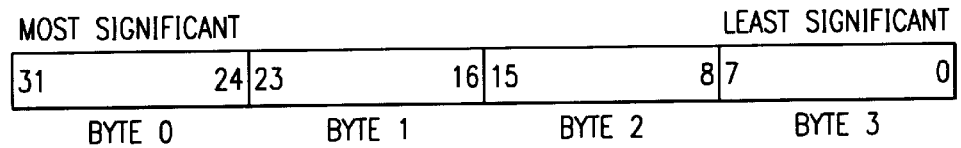
FIG. 29b illustrates the order of data bytes according to the big endian mode.

The endian mode indicates the byte order employed in multi-byte data. FIG. 29a illustrates the byte order within a 32 bit data word according to the little endian mode. In the little endian mode the least significant byte has a byte address of "0" and the most significant byte has a byte address of "3". FIG. 29b illustrates the byte order within a 32 bit data word according to the big endian mode. In the big endian mode the most significant byte has a byte address of "0" and the least significant byte has a byte address of "3". Master processor 60 sets the endian mode, which is not expected to change dynamically. Note that the bit order within bytes does not change based upon the endian mode. The convention for bit order within bytes would generally be set by the connections between the external data bus of transfer controller 80 and the host data bus. Table 30 lists the byte strobes for the various combinations of address bits 1–0, data size and the endian mode.

TABLE 30

| Address bits | | Little Endian Data size in bits | | | Big Endian Data size in bits | | |
|---|---|---|---|---|---|---|---|
| 1 | 0 | 8 | 16 | 32 | 8 | 16 | 32 |
| 0 | 0 | 0001 | 0011 | 1111 | 1000 | 1100 | 1111 |
| 0 | 1 | 0010 | 0011 | 1111 | 0100 | 1100 | 1111 |
| 1 | 0 | 0100 | 1100 | 1111 | 0010 | 0011 | 1111 |
| 1 | 1 | 1000 | 1100 | 1111 | 0001 | 0011 | 1111 |

As indicated in Table 30, if the two least significant address bits are "00", and the data size is 8 bits, then the last byte strobe for bits 7–0 is active in the little endian mode and the first byte strobe for bits 31–24 is active in the big endian mode. When the data size is less than 32 bits, a write cycle is accomplished by a read-modify-write operation. The byte strobes determine the bytes modified by the data to be written into memory. As previously described, it is technically feasible to support data sizes of 4 bits, 2 bits and 1 bit besides the data sizes noted above. Those skilled in the art would understand how to extend the byte strobe concept explained above to support these other data sizes.

Each control circuit 653 and 654 generates a read/write signal. The read/write signal indicates that; the memory access is a memory read or memory write operation. A single bit field in the instruction field for each active port indicates whether the data transfer is a load operation, which is a memory read, or a store operation, which is a memory write. Control circuits 653 and 654 generate the corresponding read/write signal to crossbar 50 based upon the corresponding single bit field in the instruction word.

Each control circuit 653 and 654 generates two strobe signals. An active data-space select signal indicates that the memory transfer is to data memory. An active parameter-space select signal indicates that the memory transfer is to parameter memory. Neither select signal is active during execution of an instruction not specifying a data transfer operation via that port. Bit 24 of the generated address controls these select signals due to the address partitioning. The data-space select signal is active when bit 24 of the address is "0" and the parameter-space select signal is active when bit 24 of the address is "1".

Global address unit 610 and local address unit 620 may be used for additional arithmetic operations. The use of an address unit for arithmetic operations is called address unit arithmetic. An address unit arithmetic operation may be substituted for any memory load operation. Any instruction word with specifies data transfer operations includes a bit that specifies whether the data transfer is a load (data transfer from memory to a register) or a store (data transfer from a register to memory). These instruction words also include a bit that specifies whether the data is sign extended on load. Sign extension fills the higher order bits of the data written to the destination with the same state as the most significant bit of the data in case the data size is less than 32 bits. The otherwise meaningless combination of store with sign extend enables address unit arithmetic. Rather than fetching the memory data located at the address generated by the address unit and storing it in the destination register, an address unit arithmetic operation stores the calculated address in the destination register. Buffer 655 supplies the output from global temporary address register GTA 651 to global port source data bus Gsrc 105 for supply to a specified destination register when the instruction word indicates sign extend and a load operation. Similarly, buffer 656 supplies the output from local temporary address register LTA 652 to local port bus Lbus 103 for supply to a specified destination register when the instruction word indicates sign extend and a load operation. Under these conditions control circuits 653 and 654 do not generate their control signals to crossbar 50. Thus the generated address is diverted from the address bus of crossbar 50 to the corresponding digital image/graphics processor data bus.

Address unit arithmetic operations enable additional parallel arithmetic operations. In the preferred embodiment, each digital image/graphics processor 71, 72, 73 and 74 can perform a multiply and three additions in one instruction. It is preferably also possible to perform a multiply, two additions and a data transfer operation in parallel in one instruction. All of the indexing, address modification and offset operations available for the corresponding load operation are available during address unit arithmetic. Thus an address unit arithmetic operation can compute a result to be stored in the destination register while also modifying a base address register either by pre-incrementing, post-incrementing, pre-decrementing or post-decrementing. An address unit arithmetic operation adding an offset index to a zero base address from address registers A15/A7 can load an offset field in parallel with any data unit operation. Address unit arithmetic operations can be performed conditionally in the same manner as conditional data transfers. As in other conditional data transfers modification of the base address register occurs unconditionally, only the transfer of the result is conditional. The preferred embodiment also supports address unit arithmetic of patched addresses. Like all other address computations address unit arithmetic calculations occur in the address pipeline stage and are written to the destination register during the execute pipeline stage. Note that the "address" computed during an address unit arithmetic operation is not checked for range. This is because no actual memory access occurs when an address unit arithmetic operation executes.

Address unit arithmetic operations are best used to reduce the number of instructions needed for a loop kernel in a loop that is repeated a large number of times. Graphics and image operations often require large numbers of repetitions of short loops. Often reduction of a loop kernel by only a single instruction can greatly improve the performance of the process.

Figure 30:
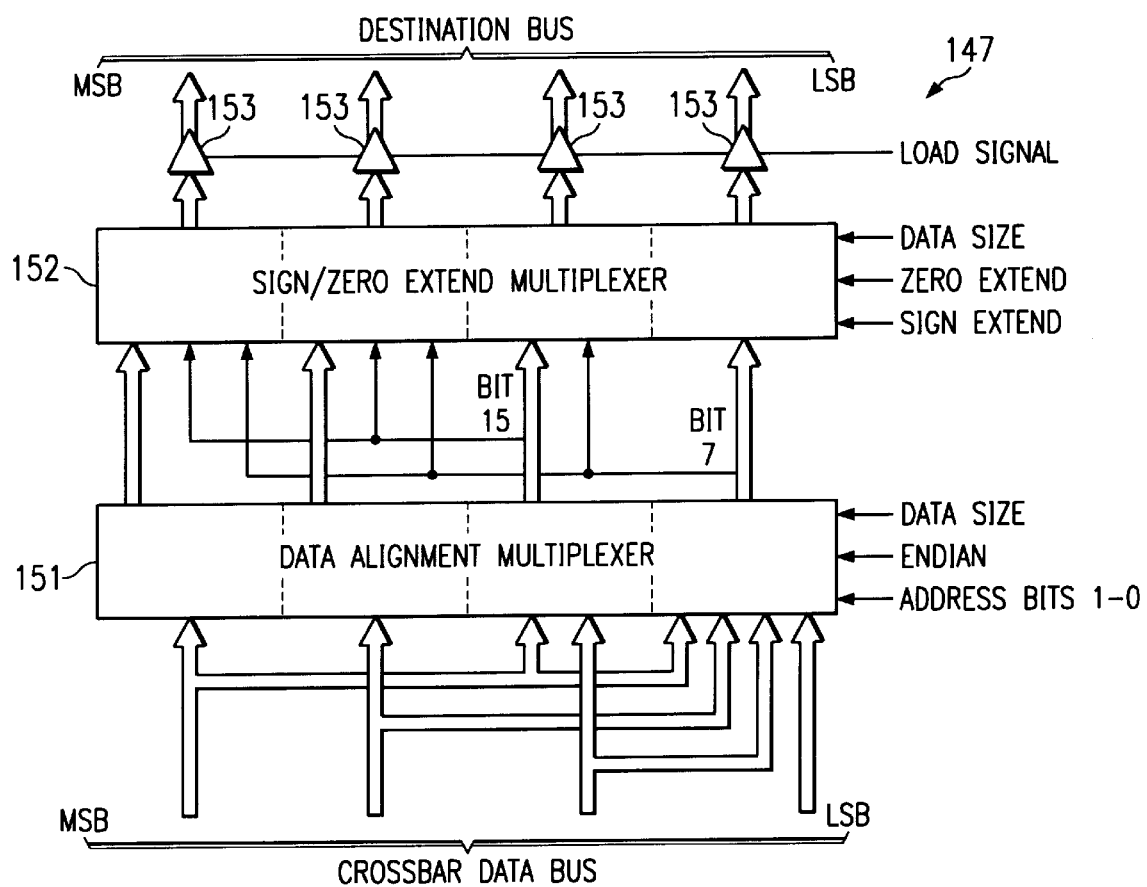
FIG. 30 illustrates a circuit for data selection, data alignment and sign or zero extension in each data port of a digital image/graphics processor.

Data transfers between digital image/graphics processor 71 and memory 20 are made via data port unit 140. Data port unit 140 handles data alignment, sign or zero extension and the like for data passing through. FIG. 30 illustrates details of this portion of buffer 147 illustrated in FIG. 3. Note that this same structure could also be used within multiplexer buffer 143 of local data port 141. Data from the crossbar data bus is divided into four data streams of 8 bits each. Data alignment multiplexer 151 selects and aligns the received data based upon the current data size, endian mode and the two least significant bits of the generated address. For a data size of 32 bits, no selection or alignment is needed and the four 8 bit data streams pass through data alignment multiplexer 151 unchanged. For a data size of 16 bits, data alignment multiplexer 151 selects either the most significant 16 bits or the least significant 16 bits for supply via the 16 least significant output bits. This selection contemplates the current endian mode and address bits 1–0. If address bit 1 is "0", then data alignment multiplexer 151 selects the least significant 16 bits in little endian mode and the most significant bits in big endian mode. The opposite selection is made if address bit 1 is "1". Similarly, if the data size is 8 bits, data alignment multiplexer 151 selects either bits 31–24, bits 23–16, bits 15–8 or bits 7–0 based upon the current endian mode and address bits 1–0.

Once the data selection and alignment have been made, sign/zero extend multiplexer 152 provides sign or zero extension. For the case of 32 bit data, no sign or zero extend is made and the data passes through sign/zero extend multiplexer 152 unchanged. Bus drivers 153 then supply the corresponding destination bus; global port data destination bus Gdst 107 for the global port and local port data bus Lbus 103 for the local port. If the data size is 16 bits, then sign/zero extend multiplexer 152 passes data bits 15–0 unchanged. For this case data bits 31–16 are filled with "0" if zero extension is selected. Data bits 31–16 are sign extended, that is filled with the state of bit 15, is sign extension is selected. For 8 bit data, sign/zero extend multiplexer 152 passes bits 7–0 unchanged. Bits 31–8 are filled with "0" if zero extension is selected and filled with the state of bit 7 is sign extension is selected.

This data selection, alignment, and sign or zero extension is available for register to register moves as well as register loads from memory. For register to register moves the instruction word includes a field that specifies a two bit item number. This item number, treated as if in little endian mode, substitutes for the address bits 1–0. In other respects the circuit illustrated in FIG. 30 operates as just described.

Data port unit 140 operates specially for local port illegal addresses. Recall that each local port can only address memories corresponding to that digital image/graphics processor. If the local address unit 620 generates an address outside its permitted range, then this address is shunted to global address port 121. If a global port access is also specified for that instruction, this is serviced first and then the local port access is serviced via global address port 121. Under these conditions during a store operation data from local data port bus Lbus 103 supplies buffer multiplexer 146, which supplies to the addressed memory location via global data port 148. Similarly, when using the global port for a local load operation buffer multiplexer 143 supplies the received data from global data port 148 to local port data bus Lbus 103.

Figure 31:
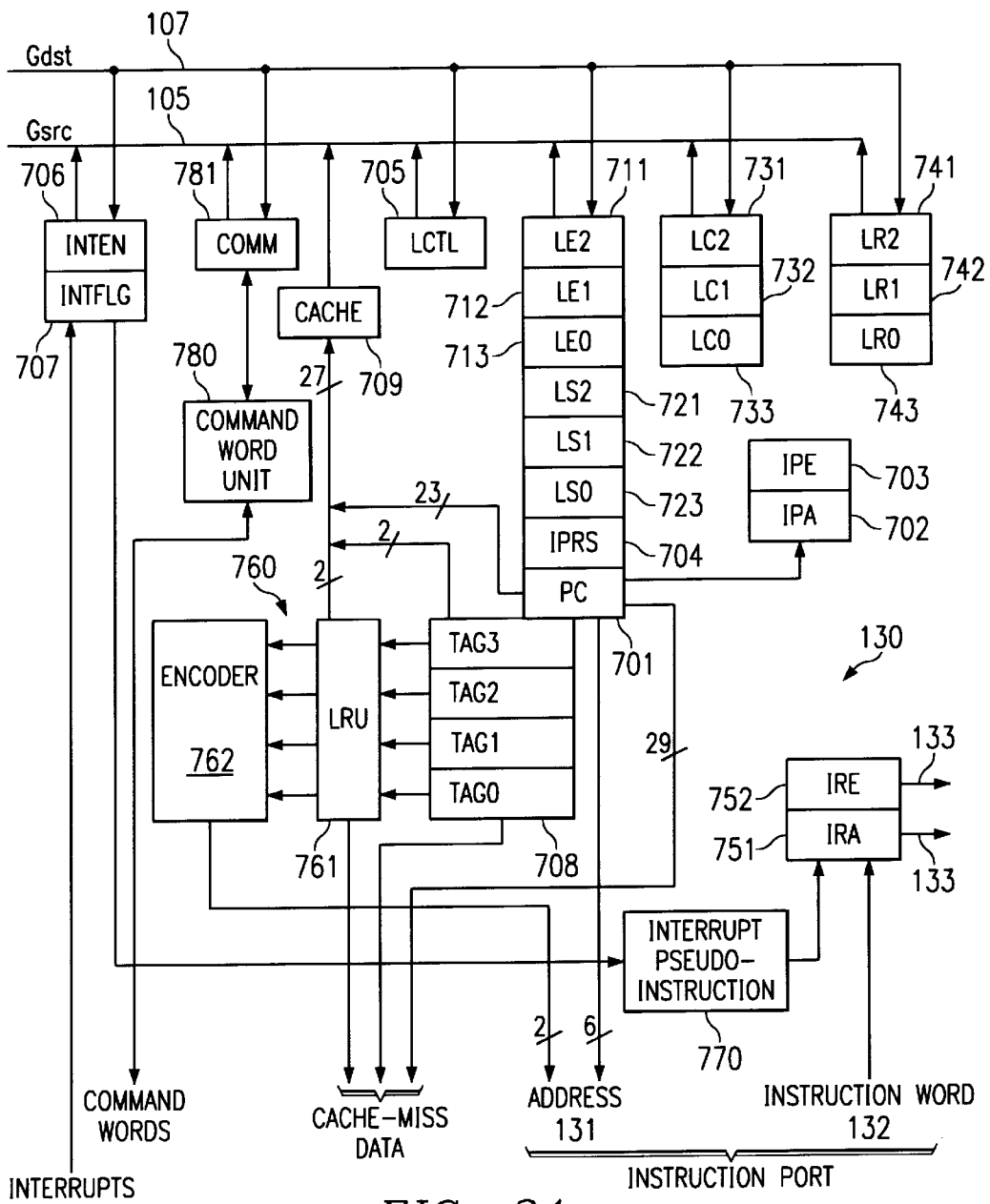
FIG. 31 illustrates in block diagram form the program flow control unit of the digital image/graphics processors illustrated in FIG. 3.

FIG. 31 illustrates in block diagram form program flow control unit 130. Program flow control unit 130 performs all the operations that occur during the fetch pipeline stage. Program flow control unit 130 controls: fetching instruction words from the corresponding instruction cache; instruction cache management including handshakes with transfer controller 80; program counter modification by branches, interrupts and loops; pipeline control, including control over data unit 110 and address unit 120; synchronization with other digital image/graphics processors in synchronized MIMD mode; and receipt of command words from other processors. As illustrated in FIG. 31 program flow control unit 130 includes the following registers: program counter PC 701; instruction pointer-address stage IPA 702; instruction pointer-execute stage IPE 703; instruction pointer-return from subroutine IPRS 704; three loop end registers LE2–LE0 711, 712 and 713; three loop start registers LS2–LS0 721, 722 and 723; three loop counter registers LC2–LC0 731, 732 and 733; three loop reload registers LR2–LR0 741, 742 and 743; loop control register LCTL 705; interrupt enable register INTEN 706; interrupt flag register INTFLG 707; four cache tag registers TAG3–TAG0, collectively called cache tag registers 708; a read only CACHE register 709; and a communications register COMM 781. There are two sets of write only register addresses (LRS2–LRS0 and LRSE2–LRSE0) employed for fast hardware loop initialization. These will be further discussed below.

Program flow control unit 130 also includes an instruction register-address stage IRA 751 and an instruction register-execution stage IRE 752. These registers are not user accessible and do not appear in the register space. Instruction register-address stage IRA 751 contains the instruction word for the current address pipeline stage. Instruction register-execution stage IRE 752 contains the instruction word for the current execute pipeline stage. These registers control the operations during the respective address and execute pipeline stages. The program flow control unit 130 pushes the fetched instruction word located at the address in program counter PC 701 into the instruction register-address stage IRA 751. In addition, the pipeline pushes the instruction word in the instruction register-address stage IRA 751 into the instruction register-execute stage IRE 752 upon each pipeline stage advance.

Program flow control unit 130 operates predominantly in the Fetch pipeline. Since the program flow control unit 130 contains the instruction register-address stage IRA 751 and instruction register-execute stage IRE 752, it extracts and distributes control information needed by data unit 110 and address unit 120 via opcode bus 133. Program flow control unit 130 also controls the aligner/extractors on the data port unit 140.

Figure 32:
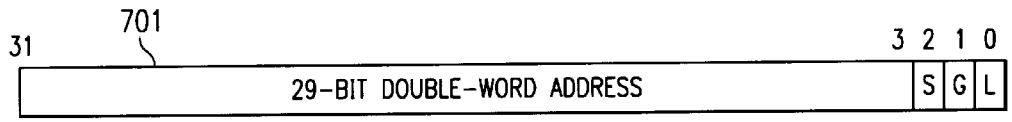
FIG. 32 illustrates in schematic form the field definitions of the program counter of the program flow control unit illustrated in FIG. 31.

The major task of program flow control unit 130 is control of instruction fetch during the fetch pipeline stage. The address of the next instruction word to be fetched is stored in program counter PC 701. FIG. 32 illustrates schematically the bits of program counter PC 701. In the preferred embodiment of this invention, internal and external memory is byte addressable. That is, each address word points to a byte (8 bits) of data in memory. As explained in detail below, each instruction word of digital image/graphics processor 71 is a 64 bit double word, which is 8 bytes. Since these instruction words are aligned on even double word boundaries, only 29 bits are necessary to specify any such instruction word. As illustrated in FIG. 32 bits 31–3 of program counter PC 701 provide this 29 bit double word address. During normal sequential instruction operation program flow control unit 130 increments bit 3 of program counter PC 701 to address the next 64 bit instruction.

Program counter PC 701 has two write register addresses. Writing to program counter PC 701 executes a subroutine call. The write alters program counter PC 701. At the same time program flow control unit 130 causes the previous contents of program counter PC 701 to be written into instruction pointer-return from subroutine IPRS 704. This enables a return instruction to reload program counter PC 701 from instruction pointer-return from subroutine IPRS 704. Writing to a different register address designated branch BR executes a software branch. This write alters only program counter PC 701 and instruction pointer-return from subroutine IPRS 704 is unchanged.

As noted above bits 2–0 of program counter PC 701 are not needed to specify instruction words. These otherwise unused bits are employed to specify other things. These bits include an "S" bit (bit 2), a "G" bit (bit 1) and an "L" bit (bit 0).

The "S" bit (bit 2) indicates whether the digital image/graphics processor 71 is in the synchronized MIMD mode. As previously described, when in the synchronized MIMD mode program control flow unit 130 inhibits fetching the next instruction word until all synchronized processors are ready to proceed. If the "S" bit is "1", then the digital image/graphics processor 71 is currently executing synchronized code. Note that the identity of the other digital image/graphics processors synchronized to digital image/graphics processor 71 is stored in the communications register COMM 781. Otherwise, digital image/graphics processor 71 will not wait for other digital image/graphics processors to be ready before fetching the next instruction word. Execution of a lock instruction (LCK) sets this "S" bit of program counter PC 701 during the address pipeline stage to enable synchronized MIMD mode. Execution of an unlock (UNLCK) instruction clears this "S" bit during the address pipeline stage thus disabling the synchronized MIMD mode. Normal register writes to program counter PC 701 do not change the state of this "S" bit.

The "G" bit (bit 1) indicates whether global interrupts are enabled. When this "G" bit is "0", the program flow control unit 130 ignores all interrupt sources, except the emulation trap. If this "G" bit is "1", then program flow control unit 130 responds to those interrupt sources individually enabled in interrupt enable register INTEN 706. Execution of an enable interrupt instruction (EINT) sets this "G" bit of program counter PC 701 during the address pipeline stage to enable interrupts. Execution of a disable interrupt instruction (DINT) clears this "G" bit during the address pipeline stage of thereby disabling most interrupt sources. Normal register writes to program counter PC 701 do not change the state of this "G" bit.

The "L" bit (bit 0) indicates whether hardware loop logic is enabled. This hardware loop logic will be fully described below. If the "L" bit is "1", then the hardware loop logic is disabled. Otherwise, hardware loops are individually enabled according to the loop control register LCTL 708. Hardware loops are normally disabled via this "L" bit only during the return sequence from an interrupt, because loops are "unwrapped" during the entry into an interrupt routine. Normal register writes to program counter PC 701 do not change the state of this "L" bit.

Figure 33:
FIG. 33 illustrates in schematic form the field definitions of the instruction pointer-address stage register of the program flow control unit illustrated in FIG. 31.

FIG. 33 illustrates schematically the bits of instruction pointer-address stage IPA 702. This register is loaded with the contents of program counter PC 701 upon each pipeline stage advance. In the first two pseudo-instructions of an interrupt, the "L" bit (bit 0) of instruction pointer-address stage IPA 702 is forced to "1" whatever the state of this bit in program counter PC 701. The other bits of program counter PC 701 are copied into instruction pointer-address stage IPA 702 without alteration. This register stores the address of the instruction currently in the Address pipeline stage.

Instruction pointer-execute stage IPE 703 is loaded with the contents of instruction pointer-address stage IPA 702 upon each pipeline stage advance. This register is useful in relative program counter computations. Note that instruction pointer-execute stage IPE 703 stores the address of the instruction currently in the execute pipeline stage. Using this register for relative program counter computations is better than using program counter PC 701 due to the possibility of branches, loops or interrupts and because no offset is required.

Figure 34:
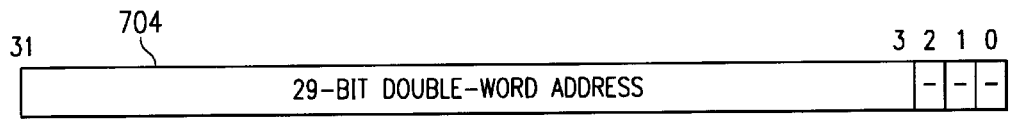
FIG. 34 illustrates in schematic form the field definitions of the instruction pointer-return from subroutine register of the program flow control unit illustrated in FIG. 31.

Instruction pointer-return from subroutine register IPRS 704 stores the subroutine return address. FIG. 34 illustrates the bits of this register schematically. Instruction pointer-return from subroutine register IPRS 704 is updated with the address previously stored in program counter PC 701 incremented at bit 3 whenever software writes to program counter PC 701. This is the address following the second delay slot of the software branch. Thus, as implied by the name, instruction pointer-return from subroutine register IPRS 704 stores the address for returns from subroutines. Executing a return instruction loads the address stored in instruction pointer-return from subroutine register IPRS 704 into program counter PC 701 during the execute pipeline stage. Only bits 31–3 of instruction pointer-return from subroutine register IPRS 704 are used. Bits 2–0 of program counter PC 701 are not stored in instruction pointer-return from subroutine IPRS 704 upon a software branch and these bits are not read from instruction pointer-return from subroutine IPRS 704 during restoration of program counter PC 701.

The program flow control unit of each digital image/graphics processor includes an instruction cache controller 760. This instruction cache controller 760 includes a set of four cache tag registers TAG3–TAG0 708, a least recently used control circuit 761 and an address encoder 762. The instruction cache controller 760 controls a section of memory dedicated to instruction caching for that digital image/graphics processor. This instruction cache memory is preferably 2K bytes in size. Instruction cache controller 760 treats the instruction cache memory as holding 256, 64 bit instructions in one set with 4 blocks supported by 4-way least recently used operations. Each block has 4 sub-blocks of 16 instructions. Thus each of the cache tag registers TAG3–TAG0 708 includes 4 "present" bits for a total of 16 "present" bits.

Figure 35:
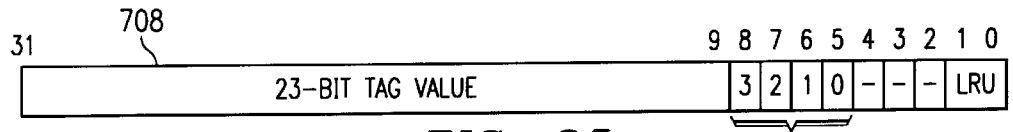
FIG. 35 illustrates in schematic form the field definitions of the cache tag registers of the program flow control unit illustrated in FIG. 31.

FIG. 35 illustrates the fields of each cache tag register TAG3–TAG0. The tag value field (bits 31–9) of each of the tag registers holds a tag value. This tag value is the virtual address of the start of the corresponding cache block in the instruction cache memory. Sub-block present bits (bits 8–5) of each cache tag register TAG3–TAG0 are associated with the respective four sub-blocks 3–0 in the block to which that cache tag register relates. Thus bit 8 represents the most significant sub-block and bit 5 represents the least significant sub-block. The "LRU" field (bits 1–0) indicates how recently the block was used. These bits are as defined in Table 31.

TABLE 31

| LRU bits | | Position in |
|---|---|---|
| 1 | 0 | use stack |
| 0 | 0 | most-recently used |
| 0 | 1 | next-most recently used |
| 1 | 0 | next-least recently used |
| 1 | 1 | least recently used |

Bits 4 to 2 of cache tag registers TAG3–TAG0 708 are not implemented. These bits are reserved for a possible extension of the instruction cache memory to include additional sub-blocks. Cache tag registers TAG3–TAG0 708 appear in the register map as listed in Tables 37 and 38.

Instruction cache controller 760 of each digital image/graphics processor 71, 72, 73 or 74 may be flushed by master processor 60 or by the digital image/graphics processor itself. Note that a cache flush resets only the cache tag registers TAG3–TAG0 708 within program flow control unit 130 and does not clear data from the corresponding instruction cache memory. An instruction cache flush is performed by writing a cache flush command word to address register A15 with the "I" bit (bit 28) set. Reset does not automatically flush the cache. An instruction cache flush causes the cache tag value field to be set to the cache tag register's own number (i.e., TAG3=3, TAG2=2, TAG1=1, TAG0=0), clears all their present bits, and sets the LRU bits to the tag register's own number (i.e., TAG3(LRU)="11", TAG2(LRU)="10", TAG1(LRU)="01" and TAG0(LRU)="00"). Cache tag register TAG3 is thus the least-recently-used following a cache flush.

Program flow control unit 130 compares corresponding bits of the address stored in program counter PC 701 to the cache tag registers TAG3–TAG0 708 during each fetch pipeline stage. This comparison yields either a cache miss result or a cache hit result. A cache miss may be either a block miss or a sub-block miss. In a block miss the most significant 23 bits of program counter PC 701 does not equal the corresponding 23 bits of any of the cache tag registers TAG3–TAG0 708. In this case, least recently used control circuit 761 chooses the least recently used block to discard, and clears all the present bits of the corresponding cache tag register. In a sub-block miss the most significant 23 bits of program counter PC 701 matches the corresponding 23 bits of one of the cache tag registers TAG3–TAG0 708, but the present bits (one of bits 8–5 of the tag register) indicating presence of the sub-block corresponding to bits 8–7 of program counter PC 701 is "0". This means that one of the cache tag registers TAG3–TAG0 708 is assigned that memory block, but that the sub-block is not present within the instruction cache.

If either type of cache miss occurs, then program flow control unit 130 requests transfer controller 80 to service the instruction cache memory via an external access. Program control flow unit 130 passes the external address and the internal sub-block address to the transfer controller 80. Program flow control unit 130 signals transfer controller 80 the cache miss information via crossbar 50. Transfer controller 80 services the cache miss by fetching the entire sub-block of instructions including the address of the currently sought instruction word. This block of instructions is stored in the least recently used block within the instruction cache memory 21, 26, 31 and 36 corresponding to the requesting digital image/graphics processor 71, 72, 73 and 74, respectively. Program flow control unit 130 then sets the proper values in the corresponding cache tag register TAG3–TAG0 708. The instruction fetch operation is then repeated, with a cache hit guaranteed.

Cache miss information may be accessed by reading from the register in the register space at register bank "1111" register number "000". This register is called the CACHE register 709 in Table 38. Program flow control unit 130 provides 27 bits. These 27 bits are the 23 most significant address of program counter PC 701 (the tag bits) plus 2 sub-block bits from cache tag registers TAG3–TAG0 708 and two bits encoding the identity of the least-recently-used block from least recently used control circuit 761. CACHE register 709 is read only, any attempt to write to write to this register is ignored. Thus CACHE register 709 is connected to only global port source data bus Gsrc bus 105 and not connected to global port destination data bus Gdst 107.

If a cache hit occurs, then the desired instruction word is stored in the corresponding instruction cache. As previously described, each instruction cache memory 21, 26, 31, 36 includes 2K bytes. Since internal and external memory is byte addressable in the preferred embodiment, 11 address bits are required. However, each instruction is aligned with a 64 bit double word boundary and thus the three least significant bits of an instruction address are always "000". The 2 most significant bits of the 11 bit instruction address on instruction port address bus 131 correspond to the cache tag register TAG3–TAG0 708 successfully matched with program counter PC 701. These address bits 10–9 are encoded as shown in Table 32.

TABLE 32

| Address bits | | Cache tag |
|---|---|---|
| 10 | 9 | register |
| 0 | 0 | TAG0 |
| 0 | 1 | TAG1 |
| 1 | 0 | TAG2 |
| 1 | 1 | TAG3 |

The bits 8–3 of the instruction address on instruction port address bus 131 are bits 8–3 of the 29 bit double word address stored in program counter PC 701. The cache tag comparison is made fast enough to output the 8 bit address via the instruction port with an implied read signal from the digital image/graphics processor to the corresponding instruction cache memory. This retrieves the addressed 64 bit instruction word into instruction register-address stage IRA 751 before the end of the fetch pipeline stage.

Program flow control unit 130 next updates program counter PC 701. If the next instruction is at the next sequential address, program control flow unit 130 post increments program counter PC 701 during the fetch pipeline stage. Note this post increment means that program counter PC 701 stores the address of the next instruction to be fetched. Otherwise, program control flow unit 130 loads the address of the next instruction into program counter PC 701 according to loop logic 720 (FIG. 37) or software branch. When in the synchronized MIMD mode, program flow control unit delays the instruction fetch until all the digital image/graphics processors specified by sync bits in communications register COMM 781 are synchronized.

Program flow control unit 130 includes loop logic 720 employed with a number of registers in nested zero-overhead looping and a variety of other powerful instruction flow control functions. Examples of these other functions include: multiple ends to the same loop; zero-delay branches without necessarily returning; zero-delay "calls and returns"; and conditional zero-delay branches. The basic function of loop logic 720 is nested zero-overhead looping. For each of three possible loops there are four registers. These are: loop end registers LE2 711, LE1 712 and LE0 713; loop start registers LS2 721, LS1 722 and LS0 723; loop count registers LC2 731, LC1 732 and LC0 733; and loop reload registers LR2 741, LR1 742 and LR0 743. The entire loop logic process is controlled by the status of loop logic control register LCTL 705 in conjunction with the loop enable bit (bit 0) of program counter PC 701. In addition there are several register address locations LRS2–LRS0 and LRSE2–LRSE0 that simultaneously load more than one of the primary registers.

Each set of four registers controls an independent zero-overhead loop. A zero-overhead loop is the solution to a problem caused by the pipeline structure. A software branch performed by loading an address into program counter PC 701 occurs during the execute pipeline stage. Such a branch does not take place immediately because it does not change two instructions that were already fetched and in the instruction pipeline. These two instructions were fetched during the previous two fetch pipeline stages. This delay in branch implementation is called a pipeline hit and the two instructions following the branch instruction are called delay slots. Sometimes clever programming enables useful work during the delay slots, but this is not always possible. Loop logic 720 operates during the fetch pipeline stage and, once some set up is accomplished, enables loops and branches without pipeline hits. Note that once the appropriate registers are loaded loop logic 720 does not require a branch instruction during looping and does not produce any delay slots. This loop logic 720 may be especially useful in algorithms with nested loops with numerous repetitions.

A simple example of loop logic 720 operation follows. Set up of loop logic 720 includes loading a particular loop end register, and the corresponding loop start register, loop count register and loop reload register. For example the loop end address is loaded into loop end register LE0 713, the loop start address is loaded into loop start register LS0 723 and the number of loop repetitions desired is loaded into loop count register LC0 733 and loop reload register LR0 743. During each fetch pipeline stage loop logic compares the address stored in program counter PC 701 with the loop end address stored in loop end register LE0 713. If the current program address equals the loop end address, loop logic 720 determines if the loop count stored in the corresponding loop count register, in this case loop count register LC0 733, is "0". If the loop count is not "0", then loop logic 720 loads the loop start address stored in loop start register LS0 723 into program counter PC 701. This repeats the loop starting from the loop start address. In addition, loop logic 720 decrements the loop count stored in the corresponding loop count register, in this case loop count register LC0 733. If the loop count in the corresponding loop count register is "0", then no branch is taken. Program flow control unit 130 increments program counter PC 701 normally to the next sequential instruction. In addition, loop logic 720 loads the loop count stored in the loop reload register LR0 into the loop count register LC0. This prepares loop logic 720 for another set of repetitions and is useful for inner loops of nested loops. Because all these processes occur during the fetch pipeline state no pipeline hit takes place.

Figure 36:
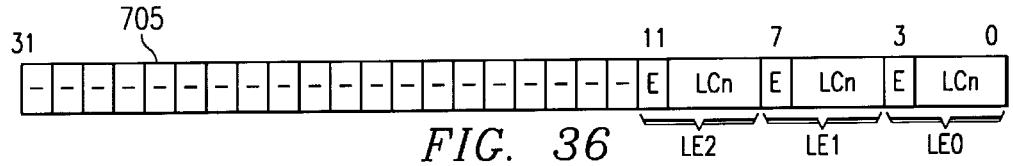
FIG. 36 illustrates in schematic form the field definitions of the loop logic control register of the program flow control unit illustrated in FIG. 31.

FIG. 36 illustrates loop logic control register 705. Loop logic control register 705 controls operation of loop logic 720 based upon data stored in three sets of bits corresponding to the three loop end registers LE2–LE0 711–713. Loop logic control register 705 bits 3–0 control the loop associated with loop end register LE0 713, bits 7–4 control the loop associated with loop end register LE1 712, and bits 11–8 control the loop associated with loop end register LE2 711. The "EE" bits (bits 11, 7 and 3) are enable bits. A "1" in the "E" bit enables the loop corresponding the associated loop end register. A "0" disables the associated loop. Thus setting bits 11, 7 and 3 to "0" completely disables loop logic 720. Each loop end register LE2–LE0 has an associated "LCn" field that assigns a loop count register LC2–LC0 for that loop end register. The coding of the "LCn" field is given in Table 33.

TABLE 33

| LCn field | Loop Count Register |
|---|---|
| 0 0 0 | none |
| 0 0 1 | LC0 |
| 0 1 0 | LC1 |

TABLE 33-continued

| LCn field | Loop Count Register |
|---|---|
| 0 1 1 | LC2 |
| 1 X X | reserved |

The assigned loop count register stores the corresponding loop count and is decremented each time the program address reaches the associated loop end address. Although the "LCn" field is coded to allow every loop end register to use any loop count register, not all combinations are supported in the preferred embodiment. In the preferred embodiment the "LCn" field may assign: loop count register LC2 or LC0 to loop end register LE2 711; register LC1 or LC0 to loop end register LE1 712; and only loop count register LC0 to loop end register LE0 713. In the case of a "LCn" field of "000", no loop count register is used and the program always branches to the loop start address stored in the corresponding loop start register. Also note that if bit 0 of program counter PC 701 is "0", then loop logic 720 is inhibited regardless of the status of loop control register LCTL 705. This permits loop logic inhibition without losing the assignment of loop count registers to loop end registers. When the count in the assigned loop count register reaches "0", encountering the loop end address does not load program counter PC 701 with the address in the corresponding loop start register. Instead the loop count register is reloaded with the contents of the corresponding loop reload register LR2–LR0. By assigning loop counter register LC0 733 to two or three loop end registers LE2–LE0, multiple end points to a loop are supported. Note that the most significant bits of loop control register LCTL 705 and the "1XX" codings of the respective "LCn" fields are reserved for a possible extension of the loop logic to include more loops.

Figure 37:
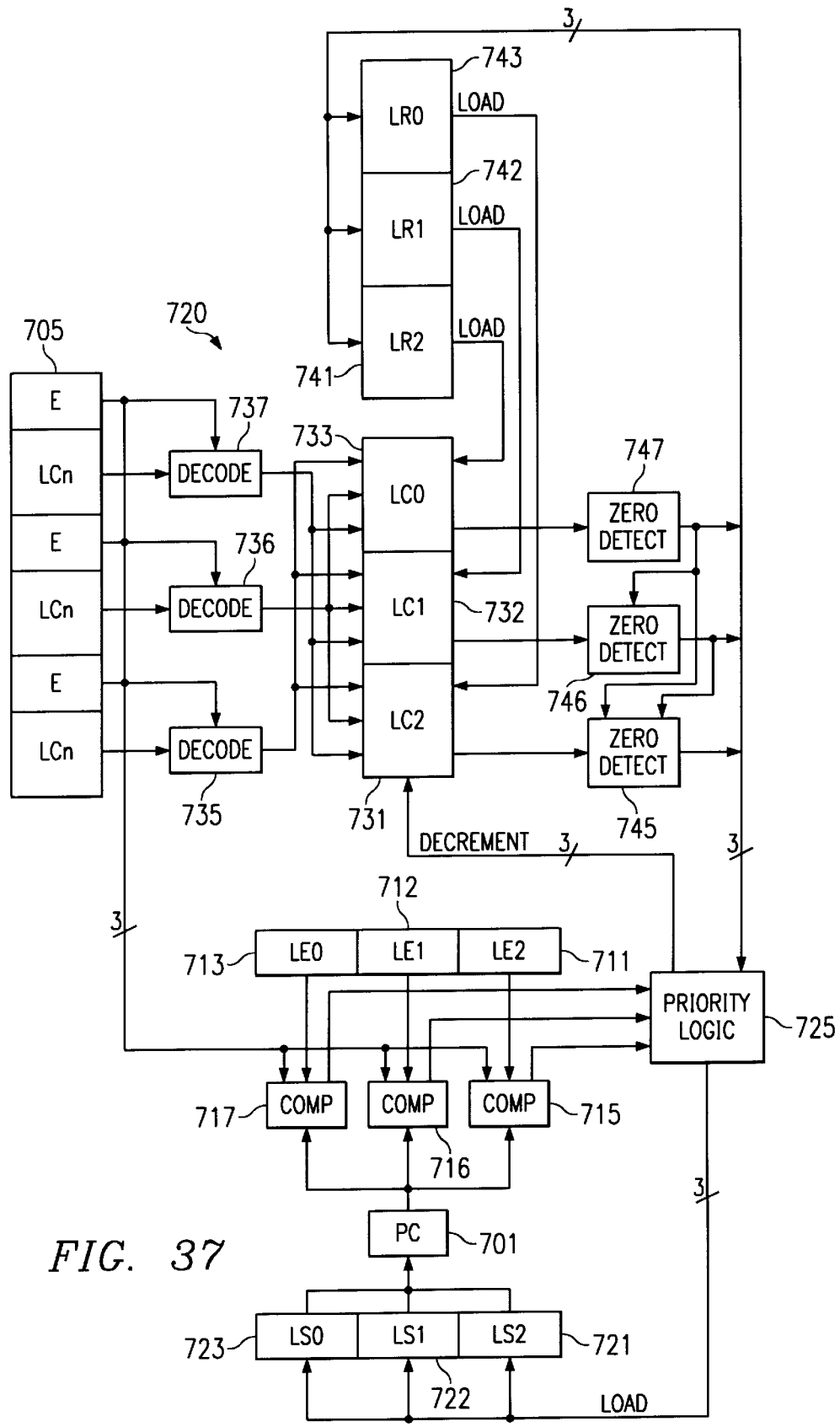
FIG. 37 illustrates in block diagram form the loop logic circuit of the program flow control unit.

FIG. 37 illustrates loop logic 720. Loop logic 720 includes previously mentioned: program counter PC 701; loop logic control register LCTL 705; the three loop end registers LE2–LE0 711, 712 and 713; the three loop start registers LS2–LS0 721, 722 and 723; the three loop counter registers LC2–LC0 731, 732 and 733; the three loop reload registers LR2–LR0 741, 742 and 743; comparitors 715, 716 and 717; priority logic 725; loop logic control register "LCn" field decoders 735, 736 and 737; and zero detectors 745, 746 and 747. The respective "E" fields of loop logic control register LCTL 705 selectively enable comparitors 715, 716 and 717 and loop logic control register "LCn" field decoders 735, 736 and 737. Comparitors 715, 716 and 717 compare the address stored in program counter PC 701 with respective loop end registers LE2 711, LE1 712 and LE0 713. Loop logic control register "LCn" field decoders 735, 736 and 737 decode respective "LCn" fields of loop logic control register LCTL 705, ensuring that the assigned loop count register LC2–LC0 is decremented upon reaching a loop end. Zero detectors 745, 746 and 747 enable reload of respective loop count registers 731, 732 and 733 from the corresponding loop reload registers 741, 742 and 743 when the loop count reaches "0".

Priority logic 725 decrements the assigned loop count register LC2–LC0 or loads program counter PC with the loop start address in loop start register LS2–LS0 depending upon the corresponding zero detection. If two or three loops end at the same address then priority logic 725 set priorities for the loop end registers in the order from loop end register LE2 (highest) to loop end register LE0 (lowest). If no zero detector 745, 756 or 747 detects "0", then the loop start register LS2–LS0 associated with the highest priority loop end register LE2–LE0 matching the program counter PC 701 is loaded into program counter PC 701 and the loop count register LC2–LC0 assigned to that highest priority loop end register LE2–LE0 is decremented. If at least one zero detector 745, 756 or 747 detects zero, then the zero-value loop count register LC2–LC0 corresponding to each zero value loop end register LE2–LE0 matched is reloaded from the corresponding loop reload register LR2–LR0 and the non-zero loop count register LC2–LC0 assigned to the highest priority non-zero loop end register LE2–LE0 matched is decremented. Program counter PC 701 is loaded with the loop start address associated with the highest priority loop end register that has a corresponding non-zero loop count register. Zero detector 747 has a disable line to zero detector 746 to disable zero detector 746 from causing reload if zero detector 747 detects a zero. Both zero detectors 747 and 746 may disable zero detector 745 from causing reload if either zero detector 747 or 746 detect zero. Thus three nested loops may end at the same instruction with the loop associated with loop end register LS2 711 the inner loop, and the loop associated with loop end register LS0 the outer loop.

Loops can have any number of instructions within the address limit of the loop end registers LE2–LE0. Loop end registers LE2–LE0 and loop start registers LS2–LS0 preferably include 29 address bits in the same fashion as program counter PC 701. The number of repetitions possible is limited by the capacity of the loop count registers and the loop reload registers. In the preferred embodiment the loop count registers LC2–LC0 and the loop reload registers LR2–LR0 each have 32 bits as most registers on digital image/graphics processor 71. For the sake of size, the capacity of the loop count and loop reload registers may be limited to 16 bits rather than 32 bits. In this case, the most significant 16 bits of these registers are not implemented. With 16 bit loop count and loop reload registers loops larger than $2^{16}=65536$ can be implemented using outside software loops to restart the hardware loops. The addresses for loop starts and loop ends can be coincident, resulting in a single instruction loop.

Figure 38:
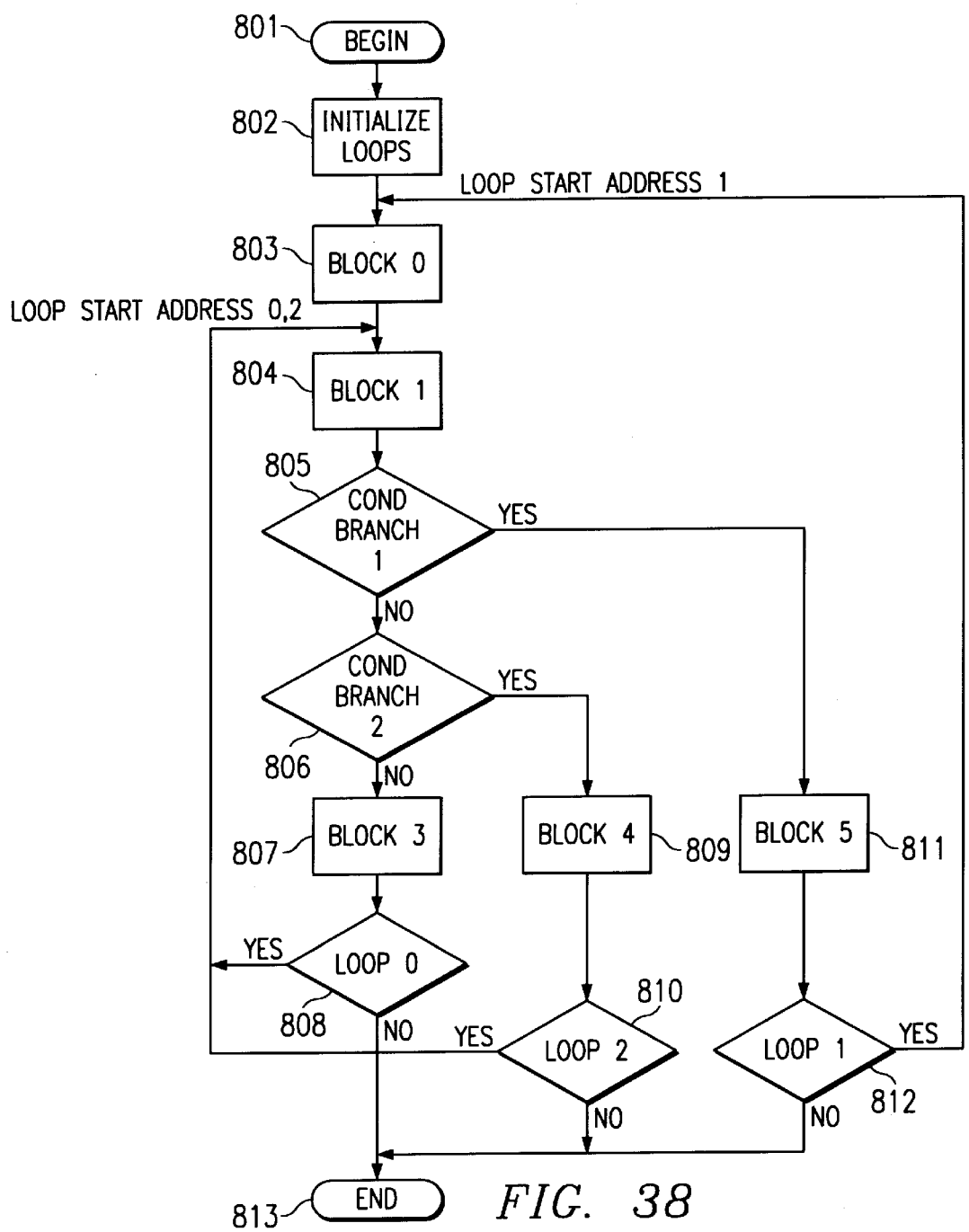
FIG. 38 illustrates in flow chart form a program example of a single program loop with multiple loop ends.

FIG. 38 illustrates an example of a program having three ends to one loop. This is achieved by assigning loop count register LC0 733 to each of the loop end registers LE2–LE0. In the example illustrated in FIG. 38 loop start register LC0 723 and loop start register LC2 721 store the same address. Loop start register LC1 722 stores a different start address. The program begins at block 801. Processing block 802 initializes the loops including storing the respective loop end addresses in loop end registers LE2–LE0, storing the respective loop start addresses in loop start registers LS2–LS0, loading loop control register LCTL 705 to enable all three loops and assign loop count register LC0 733 to all loop end registers LE2–LE0. Processing block 803 is an instruction block 0 starting at loop start address 1. Processing block 804 is an instruction block 1 starting at start address 0 and 2. Decision block 805 is a conditional branch instruction 1. Decision block 806 is a conditional branch instruction 2. Assuming neither condition 1 nor condition 2 is satisfied, then the program executes processing block 807 consisting of instruction block 3. Decision block 808 is the hardware loop decision corresponding to the loop end address stored in loop end register LE0 713. If the count stored in loop count register LC0 is non-zero, the program flow returns to loop start address 0 that repeats the loop starting with instruction block 1. If the count stored in loop count register LC0 is "0", the program ends at end block 813. In the case that condition 1 is not satisfied and condition 2 is satisfied, then the program executes processing block 809 consisting of instruction block 4. Decision block 810 is the hardware loop decision corresponding to the loop end address stored in loop end register LE2 711. If the count stored in loop count register LC0 is non-zero, the program flow returns to loop start address 2 that is the same as loop start address 0 which repeats the loop starting with instruction block 1. If the count stored in loop count register LC0 is "0", the program ends at end block 813. In the case that condition 1 is satisfied, then the program executes processing block 811 consisting of instruction block 5. Decision block 812 is the hardware loop decision corresponding to the loop end address stored in loop end register LE1 712. If the count stored in loop count register LC0 is non-zero, the program flow returns to loop start address 1 and repeats the loop starting with instruction block 0. If the count stored in loop count register LC0 is "0", the program ends at end block 813. The loop could finally terminate at any of the loop end addresses according to the condition encountered by the conditional branches on the final time through the loop.

To save instructions during loop initialization, any write to a loop reload register LR2–LR0 writes the same data to the corresponding loop count register LC2–LC0. In the preferred embodiment, writing to a loop count register LC2–LC0 does not affect the corresponding loop reload register LR2–LR0. The reason for this difference will be explained below. When restoring loop values after task switches, the loop reload registers LR2–LR0 should be restored before restoring the loop count registers LC2–LC0. Thus the form for initializing a single loop is:

$LSn$ = loop start address $LEn$ = loop end address $LRn$ = loop count this also sets $LCn$ = loop count Load $LCTL$ with bits to enable loop $n$, and assign $LCn$ to $LEn$ Begin loop This procedure is suitable for loading a number of loops, which execute for a long time. This initialization procedure is repeated to implement additional loops. Note that since the loop registers are loaded by software in the execute pipeline stage and used by the hardware in the fetch pipeline stage, there should be at least two instructions between loading any loop register and the loop end address where that loop register will be used.

The loop start address and the loop end address can be made independent of the position of the loop within the program by loading the loop start register LS2–LS0 and the loop end register LE2–LE0 as offsets to instruction pointer-execute stage register IPE 703. Recall that instruction pointer-execute stage register IPE 703 stores the address of the instruction currently in the execute pipeline stage. For example, the instruction:

LS0=IPE+88 loads loop start register LS0 723 with a value 11 instructions (88 bytes) ahead of the current instruction. A similar instruction can load a loop end register LE2–LE0.

The preferred embodiment of this invention includes additional register addresses to support even faster loop initialization for short loops. There are two sets of such register addresses, one set for multi-instruction loops and one set for single instruction loops. Writing to one of the register addresses LRS2–LRS0 used for multi-instruction loops loads the corresponding loop reload register LR2–LR0 and its corresponding loop counter LC2–LC0. This write operation also loads the corresponding loop start LS2–LS0 register with the address following the current address stored in program counter PC 701. This write operation also sets corresponding bits in loop control register LCTL 708 to enable the relevant loop. Thus, if n is a register set number from 2–0, writing to LRSn: loads LRn and LCn with the specified counat; loads LSn with PC+1; loads LCTL to enable LEn and assign LCn. These operations all occur in a single cycle, during the execute pipeline stage. There thus must be two delay slots between this instruction and the start of the loop. The instruction sequence for this multi-instruction loop short form initialization is:

|  |  |
| --- | --- |
|  | LEn = loop end address |
|  | LRSn = count |
|  | delay slot 1 |
|  | delay slot 2 |
| loop start address: | 1st_instruction_in_loop |
|  | loop_instruction |
|  | loop_instruction |
| loop end address: | last_instruction_in_loop |

Note that the loop could be as long as desired within the register space of the corresponding loop end register and loop start register. Also note that writing to LRSn automatically sets the loop start address as the instruction following the second delay slot.

Another set of register addresses is used for short form initialization of a single instruction loop. Writing to one of the register addresses LRSE2–LRSE0 initializes a single instruction loop. If n is a register set number from 2–0, writing to LRSEn: loads loop reload register LRn and loop count register LCn with the count; loads loop start register LSn with the address following the address currently in program counter PC 701; loads loop end register LEn with the address following the address currently in program counter PC 701; and sets loop control register LCTL 705 to enable loop end register LEn and assign loop count register LCn. As with writing to LRSn, these operations all occur in a single cycle during the execute pipeline stage and two delay slots are required between this instruction and the start of the loop. The instruction sequence for this single instruction loop short form initialization is:

|  |  |
| --- | --- |
|  | LRSEn = count |
|  | delay slot 1 |
|  | delay slot 2 |
| loopn: | one_instruction_loop |

This instruction sequence sets the loop start and loop end to the same address. This thus allows a single-instruction to be repeated count+1 times.

These short form loop initializations calculate the loop start address and the loop end address values from the address stored in program counter PC 701. They should therefore be used with care within the delay slots of a branch. If the branch is taken, the loop start address, and the loop end address for the case of LRSE2–LRSE0, is calculated after program counter PC 701 is loaded with the branch address. This effect can be annulled if the branch is conditional, by setting the loop initialization to be conditional upon the inverse condition.

These short form loop initializations and the standard loop initialization, do involve delay slots in much the same manner as software branches. However, the delay slots necessary for loop initialization occur once each loop initialization. The delay slots for branches formed with software loops occur once each branch instruction. In addition, there is a greater likelihood that useful instructions can occupy the delay slots during loop initialization than during loop branches. Thus the overhead needed for loop initialization can be much less than the overhead involved in software branches, particularly in short loops.

Figure 39:
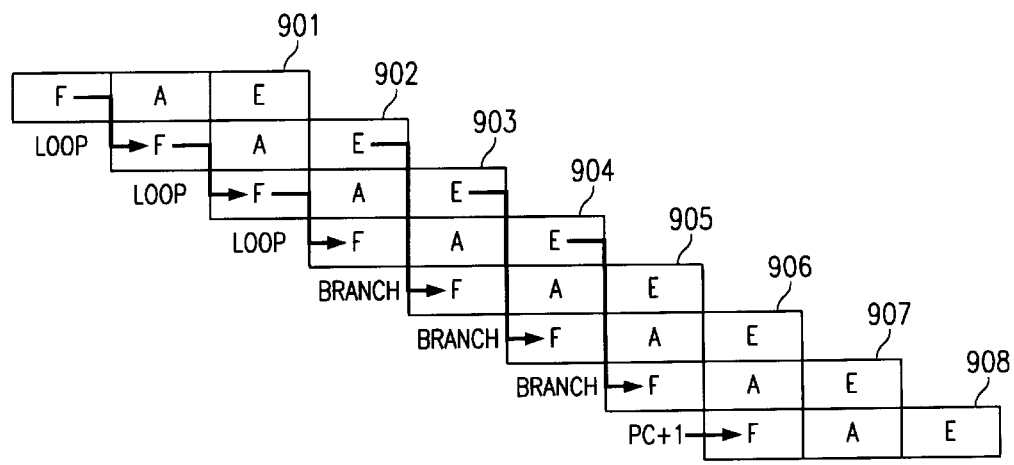
FIG. 39 illustrates the overlapping pipeline stages in an example of a software branch from a single instruction hardware loop.

Software branches have priority over loop logic 720. That is if a loop end register LE2–LE0 stores the address of the second delay slot instruction following a program counter load operation, then loop logic 720 is inhibited for that cycle. Thus the loop counter is not decremented, nor will any loop logic 720 program counter load take place. This enables a conditional software exit from a loop. If the loop logic 720 hardware loop has a single conditional branch instruction, then this instruction may be executed three times if the condition remains true. This is illustrated in FIG. 39. In instruction slot 901 the branch condition is not true so the branch is unsuccessful. Loop logic 720 has already reloaded the same instruction during the fetch pipeline stage of instruction slot 902. In instruction slot 902 the branch condition is true and the branch is taken, thereby loading the address of a target instruction into program counter PC 701. This change in program counter PC 701 does not change the two already loaded examples of the branch instruction in the pipeline in instruction slots 903 and 904. Assuming the branch condition is still true, the execute pipeline stage of these instruction slots loads the address of the target instruction into program counter PC 701. Thus the branch is taken three times in instruction slots 902, 903 and 904 and the target instruction executes three times in instruction slots 905, 906 and 906. Finally in instruction slot 908 the instruction following the target instruction is reached. As further explained below, the single branch instruction may be coded with parallel operations that would also be executed multiple times and that may change the branch condition.

Loop control logic 720 permits zero delay branches and zero delay conditional branches. In these cases the address of the point from which the branch is to be taken is loaded into a loop end register LE2–LE0. The destination address of the branch is loaded into the assigned loop start register LS2–LS0. Zero-delay branches may be implemented in two ways. Following loop initialization, the assigned loop count register LC2–LC0 is set to a non-zero number. Alternatively, the corresponding "LCn" field in loop control register LCTL 705 may be set to "000". In either case the branch will always be taken during the fetch pipeline stage with no pipeline hit or delay slots. Conditional zero-delay branches (flow chart diamonds) are implemented similarly. During initialization the corresponding loop count register LC2–LC0 is assigned to the loop end register LE2–LE0 by setting the corresponding "LCn" field in loop control register LCTL. Before the conditional branch, a conditional value is loaded into the assigned loop count register LC2–LC0. Upon encountering the loop end address, either the branch is taken to the loop start address stored in the corresponding loop start register LS2–LS0 if the conditional value is non-zero, or the branch is not taken if the conditional value is zero. Since the loop registers are loaded by software in the execute pipeline stage and used by the hardware in the fetch pipeline stage, there should be at least two instructions between loading any loop register and the branch or conditional branch instruction at the loop end address. Otherwise, the previous value for that loop register is used by loop logic 720.

Referring back to FIG. 31, program flow control unit 130 handles interrupts employing interrupt enable register INTEN 706 and interrupt flag register INTFLG 707. Program flow control unit 130 may support up to 32 interrupt sources represented by selectively setting bits of interrupt flag register INTFLG 707. Each source can be individually enabled via interrupt enable register INTEN 706. Pending interrupts are recorded in interrupt flag register INTFLG 707, which latches interrupt requests until they are specifically cleared by software, normally during the interrupt routine. The individual interrupt flag can alternatively be polled and cleared by a software loop.

Figures 40, 41, 42:
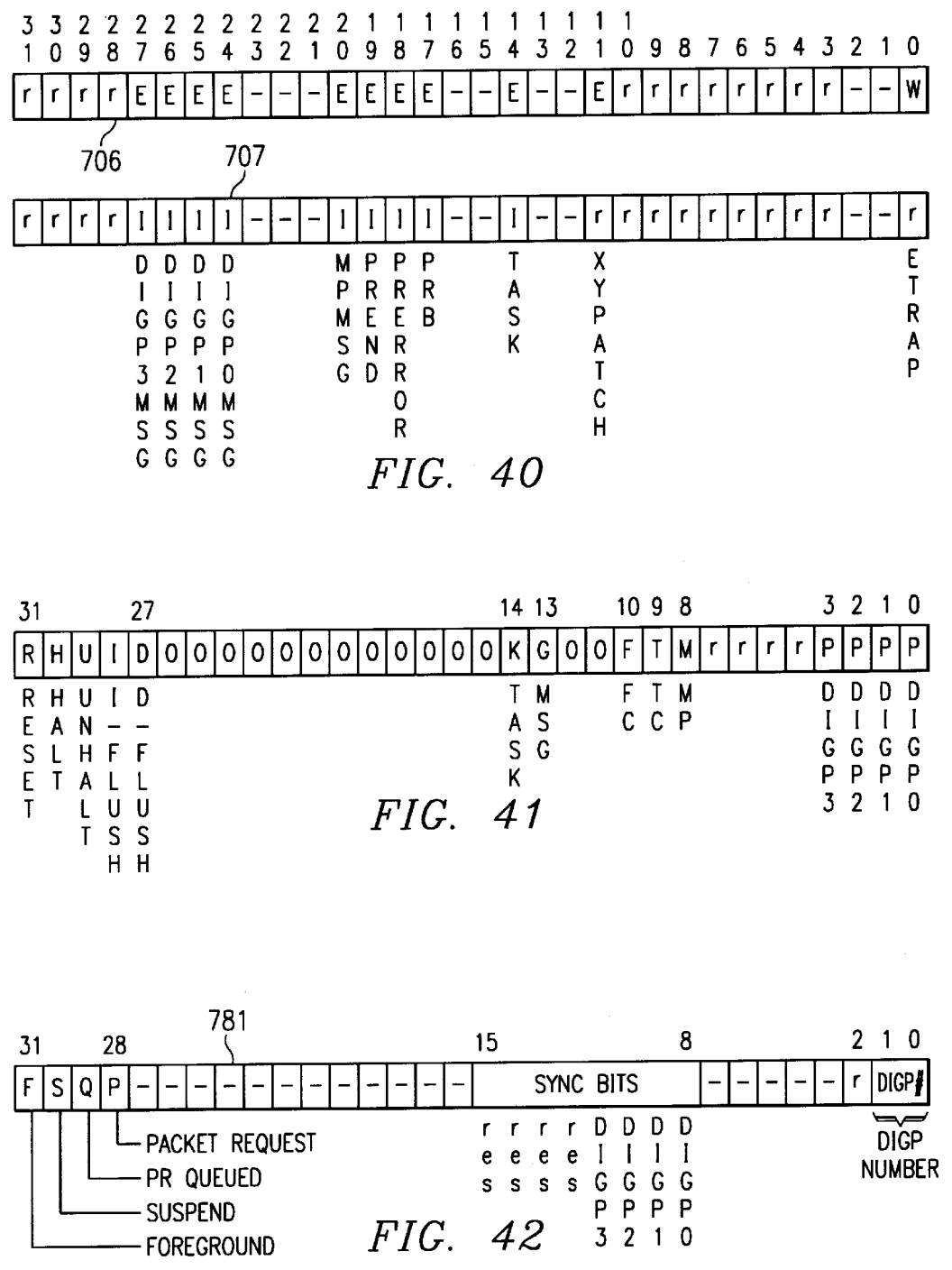

FIG. 40 illustrates the field definitions for interrupt enable register INTEN 706 and interrupt flag register INTFLG 707. The bits labeled "r" are reserved for future use and bits labeled "–" are not implemented in the preferred embodiment but may be used in other embodiments. Interrupts are prioritized from left to right. Each interrupt source can be individually enabled by setting a "1" in the corresponding Enable (E) bit of interrupt enable register INTEN 706. The interrupt source bits of interrupt flag register INTFLG 707 are in descending order of priority from right to left: Emulation interrupt ETRAP, which is always enabled; XY patch interrupt; task interrupt; packet request busy interrupt PRB; packet request error interrupt PRERR; packet request successful interrupt PREND; master processor 60 message interrupt MPMSG; digital image/graphics processor 71 message interrupt DIGP0MSG; digital image/graphics processor 72 message interrupt DIGP1MSG; digital image/graphics processor 73 message interrupt DIGP2MSG; digital image/graphics processor 74 message interrupt DIGP3MSG. Bits 31–28 are reserved for message interrupts from four additional digital image/graphics processors in an implementation of multiprocessor integrated circuit 100 including eight digital image/graphics processors.

The "W" bit (bit 0) of interrupt enable register INTEN 706 controls writes to interrupt flag register INTFLG 707. This bit would ordinarily control whether the emulation interrupt is enabled. Since in the preferred embodiment the emulation interrupt cannot be disabled there is no need for an enable bit for this interrupt in interrupt enable register INTEN 706. Bit 0 of interrupt enable register INTEN 706 modifies the behavior of the interrupt flag register INTFLG 707. When the "W" bit of interrupt enable register INTEN 706 is "1", software writes to interrupt flag register INTFLG 707 can only set bits to "1". Under these conditions, an attempt to write a "0" to any bit of interrupt flag register INTFLG 707 has no effect. When this "W" bit "0", writing a "1" to any bit of interrupt flag register INTFLG 707 clears that bit to "0". An attempt to write a "0" to any bit of interrupt flag register INTFLG 707 has no effect. This allows individual interrupt flags within interrupt flag register INTFLG 707 to be cleared without disturbing the state of others. Each interrupt service routine should clear its corresponding interrupt flag before returning because these flags are not cleared by hardware in the preferred embodiment. The emulation interrupt ETRAP, the only exception to this, is cleared by hardware because this interrupt is always enabled. If a particular interrupt source is trying to set a bit within interrupt flag register INTFLG 707 simultaneously as a software write operation attempts to clear it, logic causes the bit to be set.

The ETRAP interrupt flag (bit 0 of interrupt flag register INTFLG 707) is set from either analysis logic or an ETRAP instruction. This interrupt is normally serviced immediately because it cannot be disabled, however interrupt servicing does wait until pipeline stall conditions such as memory contention via crossbar 50 are resolved. The ENTRAP interrupt flag is the only interrupt bit in interrupt flag register INTFLG 707 cleared by hardware when the interrupt is serviced.

The XY PATCH interrupt flag (bit 11 of interrupt flag register INTFLG 707) is set under certain conditions when employing the global address unit 610 and local Address unit 620 combine to perform XY addressing. As previously described in conjunction with FIG. 27 and the description of address unit 120, XY patched addressing may generate interrupts on certain conditions. The instruction word calling for XY patched addressing indicates whether such an interrupt may be generated and whether a permitted interrupt is made on an address inside or outside a designated patch.

The TASK interrupt flag (bit 14 in interrupt flag register INTFLG 707) is set upon receipt of a command word from master processor 60. This interrupt causes digital image/graphics processor 71 to load its TASK interrupt vector. This interrupt may cause a selected digital image/graphics processor 71, 72, 73 or 74 to switch tasks under control of master processor 70, for instance.

The packet request busy interrupt flag PRB (bit 17 of interrupt flag register INTFLG 707) is set if software writes a "1" to the packet request bit of communications register COMM 781 when the queue active bit is a "1". This allows packet requests to be submitted without checking that the previous one has finished. If the previous packet request is still queued then this interrupt flag becomes set. This will be further explained below in conjunction with a description of communications register COMM 781.

The packet request error interrupt flag PRERR (bit 18 of interrupt flag register INTFLG 707) is set if transfer controller 80 encounters an error condition while executing a packet request submitted by the digital image/graphics processor.

The packet request end interrupt flag PREND (bit 19 of interrupt flag register INTFLG 707) is set by transfer controller 80 when it encounters the end of the digital image/graphics processor's linked-list, or when it completes a packet request that instructs transfer controller 80 to interrupt the requesting digital image/graphics processor upon completion.

The master processor message interrupt flag MPMSG (bit 20 of interrupt flag register INTFLG 707) becomes set when master processor 60 sends a message-interrupt to that digital image/graphics processor.

Bits 27–24 of interrupt flag register INTFLG 707 log message interrupts from digital image/graphics processors 71, 72, 73 and 74. Note that a digital image/graphics processor 71, 72, 73 or 74 can send a message to itself and interrupt itself via the corresponding bit of interrupt flag register INTFLG 707. The digital image/graphics processor 0 message interrupt flag DIGP0MSG (bit 24 of interrupt flag register INTFLG 707) is set when digital image/graphics processor 71 sends a message interrupt to the digital image/graphics processor. In a similar fashion, digital image/graphics processor 1 message interrupt flag DIGP1MSG (bit 25 of interrupt flag register INTFLG 707) is set when digital image/graphics processor 72 sends a message interrupt; digital image/graphics processor 2 message interrupt flag DIGP2MSG (bit 26 of interrupt flag register INTFLG 707) is set when digital image/graphics processor 73 sends a message interrupt, and digital image/graphics processor 3 message interrupt flag DIGP3MSG (bit 27 of interrupt flag register INTFLG 707) is set when digital image/graphics processor 74 sends a message interrupt. As previously stated, bits 31–28 of interrupt flag register INTFLG 707 are reserved for message interrupts from four additional digital image/graphics processors in an implementation of multiprocessor integrated circuit 100 including eight digital image/graphics processors.

When an enabled interrupt occurs, an interrupt pseudo-instruction unit 770, which may be a small state machine, injects the following a set of pseudo-instructions into the pipeline at instruction register-address stage 751:

$$*(A14 -= 16) = SR$$

$$*(A14 + 12) = PC$$

$$BR = *vectadd; \text{Two } LS \text{ bits of } vectadd = \text{"}11\text{"},$$

$$\text{to load } S, G \text{ and } L$$

$$*(A14 + 8) = IPA$$

$$*(A14 + 4) = IPE$$

These pseudo-instructions are referred to as PS1, PS2, PS3, PS4 and PS5, respectively. Instruction pointer-return from subroutine IPRS 704 is not saved by this sequence. If an interrupt service routine performs any branches then instruction pointer-return from subroutine IPRS 704 should first be pushed by the interrupt service routine, and then restored before returning. Note that the vector fetch is a load of the entire program counter PC 701, with instruction pointer-return from subroutine IPRS 704 protected. Since this causes the S, G and L bits of program counter PC 701 to be loaded, the three least significant bits of all interrupt vectors are made "0". One exception to this statement is that the task vector fetched after a reset should have the "L" bit (bit 0 of program counter PC 701) set, in order to disable looping.

The respective addresses of starting points of interrupt service routines for any interrupt represented in the interrupt flag register INTFLG 707 are called the digital image/graphics processor interrupt vectors. These addresses are generated by software and loaded as data to the parameter memory 25, 30, 35 and 40 corresponding to the respective interrupted digital image/graphics processor 71, 72, 73 and 74 at the fixed addresses shown in Table 34. Interrupt pseudo-instruction PS3 takes the 32 bit address stored in the indicated address in the corresponding parameter memory 25, 30, 35 or 40 and stored this in program counter PC 701. Interrupt pseudo-instruction unit 770 computes the addresses for the corresponding parameter memory based upon the highest priority interrupt enabled via interrupt enable register 706. Interrupt pseudo-instruction unit 770 operates to include the digital image/graphics processor number from communications register COMM 781 in order to generate unique addresses for each digital image/graphics processor. Note interrupt pseudo-instruction PS4 and PS5 are in the delay slots following this branch to the interrupt service routine.

TABLE 34

| INTFLG bit | Interrupt Name | Address |
| --- | --- | --- |
| 31 | Reserved for DIGP7 Message | 0100#1FC |
| 30 | Reserved for DIGP6 Message | 0100#1F8 |
| 29 | Reserved for DIGP5 Message | 0100#1F4 |
| 28 | Reserved for DIGP4 Message | 0100#1F0 |

TABLE 34-continued

| INTFLG bit | Interrupt Name | Address |
| --- | --- | --- |
| 27 | DIGP3 Message | 0100#1EC |
| 26 | DIGP2 Message | 0100#1E8 |
| 25 | DIGP1 Message | 0100#1E4 |
| 24 | DIGP0 Message | 0100#1E0 |
| 23 | Spare | 0100#1DC |
| 22 | Spare | 0100#1D8 |
| 21 | Spare | 0100#1D4 |
| 20 | Master Processor Message | 0100#1D0 |
| 19 | Packet Request Successful | 0100#1CC |
| 18 | Packet Request Error | 0100#1C8 |
| 17 | Packet Request Busy | 0100#1C4 |
| 16 | Spare | 0100#1C0 |
| 15 | Spare | 0100#1BC |
| 14 | TASK interrupt | 0100#1B8 |
| 13 | Spare | 0100#1B4 |
| 12 | Spare | 0100#1B0 |
| 11 | XY Patching | 0100#1AC |
| 10 | Reserved | 0100#1A8 |
| 9 | Reserved | 0100#1A4 |
| 8 | Reserved | 0100#1A0 |
| 7 | Reserved | 0100#19C |
| 6 | Reserved | 0100#198 |
| 5 | Reserved | 0100#194 |
| 4 | Reserved | 0100#190 |
| 3 | Reserved | 0100#18C |
| 2 | Spare | 0100#188 |
| 1 | Spare | 0100#184 |
| 0 | Emulation | 0100#180 |

In each address the "#" is replaced by the digital image/graphics processor number obtained from communications register COMM 781.

The final 4 instructions of an interrupt service routine should contain the following (32 bit data, unshifted-index) operations:

SR=*(A14++=4)
BR=*(A14++=7)
BR=*(A14++=5)
BR=*(A14++=5)

These instructions are referred to as RETI1, RETI2, RETI3 and RETI4, respectively, Other operations can be coded in parallel with these if desired, but none of these operations should modify status register 211.

The interrupt state can be saved if a new task is to be executed on the digital image/graphics processor, and then restored to the original state after finishing the new task. The write mode controlled by the "W" bit on interrupt enable register INTEN 706 allows this to be done without missing any interrupts during the saving or restoring operations. This may be achieved by the following instruction sequence. First, disable interrupts via a DINT instruction. Next save both interrupt enable register INTEN 706 and interrupt flag register INTFLG 707. Set the "W" bit (bit 0) of interrupt enable register INTEN 706 to "0" and then write Hex "FFFFFFFF" to interrupt flag register INTFLG 707. Run the new task, which may include enabling interrupts. Following completion of the new task, recover the original task. First, disable interrupts via the DINT instruction. Set the "W" bit of interrupt enable register INTEN 706 to "1". Restore the status of interrupt flag register INTFLG 707 from memory. Next, restore the status of interrupt enable register INTEN from memory. Last, enable interrupts via the EINT instruction.

Each digital image/graphics processor 71, 72, 73 and 74 may transmit command words to other digital image/graphics processors and to master processor 60. A register to register move with a destination of register A15, the zero value address register of the global address unit, initiates a command word transfer to a designated processor. Note that this register to register transfer can be combined in a single instruction with operations of data unit 110 and an access via local data port 144, as will be described below. This command word is transmitted to crossbar 50 via global data port 148 accompanied by a special command word signal. This allows master processor 60 and digital image/graphics processors 71, 72, 73 and 74 to communicate with the other processors of multiprocessor integrated circuit 100.

FIG. 41 illustrates schematically the field definitions of these command words. In the preferred embodiment command words have the same 32 bit length as data transmitted via global data port 148. The least significant bits of each command word define the one or more processors and other circuits to which the command word is addressed. Each recipient circuit responds to a received command word only if these bits indicate the command word is directed to that circuit. Bits 3–0 of each command word designate digital image/graphics processors 74, 73, 72 and 71, respectively. Bits 7–4 are not used in the preferred embodiment, but are reserved for use in a multiprocessor integrated circuit 100 having eight digital image/graphics processors. Bit 8 indicates the command word is addressed to master processor 60. Bit 9 indicates the command word is directed to transfer controller 80. Bit 10 indicates the command word is directed to frame controller 90. Note that not all circuits are permitted to send all command words to all other circuits. For example, system level command words cannot be sent from a digital image/graphics processor to another digital image/graphics processor or to master processor 60. Only master processor 60 can send command words to transfer controller 80 or to frame controller 90. The limitations on which circuit can send which command words to which other circuits will be explained below in conjunction with the description of each command word field.

The "R" bit (bit 31) of the command word is a reset bit. Master processor 60 may issue this command word to any digital image/graphics processor, or a digital image/graphics processor may issue this command word to itself. No digital image/graphics processor may reset another digital image/graphics processor. Note throughout the following description of the reset sequence each digit "#" within an address should be replaced with the digital image/graphics processor number, which is stored in bits 1–0 of command register COMM 781. When a designated digital image/graphics processor receives a reset command word, it first sets its halt latch and sends a reset request signal to transfer controller 80. Transfer controller 80 sends a reset acknowledge signal to the digital image/graphics processor. The resetting digital image/graphics processor performs no further action until receipt of this reset acknowledge signal from transfer processor 80. Upon receipt of the reset acknowledge signal, the digital image/graphics processor initiates the following sequence of operations: sets the halt latch if not already set; clears to "0" the "F", "P", "Q" and "S" bits of communications register COMM 781 (the use of these bits will be described below); clears any pending memory accesses by address unit 120; resets any instruction cache service requests; loads into instruction register-execute stage IRE 752 the instruction BR=[u.ncvz] A14<<1

||A14=Hex "0100#7F0"

which unconditionally loads the contents of the stack pointer A14 left shifted one bit to program counter PC 701 with the negative, carry, overflow and zero status bits protected from change and with the "R" bit set to reset stack pointer A14 in parallel with a load of the stack pointer A14; loads into instruction register-address stage IRA 751 the instruction

*(PBA+Hex "FC")=PC which instruction stores the contents of program counter PC 701 at the address indicated by the sum of the address PBA and Hex "FC"; sets interrupt pseudo-instruction unit 770 to next load interrupt pseudo-instruction PS3; sets bit 14 of interrupt flag register INTFLG 707 indicating a task interrupt; clears bit 0 of interrupt flag register INTFLG 707 thus clearing the emulator trap interrupt ETRAP; and clears bits 11, 7 and 3 of loop control register LCTL thus disabling all three loops.

Execution by the digital image/graphics processor begins when master processor 60 transmits an unhalt command word. Once execution begins the digital image/graphics processor: save address stored in program counter PC 701 to address Hex "0100#7FC", this saves the prior contents of stack pointer A14 left-shifted by one place and the current value of the control bits (bits 2–0) of program counter PC 701; loads the address Hex "0100#7F0" into stack pointer A14; loads program counter PC 701 with the task interrupt vector, where control bits 2–0 are "000"; stores the contents of instruction register-address stage IPA 751 including control bits 2–0 at address Hex "0100#7F8"; stores the contents of instruction register-execute stage IPE including control bits 2–0 at address Hex "0100#7F4"; and begins program execution at the address given by the Task interrupt. The stack-state following reset is shown in Table 35.

TABLE 35

| Address | Contents |
|---|---|
| Hex "0100#7FC" | stack pointer register A14 from before reset left shifted one place |
| Hex "0100#7F8" | instruction register-address stage IRA from before reset |
| Hex "0100#7F4" | instruction register-execute stage IRE from before reset |

The prior states of instruction register-address stage IRA 751 and instruction register-execute stage IRE 752 include the control bits 2–0. Note that stack pointer A14 now contains the address Hex "0100#7F0".

The "H" bit (bit 30) of the command word is a halt bit. Master processor 60 may issue this command word to any digital image/graphics processor, or a digital image/graphics processor may issue this command word to itself. No digital image/graphics processor may halt another digital image/graphics processor. When a designated digital image/graphics processor receives this command word, the digital image/graphics processor sets a halt latch and stalls the pipeline. The digital image/graphics processor after that behaves as if in an infinite crossbar memory contention. Nothing is reset and no interrupts occur or are recognized. Note that when a digital image/graphics processor halts itself by sending a command word, the two instructions following the instruction sending the halt command word are in its instruction pipeline. Note that the address pipeline stage of the first instruction following an instruction issuing a halt command word will have already executed its address pipeline stage due to the nature of the instruction pipeline. This halt state can only be reversed by receiving an unhalt command word from master processor 60.

The Halt condition reduces power consumption within the digital image/graphics processor because its state is unchanging. Further reduced power may be achieved by stopping the clocks while the digital image/graphics processor is in this mode.

The "U" bit (bit 29) of the command word is an unhalt bit. This command word can only be issued by master processor 60 to one or more of digital image/graphics processors 71, 72, 73 and 74. An unhalt command word clears halt latch of the destination digital image/graphics processor. The digital image/graphics processor then recommences code execution following a halt as if nothing had happened. This is the preferable way to start a digital image/graphics processor following a hardware or command word reset. Upon execution of an unhalt command word, the destination digital image/graphics processor begins code execution at the address given by its task interrupt vector. The "U" bit takes priority over the "H" bit of a single command word. Thus receipt of a single command word with both the "H" bit and the "U" bit set results in execution of the unhalt command. Note that simultaneously receipt of an unhalt command word from master processor 60 and a halt command word transmitted by the digital image/graphics processor itself grants priority to the master processor 60 unhalt command word. The "R" bit takes priority over the "U" bit. Thus receipt of a single command word from master processor 60 having both the "R" bit and the "U" bit set results in the digital image/graphics processor reset to the halted condition.

The "I" bit (bit 28) of the command word is an instruction cache flush bit. Master processor 60 may issue this command word to any digital image/graphics processor, or a digital image/graphics processor may issue such a command word to itself. No digital image/graphics processor may order an instruction cache flush by another digital image/graphics processor. A designated digital image/graphics processor receiving this command word flushes its instruction cache. An instruction cache flush causes the cache tag value field to be set to the cache tag register's own number, clears all their present bits, and sets the LRU bits to the tag register's own number.

The "D" bit (bit 27) of the command word indicates a data cache flush. Digital image/graphics processors 71, 72, 73 and 74 do not employ data caches, therefore this command word does not apply to digital image/graphics processors and is ignored by them. Master processor 60 may send this command word to itself to flush its data cache memories 13 and 14.

The "K" bit (bit 14) of the command word indicates a task interrupt. Master processor 60 may send this command word to any digital image/graphics processor 71, 72, 73 or 74, but no digital image/graphics processor may send this command word to another digital image/graphics processor or to master processor 60. Upon receipt of a task command word, any digital image/graphics processor designated in the command word takes a task interrupt if enabled by bit 14 of interrupt enable register INTEN 706.

The "G" bit (bit 13) of the command word indicates a message interrupt. Any digital image/graphics processor may send this message interrupt to any other digital image/graphics processor or to master processor 60. Any digital image/graphics processor designated in such a command word will set its message interrupt flag, and take a message interrupt if message interrupts are enabled via bit 20 of interrupt enable register INTEN 706. In the preferred embodiment this command word is not sent to transfer controller 80.

When a digital image/graphics processor issues a command word to itself, to halt itself via the "H" bit or flush its instruction cache via the "I" bit, this command word should have the corresponding digital image/graphics processor designator bit set, to execute the command. This is for consistency, and to allow future expansion of command word functions.

FIG. 42 illustrates schematically the field definitions of communications register COMM 781. The "F", "S", "Q" and "P" bits (bits 31–28) are employed in communication of packet requests from a digital image/graphics processor 71, 72, 73 or 74 and transfer controller 80. The "F" and "S" bits are normal read/write bits. The "P" bit may be written to only if the "S" bit is "0" or is being simultaneously cleared to "0". The "Q" bit is read only. Packet requests are requests by a digital image/graphics processor 71, 72, 73 or 74 for data movement by transfer controller 80. These data movements may involve only memories 11–14 and 21–40 internal to multiprocessor integrated circuit 100 or may involve both internal memory and external memory. Packet requests are stored as a linked-list structure and only a single packet request may be active at a time for each digital image/graphics processor. A linked-list painter at a dedicated address within the parameter memory 25, 30, 35 or 40 corresponding to the requesting digital image/graphics processor 71, 72, 73 or 74 points to the beginning of the active linked-list. Each entry in the linked-list contains a pointer to the next list entry.

Initializing a packet request involves the following steps. First, the digital image/graphics processor sets the desired packet request parameters into its corresponding parameter memory. Next, the digital image/graphics processor stores the address of the first link of the linked-list at the predetermined address Hex "0100#0FC" in its corresponding parameter memory, where "#" is replaced with the digital image/graphics processor number. Setting the "P" bit (bit 28) of communications register COMM 781 to "1" alerts transfer controller 80 of the packet request. The digital image/graphics processor may request a high priority by setting the "F" bit (bit 31) to "1" or a low priority by clearing the "F" bit "0".

Transfer controller 80 recognizes when the "P" bit is set and assigns a priority to the packet request based upon the state of the "F" bit. Transfer controller 80 clears the "P" bit and sets the "Q" bit, indicating that a packet request is in queue. Transfer controller 80 then accesses the predetermined address Hex "0100#0FC" within the corresponding parameter memory and services the packet request based upon the linked-list. Upon completion of the packet request, transfer controller 80 clears the "Q" bit to "0" indicating that the queue is no longer active. The digital image/graphics processor may periodically read this bit for an indication that the packet request is complete. Alternatively, the packet request itself may instruct transfer controller 80 to interrupt the requesting digital image/graphics processor when the packet request is complete. In this case, transfer controller 80 sends an interrupt to the digital image/graphics processor by setting bit 19, the packet request end interrupt bit PREND, in interrupt flag register INTFLG 707. If transfer controller 80 encounters an error in servicing the packet request, it sends an interrupt to the digital image/graphics processor by setting bit 18, the packet request error interrupt bit PRERROR, in interrupt flag register INTFLG 707. The digital image/graphics processor has the appropriate interrupt vectors stored at the locations noted in Table 34 and the appropriate interrupt service routines.

The digital image/graphics processor may request another packet while transfer controller 80 is servicing a prior request. In this event the digital image/graphics processor sets the "P" bit to "1" while the "Q" bit is "1". If this occurs, transfer controller 80 sends a packet request busy interrupt PRB to the digital image/graphics processor by setting bit 17 of interrupt flag register INTFLG 707. Transfer controller 80 then clears the "P" bit to "0". The interrupt service routine of requesting digital image/graphics processor may suspend the second packet request while the first packet request is in queue, cancel the packet request or take some other corrective action. This feature permits the digital image/graphics processor to submit packet requests without first checking the "Q" bit of communications register COMM 781.

The digital image/graphics processor may suspend service of the packet request by setting the "S" bit to "1". Transfer controller 80 detects when the "S" bit is "1". If this occurs while a packet request is in queue, the transfer controller copies the "Q" bit into the "P" bit and clears the "Q" bit. This will generally set the "P" bit to "1". Software within the requesting digital image/graphics processor may then change the status of the "S" and "P" bits. Transfer controller 80 retains in memory its location within the linked-list of the suspended packet request. If transfer controller 80 determines that the "S" bit is "0" and the "P" bit is simultaneously "1", then the suspended packet request is resumed.

The "Sync bits" field (bits 15–8) of communications register COMM 781 are used in a synchronized multiple instruction, multiple data mode. This operates for any instructions bounded by a lock instruction LCK, which enables the synchronized multiple instruction, multiple data mode, and an unlock instruction UNLCK, which disables this mode. Bits 11–8 indicate whether instruction fetching is to be synchronized with digital image/graphics processors 74, 73, 72 and 71, respectively. A "1" in any of these bits indicates the digital image/graphics processor delays instruction fetch until the corresponding digital image/graphics processor indicates it has completed execution of the prior instruction. The other digital image/graphics processors to which this digital image/graphics processor is to be synchronized will similarly have set the corresponding bits in their communication register COMM 781. It is not necessary that the "Sync bit" corresponding to itself be set when a digital image/graphics processor is in the synchronized multiple instruction, multiple data mode, but this does no harm. Note that bits 15–12 are reserved for a possible extension to eight digital image/graphics processors.

The "DIGP#" field (bits 2–0) of communications register COMM 781 are unique to each particular digital image/graphics processor on multiprocessor integrated circuit 100. These bits are read only, and any attempt to write to these bits fails. This is the only part of the digital image/graphics processors 71, 72, 73 and 74 that is not identical. Bits 1–0 are hardwired to a two bit code that identifies the particular digital image/graphics processor as shown in Table 36.

TABLE 36

| COMM field | | Parallel |
|---|---|---|
| 1 | 0 | Processor |
| 0 | 0 | DIGP0 (71) |
| 0 | 1 | DIGP1 (72) |
| 1 | 0 | DIGP2 (73) |
| 1 | 1 | DIGP3 (74) |

Note that bit 2 is reserved for future use in a multiprocessor integrated circuit 100 having eight digital image/graphics processors. In the current preferred embodiment this bit is hardwired to "0" for all four digital image/graphics processors 71, 72, 73 and 74.

This part of communications register COMM 781 serves to identify the particular digital image/graphics processor.

The identity number of a digital image/graphics processor may be extracted by ANDing communications register COMM 781 with 7 (Hex "0000007"). The instruction "D0= COMM&7" does this, for example. This instruction returns only the data in bits 2–0 of communications register COMM 781. Note that this instruction is suitable for embodiments having eight digital image/graphics processors. Since the addresses of the data memories and parameter memories corresponding to each digital image/graphics processor depend on the identity of that digital image/graphics processor, the identity number permits software to compute the addresses for these corresponding memories. Using this identity number makes it is, possible to write software that is independent of the particular digital image/graphics processor executing the program. Note that digital image/graphics processor independent programs may also use registers PBA and DBA for the corresponding parameter memory base address and data memory base address.

Table 37 lists the coding of registers called the lower 64 registers. Instruction words refer to registers by a combination of register bank and register number. If no register bank designation is permitted in that instruction word format, then the register number refers to one of the data registers 200 D7–D0. Some instruction words include 3 bit register bank fields. For those instructions words the register is limited to the lower 64 registers listed in Table 37, with a leading "0" implied in the designated register bank. Otherwise, the instruction word refers to a register by a four bit register bank and a three bit register number.

TABLE 37

| Reg. Bank | Reg. No. | Register Name | Reg. Bank | Reg. No. | Register Name |
|---|---|---|---|---|---|
| 0000 | 000 | A0 | 0100 | 000 | D0 |
| 0000 | 001 | A1 | 0100 | 001 | D1 |
| 0000 | 010 | A2 | 0100 | 010 | D2 |
| 0000 | 011 | A3 | 0100 | 011 | D3 |
| 0000 | 100 | reserved | 0100 | 100 | D4 |
| 0000 | 101 | reserved | 0100 | 101 | D5 |
| 0000 | 110 | A6 | 0100 | 110 | D6 |
| 0000 | 111 | A7 | 0100 | 111 | D7 |
| 0001 | 000 | A8 | 0101 | 000 | ROT |
| 0001 | 001 | A9 | 0101 | 001 | SR |
| 0001 | 010 | A10 | 0101 | 010 | MF |
| 0001 | 011 | A11 | 0101 | 011 | reserved |
| 0001 | 100 | reserved | 0101 | 100 | reserved |
| 0001 | 101 | reserved | 0101 | 101 | reserved |
| 0001 | 110 | A14 | 0101 | 110 | reserved |
| 0001 | 111 | A15 | 0101 | 111 | reserved |
| 0010 | 000 | X0 | 0110 | 000 | GLMUX |
| 0010 | 001 | X1 | 0110 | 001 | reserved |
| 0010 | 010 | X2 | 0110 | 010 | reserved |
| 0010 | 011 | X3 | 0110 | 011 | reserved |
| 0010 | 100 | reserved | 0110 | 100 | reserved |
| 0010 | 101 | reserved | 0110 | 101 | reserved |
| 0010 | 110 | reserved | 0110 | 110 | reserved |
| 0010 | 111 | reserved | 0110 | 111 | reserved |
| 0011 | 000 | X8 | 0111 | 000 | PC/CALL |
| 0011 | 001 | X9 | 0111 | 001 | IPA/BR |
| 0011 | 010 | X10 | 0111 | 010 | IPE |
| 0011 | 011 | X11 | 0111 | 011 | IPRS |
| 0011 | 100 | reserved | 0111 | 100 | INTEN |
| 0011 | 101 | reserved | 0111 | 101 | INTFLG |
| 0011 | 110 | reserved | 0111 | 110 | COMM |
| 0011 | 111 | reserved | 0111 | 111 | LCTL |

Registers A0 through A15 are address unit base address registers 611. Registers X0 through X15 are address unit index address registers 612. Registers D0 through D7 are data unit data registers 200. Register ROT is the rotation data register 208. Register SR is the data unit status register 210. Register MF is the data unit multiple flags register 211.

Register GLMUX is the address unit global/local address multiplex register 630. Register PC is the program flow control unit 130 program counter PC 701 that points to the instruction being fetched. Reading from this register address obtains the address of the next instruction to be fetched. Writing to this register address causes a software call (CALL). This changes the next instruction pointed to by program counter PC 701 and loads the previous contents of program counter PC 701 into instruction pointer-return from subroutine IPRS 704. Register IPA is the program flow control unit instruction pointer-address stage 702, which holds the address of the instruction currently controlling the address pipeline stage. Reading from this register address obtains the address of the instruction currently in the address pipeline stage. Writing to this register address executes a software branch (BR). This alters the address stored in program counter PC 701 without changing the address stored in either instruction pointer-address stage IPA 702 or instruction pointer-return from subroutine IPRS 704. Register IPE is the program flow control unit instruction pointer-execute stage 703, which holds the address of the instruction currently controlling the execute pipeline stage. Software would not ordinarily write to either of these two registers. Register IPRS is the program flow control unit instruction pointer-return from subroutine 704. Instruction pointer-return from subroutine IPRS 704 is loaded with the value of program counter PC 701 incremented in bit 3 upon every write to program counter PC 701. This provides a return address for a subroutine call as the next sequential instruction. Register INTEN is the program flow control unit interrupt enable register 706 that controls the enabling and disabling of various interrupt sources. Register INTFLG is the program flow control unit interrupt flag register 707. This register contains bits representative of the interrupt sources that are set upon receipt of a corresponding interrupt. Register COMM is the program flow control unit 130 communications register 781. This register controls packet requests by the digital image/graphics processor to the transfer controller 80, synchronization between digital image/graphics processors during synchronized MIMD operation and includes hardwired bits identifying the digital image/graphics processor. Register LCTL is the program flow control unit loop control register 705, which controls whether hardware loop operations are enabled and which loop counter to decrement.

Table 38 lists the coding of registers called the upper 64 registers. These registers have register banks in the form "1XXX".

TABLE 38

| Reg. Bank | Reg. No. | Register Name | Reg. Bank | Reg. No. | Register Name |
|---|---|---|---|---|---|
| 1000 | 000 | reserved | 1100 | 000 | LC0 |
| 1000 | 001 | reserved | 1100 | 001 | LC1 |
| 1000 | 010 | reserved | 1100 | 010 | LC2 |
| 1000 | 011 | reserved | 1100 | 011 | reserved |
| 1000 | 100 | reserved | 1100 | 100 | LR0 |
| 1000 | 101 | reserved | 1100 | 101 | LR1 |
| 1000 | 110 | reserved | 1100 | 110 | LR3 |
| 1000 | 111 | reserved | 1100 | 111 | reserved |
| 1001 | 000 | reserved | 1101 | 000 | LRSE0 |
| 1001 | 001 | reserved | 1101 | 001 | LRSE1 |
| 1001 | 010 | reserved | 1101 | 010 | LRSE2 |
| 1001 | 011 | reserved | 1101 | 011 | reserved |
| 1001 | 100 | reserved | 1101 | 100 | LRS0 |
| 1001 | 101 | reserved | 1101 | 101 | LRS1 |
| 1001 | 110 | reserved | 1101 | 110 | LRS2 |
| 1001 | 111 | reserved | 1101 | 111 | reserved |
| 1010 | 000 | ANACNTL | 1110 | 000 | LS0 |
| 1010 | 001 | ECOMCNTL | 1110 | 001 | LS1 |
| 1010 | 010 | ANASTAT | 1110 | 010 | LS2 |
| 1010 | 011 | EVTCNTR | 1110 | 011 | reserved |
| 1010 | 100 | CNTCNTL | 1110 | 100 | LE0 |
| 1010 | 101 | ECOMCMD | 1110 | 101 | LE1 |
| 1010 | 110 | ECOMDATA | 1110 | 110 | LE2 |
| 1010 | 111 | BRK1 | 1110 | 111 | reserved |
| 1011 | 000 | BRK2 | 1111 | 000 | CACHE |
| 1011 | 001 | TRACE1 | 1111 | 001 | GTA |
| 1011 | 010 | TRACE2 | 1111 | 010 | reserved |
| 1011 | 011 | TRACE3 | 1111 | 011 | reserved |
| 1011 | 100 | reserved | 1111 | 100 | TAG0 |
| 1011 | 101 | reserved | 1111 | 101 | TAG1 |
| 1011 | 110 | reserved | 1111 | 110 | TAG2 |
| 1011 | 111 | reserved | 1111 | 111 | TAG3 |

In Table 38 the registers ANACNTL, ECOMCNTL, ANASTAT, EVTCNTR, CNTCNTL, ECOMCMD, ECOMDATA, BRK1, BRK2, TRACE1, TRACE2 and TRACE3 are used with an on chip emulation technique. These registers form no part of the present invention and will not be further described. The registers LC0, LC1 and LC2 are loop count registers 733, 732 and 731, respectively, within the program flow control unit 130 that are assigned to store the current loop count for hardware loops. The registers LR0, LR1 and LR2 are program flow control unit 130 loop reload registers 743, 742 and 741, respectively. These registers store reload values for the corresponding loop count registers LC0, LC1 and LC2 permitting nested loops. The register addresses corresponding to LRSE0, LRSE1, LRSE2, LRS0, LRS1 and LRS2 are write only addresses used for fast loop initialization. Any attempt to read from these register addresses returns null data. Writing a count into one of registers LRS0, LRS1 or LRS2 writes the same count into corresponding loop count register and loop reload register; writes the address stored in program counter PC 701 incremented in bit 3 into the corresponding loop start address register; and writes to loop control register LCTL 705 to enable the corresponding hardware loop. These registers enable fast initialization of a multi-instruction loop. Writing a count into one of registers LRSE0, LRSE1 or LRSE2: writes the same count into corresponding loop count register and loop reload register; writes the address stored in program counter PC 701 incremented in bit 3 into the corresponding loop start address register and loop end address register; and writes to loop control register LCTL 705 to enable the corresponding hardware loop. These registers enable fast initialization of a loop of a single instruction. The registers LS0, LS1 and LS2 are loop start address registers 723, 722 and 721, respectively, for corresponding hardware loops. The registers LE0, LE1 and LE2 are loop end address registers 713, 712 and 711, respectively, for corresponding hardware loops. Register CACHE is register 709 that mirrors the digital image/graphics processor instruction cache coding. Register GTA is the global temporary register 108 that stores the results of the global address unit operation for later reuse upon contention or pipeline stall. This register is read only and an attempt to write to this register is ignored. Registers TAG3, TAG2, TAG1 and TAG0 are cache tag registers designated collectively as 708, which store the relevant address portions of data within the data cache memory corresponding to that digital image/graphics processor.

Figure 43:
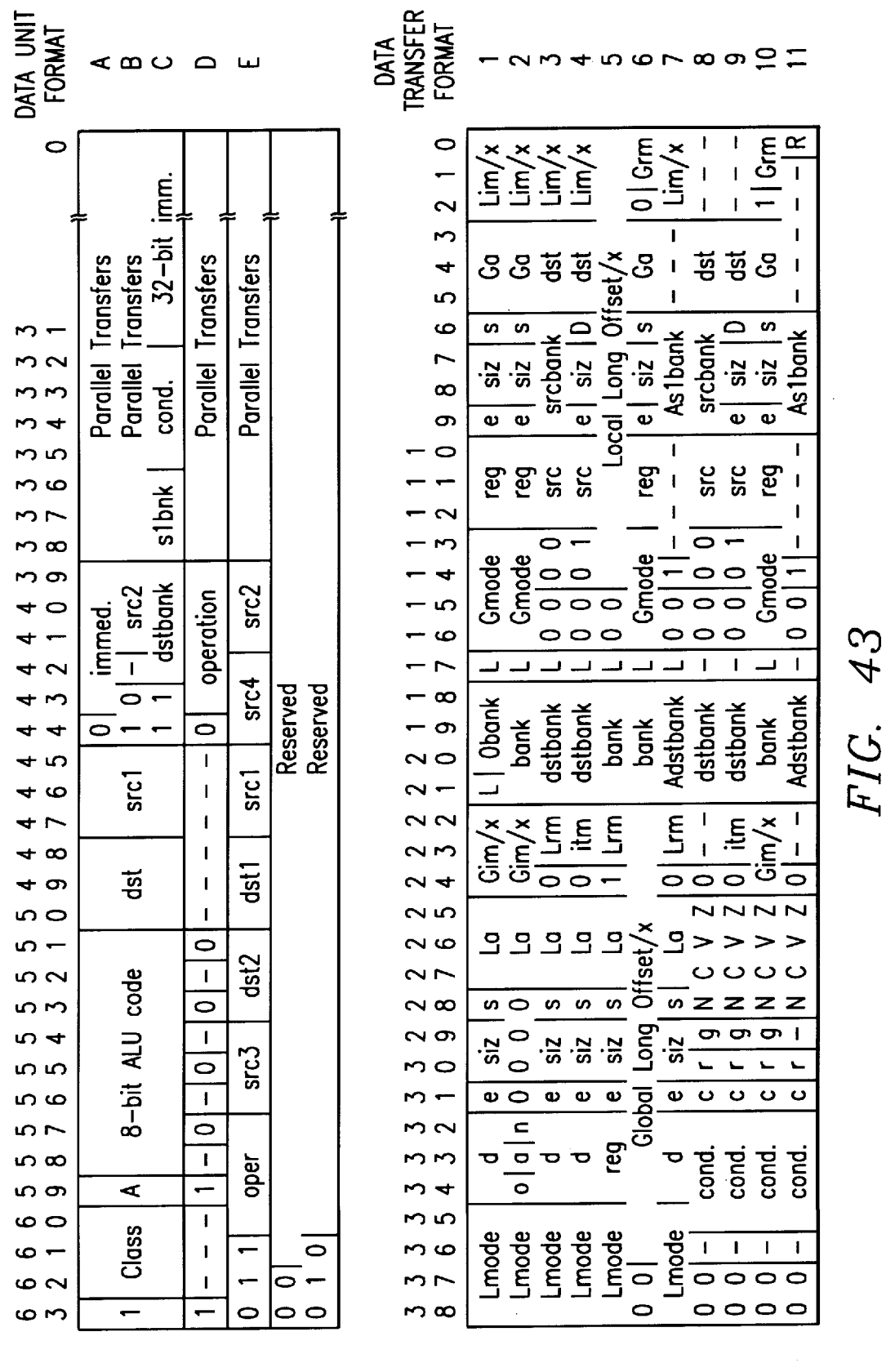

FIG. 43 illustrates the format of the instruction word for digital image/graphics processors 71, 72, 73 and 74. The instruction word has 64 bits, which are generally divided into two parallel sections as illustrated in FIG. 43. The most significant 25 bits of the instruction word (bits 63–39) specify the type of operation performed by data unit 110. The least significant 39 bits of the instruction word (bits 38–0) specify data transfers performed in parallel with the operation of data unit 110. There are five formats A, B, C, D and E for operation of data unit 110. There are ten types of data transfer formats 1 to 10. The instruction word may specify a 32 bit immediate value as an alternative to specifying data transfers. The instruction word is not divided into the two sections noted above when specifying a 32 bit immediate value, this being the exception to the general rule. Many instructions perform operations that do not use data unit 110. These instructions may allow parallel data transfer operations or parallel data transfer operations may be prohibited depending on the instruction. In other respects the operations specified for data unit 110 are independent of the operations specified for data transfer.

The instruction word alternatives are summarized as follows. The operation of data unit 110 may be a single arithmetic logic unit operation or a single multiply operation, or one of each can be performed in parallel. All operations of data unit 110 may be made conditional based upon a field in the instruction word. The parallel data transfers are performed on local port 141 and global port 145 of data port unit 140 to and/or from memory. Two data transfer operations are independently specified within the instruction word. Twelve addressing modes are supported force each memory access, with a choice of register or offset index. An internal register to register transfer within data unit 110 can be specified in the instruction word instead of a memory access via global port 145. When an operation of data unit 110 uses a non-data unit register as a source or destination, then some of the parallel data transfer section of the instruction word specifies additional register information, and the global port source data bus Gsrc 105 and global port destination data bus Gdst 107 transfer the data to and from data unit 110.

A part of the instruction word that normally specifies the local bus data transfer has an alternative use. This alternative use allows conditional data unit 110 operation and/or global memory access or a register to register move. Limited conditional source selection is supported in the operation of data unit 110. The result of data unit 110 can be conditionally saved or discarded, advantageously conditionally performing an operation without having to branch. Update of each individual bit of a status register can also be conditionally selected. Conditional stores to memory choose between two registers. Conditional loads from memory either load or discard the data. Conditional register to register moves either write to the destination, or discard the data.

Description of the types of instruction words of FIG. 43 and an explanation or glossary of various bits and fields of the five data unit operation formats follows. The bits and fields define not only the instruction words but also the circuitry that decodes the instruction words according to the specified logic relationships. This circuitry responds to a particular bit or field or logical combination of the instruction words to perform the particular operation or operations represented. Accordingly, in this art the specification of bits, fields, formats and operations defines important and advantageous features of the preferred embodiment and specifies corresponding logic circuitry to decode or implement the instruction words. This circuitry is straight forwardly implemented from this specification by the skilled worker in a programmable logic array (PLA) or in other circuit forms now known or hereafter devised. A description of the legal operation combinations follows the description of the instruction word format.

Data unit format A is recognized by bit 63="1" and bit 44="0". Data unit format A specifies a basic arithmetic logic unit operation with a 5 bit immediate field. The "class" field (bits 62–60) designates the data routing within data unit 110 with respect to arithmetic logic unit 230. Table 39 shows the definition of the data routings corresponding to the "class" field for data unit formats A, B and C.

TABLE 39

| Class field | | | | | | | |
|---|---|---|---|---|---|---|---|
| 6 2 | 6 1 | 6 0 | Input A | Input B | Input C | maskgen | rotate |
| 0 | 0 | 0 | src2/im | src1 | @MF | — | 0 |
| 0 | 0 | 1 | dstc | src1 | src2/im | — | D0(4–0) |
| 0 | 1 | 0 | dstc | src1 | mask | src2/im | 0 |
| 0 | 1 | 1 | dstc | src1 | mask | src2/im | src2/im |
| 1 | 0 | 0 | src2/im | src1 | mask | D0(4–0) | D0(4–0) |
| 1 | 0 | 1 | src2/im | src1 | @MF | — | D0(4–0) |
| 1 | 1 | 0 | dstc | src1 | src2/im | — | 0 |
| 1 | 1 | 1 | src1 | Hex "1" | src2/im | — | src2/im |

In Table 39 "Input A" is the source selected by Amux 232 for input A bus 241. The source "src2/im" is either the five bit immediate value of "immed" field (bits 43–39) in data unit format A, the data register 200 designated by the "src2" field (bits 41–39) in data unit format B, or the 32 bit immediate value of the "32-bit immediate" field (bits 31–0) in data unit format C. The source "dstc" is a companion data register 200 to the destination of the arithmetic logic unit 230 result. This companion data register 200 has a register designation with the upper four bits equal to "0110", thereby specifying one of data registers 200, and a lower three bits specified by the "dst" field (bits 50–48). Companion registers are used with transfer formats 6 and 10 which use an "Adstbnk" field (bits 21–18) to specify the register bank of the destination and an "As1bank" (bits 9–6) to specify the register bank of Input B. This is known as a long distance destination, because the destination is not one of data registers 200. Thus one source and the destination may have different register banks with the same register numbers. Table 40 shows the companion registers to various other digital image/graphics processor registers based upon the register bank specified in the "Adstbnk" field. Note that with any other transfer formats this source register is the data register 200 having the register number specified by the "dst" field.

TABLE 40

Companion Data Registers

| Adstbnk | | | | D0 | D1 | D2 | D3 | D4 | D5 | D6 | D7 |
|---|---|---|---|---|---|---|---|---|---|---|---|
| 0 | 0 | 0 | 0 | A0 | A1 | A2 | A3 | A4 | — | A6 | A7 |
| 0 | 0 | 0 | 1 | A8 | A9 | A10 | A11 | A12 | — | A14 | A15 |
| 0 | 0 | 1 | 0 | X0 | X1 | X2 | — | — | — | — | — |
| 0 | 0 | 1 | 1 | X8 | X9 | X10 | — | — | — | — | — |
| 0 | 1 | 0 | 0 | D0 | D1 | D2 | D3 | D4 | D5 | D6 | D7 |
| 0 | 1 | 0 | 1 | — | SR | MF | — | — | — | — | — |
| 0 | 1 | 1 | 1 | CALL | BR | IPS | IPRS | INTEN | INTFLG | COMM | LCTL |
| 1 | 1 | 0 | 0 | LD0 | LC1 | LC2 | — | LR0 | LR1 | LR2 | — |
| 1 | 1 | 0 | 1 | LRSE0 | LRSE1 | LRSE2 | — | LRS0 | LRS1 | LRS2 | — |
| 1 | 1 | 1 | 0 | LSD | LS1 | LS2 | — | LE0 | LE1 | LE2 | — |
| 1 | 1 | 1 | 1 | — | — | — | — | TAG0 | TAG1 | TAG2 | TAG3 |

In Table 40 "--" indicates a reserved register. Note that Table 40 does not list register banks "0110", "1000", "1001", "1010" or "1011". All the registers in these banks are either reserved or assigned to emulation functions and would not ordinarily be used as long distance destinations.

In Table 39 "Input B" is the source for barrel rotator 235 which supplies input B bus 242. The "Input B" source designated "src1" is the data register 200 indicated by the "src1" field (bits 47–45) in data unit formats A and B, or by the register bank of the "s1bank" field (bits 38–36) and the register number of the "src1" field (bits 48–45), which may be any of the 64 lower addressable registers within data unit 110 listed in Table 37, in data format C. The "Hex 1" source for "Input B" is the 32 bit constant equal to "1" from buffer 236. In Table 39 "Input C" is the source selected by Cmux 233 for input C bus 243.

The "Input C" source "@MF" is one or more bits from multiple flags register 211 as expanded by expand circuit 238 in accordance with the "Msize" field (bits 5–3) of status register 210. See Table 2 for the definition of the "Msize" field of status register 210. The "src2/im" source has been previously described in conjunction with the "Input A" source. The "mask" source is the output of mask generator 239. In Table 39 "maskgen" is the source selected by Mmux 234 for mask generator 239. This source may be "src2/im" as previously described or "D0(4–0)", which is the default barrel rotate amount of the "DBR" field (bits 4–0) of data register D0. In Table 39 "rotate" is the source selected by Smux 231 for control of the rotate amount of barrel rotator 235. This source may be "0", which provides no rotate, "D0(4–0)", which is the default barrel rotate amount of the "DBR" field (bits 4–0) of data register D0, or "src2/im" as previously described.

The "ari" bit (bit 59) designates whether arithmetic logic unit 230 of data unit 110 is used for an arithmetic operation or for a Boolean logic operation. If the "ari" bit is "1" then an arithmetic operation occurs, if "0" then a Boolean logic operation occurs.

Data unit format A permits instruction word specification of the operation of arithmetic logic unit 230. The "8-bit ALU code" field (bits 58–51) designates the operation performed by arithmetic logic unit 230. This field designates an arithmetic operation if the "ari" bit is "1". If this is the case then "8-bit ALU code" bits 57, 55, 53 and 51 designate the arithmetic operation according to Table 21 as modified by the "FMOD" field consisting of "8-bit ALU code" bits 58, 56, 54 and 52 according to Table 6. If the "ari" bit is "0", then this is a Boolean operation and the "8-bit ALU code" field translates into function signals F7–F0 according to Table 20. The details of these encodings were described above in conjunction with the description of data unit 110.

Data unit format A designates two sources and a destination for arithmetic logic unit 230. The "dst" field (bits 50–48) designates a register as the destination for arithmetic logic unit 230. The "dst" field may refer to one of data registers 200 by register number or the register number of the "dst" field may be used in conjunction with a register bank to specify a long distance register depending on the transfer format. The "src1" field (bits 47–45) designate a register as the first source for arithmetic logic unit 230. This may be one of data registers 200 or may be used in conjunction with a register bank to specify a long distance register depending on the transfer format. The "immed" field (bits 43–39) designates a 5 bit immediate value used as the second source for arithmetic logic unit 230. In use this 5 bit immediate value is zero extended to 32 bits. The use of register banks will be further discussed below in conjunction with description of the transfer formats.

The storing of the resultant in the destination register occurs only if the condition noted in the "cord." field is true. The "cond." field (bits 35–32) designates the conditions for a conditional operation. Note that this "cond." field falls within the portion of the instruction word generally used for the transfer format. Transfer formats 7, 8, 9 and 10 include this field. Thus conditional storing of the resultant of arithmetic logic unit 230 occurs only when these transfer formats are used. In the preferred embodiment the "cond." field is decoded as shown below in Table 41.

TABLE 41

| Condition field bits | | | | | | |
|---|---|---|---|---|---|---|
| 35 | 34 | 33 | 32 | Mnemonic | Condition Description | Status bits Compared |
| 0 | 0 | 0 | 0 | u | unconditional | — |
| 0 | 0 | 0 | 1 | p | positive | ~N&~Z |
| 0 | 0 | 1 | 0 | ls | lower than or same | ~C\|Z |
| 0 | 0 | 1 | 1 | hi | higher than | C&~Z |
| 0 | 1 | 0 | 0 | lt | less than | (N&~V) \| (~N&V) |
| 0 | 1 | 0 | 1 | le | less than or equal to | (N&~V) \| (~N&V) \| Z |
| 0 | 1 | 1 | 0 | ge | greater than or equal to | (N&V) \| (~N&~V) |
| 0 | 1 | 1 | 1 | gt | greater than | (N&V&~Z) \| (~N&~V&~Z) |
| 1 | 0 | 0 | 0 | hs, c | lower than, carry | C |
| 1 | 0 | 0 | 1 | lo, nc | higher than or same, no carry | ~C |

TABLE 41-continued

| Condition field bits | | | | Mnemonic | Condition Description | Status bits Compared |
|---|---|---|---|---|---|---|
| 3 5 | 3 4 | 3 3 | 3 2 | | | |
| 1 | 0 | 1 | 0 | eq, z | equal, zero | Z |
| 1 | 0 | 1 | 1 | ne, nz | not equal, not zero | ~Z |
| 1 | 1 | 0 | 0 | v | overflow | V |
| 1 | 1 | 0 | 1 | nv | no overflow | ~V |
| 1 | 1 | 1 | 0 | n | negative | N |
| 1 | 1 | 1 | 1 | nn | non-negative | ~N |

The conditions are detected with reference to status register 210. As previously described, status register 210 stores several bits related to the condition of the output of arithmetic logic unit 230. These conditions include negative, carry, overflow and zero. The conditional operation of arithmetic logic unit 230 related to status register 210 was detailed above in conjunction with the description of data unit 110.

The data unit format B is recognized by bit 63="1", bit 44="0". Data unit format B specifies a basic arithmetic logic unit operation with a register specified for the second source of arithmetic logic unit 230. The "class" field designates the data routing within data unit 110 as previously described in conjunction with Table 39. The "ari" bit designates whether arithmetic logic unit 230 of data unit 110 is used for an arithmetic operation or for a Boolean logic operation. The "8 bit ALU code" field designates the operation performed by arithmetic logic unit 230 in the manner described above. The "src2" field (bits 41–39) designates one of the data registers 200 as the second source for arithmetic logic unit 230. In data unit format B the second source for arithmetic logic unit 230 is the data register designated in the "src2" field. Some data transfer formats permit designation of banks of registers for the first source and the destination of arithmetic logic unit 230. In other respects data unit format B is the same as data unit format A.

The data unit format C is recognized by bit 63="1", bit 44="1" and bit 43="1". Data unit format C specifies a basic arithmetic logic unit operation with a 32 bit immediate field. The "class" field designates the data routing within data unit 110 as previously described in conjunction with Table 39. The "ari" bit designates whether arithmetic logic unit 230 of data unit 110 is used for an arithmetic operation or for a Boolean logic operation. The "8 bit ALU code" field designates the operation performed by arithmetic logic unit 230 as described above. The first source is the data register designated by the "src1" field. The second source is the 32 bit immediate value of the "32-bit imm." field (bits 31–0). This data unit format leaves no room to specify parallel data transfers, so none are permitted. The "dstbank" field (bits 42–39) designates a bank of registers within data unit 110. The "dstbank" field is employed with the "dst" field (bits 50–48) to designate any of 64 registers of data unit 110 listed in Tables 37 and 38 as the destination for arithmetic logic unit 230. The "s1bnk" field (bits 38–36) designates a bank of registers within data unit 110. This designation is limited to a lower half of the registers of data unit 110 and is employed with the "src1" field to designate any of 64 lower half registers in data unit 110 listed in Table 37 as the first source for arithmetic logic unit 230. Operations can be made conditional based upon the "cond." field (bits 35–32) in a manner detailed below.

Data unit format D has bit 63="1", bit 44="0", the "class" field is "000", bit 59="1" (which normally selects arithmetic as opposed to Boolean logic operation) and bits 57, 55, 53 and 51 of the "8 bit ALU code" are all "0". Data unit format D specifies non-arithmetic logic unit operations. The "operation" field (bits 43–39) designates a non-arithmetic logic unit operation. In the preferred embodiment this "operation" field is decoded as shown below in Table 42.

TABLE 42

| Operation field | | | | | Non-ALU Operation |
|---|---|---|---|---|---|
| 4 3 | 4 2 | 4 1 | 4 0 | 3 9 | |
| 0 | 0 | 0 | 0 | 0 | no operation |
| 0 | 0 | 0 | 0 | 1 | idle |
| 0 | 0 | 0 | 1 | 0 | enable global interrupts |
| 0 | 0 | 0 | 1 | 1 | disable global interrupts |
| 0 | 0 | 1 | 0 | 0 | lock synchronization of instruction fetching |
| 0 | 0 | 1 | 0 | 1 | unlock synchronization of instruction fetching |
| 0 | 0 | 1 | 1 | 0 | reserved |
| 0 | 0 | 1 | 1 | 1 | rotate D registers right 1 |
| 0 | 1 | 0 | 0 | 0 | null |
| 0 | 1 | 0 | 0 | 1 | halt instruction execution |
| 0 | 1 | 0 | 1 | 0 | reserved |
| 0 | 1 | 0 | 1 | 1 | reserved |
| 0 | 1 | 1 | 0 | 0 | go to emulator interrupt |
| 0 | 1 | 1 | 0 | 1 | issue emulator interrupt 1 |
| 0 | 1 | 1 | 1 | 0 | issue emulator interrupt 2 |
| 0 | 1 | 1 | 1 | 1 | reserved |
| 1 | X | X | X | X | reserved |

The non-arithmetic logic unit instructions null, halt instruction execution, go to emulator interrupt, issue emulator interrupt 1 and issue emulator interrupt 2 prohibit parallel data transfers. Any parallel data transfers specified in the instruction word are ignored. The other non-arithmetic logic unit instructions permit parallel data transfers.

Data unit format E is recognized by bits 63–61 being "011". Data unit format E specifies parallel arithmetic logic unit and multiply operations. These operations are referred to as "six operand operations" because of the six operands specified in this format. In the preferred embodiment the "operation" field (bits 60–57) specifies the operations shown below in Table 43. The symbol "||" indicates that the listed operations occur in parallel within data unit 110. Note that only 11 of the 16 possible operations are defined.

TABLE 43

| Operation field bits | | | | Six Operand Operations | |
|---|---|---|---|---|---|
| 6 0 | 5 9 | 5 8 | 5 7 | | |
| 0 | 0 | 0 | 0 | MPYS | || ADD |
| 0 | 0 | 0 | 1 | MPYS | || SUB |
| 0 | 0 | 1 | 0 | MPYS | || EALUT |
| 0 | 0 | 1 | 1 | MPYS | || EALUF |
| 0 | 1 | 0 | 0 | MPYU | || ADD |
| 0 | 1 | 0 | 1 | MPYU | || SUB |
| 0 | 1 | 1 | 0 | MPYU | || EALUT |
| 0 | 1 | 1 | 1 | MPYU | || EALUF |
| 1 | 0 | 0 | 0 | EALU | || ROTATE |
| 1 | 0 | 0 | 1 | EALU % | || ROTATE |
| 1 | 0 | 1 | 0 | DIVI | |
| 1 | 0 | 1 | 1 | reserved | |
| 1 | 1 | 0 | 0 | reserved | |
| 1 | 1 | 0 | 1 | reserved | |
| 1 | 1 | 1 | 0 | reserved | |
| 1 | 1 | 1 | 1 | reserved | |

The mnemonics for these operations were defined above. To review: MPYS||ADD designates a parallel signed multiply and add; MPYS‖SUB designates a parallel signed multiply and subtract; MPYS‖EALUT designates a parallel signed multiply and extended arithmetic logic unit true operation; MPYS‖EALUF designates a parallel signed multiply and extended arithmetic logic unit false operation; MPYU‖ADD designates a parallel unsigned multiply and add; MPYU‖SUB designates a parallel unsigned multiply and subtract; MPYU‖EALUT designates a parallel unsigned multiply and extended arithmetic logic unit true operation; MPYU‖EALUF designates a parallel unsigned multiply and extended arithmetic logic unit false operation; EALU‖ROTATE designates an extended arithmetic logic unit operation with the output of barrel rotator 235 separately stored; EALU%‖ROTATE designates an extended arithmetic logic unit operation employing a mask generated by mask generator 239 with the output of barrel rotator 235 separately stored; and DIVI designates a divide iteration operation used in division. The arithmetic logic unit operation in an MPYx‖EALUT instruction is selected by the "EALU" field (bits 19–26) of data register D0, with the "A" bit (bit 27) selecting either an arithmetic operation or a logic operation as modified by the "FMOD" field (bits 31–28). The coding of these fields has been described above. The arithmetic logic unit operation in an MPYx‖EALUF instruction is similarly selected except that the sense of the "EALU" field bits is inverted. The arithmetic logic unit operations for the EALU and EALU% instructions are similarly selected. These operations employ part of the data register D0 of data unit 110 to specify the arithmetic logic unit operation. Data register D0 is pre-loaded with the desired extended arithmetic logic unit operation code. The DIVI operation will be further detailed below. Any data transfer format may be specified in parallel with the operation of data unit 110.

Six operands are specified in data unit format E. There are four sources and two destinations. The "src3" field (bits 56–54) designates one of the data registers 200 as the third source. This is the first input for multiplier 220 if a multiply operation is specified, otherwise this is the barrel rotate amount of barrel rotator 235. The "dst2" field (bits 53–51) designates one of the data registers 200 as the second destination. If the instruction specifies a multiply operation, then "dst2" is the destination for multiplier 220. Otherwise "dst2" specifies the destination for the output of barrel rotator 235. The "dst1" field (bits 50–48) designates one of the data registers 200 as the destination for arithmetic logic unit 230. The "src1" field (bits 47–45) designates a register as the first input for arithmetic logic unit 230. If this instruction includes a transfer format 6 or 10, which include an "As1bank" field (bits 9–6), then this register source may be any register within data unit 110 with the "As1bank" field designating the register bank and the "src1" field designating the register number. In such a case this data cannot be rotated by barrel rotator 235. This is called a long distance arithmetic logic unit operation. For other transfer formats, the "src1" field specifies one of the data registers 200 by register number. Transfer formats 7, 8, 9 and 10 permit the register source to be conditionally selected from a pair of data registers 200 based on the "N" bit of status register 210. If the "N" bit (bit 31) of status register 211 is "1" then the designated data register is selected as the first source for arithmetic logic unit 230. If the "N" bit is "0" then the data register one less is selected. If this option is used, then the register number of the "src1" field must be odd. The "src2" field (bits 44–42) designates one of the data registers 200 as the second input for multiplier 220. The "src2" field (bits 41–39) designates one of the data registers 200 as the second input for multiplier 220.

Table 44 shows the data path connections for some of the operations supported in data unit format E. Input C is the signal supplied to input C bus 243 selected by multiplexer Cmux 233. Maskgen is the signal supplied to mask generator 239 selected by multiplexer Mmux 234. Rotate is signal supplied to the control input of barrel rotator 235 selected by multiplexer Smux 231. Product left shift is the signal supplied to the control input of product left shifter 224 supplied to the control input of product left shifter 224 selected by multiply shift multiplexer MSmux 225. Note that the special case of the DIVI operation will be described later.

TABLE 44

| Six Operand Operation | | Input C | maskgen | rotate | product left shift |
|---|---|---|---|---|---|
| MPYS | ‖ ADD | — | — | 0 | 0 |
| MPYS | ‖ SUB | — | — | 0 | 0 |
| MPYS | ‖ EALUT | mask | D0(4–0) | D0(4–0) | D0(9–8) |
| MPYS | ‖ EALUF | mask | D0(4–0) | D0(4–0) | D0(9–8) |
| MPYU | ‖ ADD | — | — | 0 | 0 |
| MPYU | ‖ SUB | — | — | 0 | 0 |
| MPYU | ‖ EALUT | mask | D0(4–0) | D0(4–0) | D0(9–8) |
| MPYU | ‖ EALUF | mask | D0(4–0) | D0(4–0) | D0(9–8) |
| EALU | | src4 | — | src3 | — |
| EALU % | | mask | src4 | src1 | — |

For all the six operand instructions listed in Table 44, the first input to multiplier 220 on bus 201 is the register designated by the "src3" field (bits 56–54), the second input to multiplier 220 on bus 202 is the register designated by the "src4" field (bits 44–42), the input to barrel rotator 235 is the register designated by the "src1" field (bits 41–39) and the input to input A bus 241 is the register designated by the "src2" field (bits 47–45). Also note that multiplier 220 is not used in the EALU and EALU% instructions, instead the results of barrel rotator 235 are saved in the register designated by the "dst2" field (bits 53–51) via multiplexer Bmux 227.

The DIVI operation uses arithmetic logic unit 230 and does not use multiplier 220. The DIVI operation may be used in an inner loop for unsigned division. Signed division may be performed using instructions to handle the sign of the quotient. It is well known in the art that division is the most difficult of the four basic arithmetic operations (addition, subtraction, multiplication and division) to implement in computers.

Figure 44:
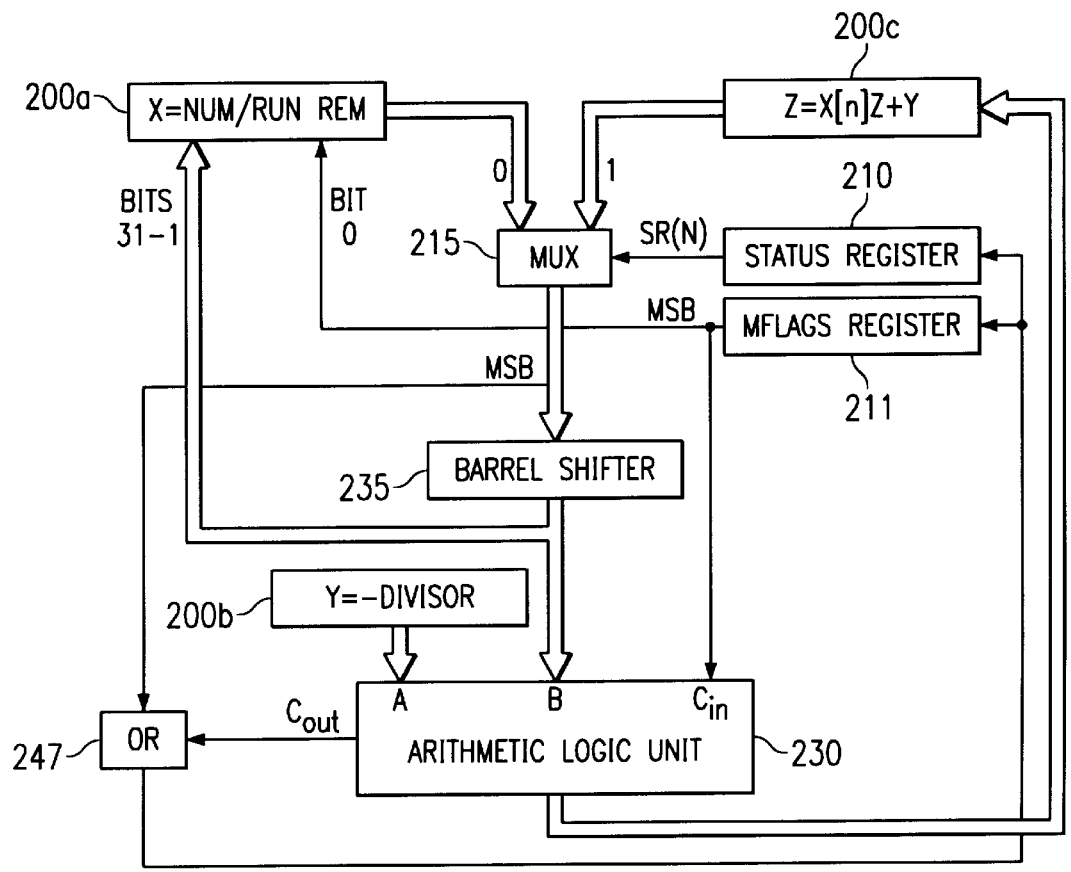
FIG. 44 illustrates in schematic form data flow within the data unit during execution of a divide iteration instruction.

The DIVI instruction employs the hardware of data unit 110 to compute one digit of the desired quotient per execute pipeline stage, once properly set up. Note that the DIVI data unit instruction can only be used with a data transfer format that supports conditional data transfers (and consequently conditional data unit operations). These data transfer formats 7, 8, 9 and 10 will be fully described below. FIG. 44 illustrates in schematic form the data flow within data unit 110 during the DIVI instruction. Refer to FIG. 5 for details of the construction of data unit 110. Multiplexer Amux 232 selects data from data register 200b designated by the "src2" field on arithmetic logic unit first input bus 205 for supply to arithmetic logic unit 230 via input A bus 241. Multiplexer Imux 222 selects the constant Hex "1" for supply to multiplier second input bus 202 and multiplexer Smux 231 selects this Hex "1" on multiplier second input bus 202 for supply to rotate bus 244. Data from one of the data registers 200 designated by the "src1" field supplies barrel rotator 235. This register can only be data register D7, D5, D3 or D1 and is a conditional register source selected by multiplexer 215 based upon the "N" bit (bit 31) of status register 210. If the "N" bit of status register 210 is "0", then data register 200a designated by the "src1" field is selected. This register selection preferably uses the same hardware used to provide conditional register selection in other instructions employing arithmetic logic unit 230, except with the opposite sense. This register selection may be achieved via a multiplexer, such as multiplexer 215 illustrated in FIG. 44, or by substituting the inverse of the "N" bit of status register 210 for the least significant bit of the register field during specification of the register. If the "N" bit of status register 210 is "1", then data register 200c, which is one less than the register designated by the "src1" field, is selected. Barrel rotator 235 left rotates this data by one bit and supplies the resultant to arithmetic logic unit 230 via input B bus 241. The output of barrel rotator 235 is also saved to data register 200a via multiplexer Bmux 227, with bit 31 of multiple flags register 211 (before rotating) substituted for bit 0 of the output of barrel rotator 235. This destination register is the register designated by the "src1" field. Multiplexer Mmux 234 selects the constant Hex "1" on multiplier second input bus 202 for supply to mask generator 239. Multiplexer Cmux 233 selects the output from mask generator 239 for supply to arithmetic logic unit 230 via input C bus 243. Bit 0 carry-in generator 246 supplies bit 31 of multiple flags register 211 (before rotating) to the carry-in input of arithmetic logic unit 230.

During the DIVI instruction arithmetic logic unit 230 receives a function code F7–F0 of Hex "A6". This causes arithmetic logic unit 230 to add the inputs upon input A bus 241 and input B bus 242 and left shift the result with zero extend. This left shift is by one bit due to the mask supplied by mask generator 239 in response to the Hex "1" input. This function is mnemonically A+B<0<. The resultant of arithmetic logic unit 230 is stored in data register 200c designated by the "dst1" field. Multiple flags register 211 is rotated by one bit, and the least significant bit (bit 0) of multiple flags register 211 is set according to the resultant produced by arithmetic logic unit 230. This same bit is stored in the "N" bit (bit 31) of status register 210. OR gate 247 forms this bit stored in multiple flags register 211 and status register 210 from $c_{out}$ of arithmetic logic unit 230 ORed with bit 31 of the input to barrel rotator 235. Note that other status register 210 bits "C", "V" and "Z" are set normally. If the data in data register 200a is X, the data in data register 200b is Y and the data in data register 200c is Z, then the DIVI instruction forms X=X<<1 and Z=X[n]Z+Y. The "n" mnemonic indicates register source selection based upon the "N" status register bit.

The DIVI instruction operates to perform iterations of a conditional subtract and shift division algorithm. This instruction can be used for a 32 bit numerator divided by a 16 bit divisor to produce a 16 bit quotient and a 16 bit remainder or a 64 bit numerator divided by a 32 bit divisor to produce a 32 bit quotient and a 32 bit remainder. In the 64 bit numerator case the 32 most significant bits of the numerator are stored initially in data register 200a and the 32 least significant bits are initially stored in multiple flags register 211. Data register 200b stores the inverse of the divisor. For the first iteration of a division operation either the DIVI instruction is executed unconditionally or the "N" bit of status register 210 is set to "0". The rotated number from barrel rotator 235 is stored in data register 200a. Barrel rotator 235 and the rotation of multiple flags register 211 effectively shift the 64 bit numerator one place. Note that the most significant bit of multiple flags register 211 is the next most significant bit of the 64 bit numerator and is properly supplied to the carry-in input of arithmetic logic unit 230. The quantity stored in data register 200a is termed the numerator/running remainder. The result of the trial subtraction is stored in data register 200c.

There are two cases for the result of the trial subtraction. If either the most significant bit of the initial numerator was "1" or if the addition of the negative divisor generates a carry, then the corresponding quotient bit is "1". This is stored in the first bit of multiple flags register 211 and in the "N" bit of status register 210. For the next trial subtraction, multiplexer 215 selects data register 200c for the B input for the next iteration by virtue of the "1" in the "N" bit of status register 210. Thus the next trial subtraction is taken from the prior result. If OR gate 247 generates a "0", then the corresponding quotient bit is "0". Thus the next trial subtraction is taken from the prior numerator/running remainder stored in data register 200a shifted left one place. This iteration continues for 32 cycles of DIVI, forming one bit of the quotient during each cycle. The 32 bit quotient is then fully formed in multiple flags register 211. The 32 bit remainder is found in either data register 200a or data register 200c depending upon the state of the "N" bit of status register 210.

The process for a 32 bit by 16 bit division is similar. The negated divisor is left shifted 16 places before storing in data register 200b. The entire numerator is stored in data register 200a. The DIVI instruction is repeated only 16 times, whereupon the quotient is formed in the 16 least significant bits of multiple flags register 211 and the remainder in the 16 most significant bits of either data register 200a or data register 200c depending on the state of the "N" bit of status register 210.

This technique employs hardware already available in data unit 100 to reduce the overhead of many microprocessor operations. The DIVI instruction essentially forms one bit of an unsigned division. Additional software can be employed to support signed division. Four divide subroutines may be written for the cases of unsigned half word (32 bit/16 bit) divide, unsigned word (64 bit/32 bit) divide, signed half word (32 bit/16 bit) divide, and signed word (64 bit/32 bit) divide. Each of the four subroutines includes three phases: divide preparation; divide iteration in a single instruction loop; and divide wrap-up. It is preferable to employ zero overhead looping and single 64 bit DIVI instruction within the loop kernel.

The first part of each division subroutine is divide preparation. This first includes testing for a divisor of zero. If the divisor is "0", then the division subroutine is aborted and an error condition is noted. Next the sign bits are determined for the numerator and divisor. In the signed division subroutines the sign of the quotient is set as an OR of the sign bits of the numerator and divisor. Then in signed division, if either the numerator or divisor is negative they are negated to obtain a positive number. The numerator is spit between a selected odd data register and the multiple flags register 211. For a word division, the upper 32 bits of the numerator are stored in the selected data register and the lower 32 bits of the numerator are stored in multiple flags register 211. For a half word division all 32 bits of the numerator are stored in the selected data register. For the half word division, the unused lower bits of multiple flags register 211 are zero filled. For half word division the divisor is stored in the upper 16 bits of a data register with the lower bits being zero filled. The divisor should be negated so that arithmetic logic unit 230 can form subtraction by addition. The subroutines may compare the absolute values of the most significant bits of the numerator and denominator to determine if the quotient will overflow.

The heart of each divide subroutine is a loop including a single DIVI instruction. It is very advantageous to write to one of the register addresses LSRE2–LSRE0 to initialize a zero overhead one instruction loop. Sixteen iterations are needed for half word quotients and 32 for word quotients. Since the loop logic 720 decrements to zero, the loop counter should be loaded with one less than the desired number of iterations. It is also possible to place up to two iterations of the DIVI instruction in the delay slots following loop logic initialization. The single instruction within this loop is the DIVI instruction, which has been fully described above.

Each division subroutine is completed with divide wrap-up. Divide wrap-up includes the following steps. The quotient is moved from multiple flags register 211 to a data register. If the sign of the quotient is negative, then "1" is added to the quotient in the data register to convert from "1's" complement representation to twos complement representation. If the remainder is needed it is selected based upon the "N" bit of status register 210.

A further refinement increases the power of the DIVI instruction in each of the divide subroutines when the numerator/running remainder has one or more strings of consecutive "0's". Before beginning the inner loop, the divisor is tested for leading "0's" via LMO/FMO/LMBC/RMBC circuit 237. The input on bus 206 is directed through LMO/RMO/LMBC/RMBC circuit 237 using the "FMOD" field of data register D0 or bits 52, 54, 56 and 56 of the "8-bit ALU code" of an arithmetic instruction word. The data register holding the divisor and the data register holding the high order bits of the numerator/running remainder is left shifted by a number of places equal to this number of leading "0's". In the same fashion, the data in multiple flags register 211 is left shifted, with zeros inserted into lower order bits corresponding to the zeros in the quotient bits. The inner loop includes additional operations in this refinement. One additional operation searches for strings of consecutive "0's" in the numerator/running remainder. The quotient bit for each place where the numerator/running remainder is "0" is also "0". Thus if such strings of consecutive "0's" can be detected, then the DIVI instruction for those places can be eliminated. This additional operation employs a conditional source register in the same manner as the DIVI instruction. The input on bus 206 is directed through LMO/RMO/LMBC/RMBC circuit 237 using the "FMOD" field. Arithmetic logic unit 230 generates a resultant equal to the data on input C bus 243, which is the number of "0's" in leading bits of the numerator/running remainder. This result is stored in one of data registers 200 D7–D0 not otherwise used by the subroutine. The loop count stored in the loop count register LC2–LC0 used for the divide iteration loop is decremented by this number of consecutive "0's". The following DIVI employs this count as the shift amount via multiplier second input bus 202. Multiple flags register 211 is slightly modified to also rotate by this amount and transfer the rotated out most significant bits into the least significant bits of data register 200a. The least significant bits of multiple flags register 211 are zero filled during this rotate. Using this instruction skips over consecutive "0's" in the numerator/running remainder, placing "0's" in the corresponding quotient bits and rotating past the consecutive "0's". In instances where the numerator/running remainder has strings of consecutive "0's", this two instruction loop produces the quotient faster than the single instruction loop.

Figure 45:
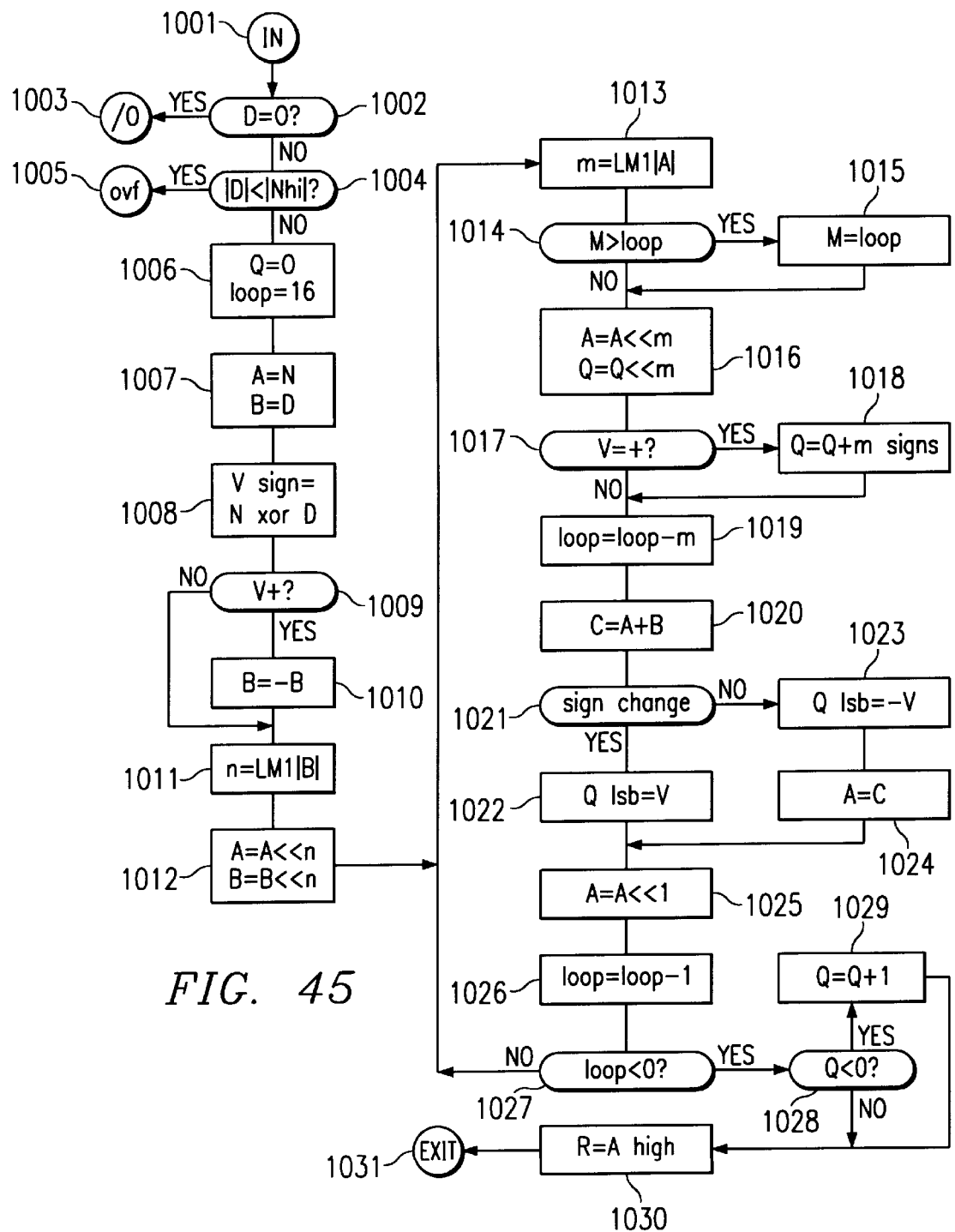
FIG. 45 illustrates in flow chart form the use of a left most one's function in a division algorithm.

This is illustrated in flow chart form in FIG. 45. The divide algorithm is begun at In block 1001. First, decision block 1002 tests for a divisor of 0 and if true the algorithm is exited at divide by zero (/0) exit block 1003. Next decision block 1004 compares the absolute value of the divisor to the high order bits of the numerator. If the absolute value of the divisor is less than the high order bits of the numerator, then the algorithm is exited at overflow exit block 1005.

Block 1006 sets the quotient stored in multiple flags register 211 to zero and sets the loop count to 16. Note that this example is of a 32 bit by 16 bit divide. The loop count would be set to 32 for a 64 bit by 32 bit divide. Block 1007 sets two registers by loading the numerator into register A and the divisor into register B. Block 1008 sets V, the sign of the quotient, equal to the exclusive OR of the sign of the numerator and the denominator. Decision block 1009 tests to determine if the sign of the quotient is positive. If so, then block 1010 negates the data in register B, which is the divisor. If not, then register B is not changed. Block 1011 sets n equal to the left most one place of the absolute value of the data in register B. This tests for leading zeros in the division. Block 1012 left shifts the data in register A, the numerator/running remainder, and the data in register B, the divisor, n places.

The division loop begins with block 1013. Block 1013 sets m equal to the left most one place of the data in register A. Decision block 1014 compares m to the loop count. If m is greater than the loop count, then block 1015 sets m equal to the loop count. Block 1016 left shifts the numerator/running remainder and the quotient m places. Decision block 1017 tests to determine if the previously computed sign of the quotient is positive. If V is positive, then block 1018 sets the quotient Q equal to Q plus number including a string of m number of sign bits, filling the places vacated in block 1016. Block 1019 decrements the loop count by the left most one place amount m.

Block 1020 performs the trial subtraction of the data in register A, the numerator/running remainder, and the divisor in register B. Note that blocks 1009 and 1010 insure that the data in register B is negative. Decision block 1021 determines if the trial subtraction changes sign, If there is a sign change, then block 1022 sets the least significant bit of the quotient equal to the sign V. If there is no sign change, then block 1023 sets the least significant bit of the quotient equal to the inverse of the sign V and block 1024 sets A equal to the sum C. In either case, block 1025 left shifts register A one place. Note that as described above, the single DIVI instruction performs the actions of blocks 1020 through 1025.

Blocks 1026 and 1027 handle the loop. Block 1026 decrements the loop count. Block 1027 determines if the loop count is less than zero. If not, then algorithm control returns to block 1013 to repeat the loop. If the loop count is less than zero, then the loop is complete. Preferably the zero-overhead loop logic handles the operations of blocks 1026 and 1027.

Upon exiting the loop, some clean up steps are needed. Decision block 1028 determines if the quotient is less than zero. If so, then block 1029 adds one to the quotient. This provides the proper conversion from one's complement to two's complement. Block 1030 sets the remainder equal to the high order bits stored in the A register. The algorithm is exited via exit block 1031.

Note the DIVI instruction advantageously performs several crucial functions in the inner loop. Thus the DIVI instruction is highly useful in this algorithm. Note also, in the absence of such a DIVI instruction, digital image/graphics processor 71 may still perform this algorithm using a determination of the left most ones in accordance with the program illustrated in FIG. 45.

Figure 46:
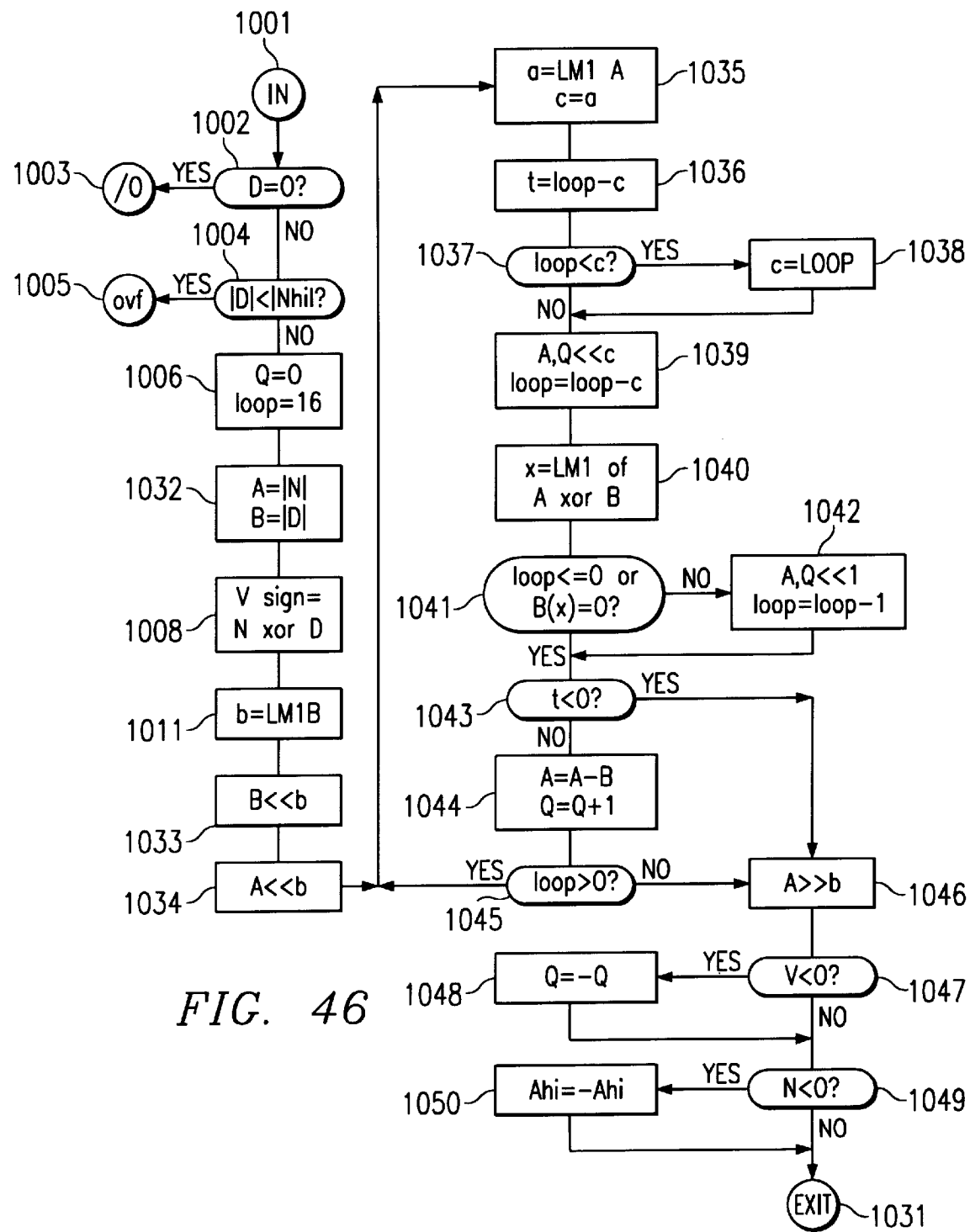
FIG. 46 illustrates in flow chart form the use of a left most one's function and an exclusive OR in a division algorithm.

FIG. 46 illustrates an alternative embodiment of the division algorithm that additionally uses a left most ones determination of the exclusive OR of the data in registers A and B. The initial steps divide by 0 and overflow steps illustrated in FIG. 46 are identical to those illustrated in FIG. 45. Block 1032 sets register A equal to the absolute value of the numerator and register B equal to the absolute value of the divisor. Block 1008 sets the sign V of the quotient as before.

Block 1011 determines the left most one place b of the absolute value of the divisor. Block 1033 left shifts the data in register B the number of places of the left most one. Block 1034 left shifts register A by b, the number of places of the left shift of register B.

Block 1035 begins the loop. Block 1035 determines the left most one place of the data in register A and sets c equal to 29 minus the left most one place a. Block 1036 sets t equal to the loop count minus c. Decision block 1037 determines if the loop count is less than c. If so, then block 1038 sets c equal to the loop count. Block 1039 left shifts both the data in register A and the quotient c places. Block 1039 also decrements the loop count by c. This step skips over trial subtraction for zeros in the numerator/running remainder.

Block 1040 determines the left most zero place of A^B. Block 1041 determines if the loop count is less than or equal to zero or if x, the left most zero place of A^B, is zero. If not, then both the data in register A and the quotient are left shifted one place and the loop count is decremented by 1.

Block 1043 determines if t, the difference of the loop count and c computed in block 1036, is less than zero. If so, then the loop is exited. If not, then block 1044 computes the trial subtraction A−B and increments the quotient by 1. Block 1045 determines if the loop count is greater than zero. If so, then the algorithm repeats the loop starting at block 1035. If not, or if t was less than zero, then the data in register A, now forming the remainder, is right shifted by b places.

The remaining steps involve clean up. Decision block 1047 determines if the sign of the quotient is less than zero. If so, then the quotient is replaced by its inverse. In either event, decisions block 1049 determines if the numerator/running remainder N is less than zero. If so, then the remainder stored in as the higher order bits in register A is replaces by its inverse. The algorithm is exited via exit block 1031.

A description of the data transfer formats and an explanation or glossary of various bits and fields of the parallel data transfer formats of instruction words of FIG. 43 follows. As previously described above in conjunction with the glossary of bits and fields of the data unit formats these bits and fields define not only the instruction word but also the circuitry that enable execution of the instruction word.

Transfer format 1 is recognized by bits 38–37 not being "00", bits 30–28 not being "000" and bits 16–15 not being "00". Transfer format 1 is called the double parallel data transfer format. Transfer format 1 permits two independent accesses of memory 20, a global access and a local access limited to the memory sections corresponding to the digital image/graphics processor. The "Lmode" field (bits 38–35) refers to a local transfer mode, which specifies how the local address unit of address unit 120 operates. This field is preferably decoded as shown in Table 45.

TABLE 45

| Lmode field | | | | Expression Syntax | Operation Description |
|---|---|---|---|---|---|
| 38 | 37 | 36 | 35 | | |
| 0 | 0 | X | X | | no operation |
| 0 | 1 | 0 | 0 | *(An++=Xm) | post-addition of index register with modify |
| 0 | 1 | 0 | 1 | *(An−−=Xm) | post-subtraction of index register with modify |
| 0 | 1 | 1 | 0 | *(An++=Imm) | post-addition of offset with modify |
| 0 | 1 | 1 | 1 | *(An−−=Imm) | post-subtraction of offset with modify |
| 1 | 0 | 0 | 0 | *(An+Xm) | pre-addition of index register |
| 1 | 0 | 0 | 1 | *(An−Xm) | pre-subtraction of index register |
| 1 | 0 | 1 | 0 | *(An+Imm) | pre-addition of offset |
| 1 | 0 | 1 | 1 | *(An−Imm) | pre-subtraction of offset |
| 1 | 1 | 0 | 0 | *(An+=Xm) | pre-addition of index register with modify |
| 1 | 1 | 0 | 1 | *(An−=Xm) | pre-subtraction of index register with modify |
| 1 | 1 | 1 | 0 | *(An+=Imm) | pre-addition of offset with modify |
| 1 | 1 | 1 | 1 | *(An−=Imm) | pre-subtraction of offset with modify |

The "d" field (bits 34–32) designates one of the data registers D0–D7 to be the source or destination of a local bus transfer. The "e" bit (bit 31) if "1" designates sign extend, else if "0" designates zero extend for the local data transfer. This is operative in a memory to register transfer when the local "siz" field (bits 30–29) indicates less than a full 32 bit word size. This "e" bit is ignored if the data size is 32 bits. The combination of "e" (bit 31)="1" and "L" (bit 21)="0", which would otherwise be meaningless, indicates a local address unit arithmetic operation. The local "siz" field (bits 30–29) is preferably coded as shown in Table 46.

TABLE 46

| Size field | | Data word size |
|---|---|---|
| 30 | 29 | |
| 0 | 0 | byte 8 bits |
| 0 | 1 | half word 16 bits |
| 1 | 0 | whole word 32 bits |
| 1 | 1 | reserved |

The "s" bit (bit 28) sets the scaling mode that applies to local address index scaling. If the "s" bit is "1" the index in the address calculation, which may be recalled from an index register or an instruction specified offset, is scaled to the size indicated by the "siz" field. If the "s" bit is "0", then no scaling occurs. As previously described this index scaling takes place in index scaler 614. If the selected data size is 8 bits (byte), then no scaling takes place regardless of the status of the "s" bit. In this case only, the "s" bit may be used as an additional offset bit. If the "Lmode" field designates an offset then this "s" bit becomes the most significant bit of the offset and converts the 3 bit offset index of the "Lim/x" field to 4 bits. The "La" field (bits 27–25) designates an address register within local address unit 620 of address unit 120 for a local data transfer. The "L" bit (bit 21) indicates the local data transfer is a load transferring data form memory to register (L="1") or a store transferring data from register to memory (L="0") transfer. The "Lim/x" field (bits 2–0) specifies either the register number of an index register or a 3 bit offset depending on the coding of the "Lmode" field.

The global data transfer operation is coded in a fashion similar to the coding of the local data transfer. The "L" bit (bit 17) is a global load/store select. This bit determines whether the global data transfer is a memory to register ("L"="1") transfer, also known as a load, or a register to memory ("L"="0") transfer, also known as a store. The "Gmode" field (bits 16–13) defines a global transfer mode in the same way the local transfer mode is defined by the "Lmode" field. This field is preferably decoded as shown in Table 47.

TABLE 47

| Gmode field | | | | Expression Syntax | Operation Description |
|---|---|---|---|---|---|
| 1 6 | 1 5 | 1 4 | 1 3 | | |
| 0 | 0 | X | X | | no operation |
| 0 | 1 | 0 | 0 | *(An++=Xm) | post-addition of index register with modify |
| 0 | 1 | 0 | 1 | *(An−−=Xm) | post-subtraction of index register with modify |
| 0 | 1 | 1 | 0 | *(An++=Imm) | post-addition of offset with modify |
| 0 | 1 | 1 | 1 | *(An−−=Imm) | post-subtraction of offset with modify |
| 1 | 0 | 0 | 0 | *(An+Xm) | pre-addition of index register |
| 1 | 0 | 0 | 1 | *(An−Xm) | pre-subtraction of index register |
| 1 | 0 | 1 | 0 | *(An+Imm) | pre-addition of offset |
| 1 | 0 | 1 | 1 | *(An−Imm) | pre-subtraction of offset |
| 1 | 1 | 0 | 0 | *(An+=Xm) | pre-addition of index register with modify |
| 1 | 1 | 0 | 1 | *(An−=Xm) | pre-subtraction of index register with modify |
| 1 | 1 | 1 | 0 | *(An+=Imm) | pre-addition of offset with modify |
| 1 | 1 | 1 | 1 | *(An=−Imm) | pre-subtraction of offset with modify |

The "reg" field (bits 12–10) identifies a register. The "reg" field designates the number of the source register in the case of a store, or the number of the destination register in the case of a load. The "0bank" field (bits 20–18) contains three bits and identifies a bank of registers in the lower 64 registers. These registers have register bank numbers in the form "0XXX". The 3 bit "0bank" filed combines with the 3 bit "reg" field to designate any register in the lower 64 registers as the data source or destination for the global data transfer. The "e" bit (bit 9) if "1" designates sign extend, else if "0" designates zero extend for the global data transfer. This is operative in a memory to register transfer when the global "siz" field (bits 8–7) indicates less than a full 32 bit word size. This "e" bit is ignored if the data size is 32 bits. The combination of "e" (bit 9)="1" and "L" (bit 17)="0" indicates a global address unit arithmetic operation. The global "siz" field (bits 8–7) is preferably coded as shown in Table 48.

TABLE 48

| Size field | | Data word size |
|---|---|---|
| 8 | 7 | |
| 0 | 0 | byte 8 bits |
| 0 | 1 | half word 16 bits |
| 1 | 0 | whole word 32 bits |
| 1 | 1 | reserved |

The "s" bit (bit 6) sets the scaling mode that applies to global address index scaling. If the "s" bit is "1" the index in the address calculation, which may be recalled from an index register or an instruction specified offset, is scaled to the size indicated by the "siz" field. If the "s" bit is "0", then no scaling occurs. No scaling takes place regardless of the status of the "s" bit if the "siz" field designates a data size of 8 bits. If the "Gmode" field designates an offset then this "s" bit becomes the most significant bit of the offset and converts the 3 bit offset index of the "Gim/x" field to 4 bits. The "Ga" field (bits 5–3) designates an address register within global address unit 610 of address unit 120 for a local bus transfer. The "Gim/x" field (bits 24–22) specifies either the register number of an index register or a 3 bit offset depending on the coding of the "Gmode" field. The "Ga" field (bits 5–4) specifies the register number of the address register used in computing the memory address of the global data transfer.

Data transfer format 2 is recognized by bits 38–37 not being "00", bits 30–28 being "000" and bits 16–15 not being "00". Data transfer format 2 is called the XY patch format. Data transfer format 2 permits addressing memory 20 in an XY patch manner multiplexing addresses from both the global and local address units of address unit 120. The "o" bit (bit 34) enables outside XY patch detection. When "o" bit is set to "1", the operations specified by the bits "a" and "n" are performed if the specified address is outside the XY patch. Otherwise, when "o" bit is "0", the operations are performed if address is inside the patch. The "a" bit (bit 33) specifies XY patch memory access mode. When the "a" bit is set to "1", the memory access is performed regardless of whether the address is inside or outside the XY patch. When the "a" bit is set to "0", the memory access is inhibited if the address is outside (if the "o" bit is "1") or inside (if the "o" bit is "0") the patch. The "n" bit (bit 32) specifies XY patch interrupt mode. When the "n" bit is set to "1", an interrupt flag register bit for XY patch is set to "1" if the address is outside (if "o" bit is "1") or inside (if "o" bit is "0") the patch. When "n" bit is set to "0", the XY patch interrupt request flag is not set.

Other fields are defined in the same manner detailed above. The "Lmode" field specifies the local address calculation mode as shown in Table 45. This local address calculation includes a local address register designated by the "La" field and either a 3 bit unsigned offset or a local index register designated by the "Lim/x" field. The "Gmode" field specifies the global address calculation. A global unsigned 3 bit offset or a global index register indicated by the "Gim/X" field is combined with the address register specified by the "Ga" field to form the global address. The 4 bit "bank" field (bits 21–18) identifies a data register bank and is combined with the 3 bit "reg" field identifying a register number to designate any register as the data source or destination for an XY Patch access. The "L" bit is a load/store select. This bit determines whether an XY Patch access is a memory to register ("L"="1") transfer, also know as a load, or register to memory ("L"="0") transfer, also known as a store. The "e" bit if "1" designates sign extend, else if "0" designates zero extend. This is operative in a load operation (memory to register data transfer) when the "siz" field indicates less than a full 32 bit word size. This "e" bit is ignored if the data size is 32 bits. The combination of "e"="1" with "L"="0" indicates a patched address unit arithmetic operation. The "s" bit sets the scaling mode that applies to global address index scaling. If the "s" bit is "1" the data recalled from memory is scaled to the size indicated by the "siz" field. If the "s" bit is "0", then no scaling occurs. If the selected data size is 8 bits (byte), then no scaling takes place regardless of the status of the "s" bit. In this case only, the "s" bit is used as the most significant bit of the offset converting the 3 bit "Gim/x" offset index to 4 bits.

Data transfer format 3 is recognized by bits 38–37 not being "00", bit 24 being "0" and bits 16–13 being "0000". Data transfer format 3 is called the move and local data transfer format. Data transfer format 3 permits a load or store of one of the data registers 200 via the local data port in parallel with a register to register move using global port source data bus Gsrc 105 and global port destination data bus Gdst 107. The local data port operation is defined by the fields "Lmode", "d", "e", "siz", "s", "La", "L" and "Lim/x" in the manner described above. The register to register move is from the register defined by the bank indicated by the "srcbank" field (bits 9–6) and the register number indicated by the "src" field (bits 12–10) to the register defined by the bank indicated by the "dstbank" field (bits 21–18) and the register number indicated by the "dst" field (bits 5–3).

Data transfer format 3 supports digital image/graphics processor relative addressing. The "Lrm" field (bits 23–22) indicate the type of addressing operation. This is set forth in Table 49.

TABLE 49

| Lrm field | | Addressing Mode |
|---|---|---|
| 8 | 7 | |
| 0 | 0 | normal addressing |
| 0 | 1 | reserved |
| 1 | 0 | Data memory base address DBA |
| 1 | 1 | Parameter memory base address PBA |

Specification of DBA causes local address unit 620 to generate the base address of its corresponding memory. Likewise, specification of PBA causes local address generator 620 to generate the base address of the corresponding parameter memory. The base address generated in this manner may be combined with the index stored in an index register or an offset field in any of the address generation operations specified in the "Lmode" field shown in Table 45.

This data transfer format also supports command word generation. If the destination of the register to register move is the zero value address register of the global address unit A15, then the instruction word decoding circuitry initiates a command word transfer to a designated processor. This command word is transmitted to crossbar 50 via the global data port accompanied by a special command word signal. This allows interprocessor communication so that, for example, any of digital image/graphics processors 71, 72, 73 and 74 may issue an interrupt to other processors. This process is detailed above.

Data transfer format 4 is recognized by bits 38–37 not being "00", bit 24 being "0" and bits 16–13 being "0001". Data transfer format 4 is called the field move and local data transfer format. Data transfer format 4 permits a load or store of one of the data registers 200 via the local data port in parallel with a register to register field move using global port source data bus Gsrc 105 and global port destination data bus Gdst 107. The local data port operation is defined by the fields "Lmode", "d", "e" (bit31), "siz" (bits 30–29), "s", "La", "L" and "Lim/x" in the manner described above.

The register to register field move is from the data register defined by the register number indicated by the "src" field (bits 12–10) to the register defined by the bank indicated by the "dstbank" field (bits 21–18) and the register number indicated by the "dst" field (bits 5–3). The "D" bit (bit 6) indicates if the field move is a field replicate move if "D"="1", or a field extract move if "D"="0". In a field replicate move the least significant 8 bits of the source register are repeated four times in the destination register if the "siz" field (bits 8–7) indicates a byte size, and the least significant 16 bits of the source register are duplicated in the destination register if the "siz" field (bits 8–7) indicates a half word size. If the "siz" field indicate a word size, then the whole 32 bits of the source register are transferred to the destination register without replication regardless of the state of the "D" bit. In a field extract move the "itm" field (bits 23–22) indicates the little endian item number to be extracted from the source register. The particular bits extracted also depends upon the "siz" field. When the data size of the "siz" field (bits 8–7) is byte, then "itm" may be 0, 1, 2 or 3 indicating the desired byte. When the data size of the "siz" field (bits 8–7) is half word, then "itm" may be 0 or 1 indicating the desired half word. The "itm" field is ignored if the "siz" field (bits 8–7) is word. The extracted field from the source register is sign extended if the "e" bit (bit 9) is "1" and zero extended if the "e" bit (bit 9) is "0". The "e" field is ignored during field replicate moves.

Data transfer format 5 is recognized by bits 38–37 not being "00", bit 24 being "1" and bits 16–15 being "00". Data transfer format 5 is called local long offset data transfer. Data transfer format 5 permits a global port memory access using an address constructed in the local address unit because no global data transfer is possible. The local data port operation is defined by the fields "Lmode", "d", "e", "siz", "s", "La" and "L" in the manner described above. The register source or destination corresponds to the register number designated in the "reg" field (bits 34–32) in the bank of registers designated in the "bank" field (bits 21–18). The "Local Long Offset/x" field (bits 14–0) specifies a 15 bit local address offset or the three least significant bits specify an index register as set by the "Lmode" field. A programmer might want to use this data transfer format using an index register rather than the "Local long offset" field because data transfer format 5 permits any data unit register as the source for a store or as the destination for a load. The "Lmode" field indicates whether this field contains an offset value or an index register number. If the selected data size is 8 bits (byte), then no scaling takes place regardless of the status of the "s" bit. In this case only, the "s" bit becomes the most significant bit of the offset converting the 15 bit "Local long offset" field into 16 bits. The "Lrm" field (bits 23–22) specify a normal address operation, a data memory base address operation or a parameter memory base operation as listed above in Table 49.

Data transfer format 6 is recognized by bits 38–37 being "00", bits 16–15 not being "00" and bit 2 being "0". Data transfer format 6 is called global long offset data transfer. Data transfer format 6 is similar to data transfer format 5 except that the address calculation occurs in the global address unit. The fields "bank", "L", "Gmode", "reg", "e", "siz", "s" and "Ga" are as defined above. The "Global Long Offset/x" field (bits 36–22) specifies a global offset address or an index register depending on the "Gmode" field. This is similar to the "Local Long Offset/x" field discussed above. The "Grm" field (bits 1–0) indicate the type of addressing operation. This is set forth in Table 50.

TABLE 50

| Grm field | | Addressing Mode |
|---|---|---|
| 1 | 0 | |
| 0 | 0 | normal addressing |
| 0 | 1 | reserved |
| 1 | 0 | Data memory base address DBA |
| 1 | 1 | Parameter memory base address PBA |

This operates in the same fashion as the "Lrm" field described above except that the address calculation takes place in global address unit 610.

Data transfer format 7 is recognized by bits 38–37 not being "00", bit 24 being "0" and bits 16–14 being "001".

Data transfer format 7 is called the non-data register data unit operation and local data transfer format. Data transfer format 7 permits a local port memory access in parallel with a data unit operation where the first source for arithmetic logic unit 230 and the destination for arithmetic logic unit 230 may be any register on digital image/graphics processor 71. The local data port operation is defined by the fields "Lmode", "d", "e", "siz", "s", "La", "Lrm", "L" and "Lim/x" in the manner described above. The "Adstbnk" field (bits 21–18) specifies a bank of registers for the arithmetic logic unit destination. This field specifies a register source in combination with the "dst" field in data unit formats A, B and C, and the "dst1" field in data unit format D. The "As1bank" field specifies a bank of registers for the first arithmetic logic unit source. This specifies a register source in combination with the "src1" field in data unit formats A, B, C and D. These data unit operations are called long distance arithmetic logic unit operations because the first source and the destination need not be the data registers 200 of data unit 110.

Data transfer format 8 is recognized by bit, 38–37 being "00", bit 24 being "0" and bits 16–13 being "0000". Data transfer format 8 is called the conditional data unit operation and conditional move transfer format. Data transfer format 8 permits conditional selection of the first source for arithmetic logic unit 230 and conditional storing of the resultant of arithmetic logic unit 230. The conditional arithmetic logic unit operations are defined by the fields "cond.", "c", "r", "g" and "N C V Z".

The "cond." field (bits 35–32) defines an arithmetic logic unit operation from conditional register sources and conditional storage of the arithmetic logic unit resultant. This field is defined in Table 41. These conditions are evaluated based upon the "N", "C", "V" and "Z" bits of status register 210.

The specified condition may determine a conditional register source, a conditional storage of the result of arithmetic logic unit 230 or a conditional register to register move. The "c" bit (bit 31) determines conditional source selection. If the "c" bit is "0", then the first source for arithmetic logic unit 230 is unconditionally selected based upon the "src1" field (bits 47–45) of the data unit format portion of the instruction word. If the "c" bit is "1", then the register source is selected between an odd and even register pair. Note that in this case the "src1" field must specify an odd numbered data register 200. If the condition is true, then the specified register is selected as the first source for arithmetic logic unit 230. If the condition is false, then the corresponding even data register one less than the specified data register is selected as the source. The preferred embodiment supports conditional source selection based upon the "N" bit of status register 210. If the "N" field of status register 210 is "1" then the designated data register is selected as the first source for arithmetic logic unit 230. If the "N" field of status register 210 is "0", then the data register one less is selected. This selection can be made by a multiplexer, such as multiplexer 215 illustrated in FIG. 44, or by substitution of the "N" field of status register 210 for the least significant bit of the register number. While the preferred embodiment supports only conditional source selection based upon the "N" bit of status register 210, it is feasible to provide conditional source selection based upon the "C", "V" and "Z" bits of status register 210.

Data transfer format 8 supports conditionally storing the resultant of arithmetic logic unit 230. The "r" bit (bit 30) indicates if storing the resultant is conditional. If the "r" bit is "1" then storing the resultant is conditional based upon the condition of the "cond." field. If the "r" bit is "0", then storing the resultant is unconditional. Note that in a conditional result operation, the status bits of status register 210 are set unconditionally. Thus these bits may be set even if the result is not stored.

Data transfer format 8 also permits a conditional register to register move operation. The condition is defined by the same "cond." field that specifies conditional data unit operations. The register data source of the move is defined by the bank indicated by the "srcbank" field (bits 9–6) and the register number indicated by the "src" field (bits 12–10). The register data destination is defined by the bank indicated by the "dstbank" field (bits 21–18) and the register number indicated by the "dst" field (bits 5–3). The "g" bit (bit 29) indicates if the data move is conditional. If the "g" bit is "1", the data move is conditional based upon the condition specified in the "cond." field. If the "g" bit is "0", the data move is unconditional. Note that a destination of the zero value address register A15 of the global address unit generates a command word write operation as previously described above. Thus data transfer format 8 permits conditional command word generation.

The "N C V Z" field (bits 28–25) indicates which bits of the status are protected from alteration during execution of the instruction. The conditions of the status register are: N negative; C carry; V overflow; and Z zero. If one or more of these bits are set to "1", the corresponding condition bit or bits in the status register are protected from modification during execution of the instruction. Otherwise the status bits of status register 210 are set normally according to the resultant of arithmetic logic unit 230.

Data transfer format 9 is recognized by bits 38–37 being "00", bit 24 being "0" and bits 16–13 being "0001". Data transfer format 9 is called the conditional data unit operation and conditional field move transfer format. Data transfer format 9 permits conditional selection of the first source for arithmetic logic unit 230 and conditional storing of the resultant of arithmetic logic unit 230 in the same manner as data transfer format 8. The conditional arithmetic logic unit operations are defined by the fields "cond.", "c", "r" and "N C V Z" as noted above in the description of data transfer format 8.

Data transfer format 9 also supports conditional register to register field moves. The condition is defined by the same "cond." field that specifies conditional data unit operations. The source of the field move must be one of data registers 200. The "src" field (bits 12–10) specifies the particular data register. The destination of the register to register move is the register defined by the register bank of the "dstbank" field (bits 21–18) and the register number of the "dst" field (bits 5–3). The fields "g" (bit 29), "itm" (bits 23–22), "e" (bit 9), "siz" (bits 8–7) and "D" (bit 6) define the parameters of the conditional field move. The "g" bit determines that the field move is unconditional if "g"="0" and that the field move is conditional if "g"="1". The "D" bit indicates if the field move is a field replicate move if "D"="1", or a field extract move if "D"="0". These options have been described above. In a field extract move the "itm" field (bits 23–22) indicates the little endian item number to be extracted from the source register base upon the data size specified by the "siz" field. The extracted field from the source register is sign extended if the "e" bit (bit 9) is "1" and zero extended if the "e" bit (bit 9) is "0". The "e" field is ignored during field replicate moves.

Data transfer format 10 is recognized by bits 38–37 being "00", bits 16–15 not being "00" and bit 2 being "1". Data transfer format 10 is called the conditional data unit operation and conditional global data transfer format. Data transfer format 10 permits conditional selection of the first source for arithmetic logic unit 230 and conditional storing of the resultant of arithmetic logic unit 230. The conditional arithmetic logic unit operations are defined by the fields "cond.", "c", "r" and "N C V Z" as noted above in the description of data transfer format 8.

Data transfer format 10 also supports conditional memory access via global address unit 610. The conditional memory access is specified by the fields "g", "Gim/x", "bank", "L", "Gmode", "reg", "e", "siz", "s", "Ga" and "Grm" as previously described. The "g" bit (bit 29) indicates if the data move is conditional in the manner previously described above. The "Gim/x" field specifies either an index register number or an offset field depending upon the state of the "Gmode" field. The "bank" field specifies the register bank and the "reg" field specifics the register number of the register source or destination of the global memory access. The "L" indicates a load operation (memory to register transfer) by a "1" and a store operation (register to memory transfer) by a "0". The "Gmode" field indicates the operation of global data unit 610 as set forth in Table 47. The "e" bit indicates sign or zero extension for load operations. Note an "L" field of "0" and an "e" field of "1" produces an address arithmetic operation. The "siz" field specifies the data size as set forth in Table 48. The "s" bit indicates whether the index is scaled to the data size as described above. The "Ga" field specifies the address register used in address computation. The "Grm" field indicates the type of addressing operation as set forth in Table 50.

Data transfer format 11 is recognized by bits 38–37 being "00", bit 24 being "0" and bits 16–14 being "001". Data transfer format 11 is called the conditional non-data register data unit format. Data transfer format 11 permits no memory accesses. Instead data transfer format 11 permits conditional data unit operation with one source and the destination for arithmetic logic unit 230 as any register within digital image/graphics processor 71. These are called long distance arithmetic logic unit operations. The "As1bank" field (bits 9–6) specifies a bank of registers that defines the first arithmetic logic unit source in combination with the "src1" field (bits 47–45) in the data unit format of the instruction. Thus this source may be any register within digital image/graphics processor 71. The "Adstbnk" field. (bits 21–18) specifies a bank of registers that defines the arithmetic logic unit destination in combination with the "dst" field (bits 50–48) in data unit formats A, B and C, and the "dst1" field (bits 50–48) in data unit format E. The conditional arithmetic logic unit operations are defined by the fields "cond.", "c", "r" and "N C V Z" as noted above in the description of data transfer format 8.

The "R" bit (bit 0) is a reset bit. The "R" bit is used only at reset. This "R" bit is used only upon reset. The "R" bit determines whether the stack pointer register A14 is initialized upon reset of digital image/graphics processor 71. This "R" bit is not available to users via the instruction set and will not be further described.

With so many operations possible within a single instruction, it is possible that more than one operation of a single instruction specifies the same destination data register 200. In such an event a fixed order of priority determines which operation saves its result in the commonly specified destination register. This fixed order of priority is shown in Table 51 in order from highest priority to lowest priority.

TABLE 51

| Priority Rank | Operation |
| --- | --- |
| highest | Global address unit data transfer |
| median | Local address unit data transfer |
| lowest | Data unit Multiply/ALU => Multiply Rotate/ALU => ALU |

Thus global address unit data transfers have the highest priority and data unit operations have the lowest priority. Since more than one data unit operation can take place during a single instruction, there is a further priority rank for such operations. If a multiply operation and an arithmetic logic unit operation have the same destination register, then only the result of the multiply operation is stored. In this case no status bits are changed by the aborted arithmetic logic unit operation. Note that if the storing of the result of an arithmetic logic unit operation is aborted due to conflict with a global or local address unit data transfer, then the status bits are set normally. If a barrel rotation result and an arithmetic logic unit operation have the same destination, then only the results of the arithmetic logic unit operation is stored. In this case the status bits are set normally for the completed arithmetic logic unit operation.

This application will now describe how multiprocessor integrated circuit 100 can be programmed to solve some typical graphics processing problems.

One key problem in graphics processing is image encoding. In facsimile transmission, video conferencing, multimedia computing and high definition television a key problem is the amount of data to be transmitted or stored in full motion video. There are known techniques for data compression of individual images that can be used for each frame of video. Current technology cannot simultaneously provide sufficient image compression and acceptable video quality for real time video. Much interest is directed toward algorithms and processors that can provide image compression for full motion video.

There is a proposed motion picture compression standard from the Motion Picture Experts Group (MPEG) which utilizes motion estimation. In motion estimation consecutive frames are compared to detect changes. These changes can then be encoded and transmitted rather than the data of the entire frame. The current proposed MPEG standard compares 16 by 16 pixel blocks of consecutive pixels. One block is displaced to differing positions ±7 pixels in the vertical dimension and ±7 pixels in the horizontal direction. For each displaced position, the proposed standard computes the sum of the absolute value of respective differences between pixels. The displaced position yielding the least sum of the absolute value of differences defines a motion vector for that 16 by 16 pixel block. Once the entire image has been compared, then some frames are transmitted in large degree via motion vectors rather than by pixel values.

This motion estimation computation involves a very large amount of computation. Each displaced position needs 256 differences, whose absolute values are summed. There are 225 such displaced positions (15×15) for each 16 by 16 pixel block. In relatively modest image resolutions such as the h.261 standard proposed for video conferencing with 352 columns lines and 288 rows, each frame includes 198 such 16 by 16 pixel blocks. Thus each frame requires about 23 million subtractions, 23 million absolute values and numerous other computations. This task requires enormous computation capability since full motion video requires at least 24 to 30 frames per second. The most voluminous portion of these computations are the subtractions for each pixel of each displaced position of each 16 by 16 pixel block and the absolute value function. Though there are many other computations, if there were an efficient manner of performing these most voluminous calculations the entire task would be feasible.

Figure 47:
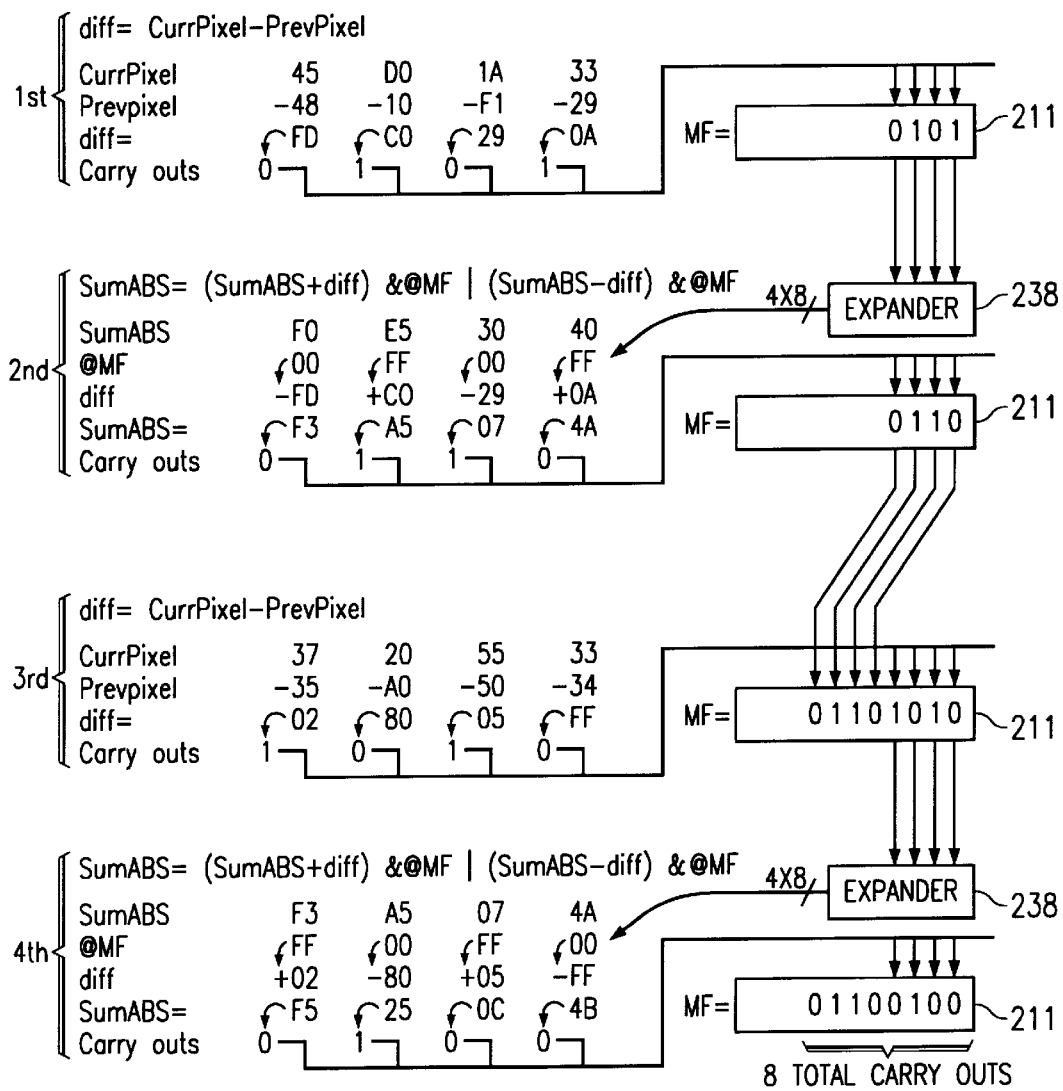
FIG. 47 illustrates in schematic form within the data flow during an example sum of absolute value of differences algorithm.

FIG. 47 illustrates schematically the operation of digital image/graphics processor 71 in a four instruction inner loop for MPEG motion estimation. Note that the example data values indicated are in hexadecimal numbers. Within this four instruction loop, digital image/graphics processor 71 computes 8 differences on 8 bit pixels, forms the absolute values and updates a running sum of the absolute values. This operation will be described in detail to demonstrate the computation power of digital image/graphics processor 71 illustrated in FIG. 3. The four instructions of the inner loop are:

```
1a.         CurrPixel =mzc CurrPixel-PrevPixel
1b.  ||     GX_CNTIndex = MF
1c.  ||     CurrPixel = *(LA_Curr++=4)
2a.         SumABS =mc (SumABS+CurrPixel) & @MF
                  | SumABS-CurrPixel) & @MF
2b.  ||     GA_CarryCount = &*(GA_CarryCount+GX_NumCout)
2c.  ||     PrevPixel = *(LA_Prev++=4)
3a.         CurrPixel =mrc CurrPixel-PrevPixel
3b.  ||     GX_NumCout = *(GA_1CntTbl+GX_CNTIndex)
3c.  ||     CurrPixel = *(LA_Curr++=4)
4a.         SumABS =mc (SumABS+CurrPixel) & @MF
                  | (SumABS-CurrPixel) &~@MF
4b.  ||     PrevPixel = *(LA_Prev ++=4)
```

This loop kernel is preferably controlled using hardware loop logic 720 for zero overhead looping in the manner described above.

The complex interactions of these four instructions will be described in detail. In summary, instructions 1a and 3a form the difference between pixels of the current frame and pixels of the previous frame and set bits in multiple flags register 211. Instructions 2a and 4a add or subtract this difference from a running sum of absolute values. The selection of addition or subtraction is based on the previously set bits within multiple flags register 211. The local address unit 620 handles fetching the pixel data from the corresponding local memory. This data is placed in a memory accessible by the local port of the digital image/graphics processor executing this algorithm. Note that the data is preferably organized as four adjacent 8 bit pixels per 32 bit data word. The global address unit 610 computes the higher order bits in the running sum of absolute values. This computation of the higher order bits employs a 256 element look up table and address unit arithmetic. Note that all the data unit operations are multiple operations on 8 bit data where both the "Msize" field and the "Asize" field of status register 210 are set to "100".

Table 52 shows the register assignments used in the example of this algorithm listed above. Those skilled in the art would realize that other register assignments may also be used to perform this same loop kernel.

TABLE 52

| Register | Variable Name | Data Assignment |
|---|---|---|
| D0 | — | instruction parameters |
| D1 | PrevPixel | 4 previous frame pixels |
| D2 | CurrPixel | 4 current frame pixels |
| D3 | PrevPixel | 4 previous frame pixels |
| D4 | CurrPixel | 4 current frame pixels |
| D5 | SumABS | running sum of abslute value of differences |
| A0 | LA_Prev | previous frame pixel address |
| A1 | LA_Curr | current frame pixel address |
| A8 | GA_CarryCount | running sum of carries |
| A9 | GA_1CntTbl | carry count loop up table base address |
| X0 | — | 4 |
| X8 | GX_CNTIndex | count of carries from multiple flags register |
| X9 | GX_NumCout | loop up table result |

In Table 52: D0 through D5 are data registers in data unit 110; A8 and A9 are address registers in global address unit 610; X8 and X9 are index registers in global address unit 610; A0 and A1 are address registers in local address unit 620; X0 is an index register in local address unit 620.

The data unit operation of instruction 1 of the loop forms the difference value CurrPixel-PrevPixel. This difference is between the values of four pixels of the current frame stored in data register D2 and the values of four corresponding pixels of the previous frames stored in data register D1. The "mzc" mnemonic for this instruction indicates: a multiple operation; multiple flags register 211 is zeroed to begin the instruction; and multiple flags register 211 has its least significant bits set by the carry-out results of the multiple sections of arithmetic logic unit 230. As previously stated, arithmetic logic unit 230 forms this difference while split into four 8 bit sections. The multiple flags register 211 has its four least significant bits set from the respective carry-outs of the four sections. Note that a "0" carry-out result indicates the difference is negative and a "1" carry-out result indicates the difference is not negative.

Global address unit 610 moves the data stored in multiple flags register 211 to index register X8. Note that this move takes place during the address pipeline stage of this instruction, which is prior to any data unit 110 operation. Thus this data is the result of instruction 4 of the previous loop and not the result of any operation of data unit 110 during instruction 1.

Local address unit 620 loads data in the address stored in address register A1 into data register D4. This moves data for four pixels of the current frame into position for use in instruction 3. Address register A1 is pre-incremented and modified by the value in index register X0. According to Table 52 this value is "4". Note that it is feasible to employ a 5 bit offset field for this increment value rather than an index register. After this post-increment, address register A1 holds the address of the word in memory storing the current four pixels of the current frame.

Instruction 2 forms the absolute value of the difference and adds this to a running sum of absolute values. The "mc" mnemonic indicates this is a multiple instruction and that the least significant bits of multiple flags register 211 are set by the respective carry-outs. In this case the carry-outs replace the four least significant bits set in instruction 1. Note that the data unit operation (SumABS+CurrPixel)&@MF |(SumABS-CurrPixel)&~@MF is a readily obtainable arithmetic operation using the translated function code "10011010" (Hex "9a") as shown in Table 21. The four least significant bits of multiple flags register 211 are expended into 32 bits in expand circuit 238 and supplied to input C bus 243 via multiplexer Cmux 233. This expanded version of the four least significant bits of multiple flags register 211 forms the terms on the "@MF" line in FIG. 47. This forms the absolute value and adds it to the running sum. Note that if the difference was negative, then the carry-out bit was "0" and the corresponding expanded multiple flags term is Hex "00". This effectively causes the negative difference to be subtracted from the running sum. On the other hand, if the difference was positive, the corresponding multiple flags term is Hex "FF" and the difference is added to the running sum. Using the expanded multiple flags register bits thus enables the formation of the pixel difference, the absolute value and the running sum in only two instructions. Note that in two cases the sum generates a carry-out. This carry-out is stored in multiple flags register 211 to be used later in computation of the higher order bits of the running sum of absolute values.

Global address unit 610 performs address unit arithmetic. The data from the higher order bit look up table stored in index register X9 is added to a running sum of the higher order bits stored in address register A8. Note that the sum of the absolute values of 256 differences of 8 bit pixels may very well overflow the capacity of 8 bits. Thus some manner of accounting for such overflow bits is needed. Index register X9 holds the count of the number of such overflow accumulated in multiple flags register 211 during one pass through the loop. Instruction 2b sums these into a running sum of these overflow bits, which later forms the higher order bits of the desired sum of absolute value of differences.

Local address unit 620 loads data in the address stored in address register A0 into data register D3. This moves data for four pixels of the previous frame into position for use in instruction 3. Address register A0 is pre-incremented by the value in index register X0, which is 4. Address register A0 thus points to the current word of previous frame pixel data. Note that this load operation occurs during the address pipeline stage of instruction 2 and is thus available for use in the execute pipeline stage of instruction 3.

Instruction 3a is similar to instruction 1a. Instruction 3a also forms a difference value (CurrPixel−PrevPixel). This difference is between the values of four pixels of the current frame stored in data register D4 and the values of four corresponding pixels of the previous frames stored in data register D3. The "mrc" mnemonic for this instruction indicates: a multiple operation; multiple flags register 211 is rotated to begin the instruction; and multiple flags register 211 has its least significant bits set by the carry-out results of the multiple sections of arithmetic logic unit 230. The rotate in multiple flags register 211 of the carry-outs formed in instruction 2 occurs at the beginning of the execute pipeline stage and makes room for storage of four new carry-outs from this difference. This rotate in multiple flags register 211 thus retains the carry-outs from the instruction 2.

Global address unit 610 performs a table look up operation. The address stored in address register A9 is the base address of a 256 element look up table. Each element in this look up table stores data corresponding to the number of "1's" in the table address. Thus the first element in the table, having a table address of "00000000", stores "0", the second element with a table address of "00000001" stores "1", the third element with a table address of "00000010" stores "1", the fourth element with a table address of "00000011" stores "2" and so forth. The index register X8 stored the carry-outs from the prior pass through the loop as loaded in instruction 1b. Each bit stores the carry-out from a corresponding running sum of the absolute value of the differences. A "1" indicates overflow of the 8 bit word. The look up table returns the number of such "1's", effectively the sum of the overflow bits. This resultant, which is stored in index register X9, is added to the running sum of the overflow bits stored in address register A8 in instruction 2b.

Local address unit 620 loads data in the address stored in address register A1 into data register D2. This moves data for four pixels of the current frame into position for use in instruction 1 of the next loop. Address register A1 is pre-incremented and modified by the value in index register X0, which is "4".

Instruction 4 forms the absolute value of the difference and adds this to the running sum of absolute values in a manner similar to instruction 2. The "mc" mnemonic indicates this is a multiple instruction and that the least significant bits of multiple flags register 211 are set by the respective carry-outs, which replace the four least significant bits set in instruction 3. Data unit 110 effectively forms the absolute value and adds it to the running sum. Note that the running sum SumABS The carry-outs are stored in multiple flags register 211 to be used later in computation of the higher order bits of the running sum of absolute values.

There is no global address unit operation in instruction 4 in this example.

Local address unit 620 loads data in the address stored in address register A0 into data register D1. This moves data for four pixels of the previous frame into position for use in instruction 1 of the next pass through the loop. Address register A0 is pre-incremented and modified by the value in index register X0, which is 4.

Some clean up operations follow after this loop kernel has computed the sum of the absolute value of the differences for an entire 16 by 16 pixel block. Once completed data register D5 holds separate sum data in four 8 bit bytes. In addition, address register A8 holds the sum of the higher order bits of the desired sum of absolute value of differences. To obtain the correct sum the data in the four sections of data register D5 are added. An arithmetic operation using the translated function code "01100000" (Hex "60"), which is a field addition, is very helpful in this addition. A method herein called summing 4 bytes into 2 into 1 is described below. This operation starts with partial sum bytes d, c, b, a as follows in a first data register:

ddddddddccccccccbbbbbbbbaaaaaaaa

Two masks are needed for this operation. The first mask is alternating Hex "00" and Hex "FF" bytes:

00000000111111110000000011111111

This mask could be formed from Hex "0101" stored in Mflags register 211 via expand circuit 238 when the "Asize" field indicating a byte data size. This first mask could also be stored in a data register. The second mask is a Hex "0000FFFF" mask:

00000000000000001111111111111111

This second mask could be formed by mask generator 239 from an input of 16. Data register D0 is loaded with a default barrel rotate amount "DBR" field indicating an 8 bit rotate. Once these preliminary steps are accomplished, then the sum of 4 bytes into 2 bytes into one byte requires only two instructions. In the first instruction the 4 byte sum data in data register D5 is supplied to both the input A bus 241 via multiplexer Amux 232 and to barrel rotator 235. The rotation amount is set at 8 bits via the default barrel rotate amount "DBR" field of data register D0. The first mask is supplied to input C bus 243 via multiplexer Cmux 233 and second multiplier input bus 202. This requires an instruction class field of "001" from Table 39. Arithmetic logic unit 230 performs a field addition (A&C)+(B&C). The resultant sum is returned to the source data register D5. This process is explained as follows. Rotation of the original data by 8 bits yields:

aaaaaaaaddddddddccccccccbbbbbbbb

Arithmetic logic unit 230 effectively masks both the original and rotated data and then adds them in two separate fields as controlled by the first mask. Applying the first mask to the original data yields:

00000000cccccccc00000000aaaaaaaa

Applying the first mask to the rotated data yields:

00000000dddddddd00000000bbbbbbbb

The addition of the these two values results in two 9 bit intermediate sums in a single data word:

0000000uuuuuuuuu0000000vvvvvvvvv which is stored back into the first source register. Note that the addition of two 8 bit numbers may yield a 9 bit number as shown above. The power of the three input arithmetic logic unit 230 is shown here where the shift, mask and addition are performed in a single cycle of arithmetic logic unit 230.

The second instruction is similar to the first instruction. In the second instruction the partial sum data stored in a data register is supplied to both the input A bus 241 via multiplexer Amux 232 and to barrel rotator 235. The rotation amount is set at 16 bits via a 5 bit offset field of "10000" selected by multiplexer Imux 222, supplied to second multiplier input bus 202 and selected by multiplexer Smux 231. The second mask is supplied to input C bus 243 via the 5 bit offset field selected by multiplexer Imux 222, supplied to second multiplier input bus 202, selected by multiplexer Mmux 234, formed into the 16 bit second mask via mask generator 239 according to Table 19 and further selected by multiplexer Cmux 233. This requires an instruction class field of "011" from Table 39. Arithmetic logic unit 230 performs a field addition (A&C)+(B&C). The resultant sum is returned to the source register. This process is explained as follows. Rotating this partial sum by 16 bits produces:

0000000vvvvvvvvv0000000uuuuuuuuu

Applying the second mask to the original partial sum data yields:

000000000000000000000000vvvvvvvvv

Applying the second mask to the rotated partial sum data mask yields:

000000000000000000000000uuuuuuuuu

The field addition of the these two values results in one 10 bit sum of the four byte partial sums:

000000000000000000000000rrrrrrrrrr which may be stored into the original source data register. Note that addition of the two 9 bit numbers may overflow into a 10 bit sum.

The final desired sum of the motion estimation process is formed by adding the above four byte partial sum to the running overflow sum rotated left 8 places. A simple rotate and add accomplishes this final addition.

This field addition is particularly useful when doing multiple arithmetic. As illustrated above it provides a fast final addition of four partial sums that are initially spread across four bytes, requiring only two instructions. Because this final addition is fast, digital image/graphics processor multiple arithmetic can have a speed advantage over single-byte arithmetic even when only a small number of additions are needed to provide the partial sums. This method is particularly useful in the clean up of the sum of absolute value of differences described above.

Suitable outer loops are needed to supplement this loop kernel. By way of example only, a suitable outer loop could so load the pixel data for the current and previous frame that an entire 16 by 16 pixel block may be handled without interrupting the inner loop. Alternatively, outer loops insure proper registration of the pixel data when employing the inner loop. Displacement of the 16 by 16 pixel blocks are also handled by larger loops. Larger loops also make the selection of the motion vector for each pixel is based upon the least sum of absolute value of differences. All these program features are within the capability of one skilled in the art. Note that these outer loops are executed much less frequently, therefore maximum coding density is not as important than in the inner loop kernel listed above.

Another function used in the proposed MPEG encoding standard is variable length codes. This is often called Huffman encoding. Huffman encoding has many other uses in addition to video encoding. Variable length codes are employed for discrete data elements to be transmitted. In order to reduce the amount of data to be transmitted, more frequently used data is encoded using fewer bits.

Huffman variable length encoding specifies both encoding and decoding techniques. In an application such as multimedia computing, the software media vendor performs the encoding. The user's computer decodes the encoded data when used. In this event, large computing resources can be employed during encoding or the encoding may be performed taking longer than the real time length of the video sequence. This is feasible since encoding is done only once. Thus in such applications only decoding need be done in real time. In other applications such as video conferencing both encoding and decoding must be done in real time by the user's apparatus.

An example of such variable length coding is shown in Table 53 below. Each coded number consists of a size field and a value field. Table 53 shows an example using a 2 bit size field and a value field of up to 3 bits.

TABLE 53

| Size | Value | Encoded Number |
|------|-------|----------------|
| 00   | —     | 0              |
| 01   | 0     | −1             |
| 01   | 1     | 1              |
| 10   | 00    | −3             |
| 10   | 01    | −2             |
| 10   | 10    | 2              |
| 10   | 11    | 3              |
| 11   | 000   | −7             |
| 11   | 001   | −6             |
| 11   | 010   | −5             |
| 11   | 011   | −4             |
| 11   | 100   | 4              |
| 11   | 101   | 5              |
| 11   | 110   | 6              |
| 11   | 111   | 7              |

Table 53 shows only some examples of Huffman encoding. Other combinations of the number of size bits and the number of value bits are feasible. Table 54 shows the range of numbers which can be encoded with various numbers of size bits and numbers of value bits.

TABLE 54

| Number of Size Bits | Number of Value Bits | Range of Encoded Numbers |
|---------------------|----------------------|--------------------------|
| 1                   | 0                    | 0                        |
| 1                   | 1                    | −1, 1                    |
| 2                   | 0                    | 0                        |

TABLE 54-continued

| Number of Size Bits | Number of Value Bits | Range of Encoded Numbers |
|---|---|---|
| 2 | 1 | −1, 1 |
| 2 | 2 | −3, −2, 2, 3 |
| 2 | 3 | −7 to −4, 4 to 7 |
| 3 | 0 | 0 |
| 3 | 1 | −1, 1 |
| 3 | 2 | −3, −2, 2, 3 |
| 3 | 3 | −7 to −4, 4 to 7 |
| 3 | 4 | −15 to −8, 8 to 15 |
| 3 | 5 | −31 to −16, 16 to 31 |
| 3 | 6 | −63 to −32, 32 to 63 |
| 3 | 7 | −127 to −64, 64 to 127 |
| 4 | 0 | 0 |
| 4 | 1 | −1, 1 |
| 4 | 2 | −3, −2, 2, 3 |
| 4 | 3 | −7 to −4, 4 to 7 |
| 4 | 4 | −15 to −8, 8 to 15 |
| 4 | 5 | −31 to −16, 16 to 31 |
| 4 | 6 | −63 to −32, 32 to 63 |
| 4 | 7 | −127 to −64, 64 to 127 |
| 4 | 8 | −255 to −128, 128 to 255 |
| 4 | 9 | −511 to −256, 256 to 511 |
| 4 | 10 | −1023 to −512, 512 to 1023 |
| 4 | 11 | −2047 to −1024, 1024 to 2047 |
| 4 | 12 | −4095 to −2048, 2048 to 4095 |
| 4 | 13 | −8191 to −4096, 4096 to 8191 |
| 4 | 14 | −16383 to −8192, 8192 to 16383 |
| 4 | 15 | −32768 to −16384, 16384 to 32768 |

Thus a single bit size permits only up to one bit for value and can encode −1, 0 and 1. A two bit size permits the value to be represented by up to 3 bits and can encode from −7 to 7. A 3 bit size permits up to 7 bits for value and can encode from −127 to 127. If size is encoded in 4 bits, then the value can have up to 15 bits and can encode from −32768 to 32768. For any particular application of Huffman encoding the number of size bits is constant. The number of value bits is selected to provide a range including the number to be encoded. From Table 54 it is clear that numbers near zero require fewer bits to encode than numbers further from zero. The raw data is preferably quantized or otherwise selected or manipulated so that numbers near zero occur more frequently than numbers distant from zero. Thus the more frequently encountered data requires fewer bits to encode. This feature reduces the average number of encoded bits that must be transmitted or stored.

An algorithm for Huffman encoding a sample appears below. This example assumes a range of values to be encoded from algorithm presupposes that the range of numbers is from −2047 to 2047 represented by 12 bits. These numbers are right justified in sign extended 32 bit words. Note theft conversion from packed signed extended 16 bit data can be accomplished using sign extended half word memory loads or register to register moves, or using half word masks coupled with rotation of 16 bit data located in the most significant bits of a 32 bit word. Inspection of Table 54 indicates this range of numbers can be encoded using 4 size bits and up to 10 value bits. Thus the data length of the Huffman encoded data may vary from 4 to 14 bits.

This example includes the following steps: forming the absolute value, determining the size via left most "1" detection; generation of the value bits for negative numbers; and packing the size and value.

| 1. | | RawData = RawData |
| 2a. | | AbsValue = [.n] 0 − RawData |
| 2b. | ‖ | AbsValue = [ge] RawData |
| 3. | | Size = [.n] LMO AbsValue |
| 4. | | Value = [n] RawData + %Size |
| 5. | | RotSize = Size \\ Size |
| 6. | | SizeValue = RotSize & ~%Size \| Value & %Size |

Table 55 shows the register assignments in this example of Huffman encoding.

TABLE 55

| Register | Variable Name | Data Assignment |
|---|---|---|
| D1 | RawData | raw data to be encoded |
|  | Value | corrected value portion of encoded data |
| D2 | AbsValue | absolute value of raw data |
|  | RotSize | rotated data size portion of encoded data |
| D3 | Size | data size portion of encoded data |
| D4 | SizeValue | packed encoded data |

Instruction 1 sets the status bits stored in status register SR 210. The negative "N" bit will be used in two later instructions. Instruction 2 forms the absolute value of RawData. Note the register to register move operation has priority over the arithmetic logic unit operation. If RawData≧0, then the register move takes place according to the greater than or equal to "ge" mnemonic and AbsValue is set to RawData. If RawData<0, then the register move does not take place and the arithmetic logic unit operation takes place. This priority of operation is in accordance with Table 51. Thus AbsValue is set to 0-RawData. This effectively sets AbsValue to the absolute value of RawData. Note the ".n" mnemonic in instruction 2a preserves the status of the negative "N" status bit regardless of the results of the arithmetic logic unit operation.

Instruction 3 determines the size of the original data. Instruction 3 employs LMO/RMO/LMBC/RMBC circuit 237 to determine the left most one in AbsValue. This is the most significant bit in the raw data. The value returned by LMO/RMO/LMBC/RMBC circuit 237 in the form shown in Table 16 yields the number of significant bits in the raw data, thus the desired size portion of the encoded number. The absolute value formed in instruction 2 ensures that this left most one operation generates the correct result for negative numbers. The ".n" mnemonic preserves the status of the negative "N" status bit. This same result can be achieved by replacing instructions 2 and 3 with Size=[.n] LMBC RawData. LMO/RMO/LMBC/RMBC circuit 237 would detect the most significant "1" for positive data and the most significant "0" for negative data. The form listed above may be preferred if the algorithm requires more data transfer operations.

Instruction 4 corrects the RawData into the Huffman form as shown in Table 54. Note that Value and RawData are the same register according to Table 55. Thus if RawData is greater than or equal to zero, the condition of instruction 4 fails and Value is RawData. If RawData is less than zero according to the "n" mnemonic, then the addition takes place. This realizes the encoding of negative numbers of the form shown in Table 53.

Instructions 5 and 6 form packed data including the size and value. Instruction 5 rotates Size by the previously determined number of bits of value. Instruction 6 merges these into a single data word. Note that any practical implementation of such Huffman encoding would require additional data handling operations. These would be required to input the raw data and to pack complete data words of encoded data and output these packed words. These functions are known in the art and will not be described in detail.

A simplified example of Huffman decoding on the multiprocessor integrated circuit of this invention is described below.

```
1.      L_WordAddressX = BitAddress >>u 5
2.      Nop
3.      ThisWord = *(L_WordAddressBase
               += [L_WordAddressX])
4a.     AlignedWord = ThisWord << BitAddress
4b.  || NextWord = *(L_WordAddressBase + [1])
5.      Cur32Bits = AlignedWord & ~% BitAddress
               | NextWord // BitAddress & % BitAddress
6a.     L_HuffLUTX = Cur32BIts >>u 26
6b.  || Dummy0000 = &*(L_WordAddressBase -=
               [L_WordAddressX])
7.      Nop
8.      UsedBits =sb *(L_BitsUsedAddress +
               L_HuffLUTX])
9a.     BitAddress = BitAddress + UsedBits
9b.  || L_BitsUsedAddress = *(G_Space +
               O_AC_BitsUsedAddress)
9c.  || RunSize =ub *(L_RunSizeAddress +
               [L_HuffLUTX])
HuffmanLoopStart:
Jump_Back_In:
10a.    WordAddress = BitAddress >> 5
10b. || BR =[c] *(G_Space + O_ExtendedTableDecode)
11a.    PosOffset = 0 - (RunSize // 28 & % 28) + cin
11b. || L_WordAddressX = WordAddress
11c. || FunctionEalu = *(L_Space + Tealu_Function)
12a.    FieldSize = FunctionEalu | (RunSize & % 4)
12b. || LC1 = RunSize
13a.    G_OffsetX = G_OffsetX + PosOffset
13b. || ThisWord = *(L_WordAddressBase +=
               [L_WordAddressX])
14a.    AlignedValue = EALU(D1, Cur32Bits // UsedBits,
                           % FieldSize)
14b. || LC1 =[le] A15
15a.    AlignedWord = ThisWord << BitAddress
15b. || G_ZigZagDCTX =ub *(G_ZigZagLUTop -
               [G_Offset])
15c. || NextWord = *(L_WordAddressBase + [1])
16a.    Cur32Bits = AlignedWord & ~% BitAddress
               | NextWord // BitAddress & % BitAddress
16b. || L_RunSizeAddress = *(G_Space +
               O_AC_RunSizeAddress)
16c. || Bit31 = *(L_Space + tBit31)
17a     Dummy0001 = AlignedValue & (Bit31 // FieldSize)
17b. || L_HuffLUTX =ub3 Cur32Bits
17c. || Dummy 0003 = &*(L_WordAddressBase -=
               [L_WordAddressX])
18a.    AdjustedValue =[z] AlignedValue - % FieldSize
18b. || QuantStep =h *(G_QuantizationTable -
               [G_OffsetX])
19a.    IDCTValue = QuantStep * AdjustedValue
19b. || UsedBits =sb *(L_BitsUsedAddress +
               [L_HuffLUTX])
End_of_Tight_Loop:
20a.    BitAddress = BitAddress + UsedBits
20b. || *(G_IDCTBase + [G_ZigZagDCTX]) =h IDCTValue
20c. || RunSize =ub *(L_RunSizeAddress +
               [L_HuffLUTX])
```

Table 56 shows the data register assignments employed in this example of the Huffman decode algorithm.

TABLE 56

| Register | Variable Name | Data Assignment |
|---|---|---|
| D0 | FieldSize | number of bits in value field |
|    | FunctionEalu | extended arithmetic logic function code |

TABLE 56-continued

| Register | Variable Name | Data Assignment |
|---|---|---|
| D1 | BitAddress | bit address of next bit to decode |
| D2 | AlignedWord | data word containing next bit in most significant bit |
|    | Cur32Bits | data word containing next 32 bits of data |
| D3 | Dummy0000 | register set but not used |
|    | AlignedValue | stripped aligned value |
|    | AdjustedValue | negative corrected decoded value |
|    | IDCTValue | dequantized value ready for inverse discrete cosine transform operation |
|    | Wordddress | base address of word including first bit to decode |
| D4 | NextWord | following data word |
|    | Dummy0001 | register set but not used |
|    | UsedBits | total number of bits used by Huffman code and encoded value |
|    | Bit31 | Hex "80000000" |
| D5 | Thisword | data word containing next bit to decode |
|    | Dummy0003 | register set but not used |
|    | QuantStep | quantization multiplier |
| D6 | RunSize | packed size of field and zero run length (4 bits each) |
| D7 | PosOffset | run length of zeros plus 1 |

Table 57 lists proposed address register assignments for implementing this example of a Huffman decode algorithm.

TABLE 57

| Address Register | Variable Name | Data Assignment |
|---|---|---|
| A0 | L_Space | pointer to local scratchpad memory |
| A1 | L_BitsUsedAddress | base address for bits used |
| A2 | L_WordAddressBase | base address of word containing the first bit to decode |
| A3 | L_RunSizeAddress | base address of size/run |
| A8 | G_QuantizationTable | quantization table base address |
| A9 | G_IDCTBase | base address of 8 by 8 output block |
| A10 | G_ZigZagLuTop | address register zig-zag scan table look-ups |
| A11 | G_Space | pointer to global scratchpad memory |

Table 58 lists proposed index register assignments for implementing this example of a Huffman decode algorithm.

TABLE 58

| Index Register | Variable Name | Data Assignment |
|---|---|---|
| X0 | L_WordAddressX | address word containing next bit to decode |

TABLE 58-continued

| Index Register | Variable Name | Data Assignment |
| --- | --- | --- |
| X1 | L__HuffLUTX | offset address for Huffman look-up table |
| X8 | G__OffsetX | index register for zig-zag scan table look-ups |
| X10 | G__ZigZagDCTX | index register for zig-zag scan table look-ups |

This example of Huffman decoding includes two parts. Instructions 1 to 9 involve initial loop set up. This portion of the program also deals with an initial DC term which has a size of 6 bits. Instructions 10 to 20 form a loop for decoding the stream of Huffman encoded data. These are AC terms and include a run value of 4 bits and a size value of 4 bits. Each pass through the loop decodes one instance of Huffman encoded data. Note that instructions 1 to 9 do not include the necessary loop set up for the loop including instructions 10 to 20. This is accomplished in a manner previously described.

Instruction 1 sets a word address index L__WordAddressX. The algorithm keeps a bit address BitAddress which points to the next bit to be decoded. Instruction 1 sets L__WordAddressX as BitAddress right rotated 5 bits. Thus BitAddress is divided by $2^5=32$ to obtain the address of the next 32 bit word. The Nop of Instruction 2 is required by the pipeline so that the value of L__WordAddressX set in the execute pipeline stage of instruction 1 is available during the address pipeline stage operation of instruction 3.

Instruction 3 loads the data word including the next bit to be decoded. Instruction 3 is a local address unit operation. A register is loaded from the memory location equal to the sum of a base address L__WordAddressBase and the just computed index address L__WordAddressX. The syntax of this instruction indicates that L__WordAddressX as scaled to the selected data size is pre-added to L__WordAddressBase, which is modified by the addition.

Instruction 4a forms an aligned version of the next bits to be decoded. ThisWord just loaded from memory contains the next bit to be decoded. The left rotate by the value BitAddress aligns the next bit to be decoded into bit 31 of AlignedWord, the most significant bit. Note that only the five least significant bits of BitAddress are used by the hardware of data unit 110 in this rotate operation. Thus the rotate is limited to the range of 31 bits. Instruction 4b is a local address unit operation. Instruction 4b loads the next data word in memory following ThisWord. Note that the base address of L__WordAddressBase was set to the address of ThisWord in instruction 3. Thus L__WordAddressBase plus 1 scaled to the data size is the address of the next data word.

Instruction 5 forms Cur32Bits as the next 32 bits to be decoded. Cur32Bits differs from AlignedWord because AlignedWord probably includes less than 32 of the next bits to be decoded. AlignedWord is masked with the inverse of BitAddress. This mask ~%BitAddress has a number of least significant "0's" equal to the number of the five least significant bits of BitAddress with the most significant bits equal to "1's". This ANDed with AlignedWord selects the next following data to be decoded. The mask %BitAddress has a number of least significant "1's" equal to the number of the five least significant bits of BitAddress with the most significant bits of this mask equal to "0's". NextWord is left rotated by the number of the five least significant bits of BitAddress. The AND thus selects the number of most significant bits of NextWord to fill the 32 bits of Cur32Bits.

Instruction 6a sets an address index L__HuffLUTX. Instruction 6a is an unsigned right rotate of Cur32Bits by 26 places. This puts the 6 most significant bits of Cur32Bits into the 6 least significant places and zero fills the remaining places. The address index L__HuffLUTX is used as an index into a look-up table. Instruction 6b resets the address L__WordAddressBase in an address arithmetic operation. The syntax of instruction 6b pre-subtracts L__WordAddressX as scaled by the data size from L__WordAddressBase. This reverses the base address modification of instruction 3. The address register is modified in this way because it makes loading NextWord easier. Without such modification of L__WordAddressBase by L__WordAddressX, computing the address of Next Word would require an arithmetic unit operation an consequent delay slots before the computed address could be used in the load operation. This is an example where using address arithmetic saves operations. Note that the same net operation could be achieved using a memory load into Dummy0000. An actual memory load operation is not used in this example to reduce the possibility of memory contention at crossbar 50. The Nop of instruction 7 is required by the pipeline so that the value of L__HuffLUTX set in the execute pipeline stage of instruction 6 is available during the address pipeline stage operation of instruction 8.

Instruction 8 is a local address unit operation. This is a look-up table operation using a base address of L__BitsUsedAddress and an index of L__HuffLUTX scaled to the data size. The load operation is a signed byte operation according to the "sb" mnemonic. UsedBits is set to a sign extended byte equal to the data stored at the address of the sum of L__BitsUsedAddress and L__HuffLUTX scaled to the data size. This look-up table operation converts the next 6 bits to be decoded into a number of bits used, expanding the size quantity into the sum of the run, size and value bits.

Instruction 9a updates BitAddress by adding the just determined UsedBits. Instruction 9b loads into L__BitsUsedAdddress an address stored in a global scratchpad memory at location O__AC__BitsUsedAddress. This address is the address of the beginning of a look-up table. Note that O__AC__BitsUsedAddress is not an index register but rather a code for a short offset value. This instruction 9c loads RunSize. This unsigned byte load (mnemonic "ub") is from a look-up table having a base address L__RunSizeAddress and a location equal to the index L__HuffLUTX scaled to the data size. Thus the index L__HuffLUTX serves as an index into two tables, a first to determine UsedBIts (instruction 8) and a second to determine RunSize.

A loop used for Huffman decoding starts at instruction 10, which is given the labels HuffmanLoopStart and Jump__Back__In. Many of the steps previously described in the start up portion of the program are repeated within the loop. Instruction 10a sets WordAddress equal to BitAddress right shifted 5 places. This converts a bit address into a word address in a manner previously described regarding instruction 1. Instruction 10b is a branch instruction. The branch destination is stored in a location corresponding to O__ExtendedTableDecode within the global scratchpad memory starting at G__Space. Note O__ExtendedTableEecode is an instruction specified short offset value. The "c" mnemonic indicates this branch is taken if the arithmetic logic unit operation BitAddress=BitAddress+UsedBits generates a carry output. Note that this arithmetic logic unit operation setting the carry output is the same for initial entry into the loop via instruction 9 and return to the loop start from instruction 20. This branches the program out of this loop for the case in which the space for storing the next bits to be decoded, which are pointed to by BitAddress, is exceeded. The program continues from the location stored at O_ExtendedTableDecode to reuse the memory holding the next bits to be decoded by loading additional bits from another memory. Once this house keeping is complete, the program returns to instruction 10 via the label Jump_Back_In.

Instruction 11a computes PosOffset. RunSize is left rotated 28 bits and masked by a mask having bits 31 to 28 all "0's" and bits 27 to 0 having all "1's" (%28). This effectively right shifts RunSize by 4 bits. Note that this particular manner of generating the right shift takes advantage of a 5 bit offset value setting both the rotate amount and the mask input. Since cin is set by the arithmetic logic unit operation of the previous instruction, which is only a rotate operation, cin is always "1". Thus PosOffset is set equal to one more than 0-Run. Instruction 11b sets the index register L_WordAddressX equal to the previously computed value WordAddress. This technique sets L_WordAddressX rather than directly setting this register as in instruction 1 because the direct setting of the non-data register requires global port source bus Gsrc 105 and global port destination bus Gdst 107 is inconsistent with the condition branch instruction in instruction 10b. Instruction 11c loads data register D0 with a code used in a later extended arithmetic logic unit operation. This code is stored in the local scratchpad memory at a location corresponding to an offset value Tealu_Function.

Instruction 12a modifies the extended arithmetic unit operation code stored in data register D0. FieldSize, which is also stored in data register D0, is replaced with the AND of the just recalled FunctionEalu and the four least significant bits of RunSize. These are extracted with the mask %4. This extracts the size from RunSize and stores it in the default barrel rotate amount field "DBR" of data register D0. Thus the default barrel rotate amount in the later extended arithmetic logic unit operation is set by this merge instruction. To facilitate this merge, the data stored in bits 4 to 0 at index Tealu_Function within the local scratchpad memory should be "00000".

Instruction 12b sets the loop counter LC1 equal to RunSize. In the MPEG standard blocks of graphic data are transformed via a discrete cosine transform (DCT). This transformation converts the pixel data into two dimensional frequency data. The two dimensional frequency data is scanned via a zig-zag pattern from low frequency data to high frequency data. This moves low frequency data into the first transformed values and high frequency data into later transformed values. Most graphic blocks will have a minimum of high frequency data. This means that many of the transformed data values will be near zero and suitable for encoding according to the technique shown in Table 54. This transformation also means that in most instances a point in the data stream will be reached where the remaining transformed values are all zero. In the MPEG standard this state is signaled by a RunSize value of "00000000". When such a RunSize value is found, then an entire block of data is decoded and the loop should be re-initialized. Thus if RunSize is an end of block marker equal to "00000000", then the loop count is zero and the loop is not re-entered.

Instruction 13a updates the value of G_OffsetX. G_OffsetX determines if all 64 bins of a block have been used. Note this would only occur if the last bin where nonzero. Otherwise a RunSize of zero would be the last data for a block. The index G_OffsetX stores the accumulated runs of RunSize via PosOffset. Since PosOffset is negative, G_OffsetX becomes less than or equal to zero when the 64 bins of a block are complete. Note that the additional 1 in PosOffset is needed to insure that each instance of a bin value is counted. Instruction 13b loads the data word including the next bits to be decoded into ThisWord in the same manner as instruction 3.

Instruction 14a is an extended arithmetic logic unit operation. This instruction performs the logic operation AlignedValue=Cur32Bits\\UsedBits&%FieldSize. The left rotate of Cur32BIts by UsedBits replaces the next bits to be decoded from the most significant bits to the least significant bits. This is masked by FieldSize. This aligns the value portion of the next bits to be decoded into the least significant bits of AlignedValue. Instruction 14b sets the loop count in LC1 to "0" from the zero value address register A15 if the arithmetic logic unit operation of instruction 13a generates a result less than or equal to zero according to the "le" mnemonic. As previously discussed, this indicates that an entire block has been decoded and thus the loop should be exited.

Instruction 15a is similar to instruction 4a. This places the next bits to be decoded from ThisWord into the most significant bits of AlignedWord. Instruction 15b sets an index G_ZigZagDCT from a look-up table starting at the address stored in G_ZigZagLUTop based upon the previously computed index value G_Offset. As previously stated the MPEG encoding technique involves standard blocks of graphic data transformed via a discrete cosine transform (DCT). Decoding requires computation of an inverse discrete cosine transform (IDCT). The order of use of the decoded values depends upon the algorithm computing the inverse discrete cosine transform. Use of the look-up table starting at the address of G_ZigZagLUTop, enables a single look-up table to handle a zig-zag scan pattern as well as this preferred ordering of components for the inverse discrete cosine transform algorithm. Instruction 15c loads NextWord from memory in the same manner as previously described at instruction 4b.

Instruction 16a is similar to instruction 5. This instruction forms Cur32Bits as a full 32 bit word with the next bit to be decoded to in the most significant bit. Instruction 16b is a global memory load. The address L_RunSizeAddress is loaded with the value from the global scratchpad memory pointed to by offset value O_AC_RunSizeAddress. Instruction 16c sets Bit31 equal to the data stored in the local scratchpad memory at a location indicated by offset tBit31. In accordance with this example, the data at this address is Hex "80000000", or bit 31 set to "1" and all other bits "0". This is used in a masking operation to be described below.

Instruction 17a performs a test on the data of AlignedValue. AlignedValue is ANDed with Bit31 (Hex "8000000") as left rotated by FieldSize. Bit31 as left rotated by FieldSize sets a "1" at the most significant bit of the value stored in AlignedValue. As evident from the examples of Table 54, negative values have a "0" in this location and positive values have a "1" in this location. Thus if the encoded value is negative, then the result is zero and the "Z" bit of status register SR 210 is set. If the encoded value is positive, then the result is nonzero and the "Z" bit of status register SR 210 is not set. As indicated by the register designation Dummy0001, the data stored in the destination register is never used. This instruction only sets the status bits in status register SR 210. Instruction 17b performs a function similar to instruction 6a. Instruction 17b loads L_HuffLUTX with the third unsigned byte of Cur32Bits. Note that the DC term handled in instruction 6a had 6 size bits, while the AC term handled in instruction 17b includes a byte consisting of 4 run bits and 4 size bits. Instruction 17c is an address arithmetic instruction which recovers the base word address stored in L_WordAddressBase. This is similar to instruction 6b.

Instruction 18a used the zero status bit "Z" set in instruction 17a. AdjustedValue is replaced with the difference of AdjustedValue and a mask of FieldSize if the result of instruction 17a was zero. Thus if the encoded value is negative it is subtracted from constant having a number of "1's" equal to the field size. Inspection of Table 53 indicates that this subtraction recovers the encoded number in signed form. Note in instruction 17a that AlignedValue and AdjustedValue are assigned the same data register D3, thus the data is unchanged if the test fails. Instruction 18b is a memory load operation. QuantStep is loaded with a quantization multiplier constant corresponding to the current bin of the 64 bins of a data block. This quantization multiplier constant is stored in a look-up table beginning at the address stored in G_QuantizationTable at a location corresponding to the value of index G_OffsetX. Note that G_OffsetX is set at instruction 13a and corresponds to the current bin.

Instruction 19a is a multiplication operation. The product of the just loaded QuantStep and AdjustedValue determines IDCTValue. IDCTValue is a dequantized value ready for inverse discrete cosine transform. This is the desired result of the Huffman decode operation. Instruction 19b updates the value of UsedBits in the same manner as instruction 8.

Instruction 20 is the last instruction of the loop and is labeled End_of_Tight_Loop. Instruction 20a updates BitAddress in the same fashion as instruction 9a. Note that the carry of this operation determines whether the conditional branch is taken at instruction 10b for the next iteration of the loop. Instruction 20b stores the just determined value of IDCTValue in a variable table starting at the address of G_IDCTBase. The index G_ZigZagDCTX which selects the location within this table was set in instruction 15b based upon the current bin stored in G_OffsetX. Thus the decoded value is stored in the order optimal for the inverse discrete cosine transform algorithm. Note the "h" mnemonic indicates that this is a half word or 16 bit data transfer. Instruction 20c loads RunSize in the same fashion as instruction 9c.

The loop of instruction 10 to 20 repeats until encountering one of three exits. If BitAddress+UsedBits generates a carry, the instruction 10b branches to another program sequence to handle loading additional data. Generally, once new data is loaded this loop will be re-entered at instruction 10, label Jump_Back_In. The loop exits when an end of block RunSize of "00000000" occurs. This indicates the end of a block of data. The loop also exits when G_OffsetX is decremented to zero via PosOffset.

Another widely used operation in graphics processing is the mean squared error. Mathematically this is expressed as:

$$MSE = \frac{1}{n \times m} \sum_{x=0}^{n} \sum_{y=0}^{m} (x - y)^2$$

A straight forward approach involves two nested loops forming the summations into a running sum. The division by the product of n and m takes place following the completion of the nested loops. The kernel includes forming the difference and the square and the data move operations to transfer data from memory 20 to the data registers of the particular digital image/graphics processor 71, 72, 73 or 74. This process is similar to the process noted above with respect to the sum of the absolute difference values.

Such a straight forward approach may not use the hardware resources with the greatest efficiency. Multi-processor integrated circuit 100 may provide several techniques for performing the same function. As examples only, address unit arithmetic may replace arithmetic operations employing data unit 110 or register-to-register moves with field extraction and sign/zero extension may replace mask and rotate operations employing data unit 110. In many cases these alternate operations involve differing characteristics in precision supported, timing and availability of intermediate results and the like. As an example, multiple arithmetic can greatly speed many operations, if the algorithm needs only the reduced number of bits available. Suppose as an example that the quantities x and y are only eight bit values. Using multiple arithmetic to simultaneously form four differences may result in a 9 bit difference with the borrow term formed as the section carry output. This ninth bit can be stored in multiple flags register 211 for later use. Note that the square of the difference is the same as the square of the absolute value of the difference. Thus it is possible to limit the differences formed to 8 bits using the absolute value technique described above. Then multiplier 220 can perform a multiple 8 by 8 multiply to form two squares simultaneously. The lower two bytes are properly positioned for such a multiple multiply operation. The upper two bytes may be extracted and positioned using either barrel rotator 235 or field extract/extend moves. Two running sums are formed, one for the upper byte differences and one for the lower byte differences. The squared error terms are 16 bits, therefore 32 bits are needed to store these running sums. As in the case of the sum of absolute difference values described above, the two running sums are added during wrap up.

An inner loop kernel for the mean squared error algorithm is listed below.

| | | |
|---|---|---|
| 1a. | | Err =mc CurrBlk−PredBlk |
| 1b. | ‖ | LX_SqErr0 =uh0 Sq_ErrA |
| 1c. | ‖ | Dummy = &*(LA_SumA+=LX_SqErr2) |
| 2a. | | ABS_Err =m (0+Err)& @MF |
| | | | (0−Err)&~@MF |
| 2b. | ‖ | LX_SqErr1 = uh1 Sq_ErrA |
| 2c. | ‖ | CurrBlk =w *LA_Curr |
| 3a. | | SQ_ErrA =mu ABS_Err * ABS_Err |
| 3b. | ‖ | ABS_ErrB = EALUT(Hex "00", ABS_Err) |
| 3c. | ‖ | LX_SqErr2 =uh0 SQ_ErrB |
| 3d. | ‖ | Dummy = &*(LA_SumA+=LX_SqErr0) |
| 4a. | | Sq_ErrB =mu ABS_ErrB * ABS_ErrB |
| 4b. | ‖ | MSE_SumB = EALUT(MSE_SumB, Sq_ErrB) |
| 4c. | ‖ | PredBlk =w *GA_Pred |
| 4d. | ‖ | Dummy = &*(LA_SumA+=LX_SqErr1) |
| 5a. | | LX_SqErr0 =uh0 Sq_ErrA |
| 5b. | ‖ | Dummy = &*(LA_SumA+=LX_SqErr2) |
| 6. | | LX_SqErr1 =uh1 Sq_ErrA |
| 7a. | | LX_SqErr2 =uh0 Sq_ErrB |
| 7b. | ‖ | Dummy = &*(LA_SumA+=LX_SqErr0) |

Table 59 shows the register assignments used in the example of this algorithm listed above. Those skilled in the art would realize that other register assignments may also perform this same loop kernel.

TABLE 59

| Register | Variable Name | Data Assignment |
|---|---|---|
| D0 | | default rotate amount 16 |
| D1 | MSE_SumB | second running sum |
| D2 | Sq_ErrB | second squared error |
| D3 | | Hex "00000000" |

TABLE 59-continued

| Register | Variable Name | Data Assignment |
|---|---|---|
| D4 | ABS_Err | absolute value of error |
|  | Sq_ErrA | first squared error |
| D5 | dummy | unused result |
|  | PredBlk | preceding block value |
| D6 | CurrBlk | current block value |
| D7 | ABS_ErrB | second absolute error |
|  | Err | error difference |
| A0 | LA_SumA | first sum address |
| A1 | LA_Curr | current block address |
| A8 | GA_Pred | preceding block address |
| X0 | LX_SqErr0 | first square error index address |
|  | LX_SqErr2 | second square error index address |
| X1 | LX_SqErr1 | third square error index address |

In Table 59: D0 through D7 are data registers in data unit 110; A8 is an address register in global address unit 610; A0 and A1 are address registers in local address unit 620; X0 and X1 are index registers in local address unit 620.

The data unit operation of the first instruction (1a) forms the difference between the current block value CurrBlk and the preceding block value PredBlk. The "mc" mnemonic indicates this is a multiple operation and that the carries are stored in multiple flags register 211. In this example, there are four eight bit subtracts taking place simultaneously. The global address unit operation of the first instruction (1b) loads the first byte of the first squared error into index register X0. Note that the mnemonic "uh0" indicates that this load operation extracts the first byte (byte 0) into a half word (16 bits) of the destination with zero extension. The local address unit operation of the first instruction (1c) performs an address unit arithmetic operation. The "+=" operator indicates that this address unit operation employs pre-addition of the index register to modify the base address register. This operation adds a second squared error term LX_SqErr1 stored in index register X0 to a running sum stored in address register A0. Note that the destination register D5 is a dummy and the data is stored in the modified address register A0.

The data unit operation of the second instruction (2a) forms the absolute value of the differences. Note that the carry-outputs stored in multiple flags register 211 controls whether the addition or the subtraction takes place. The "m" mnemonic indicates that this is a multiple operation, thus individual bits from multiple flags register control corresponding multiple sections. As explained above, this absolute value restricts the difference to eight bits enabling an 8 bit by 8 bit split multiply operation, thereby doubling the speed of computation over a 16 bit by 16 bit multiply operation. The global address unit operation (2b) is a byte load. The "uh1" mnemonic indicates that this load operation extracts the second byte (byte 1) into a half word (16 bits) of the destination with zero extension. The local address unit operation is a data load. The current block data stored in memory at the address stored in address register A0 is loaded into data register D6. The "w" mnemonic indicates that this is a word (32 bit) data transfer. The address register A1 is post incremented corresponding to the data size to point to the next 32 bit data word.

Instruction 3 includes a multiply operation forming the square. The first data unit operation (3a) in a multiple unsigned "mu" 8 bit by 8 bit multiply operation. The data is the absolute value of the difference stored in data register D4 and the result is stored in D4. The second data unit operation is an extended arithmetic logic unit true (EALUT) operation. Note that the multiple multiply operation is supported only in conjunction with an extended arithmetic logic unit operation. Thus the desired set of function signals are pre-loaded in the "EALU" field (bits 26–19) of data register D0. This should occur during a set up portion of the program not shown above. The particular extended arithmetic logic unit operation called for in instruction 4b is a rotate and add. The rotate is the default barrel rotate amount stored in the "DBR" field (bits 4–0) of data register D0, which is 16. Note that data register D3 is pre-loaded with the value Hex "00000000", thus adding zero during the rotate and add operation. This prepares the two differences in the most significant bits for multiple multiplication by rotating them to the 16 least significant bits. The global address unit operation (3c) loads the first byte (byte 0) of data register D2 into a half word (16 bits) of index register X0 with zero extension. The local address unit operation (3d) performs an address unit arithmetic operation using pre-addition of the index register to modify the base address register. This adds a first squared error term LX_SqErr0 stored in index register X0 to a running sum stored in address register A0. The destination register D5 is a dummy and the desired data is stored in the modified address register A0.

The operations of instruction 4 are similar to those of instruction 3. Instruction 4 includes a multiple unsigned multiply operation (4a), which forms another set of squared error terms. Instruction 4 also includes an extended arithmetic logic unit operation (4b), which is a rotate and add operation the same as instruction 3b. In this case a second squared error term Sq_ErrB stored in data register D4 is rotated 16 bits and added to the most significant bits of a running sum MSE_SumB stored in data register D1. The global address unit operation loads a word "w" of data from the address stored in address register A8 into data register D5. This operation loads the preceding block data into data register D5, which is subtracted during instruction 1a of the next cycle through the loop kernel. The local address unit operation (4d) is an address unit arithmetic operation using pre-addition of the index register to modify the base address register. This adds the second squared error term LX_SqErr1 stored in index register X1 to the running sum stored in address register A0. Note that the destination register D5 is a dummy and the global address unit load operation aborts this local address unit load operation. However, this is of no consequence because the desired data is stored in the modified address register A0.

Instruction 5 includes only address unit operations. The global address unit loads index register X0 with a zero extended half word from the first byte (byte 0) of data register D4. This operation loads a squared error term formed during instruction 3a into the index register. The local address unit performs an address arithmetic operation incrementing a running sum stored in address register A0 by a third squared error term. Note that the data stored in data register D5 is not used.

Instruction 6 includes only a global address unit operation. The global address unit loads index register X1 with a zero extended half word from the second byte (byte 1) of data register D4. This operation loads the other squared error term formed during instruction 3a into the index register.

Instruction 7 includes only address unit operations. The global address unit loads index register X0 with a zero extended half word from the first byte (byte 0) of data register D2. This operation loads a squared error term formed during instruction 4a into the index register. The local address unit performs an address arithmetic operation incrementing a running sum stored in address register A0 by a first squared error term.

This loop kernel assumes use of hardware loop logic 720 for control of the iterations necessary to form the summation. This may involve two nested loops as mathematically implied in the double summation or some form of unrolled loop that traverses the same terms. Note that this loop kernel also presupposes that the data terms are properly loaded in memory accessible by local address unit 620, that is all the data is stored in the corresponding memories. Additional outer loop operations handle the case where the number of elements in the summation is too large to be stored in the corresponding memories. Some wrap up operations complete the mean squared error computation. The two running sums stored in data register D1 and address register A0 are added to form the final summation. This summation is divided by the number of elements to determine the final mean squared error. However, since this loop kernel forms the most often executed portion of the program, efficiency at this point is most critical.

Median filtering is another technique widely used in image processing. Median filtering is a nonlinear signal processing technique useful in image noise suppression. Each input pixel is replaced with the median value pixel within a block surrounding the input pixel. It is known to employ a 3 pixel by 3 pixel block surrounding the input pixel at the center. Median filtering does not effect step functions or ramp functions in the image data. However, median filtering is very effective against discrete impulse noise, especially single pixel noise. Real time implementation of median filtering requires comparisons of each 3 by 3 pixel block at the pixel input rate.

FIG. 48 illustrates a median filter algorithm suitable for use by multiprocessor integrated circuit 100. This algorithm operates separately on each column of the 3 by 3 block of pixels having the current pixel at the center. The comparisons for each column then determine the median value. In the example described in detail below, four 3 by 3 blocks of 8 bit pixels are processed simultaneously using multiple arithmetic logic unit operations. When moving to the next adjacent 3 by 3 pixel block, the column comparisons for the two overlapping columns are retained. The new comparison values for the new third column are found, and then employed in determining the new median. This technique permits reduction in the determination of the column comparisons. The algorithm advantageously employs conditional operations to eliminate branches and their corresponding pipeline delay slots.

Figure 48A:
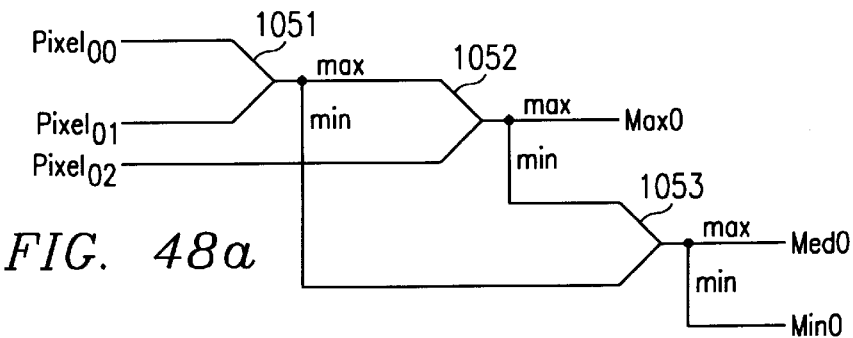
FIGS. 48a, 48b, 48c, 48d and 48e illustrate in schematic form a median filter algorithm.

FIG. 48a illustrates the processing of each column of the 3 by 3 block. This processing makes comparison of the pixel values of each of the three pixels in the column. FIG. 48a illustrates the comparisons for column 0, but the comparisons for columns 1 and 2 are identical. Comparison 1051 determines the minimum and the maximum of $Pixel_{00}$ and $Pixel_{01}$. The maximum of this comparison is passed to comparison 1051, which determined the minimum and the maximum of this maximum and $Pixel_{02}$. The maximum of comparison 1052 is the maximum of the column, designated Max0. Comparison 1053 determines the minimum and maximum of the minimums of comparisons 1051 and 1052. The maximum of comparison 1053 is the median of the column, designated Med0. The minimum of comparison 1053 is the minimum of the column designated Min0. As noted above, this same set of comparisons is applied to the pixel values of column 1 yielding Max1, Med1 and Min1 and to the pixel values of column 2 yielding Max2, Med2 and Min2.

Figure 48B:
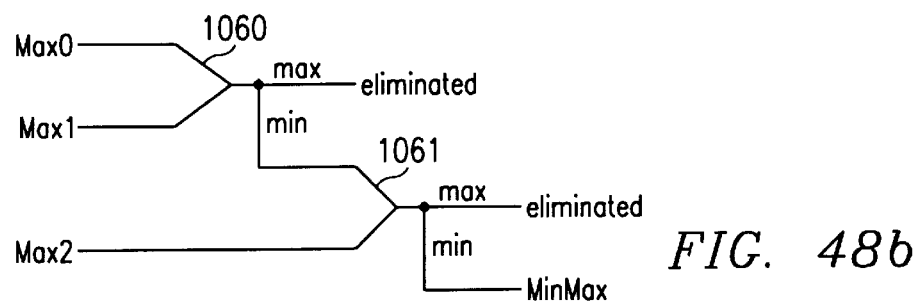

FIG. 48b illustrates the processing of the respective column maximum values Max0, Max1 and Max2. Comparison 1060 determines the minimum of Max0 and Max1. Note that the maximum of comparison 1060 is discarded. Comparison 1061 determines the minimum of the minimum result of comparison 1060 and Max2. The maximum of comparison 1061 is discarded and the minimum is designated MinMax. The value of MinMax is the minimum of the column maximum values.

Figure 48C:
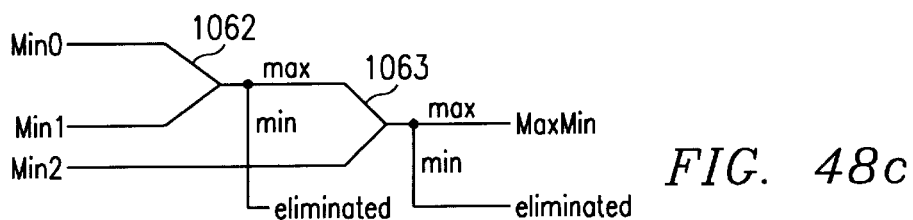

FIG. 48c illustrates the processing of the respective column minimum values Min0, Min1 and Min2. Comparison 1062 determines the maximum of Min0 and Min1. Note that the minimum of comparison 1062 is discarded. Comparison 1063 determines the maximum of the maximum result of comparison 1062 and Min2. The minimum of comparison 1063 is discarded and the maximum is designated MaxMin. The value of MaxMin is the maximum of the column minimum values.

Figure 48D:
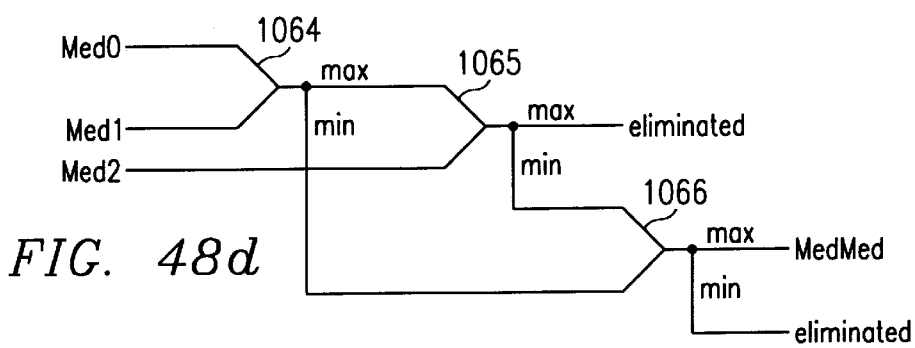

FIG. 48d illustrates the processing of the respective column median values Med0, Med1 and Med2. Comparison 1064 determines the minimum and maximum of Med0 and Med1. Comparison 1065 determines the minimum of the maximum result of comparison 1064 and Med2. Note that the maximum determined by comparison 1065 is discarded. Comparison 1066 determines the maximum of the minimum of comparison 1064 and the minimum of comparison 1065. This value designated MedMed is the median of the column median values. Note that the minimum value of comparison 1066 is discarded.

Figure 48E:
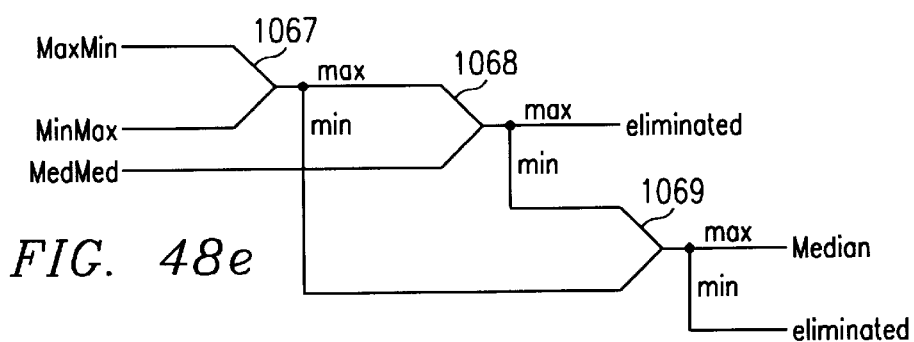

FIG. 48e illustrates the process of determining the block median from MaxMin, MinMax and MedMed. Comparison 1067 finds the minimum and maximum of MaxMin and MinMax. Comparison 1068 determines the minimum of the maximum of comparison 1067 and MedMed. The maximum determined by comparison 1068 is discarded. Comparison 1069 finds the maximum of the minimum of comparison 1068 and the minimum of comparison 1067. This value designated Median is the median value of the 3 by 3 block of pixels. Note that the minimum determined by comparison 1069 is discarded.

Below are the instructions of a loop executing this median filter algorithm. Note that instructions 1 to 9 generally perform the column comparison processes illustrated in FIG. 48a for column 2 of the block, the last column. In this example it is assumed that two column comparisons have already been made and are stored for use. This would be the case if the algorithm were used repeatedly for an entire row of the image data. For the first columns of each row, the steps of instructions 1 to 9 must be repeated for column 0 and column 1. Instructions 10 to 13 perform the column maximum comparison processes illustrated in FIG. 48b. Instructions 14 to 17 perform the column minimum comparison processes illustrated in FIG. 48c. Instructions 18 to 24 perform the column median comparison processes illustrated in FIG. 48d. Lastly, instructions 25 to 31 perform the formation of the median processes illustrated in FIG. 48e.

| 1a. |    | Dummy =mc Pack0 − Pack1 |
|-----|----|----|
| 1b. | ‖ | * (G__Col2SortAddr += [3]) = BlockMed |
| 2a. |    | TmpMax = @MF & Pack0 \| ~@MF & Pack1 |
| 2b. | ‖ | Out1 =b * (G__Col2SortAddr + 1) |
| 3a. |    | TmpMin = ~@MF & Pack0 \| @MF & Pack1 |
| 3b. | ‖ | Out2 =b * (G__Col2SortAddr + 2) |
| 3c. | ‖ | * (L__OutAdddr + LX__Tile1Index) =b Out1 |
| 4a. |    | Dummy =mc TmpMax − Pack2 |
| 4b. | ‖ | Out3 =b * (G__Col2SortAddr + 3) |

-continued

| | | |
|---|---|---|
| 4c. | \| | * (L__OutAddr + LX__Tile2Index) =b Out2 |
| 5a. | | Max2 = @MF & TmpMax \| ~@MF & Pack2 |
| 5b. | \| | Out0 =b * G__Col2SortAddr |
| 5c. | \| | * (L__OutAddr + LX__Tile3Index) =b Out3 |
| 6a. | | TmpMed = ~@MF & TmpMax \| @MF & Pack2 |
| 6b. | \| | * (G__Col2SortAddr -= [3]) = Max2 |
| 6c. | \| | * L__OutAddr ++= [b] Out0 |
| 7a. | | Dummy =mc TmpMin - TmpMed |
| 7b. | \| | Max0 = * G__Col0SortAddr |
| 8a. | | Med2 = @MF & TmpMin \| ~@MF & TmpMed |
| 8b. | \| | Max1 = * G__Col1SortAddr |
| 9a. | | Min2 = ~@MF & TmpMin\| @MF & TmpMed |
| 9b. | \| | * (G__Col2SortAddr + [1]) = Med2 |
| 10a. | | Dummy =mc Max0 - Max1 |
| 10b. | \| | * (G__Col2SortAddr + [2]) = Min2 |
| 11a. | | TmpMin = ~@MF & Max0 \| @MF & Max1 |
| 11b. | \| | Max2 = * G__Col2SortAddr |
| 12a. | | Dummy =mc Max2 - TmpMin |
| 12b. | \| | Min0 = * (G__Col0SortAddr + [2]) |
| 13a. | | MinMax = ~@MF & Max2 \| @MF & TmpMin |
| 13b. | \| | Min1 = * (G__Col1SortAddr + [2]) |
| 14a. | | Dummy =mc Min0 - Min1 |
| 14b. | \| | * (G__Col1SortAddr + [3]) = MinMax |
| 15a. | | TmpMax = @MF & Min0 \| ~@MF & Min1 |
| 15b. | \| | Min2 = * (G__Col2SortAddr + [2]) |
| 16a. | | Dummy =mc Min2 - TmpMax |
| 16b. | \| | Med0 = * (G__Col0SortAddr + [1]) |
| 17a. | | MaxMin = @MF & Min2 \| ~@MF & TmpMax |
| 17b. | \| | Med1 = * (G__Col1SortAddr + [1]) |
| 18a. | | Dummy =mc Med0 - Med1 |
| 18b. | \| | * (G__Col0SortAddr + [3]) = MaxMin |
| 19a. | | TmpMax = @MF & Med0 \| ~@MF & Med1 |
| 19b. | \| | Med2 = * (G__Col2SortAddr + [1]) |
| 20a. | | TmpMin = ~@MF & Med0 \| @MF & Med1 |
| 20b. | \| | In0 =b * (G__InputRow2Addr += 1) |
| 21a. | | Dummy =mc Med2 - TmpMax |
| 21b. | | In1 =b * (G__InputRow2Addr + GX__Tile1Index) |
| 21c. | \| | * L__PackedRow2Addr ++=b In0 |
| 22a. | | TmpMedB = ~@MF & Med2 \| @MF & TmpMax |
| 22b. | \| | In2 =b * (G__InputRow2Addr + GX__Tile2Index) |
| 22b. | \| | *L__PackedRow2Addr ++=b In1 |
| 23a. | | Dummy =mc TmpMedB - TmpMin |
| 23b. | \| | In3 =b * (G__InputRow2Addr + GX__Tile3Index) |
| 23c. | \| | * L__PackedRow2Addr ++=b In2 |
| 24a. | | MedMed = @MF & TmpMedB \| ~@MF & TmpMin |
| 24b. | \| | MinMax = * (G__Col1SortAddr + [3]) |
| 25a. | | Dummy =mc MinMax - MedMed |
| 25b. | | NewCol1SortAddr = G__Col2SortAddr |
| 25c. | \| | *L__PackedRow2Addr ++=b In3 |
| 26a. | | TmpMaxB = @MF & MinMax \| ~@MF & MedMed |
| 25b. | \| | MaxMin = * (G__Col0SortAddr + [3]) |
| 27a. | | TmpMin = ~@MF & MinMax \| @MF & MedMed |
| 27b. | \| | NewCol2SortAddr = G__Col0SortAddr |
| 28a. | | TmpMin = ~@MF & MinMax \| @MF & MedMed |
| 27b. | \| | NewCol2SortAddr = G__Col0SortAddr |
| 28a. | | Dummy =mc MaxMin = TmpMaxB |
| 28b. | \| | G__Col2SortAddr = NewCol2SortAddr |
| 29a. | | TmpMedB = ~@MF & MaxMin \| @MF & TmpMaxB |
| 29b. | \| | NewCol0SortAddr = G__Col1SortAddr |
| 29c. | \| | Pack2 = * (L PackedRow2Addr - [1]) |
| 30a. | | Dummy =mc TmpMin - TmpMedB |
| 30b. | \| | G__Col0SortAddr = NewCol0SortAddr |
| 30c. | \| | Pack1 = * L__PackedRow1Addr ++ |
| 31a. | | BlockMed = @MF & TmpMin \| ~@MF & TmpMedB |
| 31b. | \| | G__Col1SortAddr = NewCol1SortAddr |
| 31c. | \| | Pack0 = * L__PackedRow0Addr ++ |

Table 60 lists proposed data register assignments for implementing this example of a median filter algorithm.

TABLE 60

| Data Register | Variable Name | Data Assignment |
|---|---|---|
| D1 | Pack0 | packed column 2 row 0 pixels |

TABLE 60-continued

| Data Register | Variable Name | Data Assignment |
|---|---|---|
| | Max0 | packed column 0 maximum pixels |
| | Med0 | packed column 0 median pixels |
| | Min0 | packed column 0 minimum pixels |
| | NewCol1SortAddr | temporary for address pointer swap |
| D2 | Pack1 | packed column 2 row 1 pixels |
| | Max1 | packed column 1 maximum pixels |
| | Med1 | packed column 1 median pixels |
| | Min1 | packed column 1 minimum pixels |
| | MedMed | packed median of column medians |
| | NewCol2SortAddr | temporary for address pointer swap |
| D3 | Pack2 | packed column 2 row 2 pixels |
| | Med2 | packed column 2 median pixels |
| | Min2 | packed column 2 minimum pixels |
| | MaxMin | packed maximum of column minimums |
| D4 | MinMax | packed minimum of column maximums |
| | TmpMax | packed intermediate maximums |
| | TmpMedB | packed intermediate medians |
| D5 | TmpMin | packed intermediate minimums |
| D6 | Max2 | packed column 2 maximum pixels |
| | TmpMaxB | packed intermediate maximums |
| | TmpMed | packed intermediate medians |
| | BlockMed | final packed block medians |
| | Out1 | block B median pixel |
| | Out2 | block C median pixel |
| | Out3 | block D median pixel |
| | In0 | input block A pixel |
| | In1 | input block B pixel |
| | In2 | input block C pixel |
| | In3 | input block D pixel |
| | NewCol0SortAddr | temporary for address pointer swap |
| D7 | Dummy | unused result |
| | Out0 | block A median pixel |

As shown in Table 60, more than one variable is assigned to each data register. The complexity of the algorithm requires this reassignment of the data registers. Note that several of the variables are listed as packed variables. This algorithm operates on 4 blocks of eight bit pixels simultaneously employing multiple arithmetic. A packed variable is divided into 4 sections as follows:

|block A pixel|block B pixel|block C pixel|block D pixel|

Packing the variables in this way speeds processing because four pixels may be handled during each arithmetic logic unit operation and fewer memory loads and stores are required.

Table 61 lists proposed address register assignments for implementing this example of the median filter algorithm.

TABLE 61

| Address Register | Variable Name | Data Assignment |
|---|---|---|
| A0 | L_PackedRow0Addr | packed row n input pointer |
| A1 | L_PackedRow1Addr | packed row n+1 input pointer |
| A2 | L_PackedRow2Addr | packed row n+2 input pointer |
| A3 | L_OutAddr | output pointer |
| A8 | G_Col2sortAddr | pointer to sorted column 2 data |
| A9 | G_InputRow2Addr | pointer to unpacked row n+2 |
| A10 | G_Col1SortAddr | pointer to sorted column 1 data |
| A11 | G_Col0SortAddr | pointer to sorted column 0 data |

Table 62 lists proposed index register assignments for implementing this example of the median filter algorithm.

TABLE 62

| Index Register | Variable Name | Data Assignment |
|---|---|---|
| X0 | LX_Tile1Index | pitch between blocks A and B |
| X1 | LX_Tile2Index | pitch between blocks A and C |
| X2 | LX_Tile3Index | pitch between blocks A and D |
| X9 | GX_Tile1Index | pitch between blocks A and B |
| X10 | GX_Tile2Index | pitch between blocks A and C |
| X11 | GX_Tile3Index | pitch between blocks A and D |

All the comparisons are made in a manner not requiring branches. This substantially reduces the time to execute the algorithm due to the elimination of pipeline delay slots. These comparisons used conditional operations based upon the expanded state of multiple flags register 211. Such conditional operations permit selection of either the lesser or the greater of two sets of packed values following a subtraction to set multiple flags register 211.

Instructions 1 to 9 perform the column comparison processes illustrated in FIG. 48a. Instruction 1a forms the difference between two sets of packed pixels. These are the top and center rows of column 2 of the 3 by 3 block. As noted, the actual value of the difference is unimportant for this algorithm and so is designated Dummy. The "mc" mnemonic indicates a multiple operation that stores the respective carry bits in multiple flags register 211. This example operates on pixels of 8 bits, thus arithmetic logic unit 220 is divided into four sections of 8 bits each. This is accomplished by setting both the "Msize" field and the "Asize" field of status register 210 to "100". Thus each packed variable Pack0 and Pack1 include a pixel from an A, a B, a C and a D block. Instruction 1b is a store operation controlled by global address unit 610 that temporarily stores packed block median data from the prior loop at the global column 2 sort address designated by G_Col2SortAddr as incremented by an offset value of 3 as scaled via index scaler 614 by the data size. Since this is a word access the scaling is three bit positions. The instruction format incicates that G_Col2SortAddr is pre-incremented and modified.

Instruction 2a merges the maximums of the packed column 0 and column 1 pixels. If Pack0−Pack1>0 and thus Pack0>Pack1 for any of the blocks A, B, C or D, then instruction 1a generates a carry/borrow signal of "1". Multiple flags register 211 stores this "1". During instruction 2a this "1" is expanded in expander 238 to "11111111" (@MF).

Thus the OR of instruction 2a returns the value from Pack0. Alternatively, if Pack0−Pack1<0 and thus Pack1<Pack1, then instruction 1a generates a carry/borrow signal of "0". Multiple flags register 211 stores this "0" until instruction 2a, when expander 238 expands it to "00000000" (~@MF). Thus the OR of instruction 2a returns the value from Pack1. Thus TmpMax stores the block wise maximums of rows 0 and 1 of column 2 of the blocks A, B, C and D. This completes determination of the maximum of comparison 1051. Instruction 2b loads the median value of block A from the prior loop stored in one more than the global column 2 sort address into a data register employing global address unit 610. The "b" mnemonic indicates that this is a byte load operation.

Instruction 3a is the inverse of instruction 2a. Note that the @MF term in instruction 3a is of the opposite sense in the two halves of the OR statement than that of instruction 2a. Instruction 3a uses the carry/borrow data stored in multiple flags register 211 and expander 238 to select the minimums of the packed column 2 pixel values of Pack0 and Pack1. This completes determination of the minimum of comparison 1051. Instruction 3b is a global byte load operation of the block B median pixel into a data register. Instruction 3c is a byte memory store operation. The data stored in data register D6 (Out1) is stored in the memory location having an address equal to the sum of the output pointer L_OutAddr and the n+1 packed row pointer LX_Tile1Index.

Instruction 4a is another subtraction setting carry/borrow bits of multiple flags register 211. In this case the difference is between the packed temporary maximums and the packed row 2 data. This begins comparison 1051. Instruction 4b is a global address unit byte load of the block D median pixel stored at address G_Col2SortAddr plus 2. Instruction 4c is a local address unit byte store of the block B median pixel.

Instruction 5a is similar to instruction 2a. This instruction determines and merges block wise the maximums of TmpMax and the row 3 data stored in Pack2 using the carry/borrow data stored in multiple flags register 211. These merged maximums are stored in Max2. Instruction 5b is a global address unit byte load of the block A medial pixel. Instruction 5c is a local address unit byte store of the block D median pixel.

Instruction 6a is similar to instruction 3a. This instruction determines and forms a block wise merge of the minimums of TmpMax and the row 3 data stored in Pack2 using the carry/borrow data still stored in multiple flags register 211. These merged minimums are stored in TmpMin. Instruction 6b is a global address unit store of the Max2 data formed in instruction 5a. This completes comparison 1052. The instruction mnemonic indicates that global address register G_Col2SortAddr is pre-decremented and modified by the offset value 3 as scaled to the data size in index scaler 614. Instruction 6c is a local address unit store of the median pixel value of block A at the local output pointer address stored in L_OutAddr. This address register is pre-incremented by 1.

Instruction 7a forms a difference to set the carry/borrow signals in multiple flags register 211. As in the case of instructions 1a and 4a the actual difference in discarded. This subtraction begins comparison 1053. Instruction 7b loads the packed column 0 maximum pixels via global address unit 610 from the global column 0 sort address.

Instruction 8a determines the maximum of comparison 1053. This result is the column median Med2. Instruction 8b loads the packed column 1 maximum pixels via global address unit 610 from the global column 1 sort address.

Instruction 9a determines the minimum of comparison 1053. This result is the column minimum Min2. Instruction 9b stores the packed column medians Med2 into memory at the global column 2 sort address plus 1 scaled to the data size.

Instructions 10 to 13 perform the column maximum comparison processes illustrated in FIG. 48b. This involves a comparison of the column maximum pixels for the three column, retaining only the minimum of these column maximums. Instruction 10a forms the difference of Max0 and Max1, setting multiple flags register 211 for the minimum determination in instruction 11. This begins comparison 1060. Instruction 10b stores the packed column 2 minimums to memory via global address unit 610.

Instruction 11a determines the block wise minimums of the column 0 and column 1 maximums. As previously described, this determination is made from the expanded carry/borrow signals stored in multiple flags register 211. This produces TmpMin and completes comparison 1060. Instruction 11b loads the packed column 2 maximums from memory via global address unit 610.

The subtraction of instruction 12a begins comparison 1061. This subtraction sets multiple flags register 211 based upon the carry/borrow output. This begins comparison 1061. Instruction 12b loads the packed column 0 minimums from memory via global address unit 610.

Instruction 13a completes comparison 1061. MinMax is set to the minimum of the respective column maximums for each block A, B, C and D. Instruction 13b loads the packed column 1 minimums from memory via global address unit 610.

Instructions 14 to 17 perform the column minimum comparison processes illustrated in FIG. 48c. Instructions 14a and 15a form the maximums of the packed column 0 and column 1 minimums. This performs comparison 1062. Instruction 16a and 17a perform comparison 1063 between the maximum of comparison 1062 and the column 2 minimums. Instruction 14a stores the packed minimum of the column maximums MinMax formed instruction 13a via global address unit. Instructions 15b, 16b and 17b load the column 2 minimums Min2, the column 0 medians and the column 1 medians, respectively, via global address unit 610.

Instructions 18 to 24 perform the column median comparison processes illustrated in FIG. 48d. Instructions 18a, 19a and 20a perform comparison 1064. Instruction 19a determines the maximums of the column 0 and column 1 medians. Instruction 20a determines the minimums of the column 0 and column 1 medians. Instruction 18b stores the MinMax results of instruction 17a in memory via global address unit 610. Instruction 19a loads the column 2 packed median data Med2. Instruction 20a employs global address unit 610 to load a byte of block A pixel data. This begins a process of rearranging data to be in the desired packed column format for the next loop.

Instructions 21a and 22a perform comparison 1065. The result is TmpMedB, the packed column temporary median values. Instruction 21b loads the pixel data of block B via global address unit 610. Instruction 21c stores the byte of pixel data of block A via local address unit 620. Instruction 22b loads a byte of block C pixel data employing global address unit 610. Instruction 22c employs local address unit 620 to store the byte of block B pixel data.

Instructions 23a and 24a perform comparison 1066. The result is MedMed, the block wise packed median of the column medians. Instruction 23b performs a block load of block D pixel employing global address unit 610. Instruction 23c stores a byte of the block C pixel data using local address unit 620. Instruction 24b loads the packed minimums of column maximum MinMax employing global address unit 610.

Instructions 25 to 31 perform the formation of the median processes illustrated in FIG. 48e. Instructions 25a, 26a and 27a perform comparison 1067. Instruction 26a determines the maximums of MinMax and MedMed. Instruction 27a determines the minimums of MinMax and MedMed. Instruction 25b begins the process of realigning the address pointers for the next loop by setting a temporary value NewCol1SortAddr equal to the prior column 2 global sort address G_Col2SortAddr. Instruction 25c stores a byte of pixel block D data using local address unit 620. Instruction 26b loads the maximum of the column minimums MaxMin via global address unit 610. Instruction 27b continues realigning the address pointers for the next loop by setting a temporary value NewCol2SortAddr equal to the prior column 0 global sort address G_Col0SortAddr.

Instructions 28 and 29 perform comparison 1068. Instruction 28a is a subtraction setting multiple flags register 211. Instruction 29a determines the minimums of MaxMin and the temporary maximum TmpMaxB from instruction 26a. Instruction 28b continues the pointer rotation by setting the global column 2 sort address equal to the new column 2 sort address set in instruction 27b. Instruction 29b continues the pointer rotation by setting a temporary value NewCol0SortAddr equal to the global column 1 sort address. Instruction 29c loads the packed column 2 pixels using local address unit 620.

Instructions 30 and 31 perform comparison 1069 and determine the block medians BlockMed. Instruction 30a is the subtraction setting multiple flags register 211. Instruction 31a determines the maximum of comparison 1069, which is the block medians BlockMed. Instruction 30b continues the pointer rotation by setting the global column 0 sort address equal to the new column 0 sort address NewCol0SortAddr set in instruction 29b. Instruction 30c loads the packed column 1 pixels via local address unit 6320. Instruction 31b completes the pointer rotation by setting the global column 1 sort address equal to the new column 1 sort address NewCol1SortAddr set in instruction 25b. Instruction 31c loads the packed column 0 pixels using local address unit 620.

Several other programming techniques are supported by the above described hardware of the digital image/graphics processors 71, 72, 73 and 74. These include: employing the write priority of Table 51 to perform single instruction "if . . . then . . . else . . . " operations; mixed conditional operations; and zero overhead hardware branches with conditional test for zero.

An example of a single instruction "if . . . then . . . else . . . " operation is listed below. Note that a condition of status register 210 must be set before the single instruction "if . . . then . . . else . . . " operation can be performed. In this example the condition is Data=0.

| | | |
|---|---|---|
| 1. | | Data = Data |
| 2a. | | Zero_Run = Zero_Run + 1 |
| 2b. | ‖ | Zero_Run = [nz] A15 |

Table 63 shows an example of the register assignments for this program code example.

TABLE 63

| Register | Variable Name | Data Assignment |
|---|---|---|
| D6 | Data | test data |
| D7 | Zero_Run | number of consecutive examples of Data = 0 |

Instruction 1 doesn't change the contents, of the data register D6. This instruction does cause the status register 210 to set the negative "N", carry "C", overflow "V" and zero "Z" status bits based upon the result of arithmetic logic unit 230. Though instruction 1 does not change the contents of data register D6, this instruction may still set the negative status "N" if D6<0 or the zero status "Z" if D6=0.

Instruction 2 performs the "if . . . then . . . else . . . " operation. If Data≠0, then the condition of instruction 2b is true. Thus Hex "0" is moved from the zero value address register A15 to data register D7. Thus if Data≠0, then the number of consecutive zeros is set to zero. Note that according to Table 51 this address unit operation has priority over the data unit operation. Thus if the condition is true, the register to register move operation occurs and the data unit operation aborts. Only if Data=0 does the data unit operation of instruction 2a increment Zero_Run. Thus instruction 2 performs "if Data≠0, then Zero_Run=0, else Zero_Run=Zero_Run+1."

Below is a second example of a single instruction "if . . . then . . . else . . . " operation. This example uses a compare for the conditional operation.

| | | |
|---|---|---|
| 1a. | | Dummy = Data1 − Data2 |
| 1b. | ‖ | Dummy = Dummy |
| 2a. | | Data1 = Data2 |
| 2b. | ‖ | Data1 =[1t] A15 |

Table 64 shows an example of the register assignments for this program code example.

TABLE 64

| Register | Variable Name | Data Assignment |
|---|---|---|
| D5 | Data2 | second data element |
| D6 | Data1 | first test element |
| D7 | Dummy | dummy register not used |

The subtraction of instruction 1a effectively compares the numbers Data1 and Data2. If Data1<Date2, then the negative "N" status is set in status register 210. If Data1=Data2, then the zero "Z" status is set. Lastly, if Data1>Data2, then neither of these bits are set. This example illustrates another use of the write priority rules of Table 51. The unconditional address unit register move of Dummy to Dummy, protects Dummy from change while permitting status register 210 to be set based upon the arithmetic logic unit result. The register to register move aborts storing the arithmetic logic unit result. If instruction 1a sets the negative "N" status bit, the instruction 2b sets Data1 equal to zero. Otherwise instruction 2a sets Data1 equal to Data2. Thus instruction 2 performs the operation "if Data1<Data2, then Data1=0, else Data1=Data2."

This same sequence can perform other "if . . . , then . . . , else . . . " operations. The sequence requires a first arithmetic logic unit operation to set status register 210. A following instruction performs the "if . . . , then . . . , else . . . " operation. This instruction includes a conditional data unit register move or load operation based upon at least one condition set in the first instruction. The "else" operation is a data unit operation having the same destination as the register move or load operation.

It is possible to set conditions for conditional operations based upon plural tests. In a first example two tests are ANDed.

1. Dummy=D1−D2
2. Dummy=[z] D3−D4
3. BR=[z] IPRS

Instruction 1 sets the zero "Z" status bit if D1=D2. Instruction 2 is conditional based upon the zero "Z" status bit. If the zero "Z" status bit is "0", then instruction 2 is not performed and no status bits are changed. If the zero "Z" status bit is "1", then instruction 2 is performed, and the status bits are set based upon the difference of D3 and D4. Instruction 3 is a conditional subroutine return. Note writing to BR changes only program counter PC 701 and does not change instruction pointer return from subroutine IPRS 704. Writing to program counter PC 701 places the previous address stored in program counter PC 701 into instruction pointer return from subroutine IPRS 704. This subroutine return is conditional on the zero "Z" status bit. Thus the subroutine return occurs only if D1=D3 and D3=D4 is true. Note that this conditional operation could also be based upon the negative "N" status bit, the carry "C" status bit or the overflow "V" status bit. This conditional operation could also be based upon any of the compound conditions listed in Table 41.

Instruction 3 above is only an example of a conditional instruction. Any desired conditional instruction based upon the selected status bit or bits could be placed here. This could be an arithmetic logic unit operation, a register load operation, a memory store operation of a register to register move operation. Other program flow control operations such as a branch or call are also possible. This conditional instruction may be an "if . . . , then . . . , else . . . " operation such as described above.

In a second example two tests are ORed. This is listed below.

1. Dummy=D1−D2
2. Dummy=[nz] D3−D4
3. BR=[z] IPRS

Instruction 1 sets the zero "Z" status bit if D1=D2. Instruction 2 is conditional based upon the inverse of the zero "Z" status bit (not zero). If the zero "Z" status bit is "1", that is D1=D2, then instruction 2 is not performed and no status bits are changed. If the zero "Z" status bit is "0", then instruction 2 is performed, and the status bits are set based upon the difference of D3 and D4. Instruction 3 is a conditional subroutine return. As stated above, instruction 3 could be any conditional instruction based upon the zero "Z" status bit. If D1=D2, the zero "Z" status bit is "1" and instruction 2 aborted without changing any status bits. Thus instruction 3 executes. If D1≠D2, then instruction 2 executes and the zero "Z" status bit is set to "1" if D3=D4. So instruction 3 executes if D1=D2 OR D3=D4. Note that instructions 2 and 3 could be based upon any single status bit or any compound condition so long as they are logical inverses.

This technique may also be used for mixed conditions. An example of this is listed below.

1. Dummy=D1−D2
2. Dummy=[u.z] D3−D4
3. BR=[le] IPRS

Instruction 1 sets the zero "Z" status bit if D1=D2. The "u.z" mnemonic of Instruction 2 indicates this instruction is unconditional and that the zero "Z" status bit is protected form change by this operation. Thus the negative "N" status bit is set if D3<D4, but the zero "Z" status bit is not set if D3=D4. Instruction 3 is conditional based upon a "less than or equal" condition. As seen in Table 41, this condition is formed by (N&~V)|(~N&V)|Z. Thus the subroutine return is taken if D1=D2 and D3<D4. This is not the only mixed conditional operation feasible. Any compound condition listed in Table 51 (positive p, lower than or same ls, higher than hi, less than lt, less than or equal le, greater than or equal ge or greater than gt) can be used for instruction 3 of this example. Note as previously stated, any conditional instruction can be substituted into instruction 3 for the conditional subroutine return of this example.

Conditional "hardware branching" using the zero overhead loop logic were described above in conjunction with the description of the zero-overhead loop logic. Below is an example of a character search routine using a single instruction with conditional hardware branching. This character search routine makes four byte comparisons per loop using multiple arithmetic.

```
1.              Match = Hex "F0F0F0F0"
2.              LE2 = Loop2_End
3.              LRS2 = 0
4.              LRSE1 = 511
5.              LS2 = Loop2_Start
6.              Data = *(A0 = DBA)
Loop1_Start:
Loop1_End:
Loop2_End:
7a.             Dummy =mz Data - Match
7b.       ||    LS2 = MF
7c.       ||    Data = *A0++
8.              . . .
Loop2_Start:
10.             A0 = A0 - 4
11.             . . .
```

Instruction 1 loads the pattern to be matched into a register. In this case the pattern is one byte long and is repeated 4 times when stored. Instruction 2 sets the loop end address LE2 to the single instruction loop address. Instruction 3 writes the count "0" into both the loop count register LC2 and the loop reload register LR2. Instruction 4 is a single instruction loop fast initialization. Writing "511" to LRSE1 writes the loop count 511 into both loop count register LC1 and loop reload register LR1, loads the value PC+3 into both the loop start register LS1 and the loop end register LE1, and sets the program flow control unit loop control register LCTL to associate loop end register LE1 with loop count register LC1. Instruction 5 the loop start register LS2 with the branch address. Lastly, instruction 6 initializes address pointer A0 and loads the first word to be searched from the memory location pointed to by address pointer A0.

Instruction 7 forms the single instruction loop. Instruction 7a forms the difference between the data loaded in instruction 6 and the reference data Match. The "mz" mnemonic indicates that instruction 7a is a multiple instruction and that the zero status bits are stored in multiple flags register 211. Note that the "Msize" field of data register D0 must have been set to the desired data size. This sets the multiple flags register 211 according to the multiple differences. Instruction 7b loads loop count register LC2 with the data stored in multiple flags register 211. Note that multiple flags register 211 was set by the difference Data-Match of the prior loop. Instruction 7c modifies the address register A0 to point to the next data, and loads this data for the next loop. Instruction 8 starts the portion of the program that handles the case if no match is found before 512 loops recorded by loop count register LC1. Instruction 10 starts the portion of the program that handles the case when a match is found. Note that this instruction is at the address corresponding to Loop2_Start stored in loop start register LS2.

While none of the four bytes of Data and Match are identical, each difference is nonzero. Thus multiple flags register 211 stores all zeros for the four sections. This status result is loaded into loop count register LS2. With loop count register LS2 equal to zero, and loop count register LC1 not equal to zero: loop count register LC1, the outer loop, is decremented; loop count register LC2 is reloaded with the value of loop reload register LR2, which is zero; program counter 701 is loaded with the address stored in loop start register LS1, which is the address of the one instruction loop. Thus the instruction repeats.

The loop may end in two ways. First, loop count register LC1 may decrement to zero. In this case the program continues with instruction 8, the next following instruction. Second, the multiple difference may detect at least one match. In this event multiple flags register 211 is nonzero because at least one of the multiple differences is zero. When this nonzero result is loaded into loop count register LC2, the hardware loop logic branches to the second loop start address, which is Loop2_Start at instruction 10.

Figure 49:
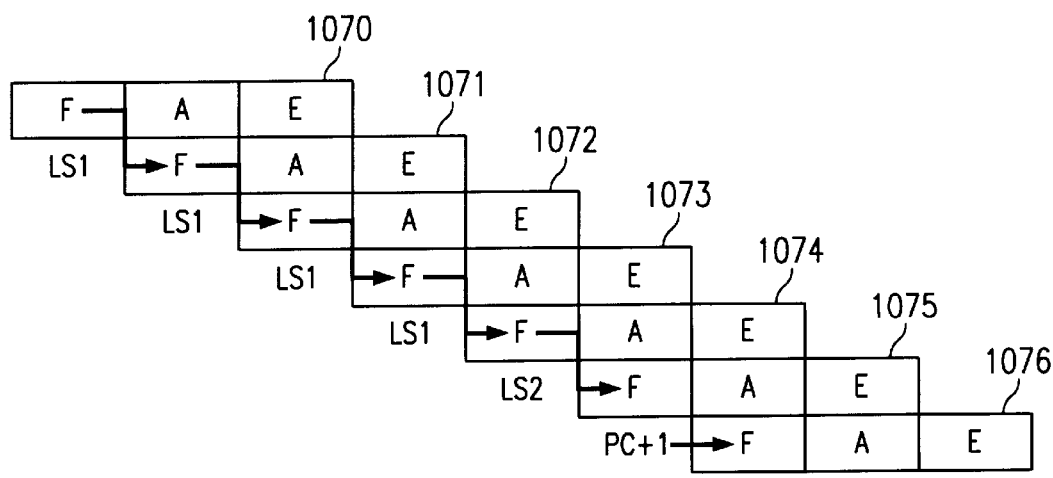
FIG. 49 illustrates the overlapping pipeline stages in an example of a single instruction hardware loop with a conditional hardware branch.

Instruction 10 subtracts 4 from address register A0. This resets address register A0 to the memory location having the match. As illustrated in FIG. 49, the program executes the single loop instruction 7 four times before the branch is taken. In FIG. 49 instruction slot 1070 does not detect a match, thus multiple flags register 211 stores "000". The global address operation of instruction slot 1070 stores a nonzero result in loop count register LC2 from the previous iteration of the loop. In instruction slot 1071 a match is found and at least one of the bits of multiple flags register 211 is not zero. The global address operation of instruction slot 1071 stores the zero multiple flags register 211 contents from the arithmetic operation of instruction slot 1070 in loop count register LC2. The global address operation of instruction slot 1072 stores the nonzero multiple flags register 211 contents from the arithmetic operation of instruction slot 1071 in loop count register LC2. There follows two delay slots, instruction slots 1073 and 1074, which occur because the global address operation executes at the beginning of the execute pipeline stage and two instructions are in the pipeline before the branch can be taken. During each of these instructions the hardware loop logic continues to load the single loop instruction due to the state of loop count register LC1. At instruction slot 1075 the branch is taken and the hardware loop logic branches to Loop2_Start. In instruction slot 1076 program counter 701 advances normally to the next memory address.

Figure 50:
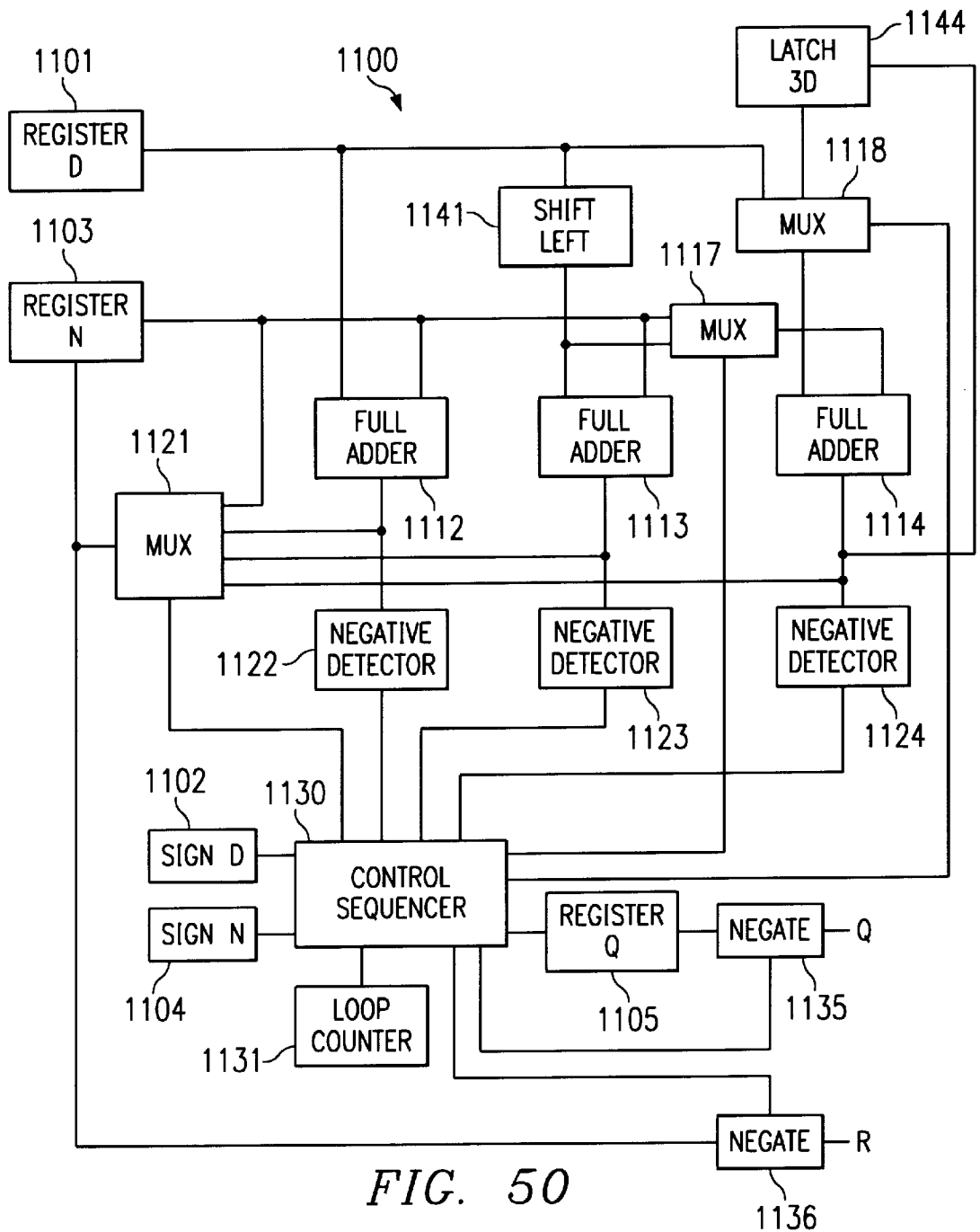
FIG. 50 illustrates in schematic form a hardware divider that generates two bits of the desired quotient per divide iteration.
Figure 51:
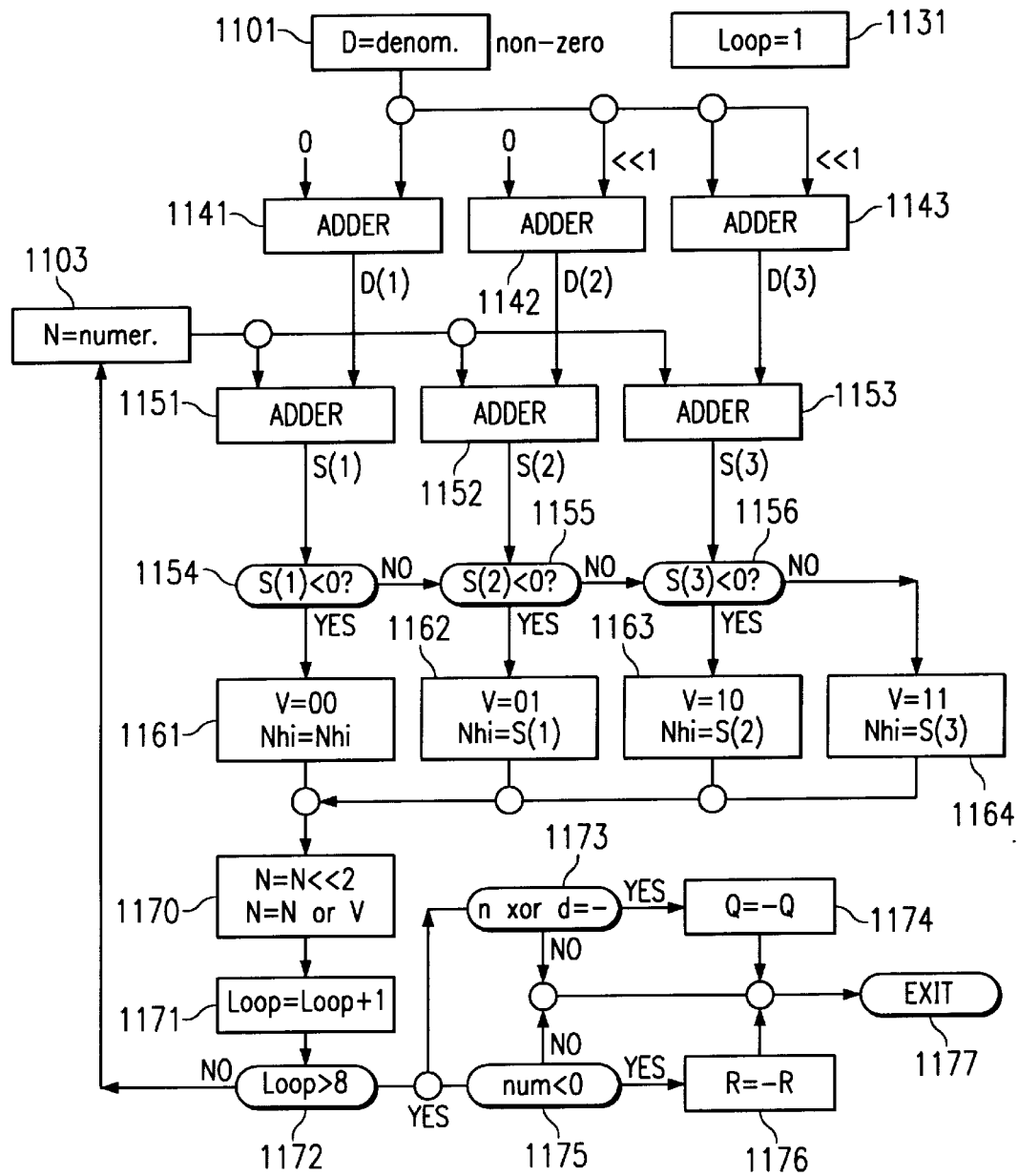
FIG. 51 illustrates in schematic form the data flow within the hardware divider illustrated in FIG. 48.
Figure 52:
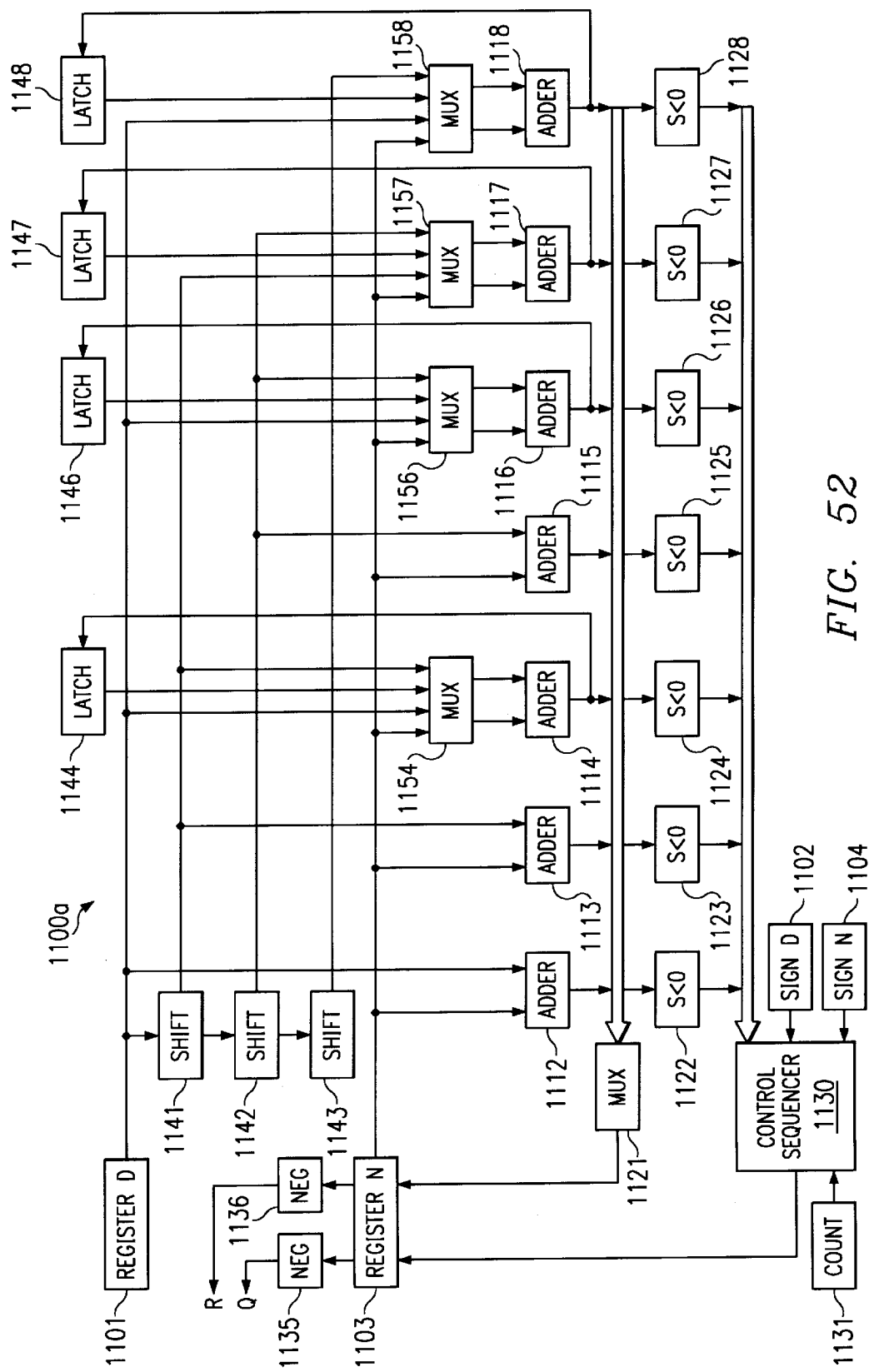
FIG. 52 illustrates in schematic form a hardware divider that generates three bits of the desired quotient per divide iteration.
Figure 53:
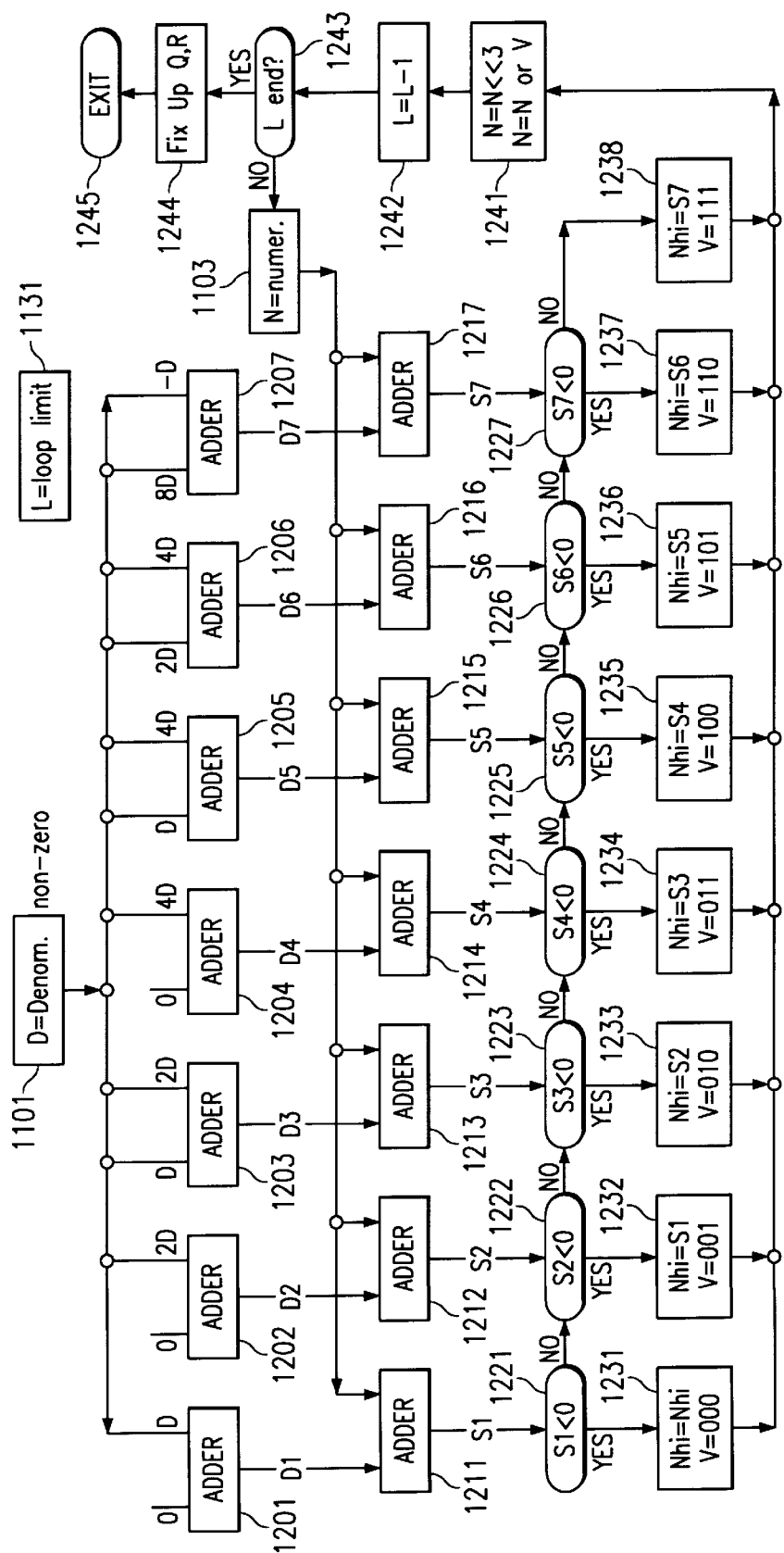
FIG. 53 illustrates in schematic form the data flow within a hardware divider illustrated in FIG. 51.

FIGS. 50, 51, 52 and 53 illustrate members of a family of hardware dividers. FIG. 50 illustrates the hardware in a divider that forms two bits of the quotient per iteration. FIG. 51 illustrates in a schematic form the data flow through the apparatus of FIG. 50. FIG. 52 illustrates the hardware in a divider that forms three bits of the quotient per iteration. FIG. 53 illustrates in schematic form the data flow in a divider that forms three bits of the quotient per iteration. Each of the members of this family of hardware dividers employs a conditional subtract and rotate algorithm. Each of the members of this family employs hardware parallelism to speed the division process.

FIG. 50 illustrates hardware divider 1100. Register 1101 stores the unsigned portion of the divisor, if the divisor is a signed number and sign latch 1102 stores the sign bit. If the divisor is unsigned, then register 1101 stores the entire divisor and sign latch 1102 stores a bit indicating a positive number. Register 1103 stores the unsigned portion of the numerator with sign latch 1104 storing the sign bit. If the numerator is unsigned, register 1103 stores the entire numerator and sign latch 1104 stores a bit indicating a positive number. Control sequencer 1130, which may be a state machine, controls loops of an iteration process with reference to a loop count stored in loop counter 1131. Control sequencer 1130 controls data flow via multiplexers 1117, 1118 and 1121 and forms two bits of the quotient each iteration. This quotient is stored in register 1105.

Hardware divider 1110 includes three full adders 1112, 1113 and 1114. These operate in parallel during the conditional subtract and rotate operation. Those skilled in the art would realize that the numerator will generally have more bits than the denominator. The DIVI instruction discussed above provided for division of a 64 bit numerator by a 32 bit divisor and division of a 32 bit numerator by a 16 bit divisor. Hardware divider 1100 is suitable for either case with suitable capacity of registers and the full adders. In the preferred embodiment the numerator will have two times the number of bits of the divisor. Full adders 1112, 1113 and 1114 operate on the full width of data stored in register 1101 and the most significant half of data stored in register 1103. To prevent loss of data during carries (borrows), full adders 1112, 1113 and 1114 should have one more bit than the number of bits of register 1101.

Full adders 1112, 1113 and 1113 operate in parallel during each iteration. Full adder 1112 subtracts the number stored in register 1101 from the most significant bits of the number stored in register 1103, effectively subtracting the divisor from the most significant bits of the numerator/running remainder. Full adder 1113 subtract the number stored in register 1101, left shifted one place by shift left circuit 1141, from the most significant bits stored in register 1103. This effectively subtracts two times the divisor from the most significant bits of the numerator/running remainder. Full adder 1114 has two alternate operations. In an initial operation, control sequencer 1130 controls multiplexer 1117 to select the output from shift left circuit 1141 and multiplexer 1118 to select the output from register 1101. Thus full adder 1114 adds the divisor to two times the divisor. The resultant of three times the divisor is stored in latch 1144. During normal operation, control sequencer 1130 controls multiplexer 1117 to select the most significant bits of register 1103 and multiplexer 1118 to select the output of latch 1144. Full adder 1114 then subtracts three times the divisor from the most significant bits of the numerator/running remainder.

Control sequencer 1130 controls the loop operation of hardware divider 1100. Negative detectors 1122, 1123 and 1124 determine if the subtractions performed by the respective full adders 1112, 1113 and 1114 result in a negative difference. Based upon these determinations, control sequencer 1130 generates two bits of the quotient, which are stored in register 1105, and controls multiplexer 1121. Multiplexer 1121 selects either the original data in register 1103 or the resultant of one of full adders 1112, 1113 or 1114 for storage in register 1103 depending upon the results of the negative determinations. Following each such storage operation, control sequencer 1130 controls register 1103 to shift left two places. Note that the storing the data selected according the negative detectors 1122, 1123 and 1124 insures that no data is lost in this shift operation. Control sequencer 1130 repeats this operation a number of times as set by the loop count in loop counter 1131. The quotient from register 1105 may be negated by negate circuit 1135 based upon the original sign bits stored in sign latches 1102 and 1103. If needed, the remainder is stored in register 1103 and may be negated by negate circuit 1136 depending upon the original sign bits stored in sign latches 1102 and 1103.

FIG. 51 illustrates in schematic form the data flow during operation of hardware divider 1100. Initially the apparatus simultaneously forms the quantities D, 2D and 3D, where D is the divisor stored in register 1101. These quantities may be formed using simultaneous addition blocks 1141, 1143 and 1143, respectively, employing the three full adders 1112, 1113 and 1114 as shown in FIG. 51 with the results stored in corresponding latches. Addition block 1141 adds "0" and D to get D. Addition block 1142 adds "0" and D left shifted one place to get 2D. Addition block 1143 adds D and D left shifted one place to get 3D. Alternatively, only 3D need be formed by an adder (block 1143) and stored as illustrated in FIG. 50 because the quantities D and 2D can easily be formed in real time during each iteration.

Next, hardware divider 1100 simultaneously forms the differences N(hi)–D, N(hi)–2D and N(hi)–3D using the three full adders 1112, 1113 and 1114 in blocks 1151, 1152 and 1153, where N(hi) is the most significant bits of the numerator/running remainder stored in register 1103. The results of these three trial subtractions determine the two bit partial quotient and the data to be recirculated as the numerator/running remainder. Simultaneous negative test blocks 1154, 1155 and 1156 determine if the quantities N(hi)–D, N(hi)–2D and N(hi)–3D are negative. There are four possible results of these simultaneous negative tests. If N(hi)–D<0, then the two quotient bits V are "00" and N(hi) is recirculated (block 1161). If N(hi)–D>0 and N(hi)–2D<0, and then the two quotient bits V are "01" and N(hi)–D is recirculated (1162). If N(hi)–2D>0 and N(hi)–3D<0, then the two quotient bits V are "10" and N(hi)–2D is recirculated (1163). Lastly, if N(hi)–3D>0, then the two quotient bits V are "11" and N(hi)–3D is recirculated (block 1164). These results represent the four possible outcomes for the trial subtractions and the corresponding quotient and recirculation quantities.

The data within register 1103 is then left shifted by two places (block 1170). As previously described, the selection of the recirculated data based upon the trial subtraction insures that no data is lost in this shift operation. Block 1170 also forms an OR of the shifted numerator/running remainder and V. Since the two least significant bit places have just been cleared by the left shift, this OR operation places the just calculated quotient bits into the least significant bits of register 1103. Since the numerator has the same number of bits as the sum of the bits of the remainder and the quotient, this process permits the same register to initially hold the numerator, the running remainder and to hold the final remainder and quotient at the end of the process. Note that this same result can be achieved by shifting in the two bits of V during the left shift operation. This is similar to the manner of shifting data register 200a and multiple flags register 211 as illustrated in FIG. 44, except that two bits are shifted in rather than only one. The loop count is incremented in block 1171. If the loop count is not greater than 8 (block 1172), then another iteration begins with simultaneous subtractions blocks 1151, 1152 and 1153. Note that the loop count of 8 is appropriate for a division of a 32 bit numerator by a 16 bit divisor yielding a 16 bit quotient. For the division of a 64 bit numerator by a 32 bit divisor yielding a 32 bit quotient a loop count of 16 is selected.

Two clean up operations occur following completion of the selected number of iterations. Block 1173 determines the sign of the quotient from an exclusive OR of the sign of the numerator and divisor. If the sign of the quotient is negative, then block 1174 forms the inverse of the computed quotient. In parallel is a determination of the sign of the remainder. Block 1175 determines if the numerator was less than zero. If the numerator was less than zero, then block 1176 forms the inverse of the computed remainder that is stored in register 1103. In any case the division operation is complete and ended at exit block 1177.

A hardware divider such as illustrated in FIG. 50 may be as useful as multiplier 220 illustrated in FIG. 5. In the preferred embodiment a division operation employs similar data paths and instruction word formats as those used for multiplication. It is feasible to employ some of the adders used in the common Booth adder type multiplier circuit to embody full adders 1112, 1113 and 1114. Thus the hardware divider would require few additional components.

FIG. 52 illustrates the major components of hardware divider 1100*a* that forms three bits of the quotient per iteration. Hardware divider 1100*a* includes register 1101, sign latch 1102, register 1103, sign latch 1104, control sequencer 1130 and loop counter 1131, which are similar to the corresponding parts illustrated in FIG. 50. Hardware divider 1110*a* includes seven full adders 1112, 1113, 1114 1115, 1116, 1117 and 1118. These operate in parallel during the conditional subtract and shift operation. During the initial step, multiplexer 1154 supplies the divisor from register 1101 and the divisor from register 1101 left shifted via shift left circuit 1141 to full adder 1114. Full adder 1114 thus forms three times the divisor, which is stored in latch 1144. During the initial step, multiplexer 1156 supplies the divisor from register 1101 and the divisor from register 1101 left shifted two places via shift left circuits 1141 and 1142 to full adder 1116, thus forming five times the divisor, which is stored in latch 1146. During the initial step, multiplexer 1157 supplies the divisor from register 1101 left shifted via shift left circuit 1141 and the divisor from register 1101 left shifted two places via shift left circuits 1141 and 1142 to full adder 1117. This forms six times the divisor, which is stored in latch 1147. Also during the initial step, multiplexer 1158 supplies the divisor from register 1101 and the divisor from register 1101 left shifted three places via shift left circuits 1141, 1142 and 1143 to full adder 1118. Full adder 1118 then subtracts the divisor from eight times the divisor, forming seven times the divisor, which is stored in latch 1148. During each iteration, full adders 1112, 1113, 1114, 1115, 1116, 1117 and 1118 subtract respectively one times, two times, three times, four times, five times, six times and seven times the divisor stored in register 1101 from the most significant bits of register 1102. Note that during each iteration multiplexers 1154, 1156, 1157 and 1158 select the numerator and the multiple of the divisor.

Control sequencer 1130 controls the loop operation of hardware divider 1100. Negative detectors 1122, 1123, 1124, 1125, 1126, 1127 and 1128 determine if the subtractions performed by the respective full adders 1112, 1113, 1114, 1115, 1116, 1117 and 1118 result in a negative difference. Based upon these determinations, control sequencer 1130 generates three bits of the quotient. These three bits of the quotient are stored in the least significant bits of register 1103. Note that register 1103 is shifted three bits each iteration, making room for the quotient bits. In other respects control sequencer 1130 of FIG. 52 operates like that previously described with regard to FIG. 50. The quotient from the least significant bits of register 1103 may be negated by negate circuit 1135 based upon the original sign bits stored in sign latches 1102 and 1103. If needed, the remainder stored in the most significant bits of register 1103 may be negated by negate circuit 1136 depending upon the original sign bits stored in sign latches 1102 and 1103.

FIG. 53 illustrates schematically data flow within hardware divider 1100*a* illustrated in FIG. 52. The divisor is stored in register 1101, the numerator in register 1103 and the loop count limit in register 1131. Initially the process uses seven full adders to compute seven multiples of the divisor. This is accomplished by simultaneous addition blocks 1201, 1202, 1203, 1203, 1204, 1205, 1206 and 1207. Addition block 1201 forms 0+D=D; addition block 1202 forms 0+D<<1=2D; addition block 1203 forms D+D<<1= 3D; addition block 1204 forms 0+D<<2=4D; addition block 1205 forms D+D<<2=5D; addition block 1206 forms D<<1+D<<2=6D; addition block 1207 forms D<<3−D=7D; where <<n is left shifting n places. Thus simultaneous addition blocks 1201, 1202, 1203, 1203, 1204, 1205, 1206 and 1207 form each multiple of D from 1 to 7. At least 3D, 5D, 6D and 7D are stored in latches for use each iteration. Note that D, 2D and 4D need not be stored in latches because these quantities can be easily formed from D stored in register 1101.

Next the respective multiples of D are subtracted from the most significant bits of the numerator/running remainder stored in register 1103. Simultaneous subtractions 1211, 1212, 1213, 1214, 1215, 1216 and 1217 form the differences between N(hi) and D, 2D, 3D, 4D, 5D, 6D and 7D, respectively. As in simultaneously addition blocks 1201, 1202, 1203, 1203, 1204, 1205, 1206 and 1207 above, these simultaneous subtractions are formed using seven full adders. The results of these seven trial subtractions determine the three bit partial quotient and the data to be recirculated as the numerator/running remainder. Simultaneous negative test blocks 1221, 1222, 1223, 1224, 1225, 1226 and 1227 determine if the quantities N(hi)−D, N(hi)−2D, N(hi)−3D, N(hi)−4D, N(hi)−5D, N(hi)−6D and N(hi)−7D are negative. There are eight possible results of these simultaneous negative tests. If N(hi)−D<0, then V="000" and N(hi) is recirculated (block 1231). If N(hi)−D>0 and N(hi)−2D<0, and then V="001" and N(hi)−D is recirculated (block 1232). If N(hi)−2D>0 and N(hi)−3D<0, then V="010", and N(hi)−2D is recirculated (block 1233). If N(hi)−3D>0 and N(hi)−4D<0, then V="011" and N(hi)−3D is recirculated (block 1234). If N(hi)−4D>0 and N(hi)−5D<0, then V="100" and N(hi)−4D is recirculated (block 1235). If N(hi)−5D>0 and N(hi)−6D<0, then V="101" and N(hi)−5D is recirculated (block 1236). If N(hi)−6D>0 and N(hi)−7D<0, then V="110" and N(hi)−6D is recirculated (block 1237). If N(hi)−7D>0, then V="111" and N(hi)−7D is recirculated (block 1238).

The data within register 1103 is then left shifted by three places (block 1241). Block 1241 also forms an OR of the shifted numerator/running remainder and V. This DR operation places the just calculated three quotient bits into the least significant bits of register 1103. Similarly to that discussed above in conjunction with block 1170 of FIG. 51, this same result can be achieved by shifting in the three bits of V during the left shift operation.

The loop count is decremented in block 1242. If the loop count has not reached zero (block 1243), then another iteration begins with simultaneous subtractions blocks 1211, 1212, 1213, 1214, 1215, 1216 and 1217. Note that FIG. 52 illustrates decrementing the loop count from a set loop limit to zero rather than incrementing the loop count from 1 to a limit. Either of these techniques may be employed in hardware dividers of this type. If iterations are complete, then block 1244 representing a clean-up operation occurs. This process has been previously described in conjunction with blocks 1173, 1174, 1175 and 1176 of FIG. 51. The division operation is complete and ended at exit block 1245.

As previously mentioned, FIGS. 50, 51, 52 and 53 illustrate members of a family of hardware dividers. Each member of this family of hardware dividers employs $2^N-1$ parallel full adders to form every trial subtraction from 1 to $2^N-1$ times the divisor. N bits of the quotient and a running remainder are determined from the results of these trial subtractions. The quotient may be formed in a separate register. Alternatively, the quotient may be shifted into the emptied bits of the numerator/running remainder register. This takes advantage of the relationship between the number of bits of the numerator, final remainder and quotient. Table 65 illustrates the properties of members of this family of hardware divider. Note that the DIVI instruction described above falls into the first member of this family, hardware divider 1100 illustrated in FIG. 50 the second member of this family and hardware divider 1100a illustrated in FIG. 52 the third member of this family.

TABLE 65

| Quotient bits per iteration | Number of parallel adders | Number of iterations for 32/16 | Number of iterations for 64/32 |
|---|---|---|---|
| 1 | 1 | 16 | 32 |
| 2 | 3 | 8 | 16 |
| 3 | 7 | 6 | 11 |
| 4 | 15 | 4 | 8 |
| 5 | 31 | 4 | 7 |
| 6 | 63 | 3 | 6 |
| 7 | 127 | 3 | 5 |
| 8 | 255 | 2 | 4 |
| 16 | 65535 | 1 | 2 |
| 32 | 4294967295 | 1 | 1 |

Table 65 illustrates a startling diminishing return to scale. If the number of bits per iteration is N, then the number of parallel full adders needed is $2^N-1$. The greatest number of bits per iteration for practical devices in current semiconductor technology is probably 3 or 4. Current Booth re-coding multiply circuits may have 9 full adders. Thus 15 full adders for division is not unreasonable, particularly if the adders can be used for both hardware multiply and hardware divide. Use of additional hardware for divides of more than 4 bits per iteration is not currently economically feasible.

Figure 54:
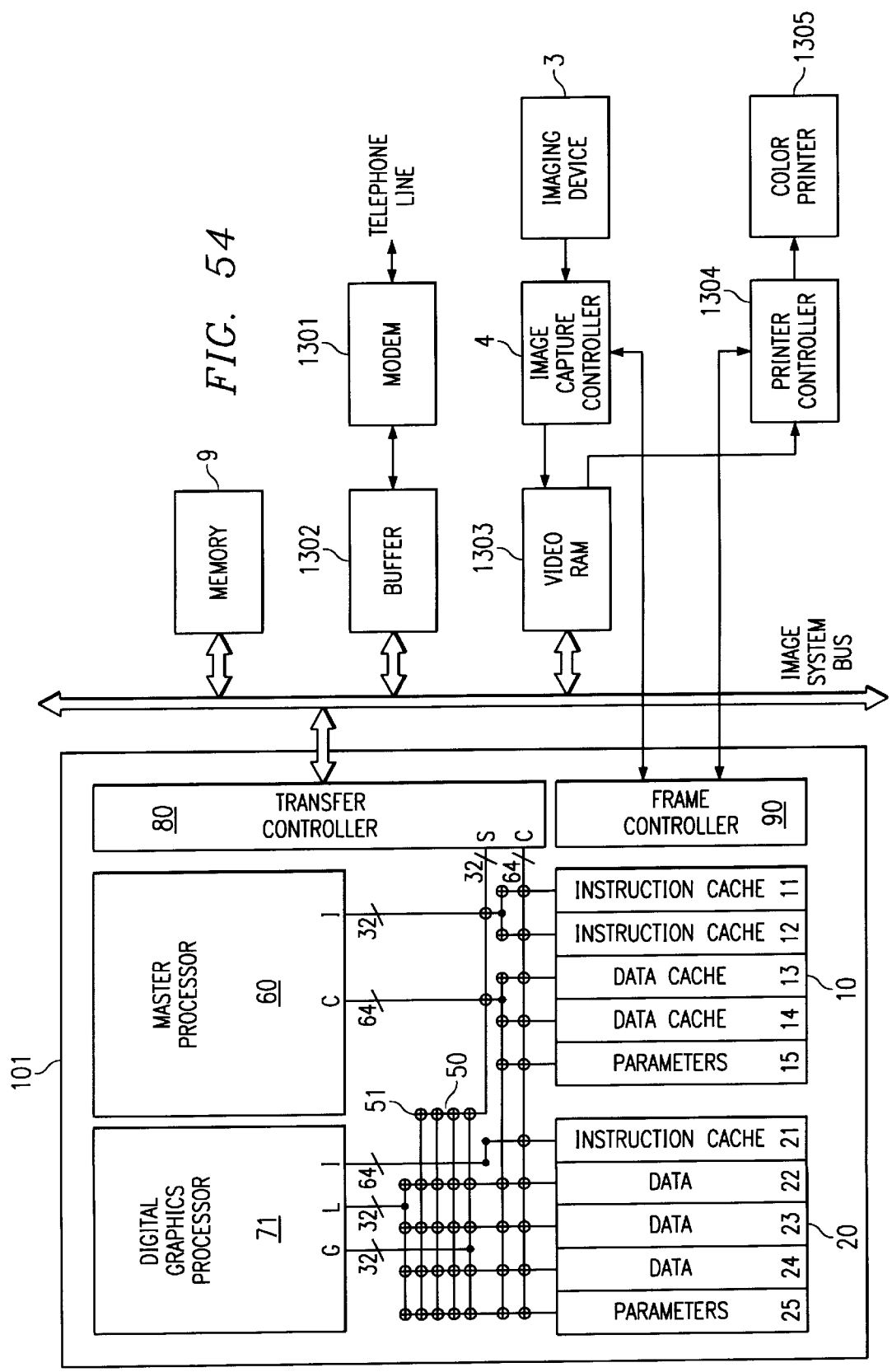
FIG. 54 illustrates in schematic form the multiprocessor integrated circuit of this invention having a single digital image/graphics processor in color facsimile system.

FIG. 54 illustrates an alternative embodiment of this invention. In FIG. 54 multiprocessor integrated circuit 101 includes master processor 60 and a single digital image/graphics processor 71. Multiprocessor integrated circuit 101 requires less silicon substrate area than multiprocessor integrated circuit 100 and consequently can be constructed less expensively. Multiprocessor integrated circuit 101 is constructed using the same techniques as previously noted for construction of multiprocessor integrated circuit 100. Because the width of each digital image/graphics processor matches the width of its corresponding memory and the associated portions of crossbar 50, multiprocessor integrated circuit 100 may be cut between digital image/graphics processors 71 and 72 to obtain the design of multiprocessor integrated circuit 101. Multiprocessor integrated circuit 101 can be employed for applications when the processing capacity of four digital image/graphics processors is not required.

Multiprocessor integrated circuit 101 is illustrated in FIG. 54 as part of a color facsimile apparatus. Modem 1301 is bidirectionally coupled to a telephone line for sending and receiving. Modem 1301 also communicates with buffer 1302, which is further coupled the image system bus. Modem 1301 receives a fascimile signal via the telephone line. Modem 1301 demodulates these signals, which are then temporarily stored in buffer 1302. Transfer controller 80 services buffer 1302 by transferring data to data memories 22, 23 and 24 for processing by digital image/graphics processor 71. In the event that digital image/graphics processor 71 cannot keep ahead of the incoming data, transfer controller 80 may also transfer data from buffer 1302 to memory 9. Digital image/graphics processor 71 processes the image data of the incoming facsimile. This may include image decompression, noise reduction, error correction, color base correction and the like. Once processed, transfer controller 80 transfers image data from data memories 22, 23 and 24 to video random access memory (VRAM) 1303. Printer controller 1304 recalls the image data under control of frame controller 90 and supplies it to color printer 1305, which forms the hard copy.

The apparatus of FIG. 54 can also send a color facsimile. Imaging device 3 scans the source document. Imaging device 3 supplies the raw image data to image capture controller 4 that operates under control of frame controller 90. This image data is stored in video random access memory 1303. Note that the embodiment illustrated in FIG. 54 shares video random access memory 1303 for both image capture and image display in contrast to the embodiment of FIG. 1, which uses separate video random access memories. Transfer controller 80 transfers this image data to data memories 22, 23 and 24. Digital image/graphics processor 71 then processes the image data for image compression, error correction redundancy, color base correction and the like. The processed data is transferred to buffer 1303 by transfer controller 80 as needed to support the facsimile transmission. Depending upon the relative data rates, transfer controller 80 may temporarily store data in memory 9 before transfer to buffer 1302. This image data in buffer 1302 is modulated by modem 1301 and transmitted via the telephone line.

Note that the presence of an imaging device and a color printer in the same system permits this system to also operate as a color copier. In this event data compression and decompression may not be required. However, digital image/graphics processor 71 is still useful for noise reduction and color base correction. It is also feasible for digital image/graphics processor 71 to be programmed to deliberately shift colors so that the copy has different coloring than the original. This technique, known as false coloring, is useful to conform the dynamic range of the data to the dynamic range of the available print colors.

I claim:

1. A data processing apparatus comprising:

a data processor bus;

a plurality of N data registers connected to said data processor bus, each data register having a plurality of I bits divided into M equal bit groups, where N, I and M are integers and I equals N times M; and a register selection circuit connected to said N data registers, said register selection circuit selecting a specified data register for read access via said data processor bus in a normal register read mode, selecting a specified data register for write access via said data processor bus in a normal register write mode, and selecting I mutually noncontiguous bits from a predetermined position within each of said M equal bit groups for each said N data registers for read access via said data processor bus in response to a rotation register read mode.

2. The data processing apparatus of claim 1, wherein:
said register selection circuit
selecting I mutually noncontiguous bits from a predetermined position within each of said M sections for each said N data registers for write access via said data processor bus in response to a rotation register write mode.

3. The data processing apparatus of claim 1, further comprising:
at least one additional data processor bus;
wherein said each of said N data registers is connected to said at least one additional data processor bus; and
said register selection circuit
selecting a specified data register for read access via a specified one of said at least one additional data processor bus in an additional data processor bus register read mode,
selecting a specified data register for write access via a specified one of said at least one additional data processor bus in an additional data processor bus register write mode.

4. The data processing apparatus of claim 1, wherein:
said N data registers are connected together in a loop with a most significant bit of one data register connected to a least significant bit of a sequential data register, a most significant bit of a last sequential data register connected to a least significant bit of a first sequential data register; and
said register selection circuit
rotating the bits in each data register within said loop in a register rotation mode.

5. The data processing apparatus of claim 4, wherein:
said register selection circuit
rotating the bits in each data register one bit position within said register rotation mode.

6. The data processing apparatus of claim 4, further comprising:
a source of instructions including at least one normal register read mode instruction, at least one normal register write mode instruction and at least one register rotation instruction;
an instruction decode logic connected to said register selection circuit and said source of instructions, said instruction decode logic controlling said register selection circuit to
enter said normal register read mode, select an instruction specified data register and transfer I bits of data stored in said instruction specified data register to said data processor bus in response to a normal register read mode instruction,
enter said normal register write mode, select an instruction specified data register and transfer I bits of data from said data processor bus to said instruction specified data register in response to a normal register write mode instruction, and
enter said register rotation mode and rotating the bits in each data register within said loop response to a register rotation instruction.

7. The data processing apparatus of claim 6, further comprising:
an arithmetic logic unit having at least two inputs and an output, said arithmetic logic unit forming an instruction specified combination of said at least two inputs at said output;
said source of instructions including at least one arithmetic logic unit instruction having source register fields specifying one of said data registers for input to each of said at least two inputs of said arithmetic logic unit, a destination register field specifying one of said data registers for storing said output of said arithmetic logic unit and an arithmetic logic unit operation field designating a combination to be formed by said arithmetic logic unit; and
said instruction decode logic is further coupled to said arithmetic logic unit to supply data recalled from said data registers specified in said source register fields to corresponding inputs of said arithmetic logic unit, control said arithmetic logic unit to form said combination specified in said arithmetic logic unit operation field and store said output of said arithmetic logic unit in said data register specified by said destination field in response to an arithmetic logic unit instruction.

8. The data processing apparatus of claim 1, wherein:
said N data registers comprise 32 bit registers having 4 sections of 8 bits each;
said register selection circuit
selecting 32 bits from a first position within each of said 4 sections of each said 8 data registers for read access via said data processor bus in response to a rotation register read mode.

9. The data processing apparatus of claim 1, further comprising:
a source of instructions including at least one normal register read mode instruction, at least one normal register write mode instruction and at least one rotation register read mode instruction;
an instruction decode logic connected to said register selection circuit and said source of instructions, said instruction decode logic controlling said register selection circuit to
enter said normal register read mode, select an instruction specified data register and transfer I bits of data stored in said instruction specified data register to said data processor bus in response to a normal register read mode instruction,
enter said normal register write mode, select an instruction specified data register and transfer I bits of data from said data processor bus to said instruction specified data register in response to a normal register write mode instruction, and
enter said rotation register read mode, select said I mutually noncontiguous bits and transfer said selected I mutually noncontiguous bits from said plurality of data registers to said data processor bus in response to a rotation register read mode instruction.

10. The data processing apparatus of claim 9, further comprising:
an arithmetic logic unit having at least two inputs and an output, said arithmetic logic unit forming an instruction specified combination of said at least two inputs at said output;
said source of instructions including at least one arithmetic logic unit instruction having source register fields specifying one of said data registers for input to each of said at least two inputs of said arithmetic logic unit, a destination register field specifying one of said data registers for storing said output of said arithmetic logic unit and an arithmetic logic unit operation field designating a combination to be formed by said arithmetic logic unit; and said instruction decode logic is further coupled to said arithmetic logic unit to supply data recalled from said data registers specified in said source register fields to corresponding inputs of said arithmetic logic unit, control said arithmetic logic unit to form said combination specified in said arithmetic logic unit operation field and store said output of said arithmetic logic unit in said data register specified by said destination field in response to an arithmetic logic unit instruction.

11. The data processing apparatus of claim 9, further comprising:

said at least one rotation register read mode instruction includes an indication of said predetermined position within each of said M sections of said selected I mutually noncontiguous bits; and said instruction decode logic selects said I mutually noncontiguous bits within said plurality of data registers corresponding to said predetermined position within each of said M sections indicated in said rotation register read mode instruction.

12. An data processing system comprising:

an data system bus transferring data and addresses;

a system memory connected to said data system bus, said system memory storing data and transferring data via said data system bus;

an data processor circuit connected to said data system bus, said data processor circuit including a data processor bus, a plurality of N data registers connected to said data processor bus, each data register having a plurality of I bits divided into M equal bit groups, where N, I and N are integers and I equals N times M, and a register selection circuit connected to said N data registers, said register selection circuit selecting a specified data register for read access via said data processor bus in a normal register read mode, selecting a specified data register for write access via said data processor bus in a normal register write mode, and selecting I mutually noncontiguous bits from a predetermined position within each of said M equal bit groups for each said N data registers for read access via said data processor bus in response to a rotation register read mode.

13. The data processing system of claim 12, wherein:

said data processor circuit wherein said register selection circuit selecting I mutually noncontiguous bits from a predetermined position within each of said M sections for each said N data registers for write access via said data processor bus in response to a rotation register write mode.

14. The data processing system of claim 12, wherein:

said data processor circuit further includes at least one additional data processor bus;

wherein said each of said N data registers is connected to said at least one additional data processor bus, and said register selection circuit selecting a specified data register for read access via a specified one of said at least one additional data processor bus in an additional data processor bus register read mode, selecting a specified data register for write access via a specified one of said at least one additional data processor bus in an additional data processor bus register write mode.

15. The data processing system of claim 12, wherein:

said data processor circuit wherein said N data registers are connected together in a loop with a most significant bit of one data register connected to a least significant bit of a sequential data register, a most significant bit of a last sequential data register connected to a least significant bit of a first sequential data register, and said register selection circuit rotating the bits in each data register within said loop in a register rotation mode.

16. The data processing system of claim 15, wherein:

said data processor circuit wherein said register selection circuit rotating the bits in each data register one bit position within said register rotation mode.

17. The data processing system of claim 15, wherein:

said data processor circuit further includes a source of instructions including at least one normal register read mode instruction, at least one normal register write mode instruction and at least one register rotation instruction, an instruction decode logic connected to said register selection circuit and said source of instructions, said instruction decode logic controlling said register selection circuit to enter said normal register read mode, select an instruction specified data register and transfer I bits of data from said instruction specified data register to said data processor bus in response to a normal register read mode instruction, enter said normal register write mode, select an instruction specified data register and transfer I bits of data from said data processor bus to said instruction specified data register in response to a normal register write mode instruction, and enter said register rotation mode and rotate the bits in each data register within said loop in response to a register rotation instruction.

18. The data processing system of claim 17, wherein:

said data processor circuit further includes an arithmetic logic unit having at least two inputs and an output, said arithmetic logic unit forming an instruction specified combination of said at least two inputs at said output, said source of instructions including at least one arithmetic logic unit instruction having source register fields specifying one of said data registers for input to each of said at least two inputs of said arithmetic logic unit, a destination register field specifying one of said data registers for storing said output of said arithmetic logic unit and an arithmetic logic unit operation field designating a combination to be formed by said arithmetic logic unit, and said instruction decode logic is further coupled to said arithmetic logic unit to supply data recalled from said data registers specified in said source register fields to corresponding inputs of said arithmetic logic unit, control said arithmetic logic unit to form said combination specified in said arithmetic logic unit operation field and store said output of said arithmetic logic unit in said data register specified by said destination field in response to an arithmetic logic unit instruction.

19. The data processing system of claim 12, wherein:

said data processor circuit wherein said N data registers comprise 32 bit registers having 4 sections of 8 bits each,
said register selection circuit
selecting 32 bits from a first position within each of said 4 sections of each said 8 data registers for read access via said data processor bus in response to a rotation register read mode.

20. The data processing system of claim 12, wherein:
said data processor circuit further including
a source of instructions including at least one normal register read mode instruction, at least one normal register write mode instruction and at least one rotation register read mode instruction,
an instruction decode logic connected to said register selection circuit and said source of instructions, said instruction decode logic controlling said register selection circuit to
enter said normal register read mode, select an instruction specified data register and transfer I bits of data from said instruction specified data register to said data processor bus in response to a normal register read mode instruction,
enter said normal register write mode, select an instruction specified data register and transfer I bits of data from said data processor bus to said instruction specified data register in response to a normal register write mode instruction, and
enter said rotation register read mode, select said I mutually noncontiguous bits and transfer said selected I mutually noncontiguous bits from said plurality of data registers to said data processor bus in response to a rotation register read mode instruction.

21. The data processing system of claim 20, wherein:
said data processor circuit further includes
an arithmetic logic unit having at least two inputs and an output, said arithmetic logic unit forming an instruction specified combination of said at least two inputs at said output,
said source of instructions including at least one arithmetic logic unit instruction having source register fields specifying one of said data registers for input to each of said at least two inputs of said arithmetic logic unit, a destination register field specifying one of said data registers for storing said output of said arithmetic logic unit and an arithmetic logic unit operation field designating a combination to be formed by said arithmetic logic unit, and
said instruction decode logic is further coupled to said arithmetic logic unit to supply data recalled from said data registers specified in said source register fields to corresponding inputs of said arithmetic logic unit, control said arithmetic logic unit to form said combination specified in said arithmetic logic unit operation field and store said output of said arithmetic logic unit in said data register specified by said destination field in response to an arithmetic logic unit instruction.

22. The data processing system of claim 20, wherein:
said data processor circuit wherein
said at least one rotation register read mode instruction includes an indication of said predetermined position within each of said M sections of said selected I mutually noncontiguous bits, and
said instruction decode logic selects said I mutually noncontiguous bits within said plurality of data registers corresponding to said predetermined position within each of said M sections indicated in said rotation register read mode instruction.

23. The data processing system of claim 12, wherein:
said data processor circuit further includes
a plurality of data memories connected to said data processor circuit,
an instruction memory supplying instructions to said data processor circuit; and
said data processing system further comprising a transfer controller connected to said data system bus, each of said data memories and said instruction memory controlling data transfer between said system memory and said plurality of data memories and between said system memory and said instruction memory.

24. The data processing system of claim 23, further comprising:
at least one additional data processor circuit identical to said data processor circuit,
a plurality of additional data memories connected to each additional data processor circuit,
an additional instruction memory supplying instructions to each additional data processor circuit, and
said transfer controller is further connected to each of said additional data memories and each said additional instruction memory, said transfer controller further controlling data transfer between said system memory and said each of said additional data memories and between said system memory and each said additional instruction memory.

25. The data processing system of claim 24, wherein:
said data processor circuit, said data memories, said instruction memories, each of said additional data processor circuits, each of said additional data memories, each additional instruction memory and said transfer controller are formed on a single integrated circuit.

26. The data processing system of claim 23, further comprising:
a master data processor,
a plurality of master data memories connected to said master data processor,
at least one master instruction memory supplying instructions to said master data processor, and
said transfer controller is further connected to each of said master data memories and each said master instruction memory, said transfer controller further controlling data transfer between said system memory and said each of said master data memories and between said system memory and each said master instruction memory.

27. The data processing system of claim 26, wherein:
said data processor circuit, said data memories, said instruction memories, said master data processor, each of said master data memories, each master instruction memory and said transfer controller are formed on a single integrated circuit.

28. The data processing system of claim 12, wherein:
said system memory consists of an image memory storing image data in a plurality of pixels; and
said data processing system further comprising:
an image display unit connected to said image memory generating a visually perceivable output of an image consisting of a plurality of pixels stored in said image memory.

29. The data processing system of claim 28, further comprising:

a palette forming a connection between said image memory and said image display unit, said palette transforming pixels recalled from said image memory into video signals driving said image display unit; and a frame controller connected to said palette controlling said palette transformation of pixels into video signals.

30. The data processing system of claim 12, wherein:

said system memory consists of an image memory storing image data in a plurality of pixels; and said data processing system further comprising:

a printer connected to said image memory generating a printed output of an image consisting of a plurality of pixels stored in said image memory.

31. The data processing system of claim 30, wherein:

said printer consists of a color printer.

32. The data processing system of claim 30, further comprising:

a printer controller forming a connection between said image memory and said printer, said printer controller transforming pixels recalled from said image memory into print signals driving said printer; and a frame controller connected to said print controller controlling said print controller transformation of pixels into print signals.

33. The data processing system of claim 12, wherein:

said system memory consists of an image memory storing image data in a plurality of pixels; and said data processing system further comprising:

an imaging device connected to said image memory generating an image signal input.

34. The data processing system of claim 33, further comprising:

an image capture controller forming a connection between said imaging device and said image memory, said image capture controller transforming said image signal into pixels supplied for storage in said image memory;

and wherein said data processor circuit further includes a frame controller connected to said image capture controller controlling said image capture controller transformation of said image signal into pixels.

35. The data processing system of claim 12, further comprising:

a modem connected to said data system bus and to a communications line.

36. The data processing system of claim 35, further comprising:

a host processing system connected to said data system bus.

37. The data processing system of claim 36, further comprising:

a host system bus connected to said host processing system transferring data and addresses; and at least one host peripheral connected to said host system bus.

38. A data processing apparatus comprising:

a data processor bus;

a plurality of N data registers connected to said data processor bus, each data register having a plurality of I bits divided into M equal bit groups, where N, I and N are integers and I equals N times M; and a register selection circuit connected to said N data registers, said register selection circuit selecting a specified data register for read access via said data processor bus in a normal register read mode, selecting a specified data register for write access via said data processor bus in a normal register write mode, and selecting I mutually noncontiguous bits from a predetermined position within each of said M equal bit groups for each said N data registers for write access via said data processor bus in response to a rotation register write mode.

39. The data processing apparatus of claim 38, further comprising:

at least one additional data processor bus;

wherein said each of said N data registers is connected to said at least one additional data processor bus; and said register selection circuit selecting a specified data register for read access via a specified one of said at least one additional data processor bus in an additional data processor bus register read mode, selecting a specified data register for write access via a specified one of said at least one additional data processor bus in an additional data processor bus register write mode.

40. The data processing apparatus of claim 38, wherein:

said N data registers are connected together in a loop with a most significant bit of one data register connected to a least significant bit of a sequential data register, a most significant bit of a last sequential data register connected to a least significant bit of a first sequential data register; and said register selection circuit rotating the bits in each data register within said loop in a register rotation mode.

41. The data processing apparatus of claim 40, wherein:

said register selection circuit rotating the bits in each data register one bit position within said loop in said register rotation mode.

42. The data processing apparatus of claim 40, further comprising:

a source of instructions including at least one normal register read mode instruction, at least one normal register write mode instruction and at least one register rotation instruction;

an instruction decode logic connected to said register selection circuit and said source of instructions, said instruction decode logic controlling said register selection circuit to enter said normal register read mode, select an instruction specified data register and transfer I bits from said instruction specified data register to said data processor bus in response to a normal register read mode instruction, enter said normal register write mode, select an instruction specified data register and transfer I bits from said data processor bus to said instruction specified data register in response to a normal register write mode instruction, and enter said register rotation mode and rotating the bits in each data register within said loop in response to a register rotation instruction.

43. The data processing apparatus of claim 42, further comprising:

an arithmetic logic unit having at least two inputs and an output, said arithmetic logic unit forming an instruction specified combination of said at least two inputs at said output;

said source of instructions including at least one arithmetic logic unit instruction having source register fields specifying one of said data registers for input to each of said at least two inputs of said arithmetic logic unit, a destination register field specifying one of said data registers for storing said output of said arithmetic logic unit and an arithmetic logic unit operation field designating a combination to be formed by said arithmetic logic unit; and said instruction decode logic is further coupled to said arithmetic logic unit to supply data recalled from said data registers specified in said source register fields to corresponding inputs of said arithmetic logic unit, control said arithmetic logic unit to form said combination specified in said arithmetic logic unit operation field and store said output of said arithmetic logic unit in said data register specified by said destination field in response to an arithmetic logic unit instruction.

44. The data processing apparatus of claim 38, wherein:

said N data registers comprise 32 bit registers having 4 sections of 8 bits each;

said register selection circuit selecting 32 bits from a first position within each of said 4 sections of each said 8 data registers for read access via said data processor bus in response to a rotation register read mode.

45. The data processing apparatus of claim 38, further comprising:

a source of instructions including at least one normal register read mode instruction, at least one normal register write mode instruction and at least one rotation register write mode instruction;

an instruction decode logic connected to said register selection circuit and said source of instructions, said instruction decode logic controlling said register selection circuit to enter said normal register read mode, select an instruction specified data register and transfer I bits from said instruction specified data register to said data processor bus in response to a normal register read mode instruction, enter said normal register write mode, select an instruction specified data register and transfer I bits from said data processor bus to said instruction specified data register in response to a normal register write mode instruction, and enter said rotation register write mode, select said I mutually noncontiguous bits and transfer I bits from said data processor bus to said I mutually noncontiguous bits of said plurality of N data registers in response to a rotation register write mode instruction.

46. The data processing apparatus of claim 45, further comprising:

an arithmetic logic unit having at least two inputs and an output, said arithmetic logic unit forming an instruction specified combination of said at least two inputs at said output;

said source of instructions including at least one arithmetic logic unit instruction having source register fields specifying one of said data registers for input to each of said at least two inputs of said arithmetic logic unit, a destination register field specifying one of said data registers for storing said output of said arithmetic logic unit and an arithmetic logic unit operation field designating a combination to be formed by said arithmetic logic unit; and said instruction decode logic is further coupled to said arithmetic logic unit to supply data recalled from said data registers specified in said source register fields to corresponding inputs of said arithmetic logic unit, control said arithmetic logic unit to form said combination specified in said arithmetic logic unit operation field and store said output of said arithmetic logic unit in said data register specified by said destination field in response to an arithmetic logic unit instruction.

47. The data processing apparatus of claim 45, wherein:

said at least one rotation register write mode instruction includes an indication of said predetermined position within each of said M sections of said selected I mutually noncontiguous bits; and said instruction decode logic selects said I mutually noncontiguous bits within said plurality of data registers corresponding to said predetermined position within each of said M sections indicated in said rotation register write mode instruction.

48. An data processing system comprising:

an data system bus transferring data and addresses;

a system memory connected to said data system bus, said system memory storing data and transferring data via said data system bus;

an data processor circuit connected to said data system bus, said data processor circuit including a data processor bus, a plurality of N data registers connected to said data processor bus, each data register having a plurality of I bits divided into M equal bit groups, where N, I and N are integers and I equals N times M, and a register selection circuit connected to said N data registers, said register selection circuit selecting a specified data register for read access via said data processor bus in a normal register read mode, selecting a specified data register for write access via said data processor bus in a normal register write mode, and selecting I mutually noncontiguous bits from a predetermined position within each of said M equal bit groups for each said N data registers for write access via said data processor bus in response to a rotation register write mode.

49. The data processing system of claim 48, wherein:

said data processor circuit further includes at least one additional data processor bus;

wherein said each of said N data registers is connected to said at least one additional data processor bus, and said register selection circuit selecting a specified data register for read access via a specified one of said at least one additional data processor bus in an additional data processor bus register read mode, selecting a specified data register for write access via a specified one of said at least one additional data processor bus in an additional data processor bus register write mode.

50. The data processing system of claim 48, wherein:

said data processor circuit wherein said N data registers are connected together in a loop with a most significant bit of one data register connected to a least significant bit of a sequential data register, a most significant bit of a last sequential data register connected to a least significant bit of a first sequential data register, and said register selection circuit rotating the bits in each data register within said loop in a register rotation mode.

51. The data processing system of claim 50, wherein:
said data processor circuit wherein
    said register selection circuit
        rotating the bits in each data register one bit position within said loop in said register rotation mode.

52. The data processing system of claim 50, wherein:
said data processor circuit further includes
    a source of instructions including at least one normal register read mode instruction, at least one normal register write mode instruction and at least one register rotation instruction,
    an instruction decode logic connected to said register selection circuit and said source of instructions, said instruction decode logic controlling said register selection circuit to
        enter said normal register read mode, select an instruction specified data register and transfer I bits from said instruction specified data register to said data processor bus in response to a normal register read mode instruction,
        enter said normal register write mode, select an instruction specified data register and transfer I bits from said data processor bus to said instruction specified data register in response to a normal register write mode instruction, and
        enter said register rotation mode and rotating the bits in each data register within said loop in response to a register rotation instruction.

53. The data processing system of claim 52, wherein:
said data processor circuit further includes
    an arithmetic logic unit having at least two inputs and an output, said arithmetic logic unit forming an instruction specified combination of said at least two inputs at said output,
    said source of instructions including at least one arithmetic logic unit instruction having source register fields specifying one of said data registers for input to each of said at least two inputs of said arithmetic logic unit, a destination register field specifying one of said data registers for storing said output of said arithmetic logic unit and an arithmetic logic unit operation field designating a combination to be formed by said arithmetic logic unit, and
    said instruction decode logic is further coupled to said arithmetic logic unit to supply data recalled from said data registers specified in said source register fields to corresponding inputs of said arithmetic logic unit, control said arithmetic logic unit to form said combination specified in said arithmetic logic unit operation field and store said output of said arithmetic logic unit in said data register specified by said destination field in response to an arithmetic logic unit instruction.

54. The data processing system of claim 48, wherein:
said data processor circuit wherein
    said N data registers comprise 32 bit registers having 4 sections of 8 bits each,
    said register selection circuit
        selecting 32 bits from a first position within each of said 4 sections of each said 8 data registers for read access via said data processor bus in response to a rotation register read mode.

55. The data processing system of claim 48, wherein:
said data processor circuit further including
    a source of instructions including at least one normal register read mode instruction, at least one normal register write mode instruction and at least one rotation register write mode instruction,
    an instruction decode logic connected to said register selection circuit and said source of instructions, said instruction decode logic controlling said register selection circuit to
        enter said normal register read mode, select an instruction specified data register and transfer I bits from said instruction specified data register to said data processor bus in response to a normal register read mode instruction,
        enter said normal register write mode, select an instruction specified data register and transfer I bits from said data processor bus to said instruction specified data register in response to a normal register write mode instruction, and
        enter said rotation register write mode, select said I mutually noncontiguous bits and transfer I bits from said data processor bus to said I mutually noncontiguous bits of said plurality of N data registers in response to a rotation register write mode instruction.

56. The data processing system of claim 55, wherein:
said data processor circuit further includes
    an arithmetic logic unit having at least two inputs and an output, said arithmetic logic unit forming an instruction specified combination of said at least two inputs at said output,
    said source of instructions including at least one arithmetic logic unit instruction having source register fields specifying one of said data registers for input to each of said at least two inputs of said arithmetic logic unit, a destination register field specifying one of said data registers for storing said output of said arithmetic logic unit and an arithmetic logic unit operation field designating a combination to be formed by said arithmetic logic unit, and
    said instruction decode logic is further coupled to said arithmetic logic unit to supply data recalled from said data registers specified in said source register fields to corresponding inputs of said arithmetic logic unit, control said arithmetic logic unit to form said combination specified in said arithmetic logic unit operation field and store said output of said arithmetic logic unit in said data register specified by said destination field in response to an arithmetic logic unit instruction.

57. The data processing system of claim 55, wherein:
said data processor circuit wherein
    said at least one rotation register write mode instruction includes an indication of said predetermined position within each of said M sections of said selected I mutually noncontiguous bits, and
    said instruction decode logic selects said I mutually noncontiguous bits within said plurality of data registers corresponding to said predetermined position within each of said M sections indicated in said rotation register write mode instruction.

58. The data processing system of claim 48, wherein:
said data processor circuit further includes
    a plurality of data memories connected to said data processor circuit,
    an instruction memory supplying instructions to said data processor circuit, and
    a transfer controller connected to said data system bus, each of said data memories and said instruction memory controlling data transfer between said system memory and said plurality of data memories and between said system memory and said instruction memory.

59. The data processing system of claim 58, further comprising:
at least one additional data processor circuit identical to said data processor circuit,
a plurality of additional data memories connected to each additional data processor circuit,
an additional instruction memory supplying instructions to each additional data processor circuit, and
said transfer controller is further connected to each of said additional data memories and each said additional instruction memory controlling data transfer between said system memory and said each of said additional data memories and between said system memory and each said additional instruction memory.

60. The data processing system of claim 59, wherein:
said data processor circuit, said data memories, said instruction memories, each of said additional data processor circuits, each of said additional data memories, each additional instruction memory and said transfer controller are formed on a single integrated circuit.

61. The data processing system of claim 58, further comprising:
a master data processor,
a plurality of master data memories connected to said master data processor,
at least one master instruction memory supplying instructions to said master data processor, and
said transfer controller is further connected to each of said master data memories and each said master instruction memory controlling data transfer between said system memory and said each of said master data memories and between said system memory and each said master instruction memory.

62. The data processing system of claim 61, wherein:
said data processor circuit, said data memories, said instruction memories, said master data processor, each of said master data memories, each master instruction memory and said transfer controller are formed on a single integrated circuit.

63. The data processing system of claim 48, wherein:
said system memory consists of an image memory storing image data in a plurality of pixels; and
said data processing system further comprising:
an image display unit connected to said image memory generating a visually perceivable output of an image consisting of a plurality of pixels stored in said image memory.

64. The data processing system of claim 63, further comprising:
a palette forming a connection between said image memory and said image display unit, said palette transforming pixels recalled from said image memory into video signals driving said image display unit;
and wherein said data processor circuit further includes a frame controller connected to said palette controlling said palette transformation of pixels into video signals.

65. The data processing system of claim 64, further comprising:
a printer controller forming a connection between said image memory and said printer, said printer controller transforming pixels recalled from said image memory into print signals driving said printer;
and wherein said data processor circuit further includes a frame controller connected to said print controller controlling said print controller transformation of pixels into print signals.

66. The data processing system of claim 48, wherein:
said system memory consists of an image memory storing image data in a plurality of pixels; and
said data processing system further comprising:
a printer connected to said image memory generating a printed output of an image consisting of a plurality of pixels stored in said image memory.

67. The data processing system of claim 66, wherein:
said printer consists of a color printer.

68. The data processing system of claim 48, wherein:
said system memory consists of an image memory storing image data in a plurality of pixels; and
said data processing system further comprising:
an imaging device connected to said image memory generating an image signal input.

69. The data processing system of claim 68, further comprising:
an image capture controller forming a connection between said imaging device and said image memory, said image capture controller transforming said image signal into pixels supplied for storage in said image memory;
and wherein said data processor circuit further includes a frame controller connected to said image capture controller controlling said image capture controller transformation of said image signal into pixels.

70. The data processing system of claim 48, further comprising:
a modem connected to said data system bus and to a communications line.

71. The data processing system of claim 70, further comprising:
a host processing system connected to said data system bus.

72. The data processing system of claim 71, further comprising:
a host system bus connected to said host processing system transferring data and addresses; and
at least one host peripheral connected to said host system bus.

73. A data processing apparatus comprising:
a data processor bus;
a plurality of N data registers connected to said data processor bus, said N data registers connected together in a loop with a most significant bit of one data register connected to a least significant bit of a sequential data register, a most significant bit of a last sequential data register connected to a least significant bit of a first sequential data register; and
a register selection circuit connected to said N data registers, said register selection circuit
selecting a specified data register for read access via said data processor bus in a normal register read mode,
selecting a specified data register for write access via said data processor bus in a normal register write mode, and
rotating the bits in each data register within said loop in a register rotation mode.

74. The data processing apparatus of claim 73, wherein:
said register selection circuit
rotating the bits in each data register one bit position within said loop in said register rotation mode.

75. The data processing apparatus of claim 73, further comprising:
a source of instructions including at least one normal register read mode instruction, at least one normal register write mode instruction and at least one register rotation instruction;
an instruction decode logic connected to said register selection circuit and said source of instructions, said instruction decode logic controlling said register selection circuit to
enter said normal register read mode, select an instruction specified data register and transfer I bits from said instruction specified data register to said data processor bus in response to a normal register read mode instruction,
enter said normal register write mode, select an instruction specified data register and transfer I bits from said data processor bus to said instruction specified data register in response to a normal register write mode instruction, and
enter said register rotation mode and rotate the bits in each data register within said loop in response to a register rotation instruction.

76. The data processing apparatus of claim 75, further comprising:
an arithmetic logic unit having at least two inputs and an output, said arithmetic logic unit forming an instruction specified combination of said at least two inputs at said output;
said source of instructions including at least one arithmetic logic unit instruction having source register fields specifying one of said data registers for input to each of said at least two inputs of said arithmetic logic unit, a destination register field specifying one of said data registers for storing said output of said arithmetic logic unit and an arithmetic logic unit operation field designating a combination to be formed by said arithmetic logic unit; and
said instruction decode logic is further coupled to said arithmetic logic unit to supply data recalled from said data registers specified in said source register fields to corresponding inputs of said arithmetic logic unit, control said arithmetic logic unit to form said combination specified in said arithmetic logic unit operation field and store said output of said arithmetic logic unit in said data register specified by said destination field in response to an arithmetic logic unit instruction.

77. The data processing apparatus of claim 73, wherein:
each data register of said plurality of N data registers having a plurality of I bits divided into M equal bit groups, where N, I and N are integers and I equals N times M, and
said register selection circuit further
selecting I mutually noncontiguous bits from a predetermined position within each of said M equal bit groups for each said N data registers for read access via said data processor bus in response to a rotation register read mode, and
selecting I mutually noncontiguous bits from a predetermined position within each of said M equal bit groups for each said N data registers for write access via said data processor bus in response to a rotation register write mode.

78. The data processing apparatus of claim 77, further comprising:
at least one additional data processor bus;
wherein said each of said N data registers is connected to said at least one additional data processor bus; and
said register selection circuit
selecting a specified data register for read access via a specified one of said at least one additional data processor bus in an additional data processor bus register read mode,
selecting a specified data register for write access via a specified one of said at least one additional data processor bus in an additional data processor bus register write mode.

79. The data processing apparatus of claim 77, wherein:
said N data registers comprise 32 bit registers having 4 sections of 8 bits each;
said register selection circuit
selecting 32 bits from a first position within each of said 4 sections of each said 8 data registers for read access via said data processor bus in response to a rotation register read mode.

80. The data processing apparatus of claim 77, further comprising:
a source of instructions including at least one normal register read mode instruction, at least one normal register write mode instruction, at least one resister rotation instruction, at least one rotation register read mode instruction and at least one rotation register write mode instruction;
an instruction decode logic connected to said register selection circuit and said source of instructions, said instruction decode logic controlling said register selection circuit to
enter said normal register read mode, select an instruction specified data register and transfer I bits from said instruction specified data resister to said data processor bus in response to a normal register read mode instruction,
enter said normal register write mode, select an instruction specified data register and transfer I bits from said data processor bus to said instruction specified data register in response to a normal register write mode instruction, and
enter said register rotation mode and rotate the bits in each data register within said loop in response to a register rotation instruction,
enter said rotation register read mode, select said I mutually noncontiguous bits and transfer said selected I mutually noncontiguous bits from said plurality of data registers to said data processor bus in response to a rotation register read mode instruction, and
enter said rotation register write mode, select said I mutually noncontiguous bits and transfer I bits of data from said data processor bus to said selected I mutually noncontiguous bits of said data registers in response to a rotation register write mode instruction.

81. The data processing apparatus of claim 80, further comprising:
an arithmetic logic unit having at least two inputs and an output, said arithmetic logic unit forming an instruction specified combination of said at least two inputs at said output;
said source of instructions including at least one arithmetic logic unit instruction having source register fields specifying one of said data registers for input to each of said at least two inputs of said arithmetic logic unit, a destination register field specifying one of said data registers for storing said output of said arithmetic logic unit and an arithmetic logic unit operation field designating a combination to be formed by said arithmetic logic unit; and said instruction decode logic is further coupled to said arithmetic logic unit to supply data recalled from said data registers specified in said source register fields to corresponding inputs of said arithmetic logic unit, control said arithmetic logic unit to form said combination specified in said arithmetic logic unit operation field and store said output of said arithmetic logic unit in said data register specified by said destination field in response to an arithmetic logic unit instruction.

82. The data processing apparatus of claim 80, wherein:

said at least one rotation register read mode instruction includes an indication of said predetermined position within each of said M sections of said selected I mutually noncontiguous bits;

said at least one rotation register write mode instruction includes an indication of said predetermined position within each of said M sections of said selected I mutually noncontiguous bits;

said instruction decode logic selects said I mutually noncontiguous bits within said plurality of data registers corresponding to said predetermined position within each of said M sections indicated in said rotation register read mode instruction; and said instruction decode logic selects said I mutually noncontiguous bits within said plurality of data registers corresponding to said predetermined position within each of said M sections indicated in said rotation register write mode instruction.

83. An data processing system comprising:

an data system bus transferring data and addresses;

a system memory connected to said data system bus, said system memory storing data and transferring data via said data system bus;

an data processor circuit connected to said data system bus, said data processor circuit including a data processor bus, a plurality of N data registers connected to said data processor bus, said N data registers connected together in a loop with a most significant bit of one data register connected to a least significant bit of a sequential data register, a most significant bit of a last sequential data register connected to a least significant bit of a first sequential data register, and a register selection circuit connected to said N data registers, said register selection circuit selecting a specified data register for read access via said data processor bus in a normal register read mode, selecting a specified data register for write access via said data processor bus in a normal register write mode, and rotating the bits in each data register within said loop in a register rotation mode.

84. The data processing system of claim 83, wherein:

said data processor circuit wherein said register selection circuit rotating the bits in each data register one bit position within said loop in said register rotation mode.

85. The data processing system of claim 83, wherein:

said data processor circuit further includes a source of instructions including at least one normal register read mode instruction at least one normal register write mode instruction and at least one register rotation instruction, an instruction decode logic connected to said register selection circuit and said source of instructions, said instruction decode logic controlling said register selection circuit to enter said normal register read mode, select an instruction specified data register and transfer I bits from said instruction specified data register to said data processor bus in response to a normal register read mode instruction, enter said normal register write mode, select an instruction specified data register and transfer I bits from said data processor bus to said instruction specified data register in response to a normal register write mode instruction, and enter said register rotation mode and rotate the bits in each data register within said loop in response to a register rotation instruction.

86. The data processing system of claim 85, wherein:

said data processor circuit further includes an arithmetic logic unit having at least two inputs and an output, said arithmetic logic unit forming an instruction specified combination of said at least two inputs at said output, said source of instructions including at least one arithmetic logic unit instruction having source register fields specifying one of said data registers for input to each of said at least two inputs of said arithmetic logic unit, a destination register field specifying one of said data registers for storing said output of said arithmetic logic unit and an arithmetic logic unit operation field designating a combination to be formed by said arithmetic logic unit, and said instruction decode logic is further coupled to said arithmetic logic unit to supply data recalled from said data registers specified in said source register fields to corresponding inputs of said arithmetic logic unit, control said arithmetic logic unit to form said combination specified in said arithmetic logic unit operation field and store said output of said arithmetic logic unit in said data register specified by said destination field in response to an arithmetic logic unit instruction.

87. The data processing apparatus of claim 84, wherein:

each data register of said plurality of N data registers having a plurality of I bits divided into M equal bit groups, where N, I and N are integers and I equals N times M, and said register selection circuit further selecting I mutually noncontiguous bits from a predetermined position within each of said M equal bit groups for each said N data registers for read access via said data processor bus in response to a rotation register read mode, and selecting I mutually noncontiguous bits from a predetermined position within each of said M equal bit groups for each said N data registers for write access via said data processor bus in response to a rotation register write mode.

88. The data processing apparatus of claim 87, further comprising:

at least one additional data processor bus;

wherein said each of said N data registers is connected to said at least one additional data processor bus; and said register selection circuit
  selecting a specified data register for read access via a specified one of said at least one additional data processor bus in an additional data processor bus register read mode,
  selecting a specified data register for write access via a specified one of said at least one additional data processor bus in an additional data processor bus register write mode.

89. The data processing apparatus of claim 87, wherein:
said N data registers comprise 32 bit registers having 4 sections of 8 bits each;
said register selection circuit
  selecting 32 bits from a first position within each of said 4 sections of each said 8 data registers for read access via said data processor bus in response to a rotation register read mode.

90. The data processing apparatus of claim 87, further comprising:
a source of instructions including at least one normal register read mode instruction, at least one normal register write mode instruction, at least one register rotation instruction, at least one rotation register read mode instruction and at least one rotation register write mode instruction;
an instruction decode logic connected to said register selection circuit and said source of instructions, said instruction decode logic controlling said register selection circuit to
  enter said normal register read mode, select an instruction specified data register and transfer I bits from said instruction specified data register to said data processor bus in response to a normal register read mode instruction,
  enter said normal register write mode, select an instruction specified data register and transfer I bits from said data processor bus to said instruction specified data register in response to a normal register write mode instruction, and
  enter said register rotation mode and rotate the bits in each data register within said loop in response to a register rotation instruction,
  enter said rotation register read mode, select said I mutually noncontiguous bits and transfer said selected I mutually noncontiguous bits from said plurality of data registers to said data processor bus in response to a rotation register read mode instruction, and
  enter said rotation register write mode, select said I mutually noncontiguous bits and transfer I bits from said data processor bus to said selected I mutually noncontiguous bits of said plurality of data registers in response to a rotation register write mode instruction.

91. The data processing system of claim 90, wherein:
said data processor circuit further includes
  an arithmetic logic unit having at least two inputs and an output, said arithmetic logic unit forming an instruction specified combination of said at least two inputs at said output,
  said source of instructions including at least one arithmetic logic unit instruction having source register fields specifying one of said data registers for input to each of said at least two inputs of said arithmetic logic unit, a destination register field specifying one of said data registers for storing said output of said arithmetic logic unit and an arithmetic logic unit operation field designating a combination to be formed by said arithmetic logic unit, and
  said instruction decode logic is further coupled to said arithmetic logic unit to supply data recalled from said data registers specified in said source register fields to corresponding inputs of said arithmetic logic unit, control said arithmetic logic unit to form said combination specified in said arithmetic logic unit operation field and store said output of said arithmetic logic unit in said data register specified by said destination field in response to an arithmetic logic unit instruction.

92. The data processing system of claim 90, wherein:
said data processor circuit wherein
  said at least one rotation register read mode instruction includes an indication of said predetermined position within each of said M sections of said selected I mutually noncontiguous bits,
  said at least one rotation register write mode instruction includes an indication of said predetermined position within each of said M sections of said selected I mutually noncontiguous bits,
  said instruction decode logic selects said I mutually noncontiguous bits within said plurality of data registers corresponding to said predetermined position within each of said M sections indicated in said rotation register read mode instruction, and
  said instruction decode logic selects said I mutually noncontiguous bits within said plurality of data registers corresponding to said predetermined position within each of said M sections indicated in said rotation register write mode instruction.

93. The data processing system of claim 83, wherein:
said data processor circuit further includes
  a plurality of data memories connected to said data processor circuit,
  an instruction memory supplying instructions to said data processor circuit, and
  a transfer controller connected to said data system bus, each of said data memories and said instruction memory controlling data transfer between said system memory and said plurality of data memories and between said system memory and said instruction memory.

94. The data processing system of claim 93, further including:
at least one additional data processor circuit identical to said data processor circuit,
a plurality of additional data memories connected to each additional data processor circuit,
an additional instruction memory supplying instructions to each additional data processor circuit, and
said transfer controller is further connected to each of said additional data memories and each said additional instruction memory controlling data transfer between said system memory and said each of said additional data memories and between said system memory and each said additional instruction memory.

95. The data processing system of claim 94, wherein:
said data processor circuit, said data memories, said instruction memories, each of said additional data processor circuits, each of said additional data memories, each additional instruction memory and said transfer controller are formed on a single integrated circuit.

96. The data processing system of claim 94, further including:
- a master data processor,
- a plurality of master data memories connected to said master data processor,
- at least one master instruction memory supplying instructions to said master data processor, and
- said transfer controller is further connected to each of said master data memories and each said master instruction memory controlling data transfer between said system memory and said each of said master data memories and between said system memory and each said master instruction memory.

97. The data processing system of claim 96, wherein: said data processor circuit, said data memories, said instruction memories, said master data processor, each of said master data memories, each master instruction memory and said transfer controller are formed on a single integrated circuit.

98. The data processing system of claim 83, wherein: said system memory consists of an image memory storing image data in a plurality of pixels; and
said data processing system further comprising:
- an image display unit connected to said image memory generating a visually perceivable output of an image consisting of a plurality of pixels stored in said image memory.

99. The data processing system of claim 98, further comprising:
- a palette forming a connection between said image memory and said image display unit, said palette transforming pixels recalled from said image memory into video signals driving said image display unit;
- and wherein said data processor circuit further includes
  - a frame controller connected to said palette controlling said palette transformation of pixels into video signals.

100. The data processing system of claim 84, wherein: said system memory consists of an image memory storing image data in a plurality of pixels; and
said data processing system further comprising:
- a printer connected to said image memory generating a printed output of an image consisting of a plurality of pixels stored in said image memory.

101. The data processing system of claim 100, wherein: said printer consists of a color printer.

102. The data processing system of claim 100, further comprising:
- a printer controller forming a connection between said image memory and said printer, said printer controller transforming pixels recalled from said image memory into print signals driving said printer;
- and wherein said data processor circuit further includes
  - a frame controller connected to said print controller controlling said print controller transformation of pixels into print signals.

103. The data processing system of claim 83, wherein: said system memory consists of an image memory storing image data in a plurality of pixels; and
said data processing system further comprising:
- an imaging device connected to said image memory generating an image signal input.

104. The data processing system of claim 103, further comprising:
- an image capture controller forming a connection between said imaging device and said image memory, said image capture controller transforming said image signal into pixels supplied for storage in said image memory;
- and wherein said data processor circuit further includes
  - a frame controller connected to said image capture controller controlling said image capture controller transformation of said image signal into pixels.

105. The data processing system of claim 83, further comprising:
- a modem connected to said data system bus and to a communications line.

106. The data processing system of claim 83, further comprising:
- a host processing system connected to said data system bus.

107. The data processing system of claim 106, further comprising:
- a host system bus connected to said host processing system transferring data and addresses; and
- at least one host peripheral connected to said host system bus.

* * * * *